US011860540B2

(12) United States Patent
Hatakeyama

(10) Patent No.: US 11,860,540 B2
(45) Date of Patent: *Jan. 2, 2024

(54) POSITIVE RESIST COMPOSITION AND PATTERNING PROCESS

(71) Applicant: Shin-Etsu Chemical Co., Ltd., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 107 days.

This patent is subject to a terminal disclaimer.

(21) Appl. No.: 17/308,334

(22) Filed: May 5, 2021

(65) Prior Publication Data

US 2021/0364921 A1 Nov. 25, 2021

(30) Foreign Application Priority Data

May 18, 2020 (JP) ................................ 2020-086623

(51) Int. Cl.

| | |
|---|---|
| ***G03F 7/039*** | (2006.01) |
| ***G03F 7/38*** | (2006.01) |
| ***C08F 220/04*** | (2006.01) |
| ***C08F 220/38*** | (2006.01) |
| ***G03F 7/00*** | (2006.01) |
| ***G03F 7/004*** | (2006.01) |

(52) U.S. Cl.

CPC .......... *G03F 7/0392* (2013.01); *G03F 7/0045* (2013.01); *G03F 7/0048* (2013.01); *G03F 7/0395* (2013.01); *G03F 7/0397* (2013.01); *G03F 7/70025* (2013.01); *C08F 220/04* (2013.01); *C08F 220/382* (2020.02)

(58) Field of Classification Search

CPC .... G03F 7/0392; G03F 7/0397; C08F 226/00; C08F 220/04; C08F 220/382

See application file for complete search history.

(56) References Cited

U.S. PATENT DOCUMENTS

| | | | | |
|---|---|---|---|---|
| 4,533,773 | A | 8/1985 | Michaelson et al. | |
| 6,294,693 | B1 | 9/2001 | Asakawa et al. | |
| 7,482,108 | B2 | 1/2009 | Matsumaru et al. | |
| 7,598,016 | B2 * | 10/2009 | Kobayashi | G03F 7/0046 430/326 |
| 7,960,091 | B2 | 6/2011 | Shimizu et al. | |
| 9,005,874 | B2 | 4/2015 | Komuro et al. | |
| 9,122,153 | B2 | 9/2015 | Echigo et al. | |
| 9,176,379 | B2 | 11/2015 | Ichikawa et al. | |
| 9,250,518 | B2 | 2/2016 | Hatakeyama et al. | |
| 9,360,753 | B2 | 6/2016 | Hatakeyama | |
| 9,448,475 | B2 | 9/2016 | Masuyama et al. | |
| 9,563,123 | B2 | 2/2017 | Masuyama et al. | |
| 10,101,654 | B2 | 10/2018 | Hatakeyama et al. | |
| 10,295,904 | B2 | 5/2019 | Hatakeyama et al. | |
| 10,303,056 | B2 | 5/2019 | Hatakeyama et al. | |
| 10,474,030 | B2 | 11/2019 | Hatakeyama et al. | |
| 11,586,110 | B2 * | 2/2023 | Hatakeyama | G03F 7/0045 |
| 11,592,745 | B2 * | 2/2023 | Hatakeyama | C08L 33/14 |
| 2003/0152190 | A1 | 8/2003 | Watanabe et al. | |
| 2003/0198894 | A1 | 10/2003 | Mizutani et al. | |
| 2007/0043234 | A1 | 2/2007 | Vaultier et al. | |
| 2007/0259773 | A1 | 11/2007 | Burdeniuc et al. | |
| 2008/0153030 | A1 | 6/2008 | Kobayashi et al. | |
| 2008/0241736 | A1 * | 10/2008 | Kobayashi | G03F 7/0397 430/322 |
| 2009/0197197 | A1 | 8/2009 | Shimizu et al. | |
| 2012/0082936 | A1 | 4/2012 | Serizawa et al. | |
| 2012/0149916 | A1 | 6/2012 | Utsumi et al. | |
| 2012/0208127 | A1 | 8/2012 | Hatakeyama | |
| 2013/0029270 | A1 | 1/2013 | Hatakeyama | |
| 2013/0052588 | A1 | 2/2013 | Yoshida et al. | |
| 2014/0242526 | A1 | 8/2014 | Allen et al. | |
| 2014/0308615 | A1 | 10/2014 | Echigo et al. | |
| 2015/0086926 | A1 | 3/2015 | Ohashi et al. | |
| 2016/0048076 | A1 | 2/2016 | Hatakeyama et al. | |
| 2017/0173938 | A1 * | 6/2017 | Nozaki | G03F 7/039 |
| 2017/0174801 | A1 | 6/2017 | Hirano | |
| 2017/0184962 | A1 | 6/2017 | Hatakeyama et al. | |
| 2017/0205709 | A1 | 7/2017 | Hatakeyama et al. | |
| 2017/0299963 | A1 | 10/2017 | Fujiwara | |
| 2017/0315442 | A1 | 11/2017 | Fukushima et al. | |
| 2017/0351177 | A1 | 12/2017 | Hatakeyama et al. | |

(Continued)

FOREIGN PATENT DOCUMENTS

| | | | |
|---|---|---|---|
| JP | H5-204157 | A | 8/1993 |
| JP | H11-102072 | A | 4/1999 |

(Continued)

OTHER PUBLICATIONS

Notice of Allowance dated Jun. 29, 2022, issued in U.S. Appl. No. 16/919,574. (13 pages).

(Continued)

*Primary Examiner* — John S Chu

(74) *Attorney, Agent, or Firm* — WHDA, LLP

(57) ABSTRACT

A positive resist composition comprising a base polymer comprising recurring units (a) having the structure of an ammonium salt of a sulfonamide having an iodized aromatic ring, and recurring units (b1) having an acid labile group-substituted carboxyl group and/or recurring units (b2) having an acid labile group-substituted phenolic hydroxyl group exhibits a high sensitivity, high resolution, low edge roughness and improved CDU, and forms a pattern of good profile after exposure and development.

12 Claims, No Drawings

(56) References Cited

U.S. PATENT DOCUMENTS

| | | | |
|---|---|---|---|
| 2018/0004087 A1 | 1/2018 | Hatakeyama et al. | |
| 2018/0081267 A1* | 3/2018 | Hatakeyama | C07C 69/76 |
| 2018/0081268 A1 | 3/2018 | Hatakeyama | |
| 2018/0088463 A1 | 3/2018 | Hatakeyama et al. | |
| 2018/0101094 A1* | 4/2018 | Hatakeyama | G03F 7/38 |
| 2018/0143532 A1 | 5/2018 | Hatakeyama | |
| 2018/0364570 A1 | 12/2018 | Hatakeyama et al. | |
| 2018/0373148 A1 | 12/2018 | Hatakeyama et al. | |
| 2019/0155155 A1 | 5/2019 | Hatakeyama et al. | |
| 2020/0026188 A1 | 1/2020 | Maruyama | |
| 2020/0073237 A1* | 3/2020 | Hatakeyama | G03F 7/0045 |
| 2020/0241414 A1 | 7/2020 | Hatakeyama et al. | |
| 2020/0241418 A1 | 7/2020 | Hatakeyama | |
| 2020/0272048 A1 | 8/2020 | Hatakeyama et al. | |
| 2020/0301274 A1 | 9/2020 | Taniguchi et al. | |
| 2021/0033970 A1 | 2/2021 | Hatakeyama et al. | |
| 2021/0033971 A1 | 2/2021 | Hatakeyama | |
| 2021/0063879 A1 | 3/2021 | Hatakeyama | |
| 2021/0149301 A1 | 5/2021 | Fujiwara et al. | |
| 2021/0179554 A1 | 6/2021 | Fujiwara et al. | |
| 2021/0188770 A1 | 6/2021 | Fujiwara et al. | |

FOREIGN PATENT DOCUMENTS

| | | | |
|---|---|---|---|
| JP | 2001-194776 | A | 7/2001 |
| JP | 2002-226470 | A | 8/2002 |
| JP | 2002-363148 | A | 12/2002 |
| JP | 2006-45311 | A | 2/2006 |
| JP | 2006-178317 | A | 7/2006 |
| JP | 2008-133312 | A | 6/2008 |
| JP | 2009-145578 | A | 7/2009 |
| JP | 2009-181062 | A | 8/2009 |
| JP | 2010-061087 | A | 3/2010 |
| JP | 2011-39266 | A | 2/2011 |
| JP | 2011-039502 | A | 2/2011 |
| JP | 2011-530652 | A | 12/2011 |
| JP | 2013-025211 | A | 2/2013 |
| JP | 2013-83957 | A | 5/2013 |
| JP | 2015-90382 | A | 5/2015 |
| JP | 2015-161823 | A | 9/2015 |
| JP | 2015-172746 | A | 10/2015 |
| JP | 2015-180928 | A | 10/2015 |
| JP | 5852490 | B2 | 2/2016 |
| JP | 5852496 | B2 | 2/2016 |
| JP | 2017-219836 | A | 12/2017 |
| JP | 2018-4812 | A | 1/2018 |
| JP | 2018-49264 | A | 3/2018 |
| JP | 2018-060069 | A | 4/2018 |
| JP | 2018-97356 | A | 6/2018 |
| KR | 10-2012-0093777 | A | 8/2012 |
| KR | 10-2016-0019860 | A | 2/2016 |
| TW | 200906866 | A | 2/2009 |
| TW | 201241556 | A | 10/2012 |
| TW | 201516024 | A | 5/2015 |
| TW | 201730674 | A | 9/2017 |
| TW | 201837604 | A | 10/2018 |
| WO | 2008/066011 | A1 | 6/2008 |
| WO | 2010/059174 | A1 | 5/2010 |
| WO | 2013/024777 | A1 | 2/2013 |
| WO | 2013/141015 | A1 | 9/2013 |
| WO | 2021/039244 | A1 | 3/2021 |

OTHER PUBLICATIONS

Eckert et al., "CIDNP Investigation of Radical Decay Pathways in the Sensitized Photolysis of Triphenylsulfonium Salts", J. Am. Chem. Soc., 1999, 121, 10, pp. 2274-2280. (7 pages).

Wang et al., "Photobase generator and photo decomposable quencher for high-resolution photoresist applications", Proc. of SPIE, 2010, vol. 7639, pp. 76390W1-76390W15. (15 pages).

Office Action dated Feb. 2, 2021, issued in TW Application No. 109127275 (counterpart to U.S. Appl. No. 16/871,648). (10 pages).

Non-Final Office Action dated Mar. 29, 2022, issued in U.S. Appl. No. 16/871,648. (23 pages).

Office Action dated Oct. 15, 2018, issued in TW Application 106134104 (counterpart to U.S. Appl. No. 15/725,404). (9 pages).

Office Action dated Oct. 2, 2018, issued in KR Application No. 10-2017-0128141 (counterpart to U.S. Appl. No. 15/725,404), with English translation. (13 pages).

Non-Final Office Action dated Mar. 22, 2019, issued in U.S. Appl. No. 15/725,404. (28 pages).

Office Action dated Apr. 16, 2021, issued in TW Application No. 109129970 (counterpart to U.S. Appl. No. 16/984,535). (8 pages).

Notice of Allowance dated Oct. 19, 2022, issued in U.S. Appl. No. 16/942,981. (24 pages).

Office Action dated Sep. 2, 2020, issued in TW Application No. 109102066 (counterpart to U.S. Appl. No. 16/774,057). (12 pages).

Non-Final Office Action dated Apr. 5, 2022, issued in U.S. Appl. No. 16/774,057. (19 pages).

* cited by examiner

POSITIVE RESIST COMPOSITION AND PATTERNING PROCESS

CROSS-REFERENCE TO RELATED APPLICATION

This non-provisional application claims priority under 35 U.S.C. § 119(a) on Patent Application No. 2020-086623 filed in Japan on May 18, 2020, the entire contents of which are hereby incorporated by reference.

TECHNICAL FIELD

This invention relates to a positive resist composition and a patterning process.

BACKGROUND ART

To meet the demand for higher integration density and operating speed of LSIs, the effort to reduce the pattern rule is in rapid progress. The logic devices used in smart phones or the like drive forward the miniaturization technology. Logic devices of 10-nm node are manufactured in a large scale using a multi-patterning lithography process based on ArF lithography. In the application of lithography to next 7-nm or 5-nm node devices, the increased expense and overlay accuracy of multi-patterning lithography become tangible. The advent of EUV lithography capable of reducing the number of exposures is desired.

Since the wavelength (13.5 nm) of extreme ultraviolet (EUV) is shorter than 1/10 of the wavelength (193 nm) of ArF excimer laser, the EUV lithography achieves a high light contrast, from which a high resolution is expectable. Because of the short wavelength and high energy density of EUV, an acid generator is sensitive to a small dose of photons. It is believed that the number of photons available with EUV exposure is 1/14 of that of ArF excimer laser exposure. In the EUV lithography, the phenomenon that the edge roughness (LER, LWR) of line patterns or the critical dimension uniformity (CDU) of hole patterns is degraded by a variation of photon number is considered a problem.

Aiming to reduce a photon number variation, an attempt was made to render the resist film more absorptive so that the number of photons absorbed in the resist film is increased. For example, among halogens, iodine is highly absorptive to EUV of wavelength 13.5 nm. Patent Documents 1 to 3 disclose to use iodized polymers as the EUV resist material. On use of such iodized polymers, the number of photons absorbed in the resist film increases due to more absorption of EUV. It is then expected that the amount of acid generated is increased, leading to an increase of sensitivity and improvements in LER, LWR and CDU. In fact, however, the iodized polymers are only sparsely soluble in the developer or alkaline aqueous solution, leading to a lowering of dissolution contrast and degradations of LER, LWR and CDU. There is the demand for a resist material having satisfactory light absorption and dissolution contrast.

For the purpose of suppressing acid diffusion, Patent Documents 4 and 5 disclose resist compositions comprising a polymer comprising amino-containing recurring units. The polymeric amine is effective for suppressing acid diffusion at the sacrifice of sensitivity.

CITATION LIST

Patent Document 1: JP-A 2015-161823
Patent Document 2: WO 2013/024777
Patent Document 3: JP-A 2018-004812
Patent Document 4: JP-A 2008-133312
Patent Document 5: JP-A 2009-181062

SUMMARY OF INVENTION

An object of the present invention is to provide a positive resist composition which exhibits a higher sensitivity and resolution than conventional positive resist compositions, low LER or LWR and improved CDU, and forms a pattern of good profile after exposure and development, and a patterning process using the resist composition.

Making extensive investigations in search for a positive resist material capable of meeting the current requirements including high sensitivity and resolution, low LER or LWR and improved CDU, the inventor has found the following. To meet the requirements, the acid diffusion distance should be minimized. This invites a lowering of sensitivity and a drop of dissolution contrast, raising the problem that the resolution of a two-dimensional pattern such as hole pattern is reduced. Unexpectedly, better results are obtained when a polymer comprising recurring units having the structure of an ammonium salt of a sulfonamide having an iodized aromatic ring is used as a base polymer. Since the sulfonamide having an iodized aromatic ring is dissolved in the alkaline developer, the iodine atoms attached to the base polymer are lost, and any drop of dissolution rate in alkaline developer is avoided. During exposure, the number of photons absorbed is increased due to strong absorption of iodine atoms. The efficiency of acid generation of an acid generator is increased by the furtherance of absorption and at the same time, the acid diffusion distance is minimized. Better results are thus obtainable using the polymer as a base polymer in a chemically amplified positive resist composition.

Further, for improving the dissolution contrast, recurring units having a carboxyl or phenolic hydroxyl group in which the hydrogen is substituted by an acid labile group are incorporated into the base polymer. There is obtained a positive resist composition having a high sensitivity, a significantly increased contrast of alkali dissolution rate before and after exposure, a remarkable acid diffusion-suppressing effect, a high resolution, improved LER, LWR and CDU, and a good pattern profile after exposure. The composition is thus suitable as a fine pattern forming material for the manufacture of VLSIs and photomasks.

In one aspect, the invention provides a positive resist composition comprising a base polymer comprising recurring units (a) having the structure of an ammonium salt of a sulfonamide having an iodized aromatic ring and recurring units of at least one type selected from recurring units (b1) having a carboxyl group substituted with an acid labile group and recurring units (b2) having a phenolic hydroxyl group substituted with an acid labile group.

In a preferred embodiment, the recurring units (a) have the formula (a).

(a)

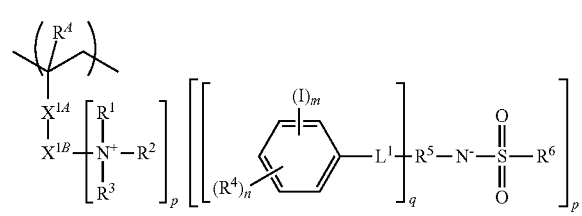

Herein m is an integer of 1 to 5, n is an integer of 0 to 3, $1 \leq m+n \leq 5$, p is 1 or 2, and q is 1 or 2. $R^A$ is hydrogen or methyl. $X^{1A}$ is a single bond, ester bond or amide bond. $X^{1B}$ is a single bond or a $C_1$-$C_{20}$ (p+1)-valent hydrocarbon group which may contain an ether bond, carbonyl moiety, ester bond, amide bond, suit one moiety, lactam moiety, carbonate bond, halogen, hydroxyl moiety or carboxyl moiety. $R^1$, $R^2$ and $R^3$ are each independently hydrogen, a $C_1$-$C_{12}$ alkyl group, $C_2$-$C_{12}$ alkenyl group, $C_6$-$C_{12}$ aryl group, or $C_7$-$C_{12}$ aralkyl group, $R^1$ and $R^2$, or $R^1$ and $X^{1B}$ may bond together to form a ring with the nitrogen atom to which they are attached, the ring may contain oxygen, sulfur, nitrogen or a double bond. $R^4$ is a hydroxyl group, optionally halogenated $C_1$-$C_6$ saturated hydrocarbyl group, optionally halogenated $C_1$-$C_6$ saturated hydrocarbyloxy group, optionally halogenated $C_2$-$C_7$ saturated hydrocarbylcarbonyloxy group, optionally halogenated $C_2$-$C_7$ saturated hydrocarbyloxycarbonyl group, optionally halogenated $C_1$-$C_4$ saturated hydrocarbylsulfonyloxy group, fluorine, chlorine, bromine, amino, nitro, cyano, —N($R^{4A}$)—C(═O)—$R^{4B}$, or —N($R^{4A}$)—C(═O)—O—$R^{4B}$, wherein $R^{4A}$ is hydrogen or a $C_1$-$C_6$ saturated hydrocarbyl group, $R^{4B}$ is a $C_1$-$C_6$ saturated hydrocarbyl group, $C_2$-$C_8$ unsaturated aliphatic hydrocarbyl group, $C_6$-$C_{14}$ aryl group or $C_7$-$C_{15}$ aralkyl group. $R^5$ is a $C_1$-$C_{10}$ (q+1)-valent hydrocarbon group. $R^6$ is a $C_1$-$C_6$ fluoridated saturated hydrocarbyl group or $C_6$-$C_{10}$ fluorinated aryl group. $L^1$ is a single bond, ether bond, carbonyl group, ester bond, amide bond, carbonate bond, or $C_1$-$C_{20}$ hydrocarbylene group, the hydrocarbylene group may contain an ether bond, carbonyl moiety, ester bond, amide bond, sultone ring, lactam ring carbonate bond, halogen, hydroxyl moiety or carboxyl moiety.

In a preferred embodiment, the recurring units (b1) have the formula (b1) and the recurring units (b2) have the formula (b2).

(b1)

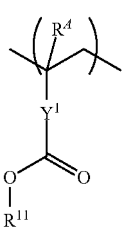

(b2)

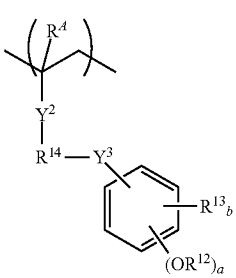

Herein $R^A$ is each independently hydrogen or methyl. $Y^1$ is a single bond, phenylene, naphthylene, or a $C_1$-$C_{12}$ linking group containing an ester bond and/or lactone ring. $Y^2$ is a single bond or ester bond. $Y^3$ is a single bond ether bond or ester bond. $R^{11}$ and $R^{12}$ each are an acid labile group. $R^{13}$ is a $C_1$-$C_{12}$ saturated hydrocarbyl group, $C_1$-$C_6$ saturated hydrocarbyloxy group, $C_2$-$C_6$ saturated hydrocarbylcarbonyl group, $C_2$-$C_6$ saturated hydrocarbylcarbonyloxy group, $C_2$-$C_6$ saturated hydrocarbyloxycarbonyl group, halogen, nitro group, or cyano group. $R^{14}$ is a single bond or a $C_1$-$C_6$ saturated hydrocarbylene group in which some carbon may be replaced by an ether bond or ester bond, a is 1 or 2, b is an integer of 0 to 4, and $1 \leq a+b \leq 5$.

The base polymer may further comprise recurring units of at least one type selected from recurring units having the formulae (d1) to (d3).

(d1)

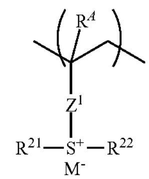

(d2)

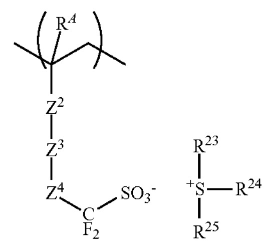

(d3)

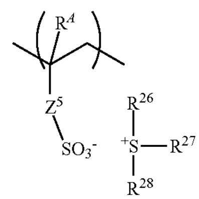

Herein $R^A$ is hydrogen or methyl. $Z^1$ is a single bond, or a $C_1$-$C_6$ aliphatic hydrocarbylene group, phenylene group, naphthylene group, or a $C_7$-$C_{18}$ group obtained by combining the foregoing, or —O—$Z^{11}$—, —C(═O)—O—$Z^{11}$— or —C(═O)—NH—$Z^{11}$—, wherein $Z^{11}$ is a $C_1$-$C_6$ aliphatic hydrocarbylene group, phenylene group, naphthylene group, or a $C_7$-$C_{18}$ group obtained by combining the foregoing, which may contain a carbonyl moiety, ester bond, ether bond or hydroxyl moiety. $Z^2$ is a single bond or ester bond. $Z^3$ is a single bond, —$Z^{31}$—C(═O)—O—, —$Z^{31}$—O—, or —$Z^{31}$—O—C(═O)—, wherein $Z^{31}$ is a $C_1$-$C_{12}$ hydrocarbylene group, phenylene group or a $C_7$-$C_{18}$ group obtained by combining the foregoing, which may contain a carbonyl moiety, ester bond, ether bond, bromine or iodine. $Z^4$ is methylene, 2,2,2-trifluoro-1,1-ethanediyl or carbonyl. $Z^5$ is a single bond, methylene, ethylene, phenylene, fluorinated phenylene, trifluoromethyl-substituted phenylene group, —O—$Z^{51}$—, —C(═O)—O—$Z^{51}$— or —C(═O)—NH—$Z^{51}$—, wherein $Z^{51}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxyl moiety. $R^{21}$ to $R^{28}$ are each independently a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached. $M^-$ is a non-nucleophilic counter ion.

The resist composition may further comprise an acid generator capable of generating a sulfonic acid, sulfone imide or sulfone methide, an organic solvent, a dissolution inhibitor, and/or a surfactant.

In another aspect, the invention provides a pattern forming process comprising the steps of applying the positive resist composition defined above to form a resist film on a substrate, exposing the resist film to high-energy radiation, and developing the exposed resist film in a developer.

Preferably, the high-energy radiation is ArF excimer laser of wavelength 193 nm, KrF excimer laser of wavelength 248 nm, EB, or EUV of wavelength 3 to 15 nm.

Advantageous Effects of Invention

The positive resist composition has a high decomposition efficiency of the acid generator, a remarkable acid diffusion-suppressing effect, a high sensitivity, and a high resolution, and forms a pattern of good profile with improved LER or LWR and CDU after exposure and development. By virtue of these properties, the resist composition is fully useful in commercial application and best suited as a micropatterning material for photomasks by EB lithography or for VLSIs by EB or EUV lithography. The resist composition may be used not only in the lithography for forming semiconductor circuits, but also in the formation of mask circuit patterns, micromachines, and thin-film magnetic head circuits.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. As used herein, the term "iodized" compound indicates a compound containing iodine or a compound substituted with iodine. The terms "group" and "moiety" are interchangeable. In chemical formulae, the broken line denotes a valence bond, Me stands for methyl, and Ac for acetyl.

The abbreviations and acronyms have the following meaning.

EB: election beam

EUV: extreme ultraviolet

Mw: weight average molecular weight

Mn: number average molecular weight

Mw/Mn: molecular weight dispersity

GPC: gel permeation chromatography

PEB: post-exposure bake

PAG: photoacid generator

LER: line edge roughness

LWR: line width roughness

CDU: critical dimension uniformity

Positive Resist Composition

One embodiment of the invention is a positive resist composition comprising a base polymer comprising recurring units (a) having the structure of an ammonium salt of a sulfonamide having an iodized aromatic ring and recurring units of at least one type selected from recurring units (b1) having a carboxyl group in which the hydrogen atom is substituted by an acid labile group and recurring units (b2) having a phenolic hydroxyl group in which the hydrogen atom is substituted by an acid labile group.

Base Polymer

Preferably, the recurring units (a) have the formula (a).

(a)

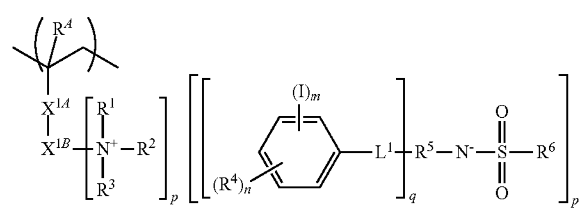

In formula (a), m is an integer of 1 to 5, n is an integer of 0 to 3, 1≤m+n≤5, p is 1 or 2, and q is 1 or 2.

In formula (a), $R^A$ is hydrogen or methyl. $X^{1A}$ is a single bond, ester bond or amide bond. $X^{1B}$ is a single bond or a $C_1$-$C_{20}$ (p+1)-valent hydrocarbon group which may contain an ether bond, carbonyl moiety, ester bond, amide bond, suit one moiety, lactam moiety, carbonate bond, halogen, hydroxyl moiety or carboxyl moiety.

The $C_1$-$C_{20}$ (p+1)-valent hydrocarbon group represented by $X^{1B}$ is a group obtained by removing (p+1) number of hydrogen atoms from a $C_1$-$C_{20}$ aliphatic hydrocarbon or $C_6$-$C_{20}$ aromatic hydrocarbon, and may be straight, branched or cyclic. Examples thereof include alkanediyl groups such as methanediyl, ethane-1,1-diyl, ethane-1,2-diyl, propane-1,2-diyl, propane-1,3-diyl, propane-2,2-diyl, butane-1,2-diyl, butane-1,3-diyl, butane 1,4-diyl, butane-2,2-diyl, butane-2,3-diyl, 2-methylpropane 1,3-diyl, pentane 1,5-diyl, hexane-1,6-diyl, heptane 1,7-diyl, octane 1,8-diyl, nonane-1,9-diyl, decane-1,10-diyl, undecane 1,11-diyl, and dodecane 1,12-diyl; $C_3$-$C_{10}$ cyclic saturated hydrocarbylene groups such as cyclopentanediyl, cyclohexanediyl, norbornanediyl and adamantanediyl; arylene groups such as phenylene and naphthylene; and groups obtained by combining the foregoing groups; as well as trivalent groups obtained by further removing one hydrogen atom from the foregoing.

In formula (a), $R^1$, $R^2$ and $R^3$ are each independently hydrogen, a $C_1$-$C_{12}$ alkyl group, $C_2$-$C_{12}$ alkenyl group, $C_1$-$C_{12}$ aryl group, or $C_7$-$C_{12}$ aralkyl group. $R^1$ and $R^2$, or $R^1$ and $X^{1B}$ may bond together to form a ring with the nitrogen atom to which they are attached, the ring may contain oxygen, sulfur, nitrogen or a double bond, with the ring being preferably of 3 to 12 carbon atoms.

Of the groups represented by $R^1$, $R^2$ and $R^3$, the $C_1$-$C_{12}$ alkyl group may be straight, branched or cyclic and examples thereof include methyl, ethyl, n-propyl, isopropyl, n-butyl, isobutyl, sec-butyl, tert-butyl, n-pentyl, n-hexyl, n-heptyl, n-octyl, n-nonyl, n-decyl, and n-dodecyl. Examples of the $C_2$-$C_{12}$ alkenyl group include vinyl, 1-propenyl, 2-propenyl, butenyl and hexenyl. Examples of the $C_6$-$C_{12}$ aryl group include phenyl, tolyl, xylyl, 1-naphthyl and 2-naphthyl. Typical of the $C_7$-$C_{12}$ aralkyl group is benzyl.

In formula (a), $R^4$ is a hydroxyl group, optionally halogenated $C_1$-$C_6$ saturated hydrocarbyl group, optionally halogenated $C_1$-$C_6$ saturated hydrocarbyloxy group, optionally halogenated $C_2$-$C_7$ saturated hydrocarbylcarbonyloxy group, optionally halogenated $C_2$-$C_7$ saturated hydrocarbyloxy carbonyl group, optionally halogenated $C_1$-$C_4$ saturated hydrocarbylsulfonyloxy group, fluorine, chlorine, bromine, amino, nitro, cyano, —N($R^{4A}$)—C(═O)—$R^{4B}$, or —N($R^{4A}$)—C(═O)—O—$R^{4B}$. $R^{4A}$ is hydrogen or a $C_1$-$C_6$ saturated hydrocarbyl group. $R^{4B}$ is a $C_1$-$C_6$ saturated hydrocarbyl group, $C_2$-$C_8$ unsaturated aliphatic hydrocarbyl group, $C_6$-$C_{14}$ aryl group or $C_7$-$C_{15}$ aralkyl group.

The $C_1$-$C_6$ saturated hydrocarbyl group represented by $R^4$, $R^{4A}$ and $R^{4B}$ may be straight, branched or cyclic, and examples thereof include $C_1$-$C_6$ alkyl groups such as methyl, ethyl, n-propyl, isopropyl, n-butyl, isobutyl, sec-butyl, tert-butyl, n-pentyl, n-hexyl; and $C_3$-$C_6$ cycloalkyl groups such as cyclopropyl, cyclobutyl, cyclopentyl, and cyclohexyl. The saturated hydrocarbyl moiety in the $C_1$-$C_6$ saturated hydrocarbyloxy group, $C_2$-$C_7$ saturated hydrocarbylcarbonyloxy group, or $C_2$-$C_7$ saturated hydrocarbyloxycarbonyl group, represented by $R^4$, is as exemplified above for the saturated hydrocarbyl group. The saturated hydrocarbyl moiety in the $C_1$-$C_4$ saturated hydrocarbylsulfonyloxy group represented by $R^4$ is as exemplified above for the saturated hydrocarbyl group, but of 1 to 4 carbon atoms.

Of the groups represented by $R^{4B}$, the $C_2$-$C_8$ unsaturated aliphatic hydrocarbyl group may be straight, branched or cyclic, and examples thereof include $C_2$-$C_8$ alkenyl groups such as vinyl, 1-propenyl, 2-propenyl, butenyl and hexenyl; and $C_3$-$C_8$ unsaturated cycloaliphatic hydrocarbyl groups such as cyclohexenyl. Examples of the $C_6$-$C_{14}$ aryl group include phenyl, naphthyl, and fluorenyl. Examples of the $C_7$-$C_{15}$ aralkyl group include benzyl, phenethyl, naphthylmethyl, naphthylethyl, fluorenylmethyl and fluorenylethyl.

Among others, $R^4$ is preferably selected from fluorine, chlorine, bromine, hydroxyl, amino, $C_1$-$C_3$ saturated hydrocarbyl, $C_1$-$C_3$ saturated hydrocarbyloxy, $C_2$-$C_4$ saturated hydrocarbylcarbonyloxy, —N($R^{4A}$)—C(═O)—$R^{4B}$, and —N($R^{4A}$)—C(═O)—O—$R^{4B}$.

In formula (a), $R^5$ is a $C_1$-$C_{10}$ (q+1)-valent hydrocarbon group. The (q+1)-valent hydrocarbon group is a group obtained by removing (q+1) number of hydrogen atoms from a $C_1$-$C_{10}$ aliphatic hydrocarbon or $C_6$-$C_{10}$ aromatic hydrocarbon and may be straight, branched or cyclic. Examples thereof include $C_1$-$C_{10}$ alkanediyl groups such as methanediyl, ethane-1,1-diyl, ethane-1,2-diyl, propane-1,2-diyl, propane-1,3-diyl, propane-2,2-diyl, butane-1,2-diyl, butane-1,3-diyl, butane-1,4-diyl, butane-2,2-diyl, butane-2,3-diyl, 2-methylpropane-1,3-diyl, pentane-1,5-diyl, hexane-1,6-diyl, heptane-1,7-diyl, octane-1,8-diyl, nonane-1,9-diyl, and decane-1,10-diyl; $C_3$-$C_{10}$ cyclic saturated hydrocarbylene groups such as cyclopentanediyl, cyclohexanediyl, norbomanediyl, and adamantanediyl; $C_6$-$C_{10}$ arylene groups such as phenylene and naphthylene; combinations thereof; and trivalent forms of the foregoing groups with one hydrogen atom being further removed.

In formula (a), $R^6$ is a $C_1$-$C_6$ fluorinated saturated hydrocarbyl group or $C_6$-$C_{10}$ fluorinated aryl group. The $C_1$-$C_6$ fluorinated saturated hydrocarbyl group may be straight, branched or cyclic and examples thereof are those exemplified above for the $C_1$-$C_6$ saturated hydrocarbyl group in which some or all hydrogen atoms are substituted by fluorine. Examples of the $C_6$-$C_{10}$ fluorinated aryl group include phenyl, naphthyl and other aryl groups in which some or all hydrogen atoms are substituted by fluorine, and groups obtained by combining the foregoing.

In formula (a), $L^1$ is a single bond, ether bond, carbonyl group, ester bond, amide bond, carbonate bond, or $C_1$-$C_{20}$ hydrocarbylene group. The hydrocarbylene group may be saturated or unsaturated, and straight, branched or cyclic, and may contain an ether bond, carbonyl moiety, ester bond, amide bond, sultone ring, lactam ring, carbonate bond, halogen, hydroxyl moiety or carboxyl moiety.

Examples of the cation in the monomer from which recurring units (a) are derived are shown below, but not limited thereto. Herein $R^A$ is as defined above.

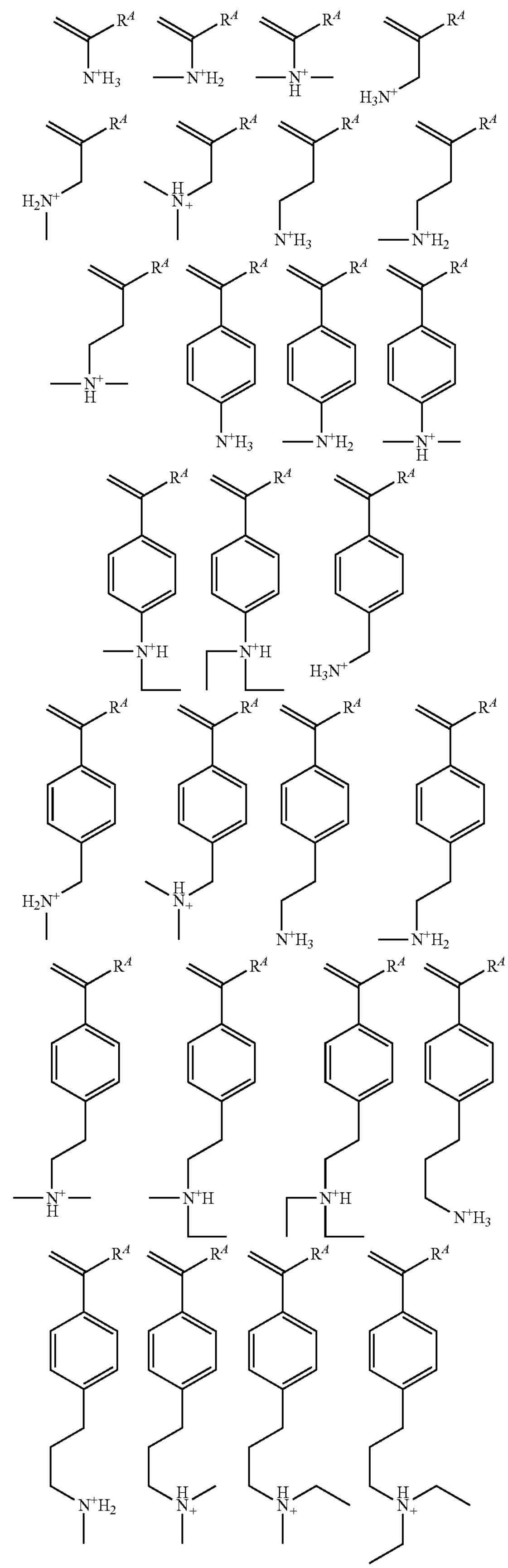

-continued
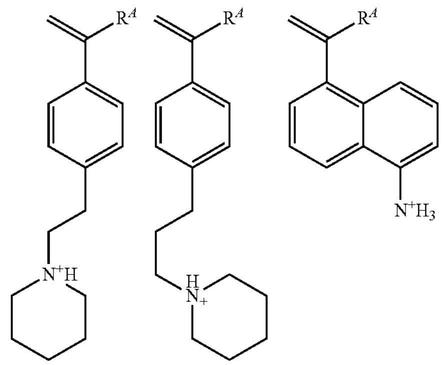
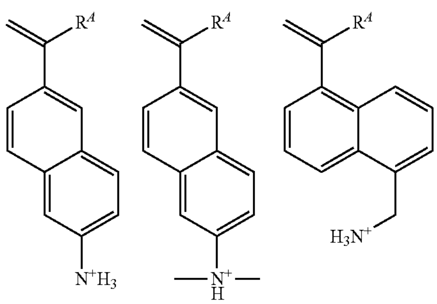
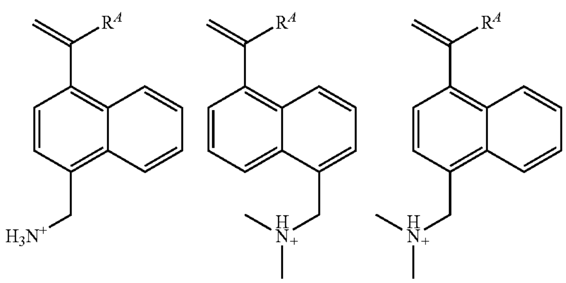
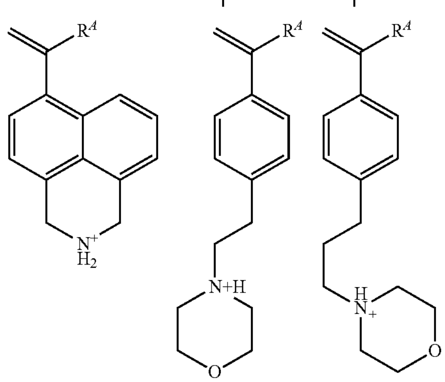
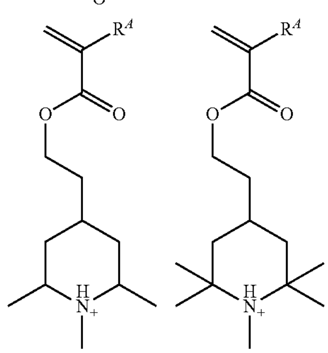
-continued
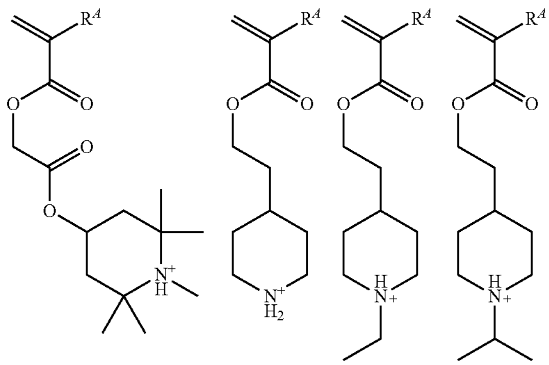
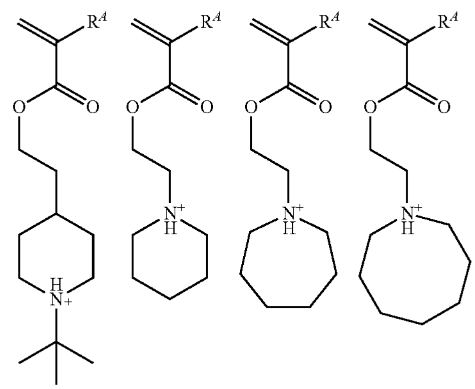
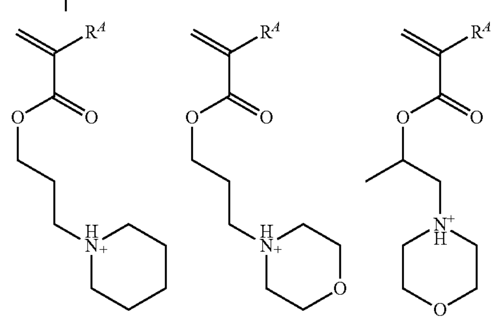
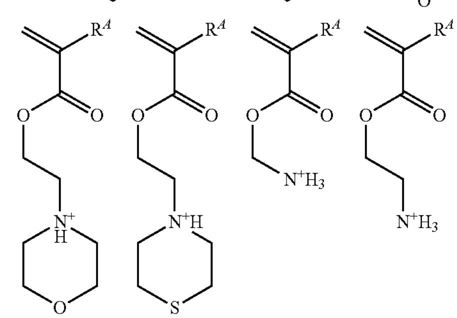
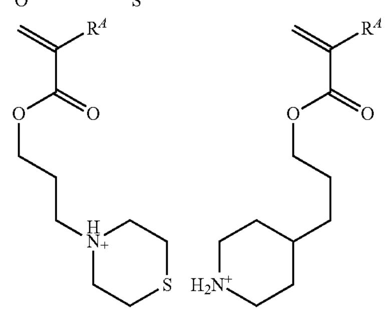

-continued
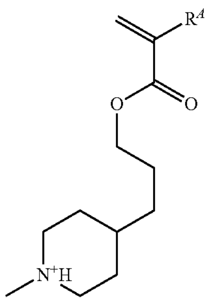
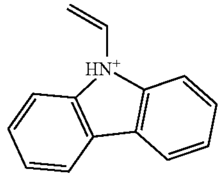
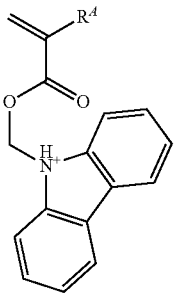
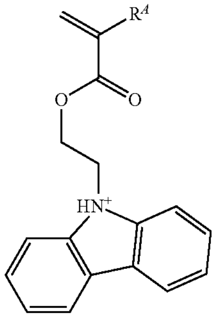
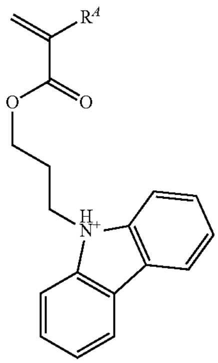
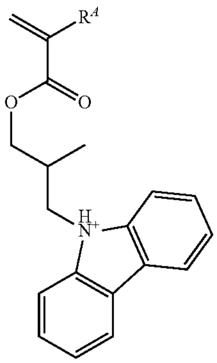
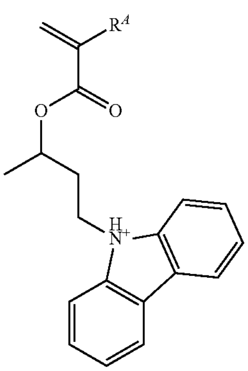
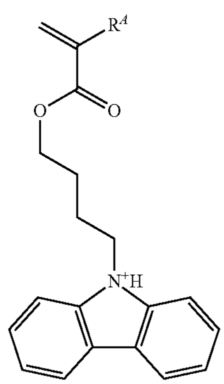
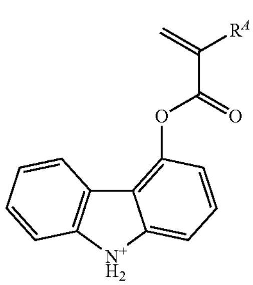
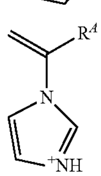
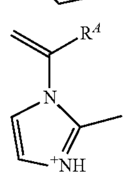
-continued
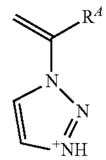
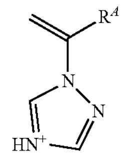
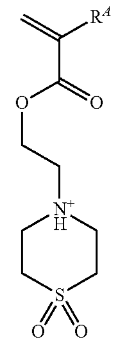
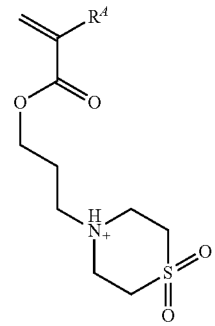
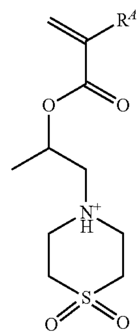
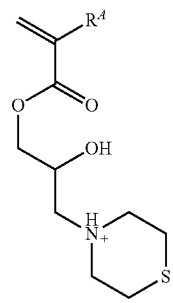
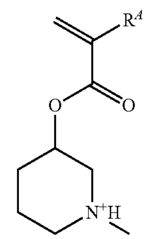
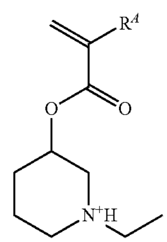
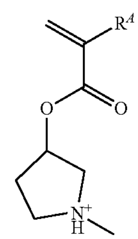
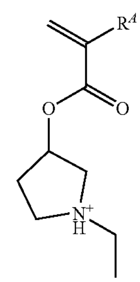
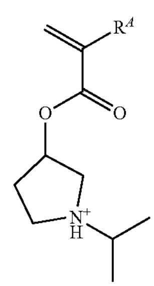
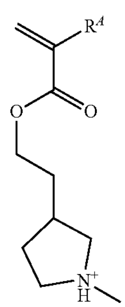
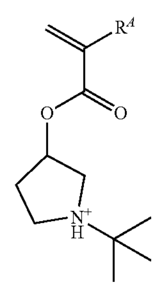
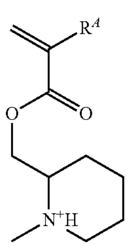
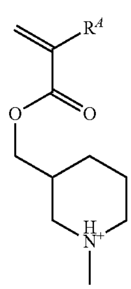
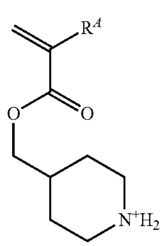

-continued
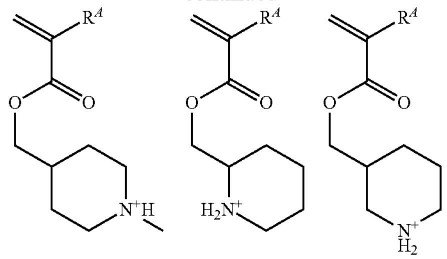
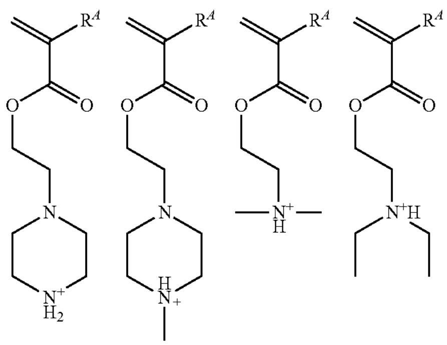
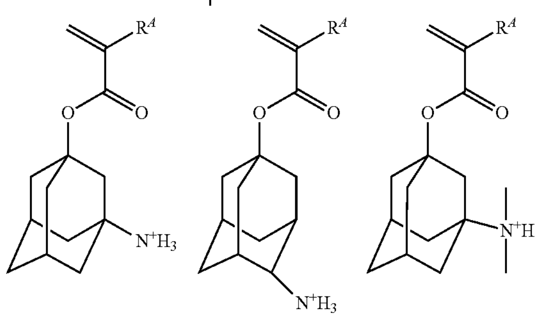
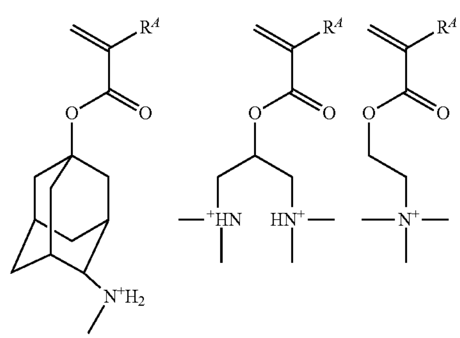
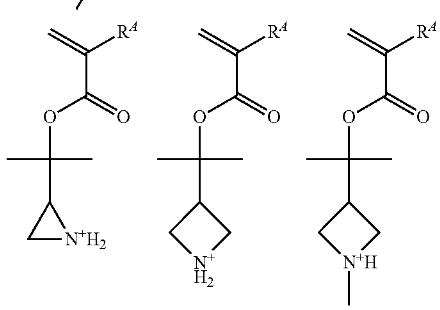
-continued
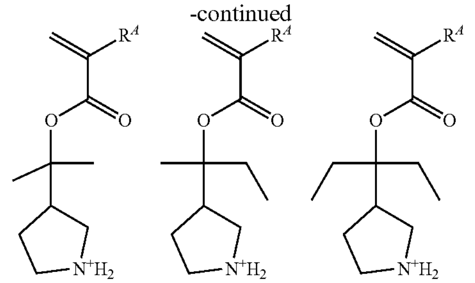
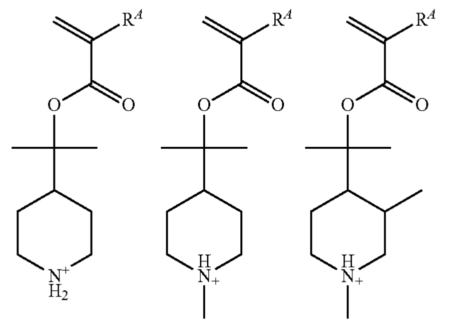
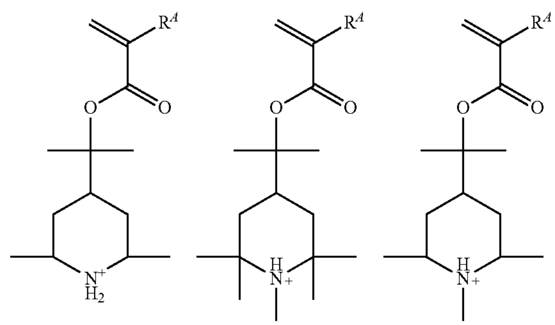
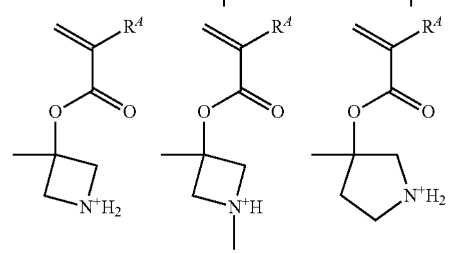
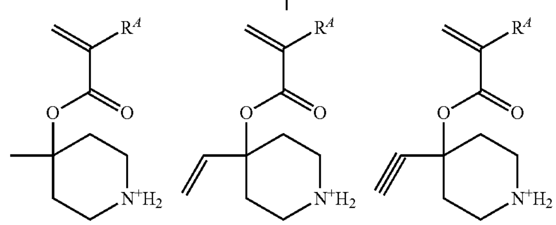
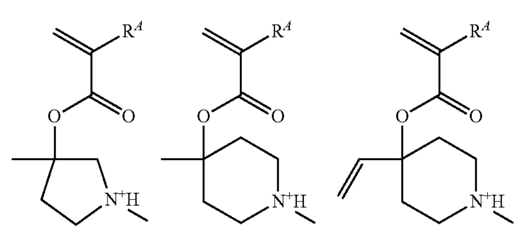

-continued
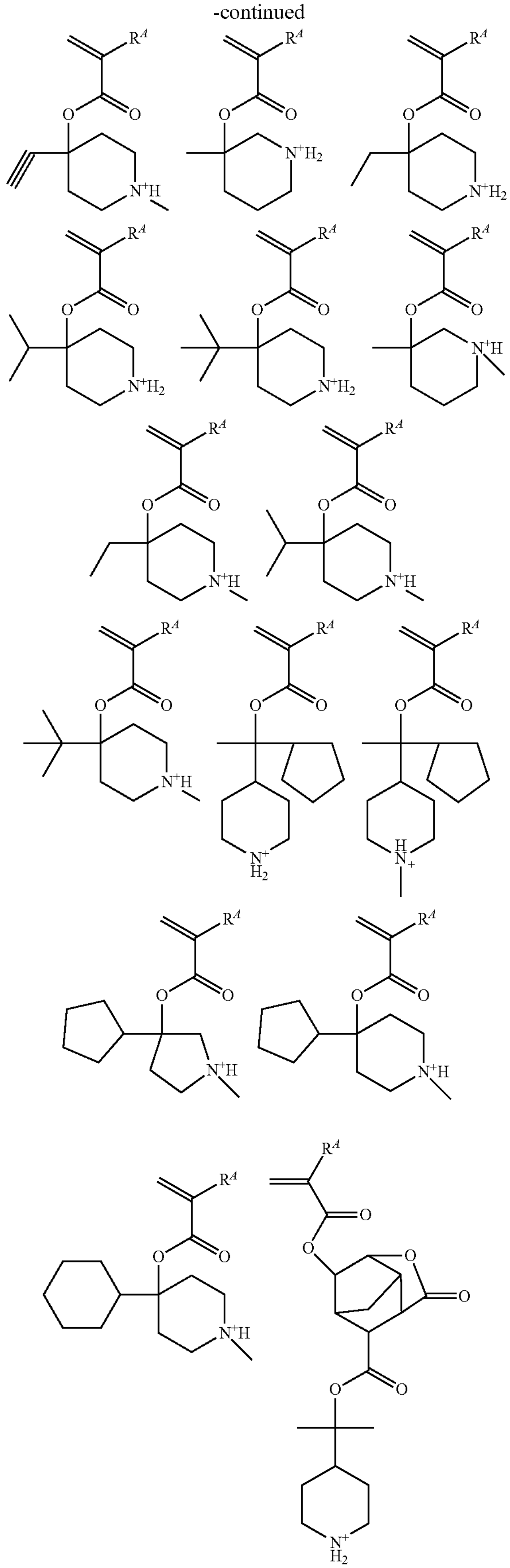
-continued
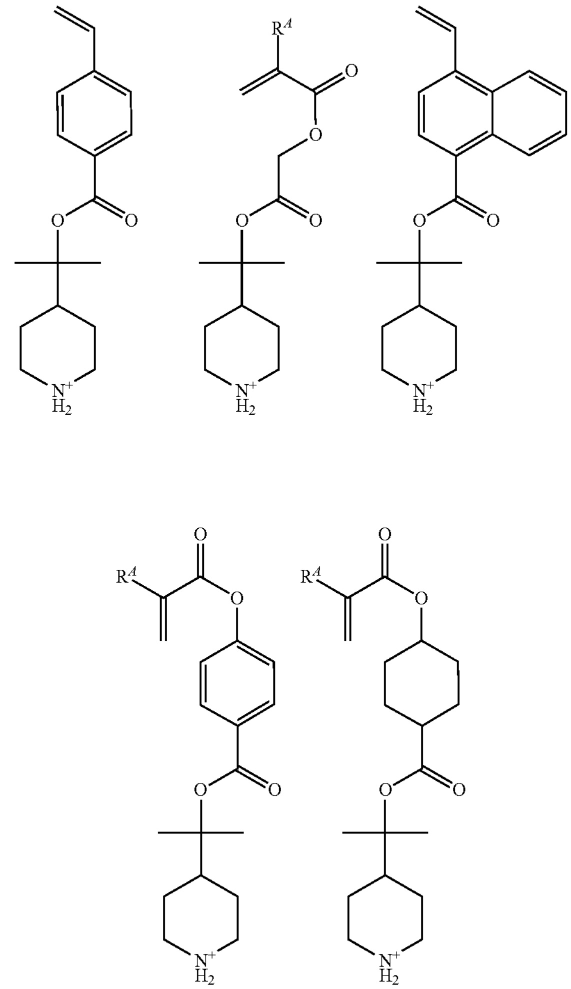
Examples of the anion in the monomer from which recurring units (a) are derived are shown below, but not limited thereto.
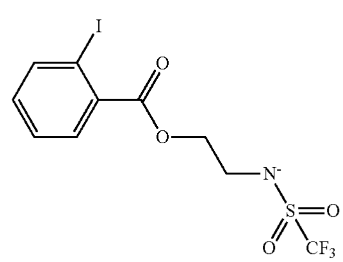
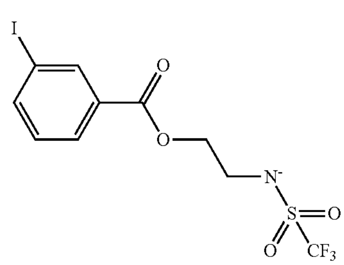

-continued
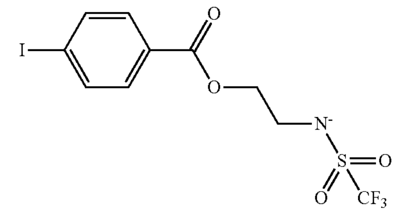
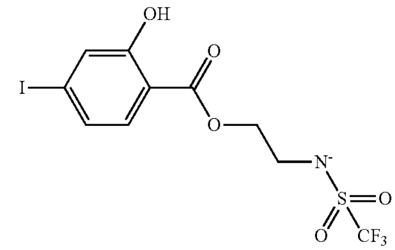
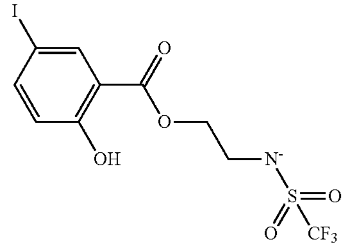
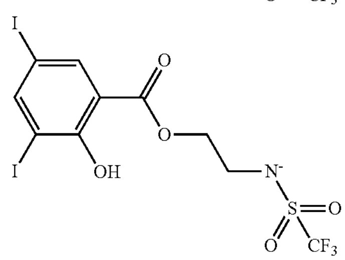
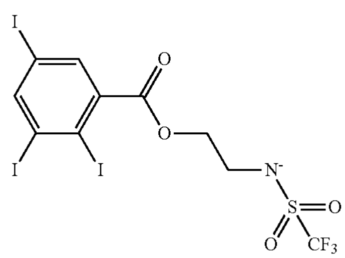
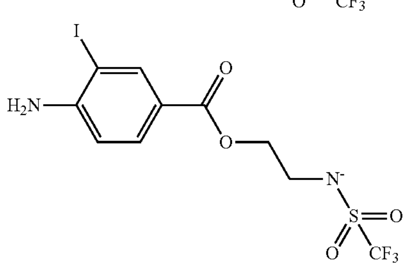
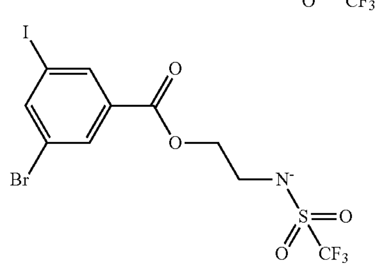
-continued
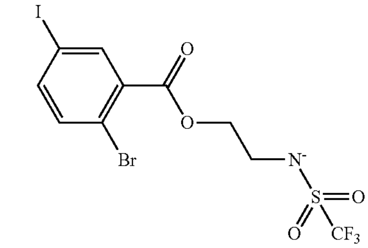
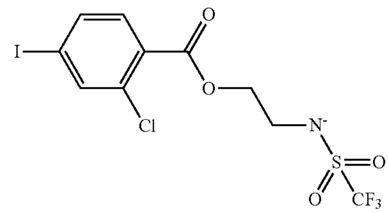
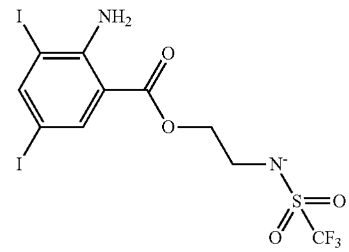
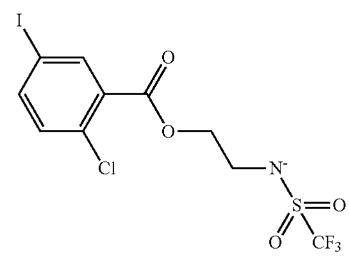
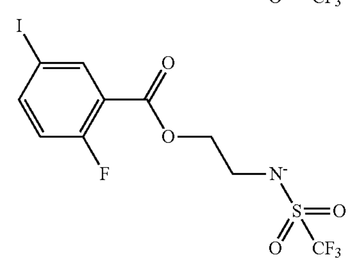
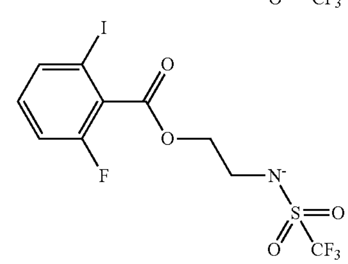
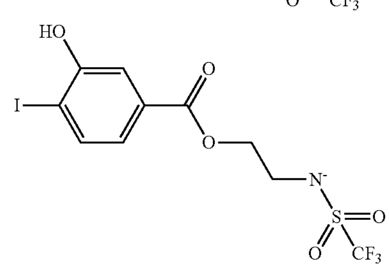

-continued
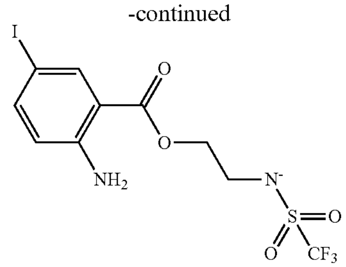
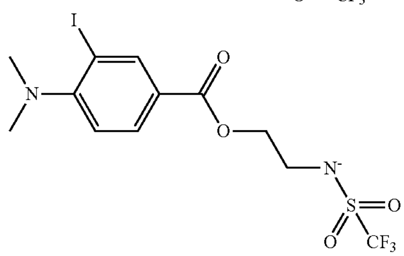
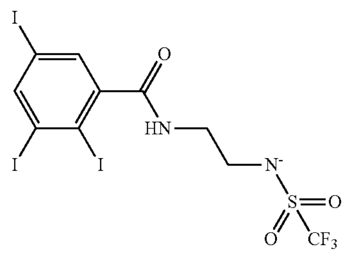
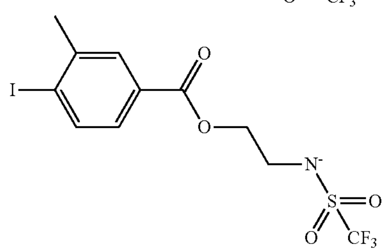
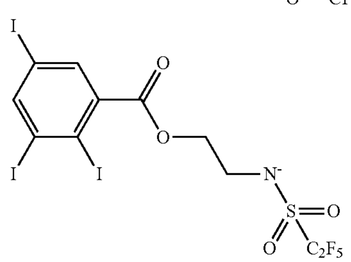
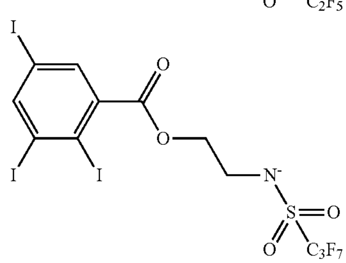
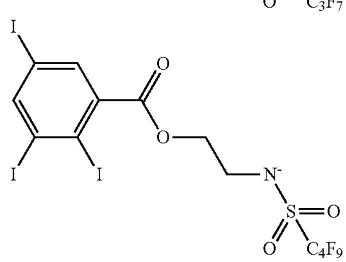
-continued
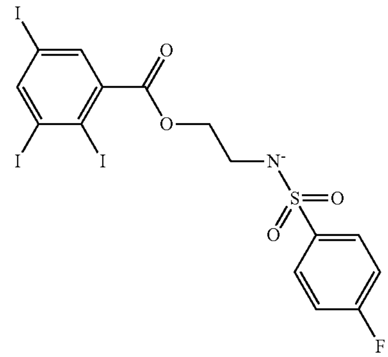
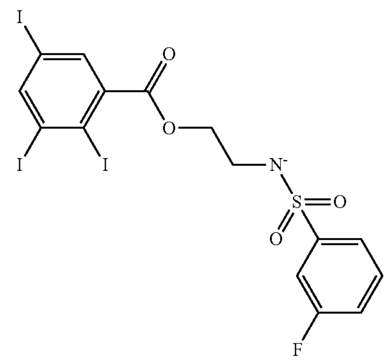
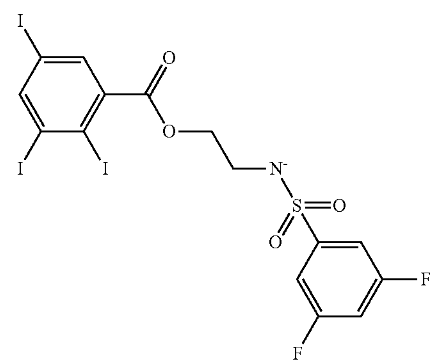
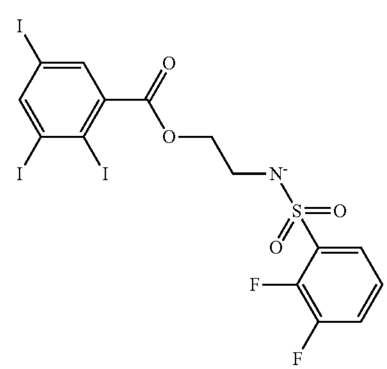

-continued
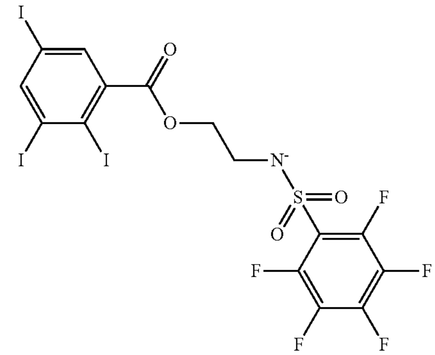
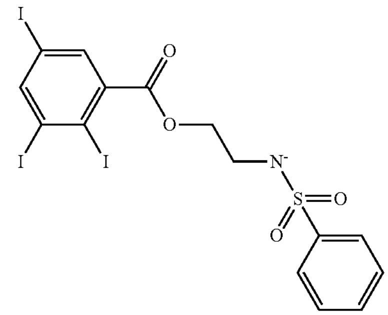
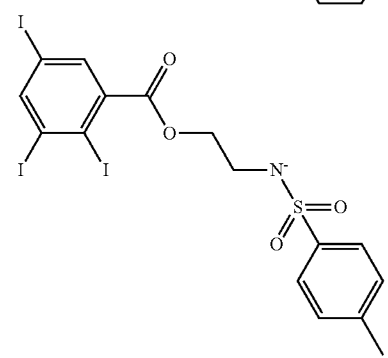
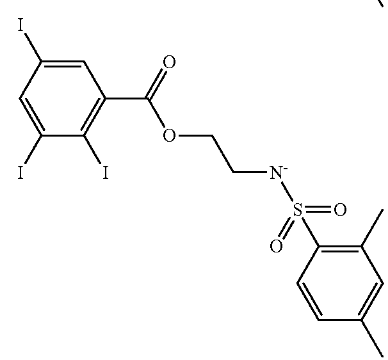
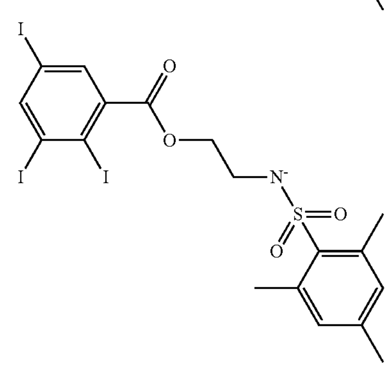
-continued
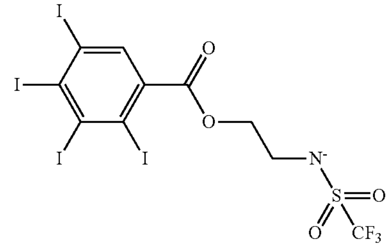
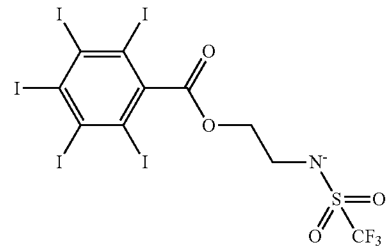
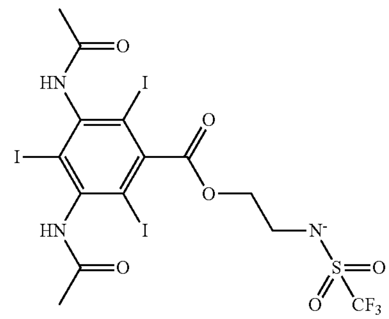
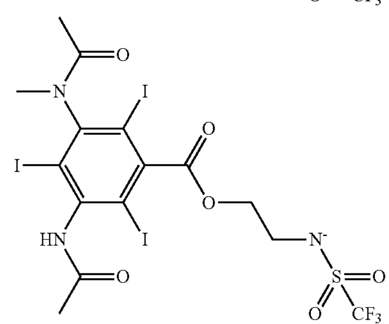
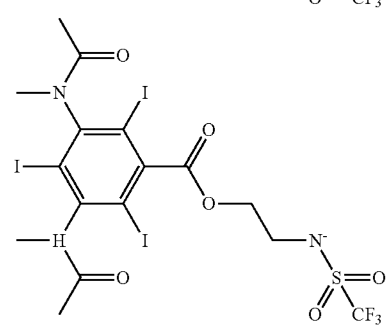
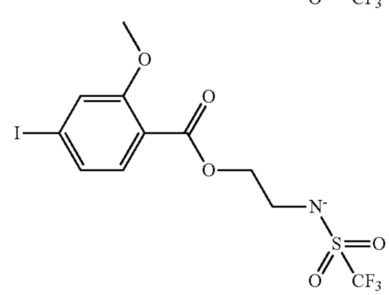

-continued
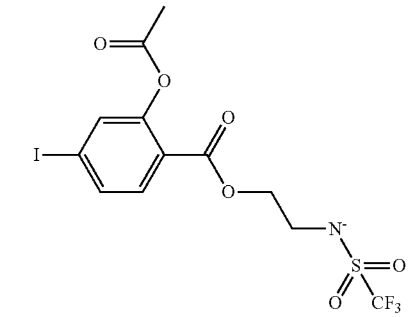
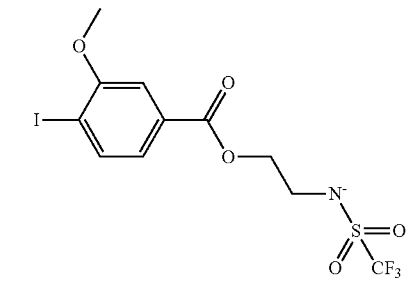
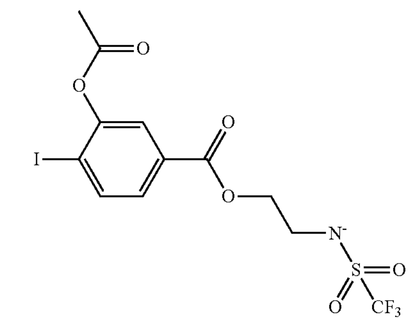
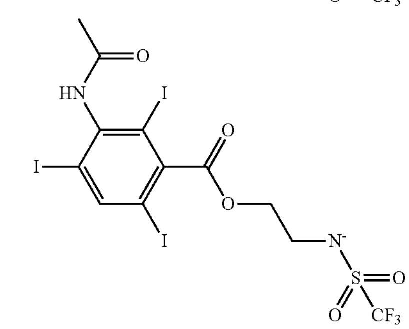
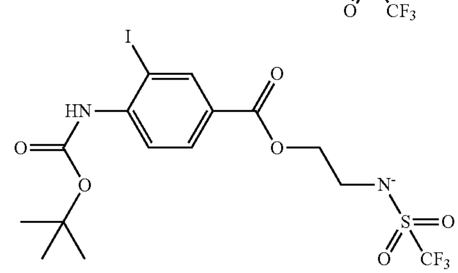
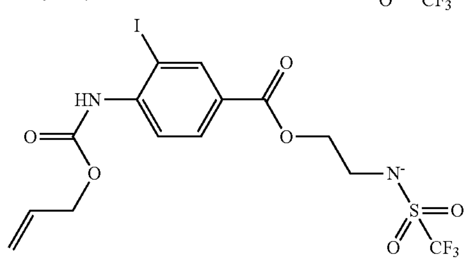
-continued
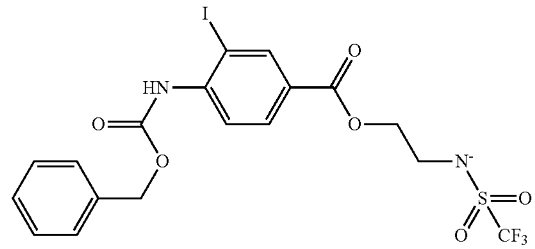
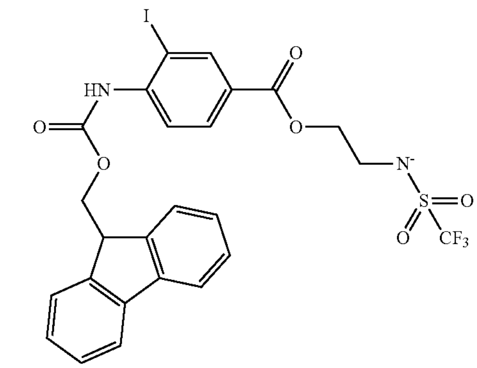
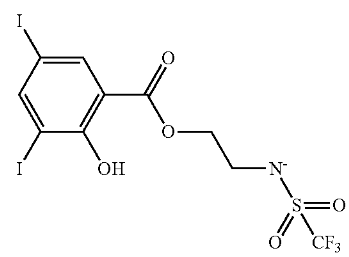
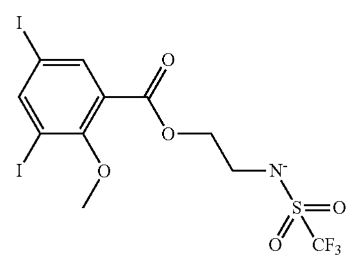
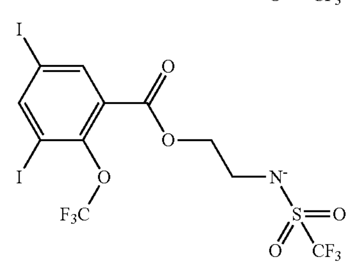
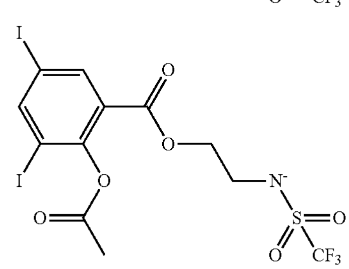

-continued
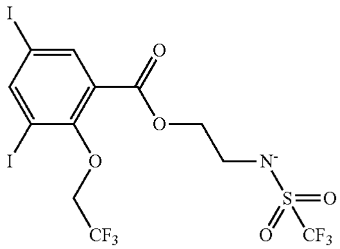
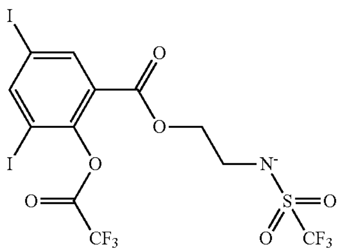
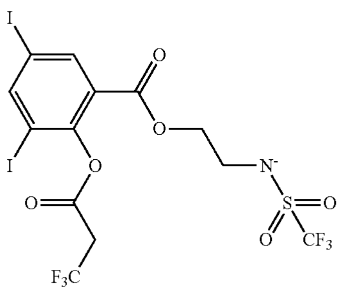
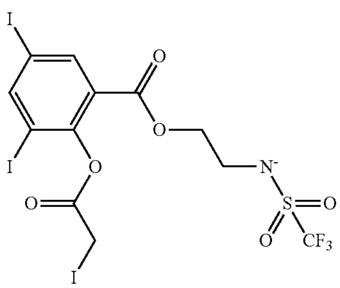
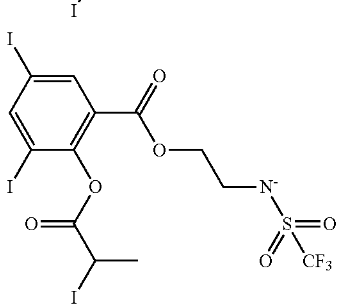
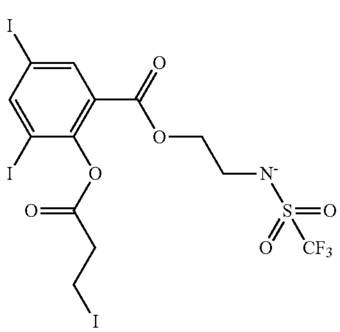
-continued
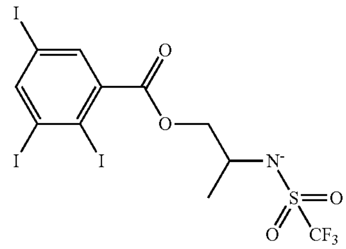
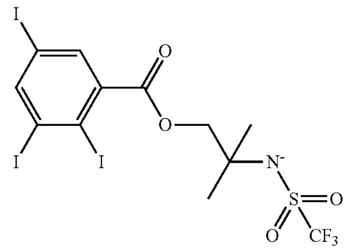
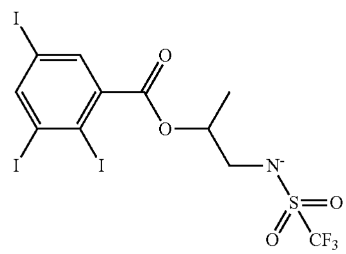
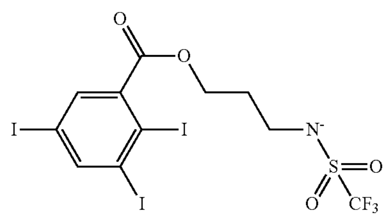
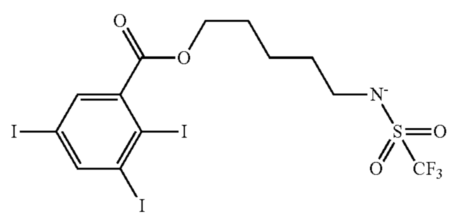
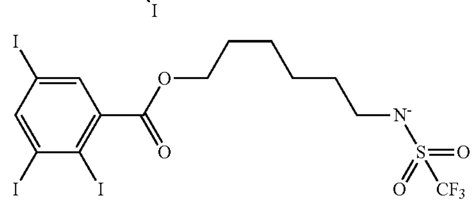
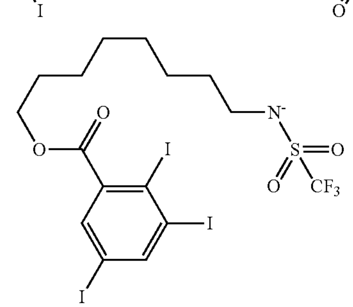

-continued
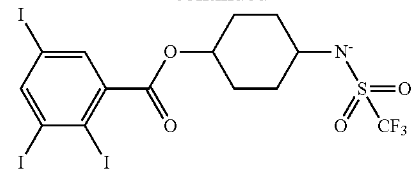
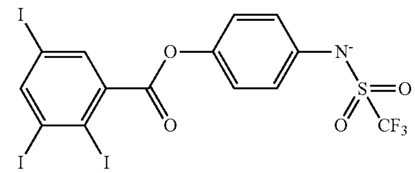
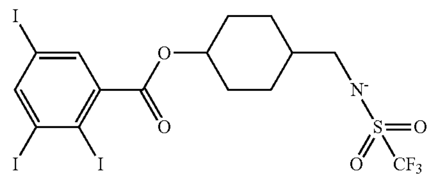
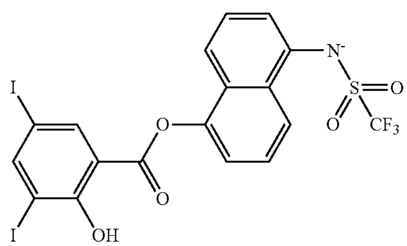
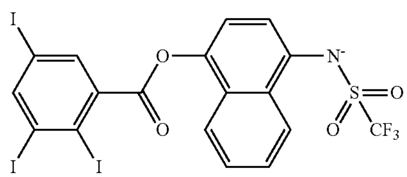
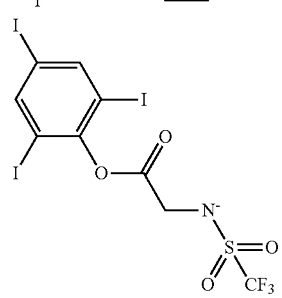
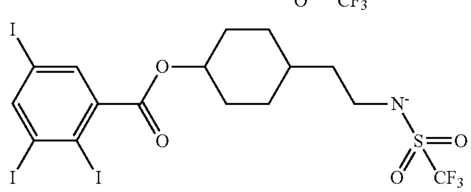
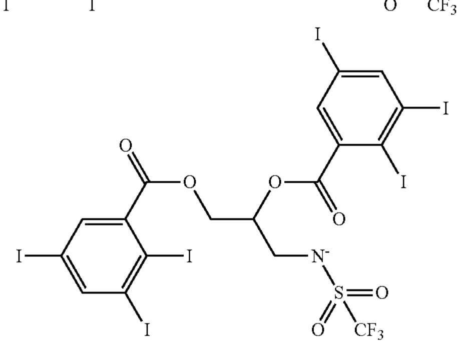
-continued
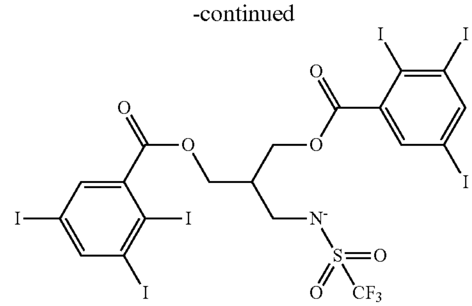
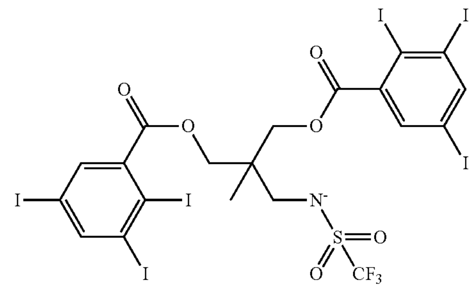
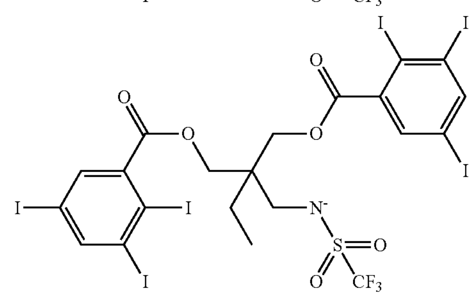
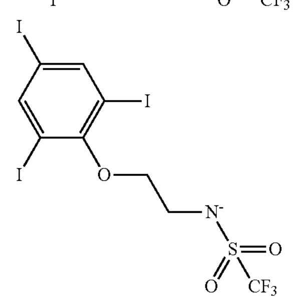
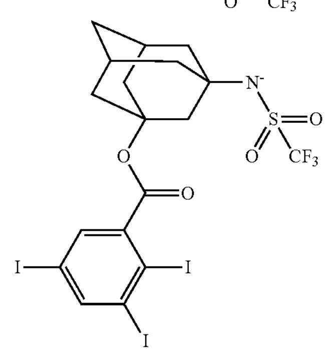
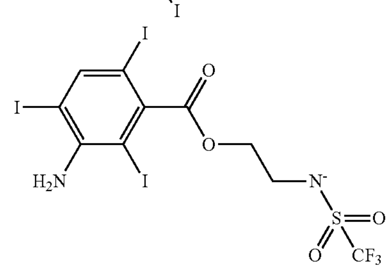

-continued
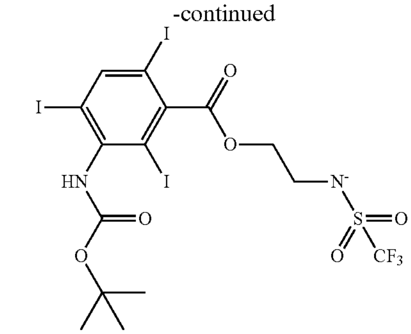
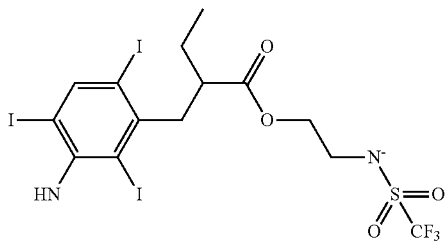
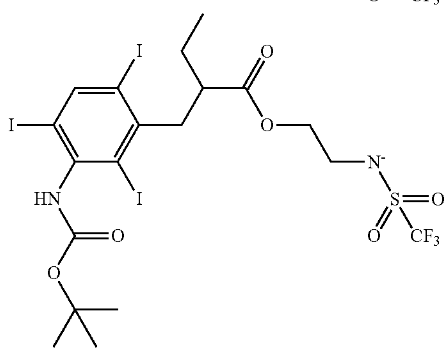
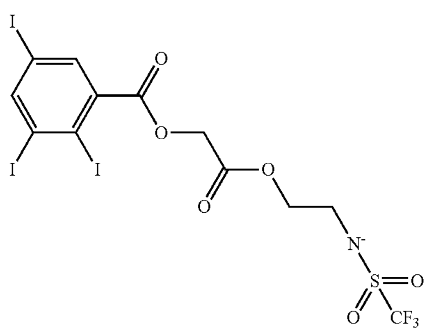
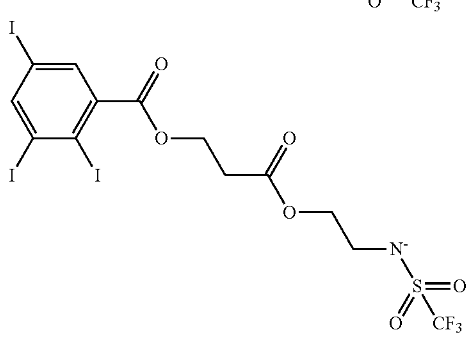
-continued
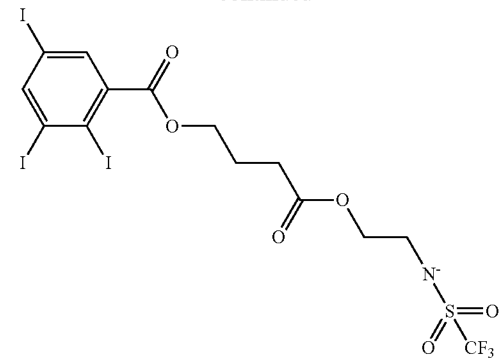
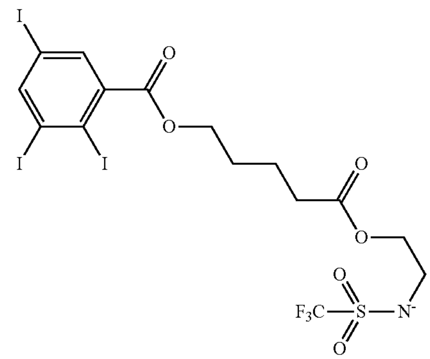
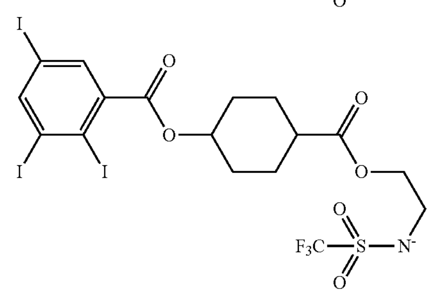
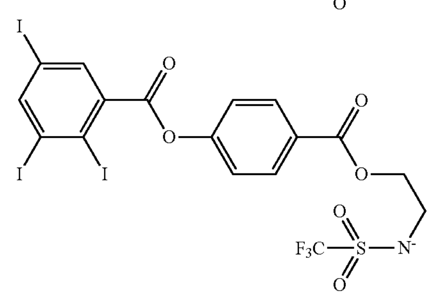
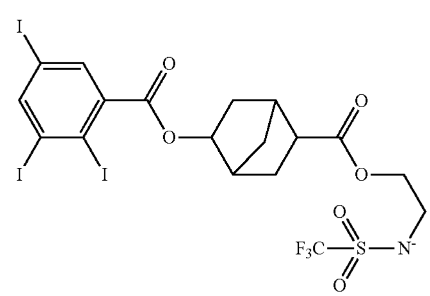

-continued
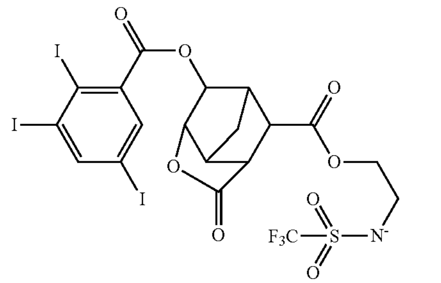
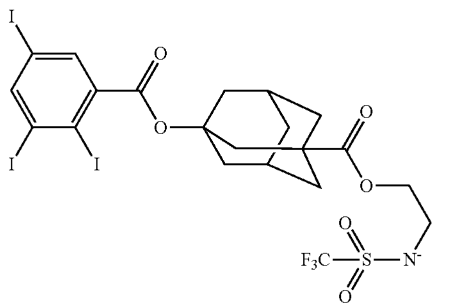
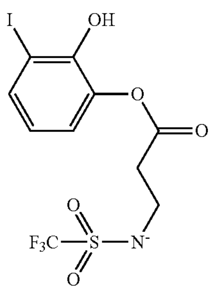
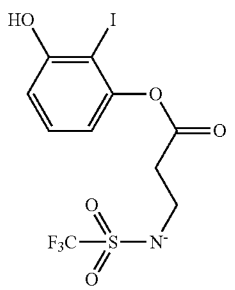
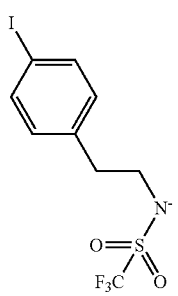
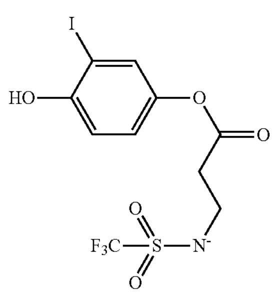
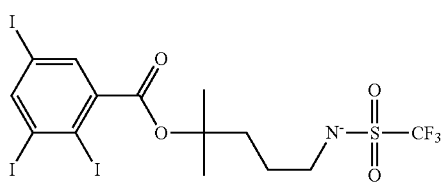
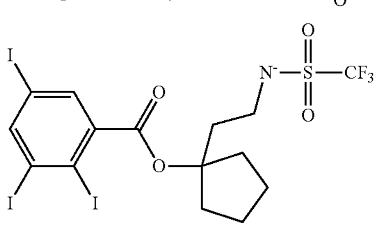
-continued
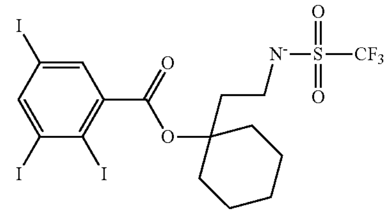
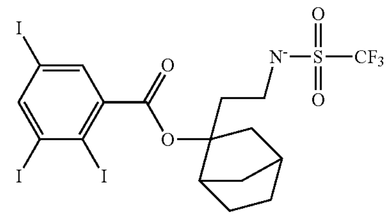
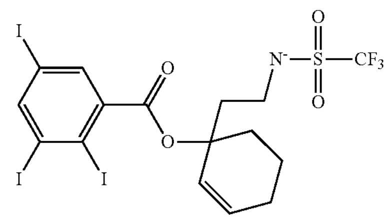
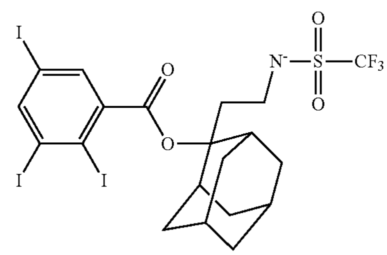
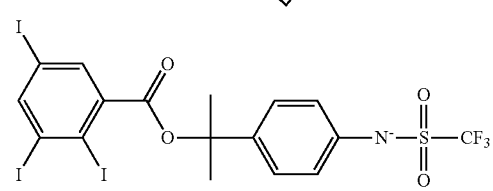
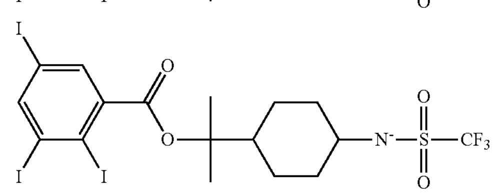
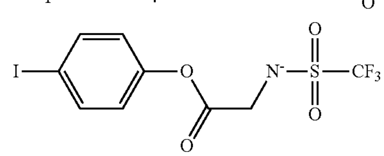
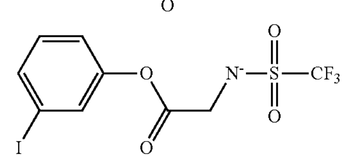
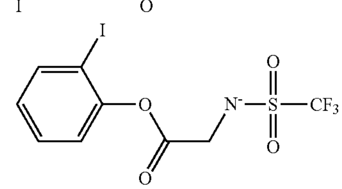

-continued

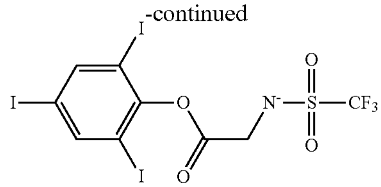

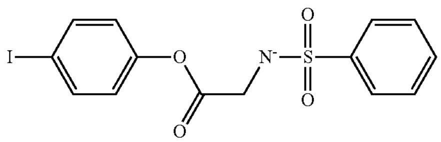

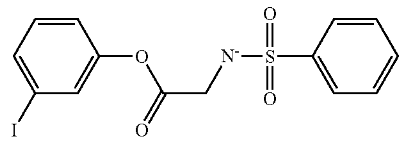

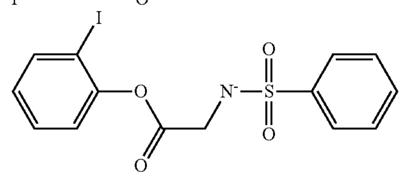

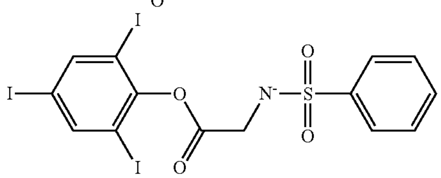

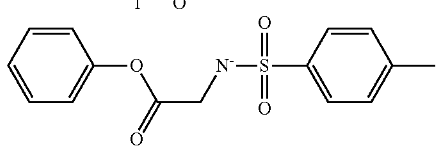

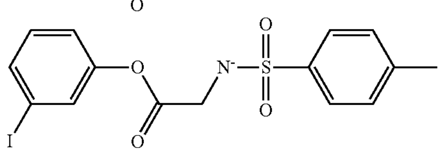

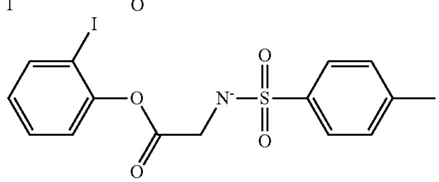

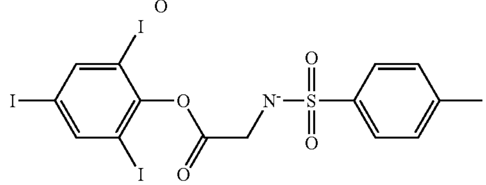

The recurring unit (a) functions as a quencher due to the structure of an ammonium salt of a sulfonamide having an iodized aromatic ring. In this sense, the base polymer may be referred to as a quencher-bound polymer. The quencher-bound polymer has the advantages of a remarkable acid diffusion-suppressing effect and improved resolution. In addition, since the recurring unit (a) contains an iodine atom or atoms having high absorption, it generates secondary electrons to promote decomposition of the acid generator during exposure, leading to a high sensitivity. As a result, a high sensitivity, high resolution, and low LWR or improved CDU are achieved at the same time.

Iodine is less soluble in alkaline developer because of a large atomic weight. When iodine is attached to the polymer backbone, a resist film in the exposed region is reduced in alkaline solubility, leading to losses of resolution and sensitivity and causing defect formation. When the recurring unit (a) is in an alkaline developer, the iodized sulfonamide in recurring unit (a) forms a salt with an alkaline compound in the developer, separating from the polymer backbone. This ensures sufficient alkaline dissolution and minimizes defect formation.

The monomer from which recurring units (a) are derived is a polymerizable ammonium salt monomer. The ammonium salt monomer is obtainable from neutralization reaction of a monomer or amine compound of the structure corresponding to the cation moiety in the recurring unit from which one nitrogen-bonded hydrogen atom has been eliminated with a sulfonamide.

The recurring unit (a) is formed from polymerization reaction using the ammonium salt monomer. Alternatively, the recurring unit (a) is formed by carrying out polymerization reaction of the monomer or amine compound to synthesize a polymer, adding a sulfonamide to the reaction solution or a solution of the purified polymer, and carrying out neutralization reaction.

The preferred recurring units (b1) and (b2) are recurring units having the formulae (b1) and (b2), respectively.

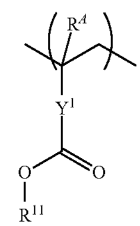

(b1)

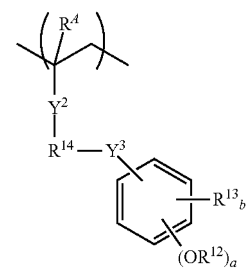

(b2)

In formulae (b1) and (b2), $R^A$ is each independently hydrogen or methyl. $Y^1$ is a single bond, phenylene, naphthylene, or a $C_1$-$C_{12}$ linking group containing an ester bond and/or lactone ring. $Y^2$ is a single bond or ester bond. $Y^3$ is a single bond, ether bond or ester bond. $R^{11}$ and $R^{12}$ each are an acid labile group. $R^{13}$ is a $C_1$-$C_6$ saturated hydrocarbyl group, $C_1$-$C_6$ saturated hydrocarbyloxy group, $C_2$-$C_6$ saturated hydrocarbylcarbonyl group, $C_2$-$C_6$ saturated hydrocarbylcarbonyloxy group, $C_2$-$C_6$ saturated hydrocarbyloxycarbonyl group, halogen, nitro group, or cyano group. $R^{14}$ is a single bond or a $C_1$-$C_6$ saturated hydrocarbylene group in which some carbon may be replaced by an ether bond or ester bond. The subscript "a" is 1 or 2, "b" is an integer of 0 to 4, and $1 \leq a+b \leq 5$.

Examples of the monomer from which recurring units (b1) are derived are shown below, but not limited thereto. Herein $R^A$ and $R^{11}$ are as defined above.

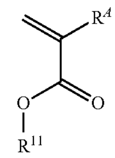
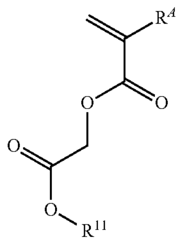
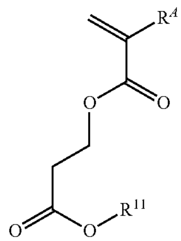
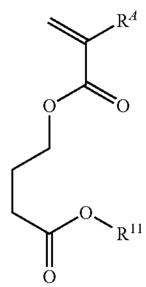
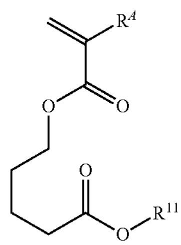
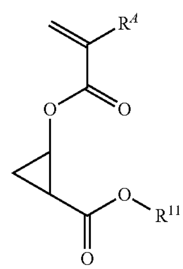
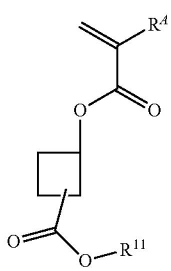
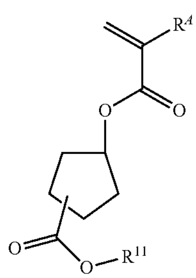
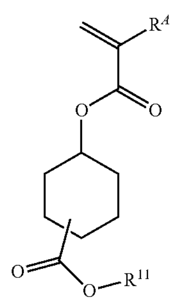
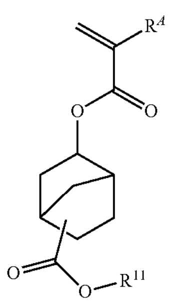
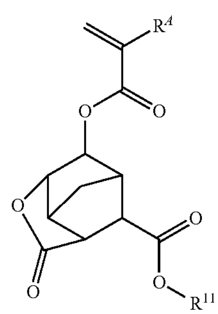
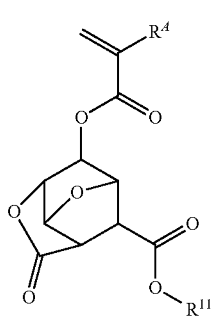
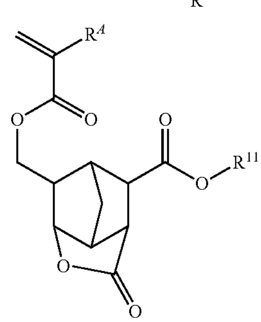
-continued
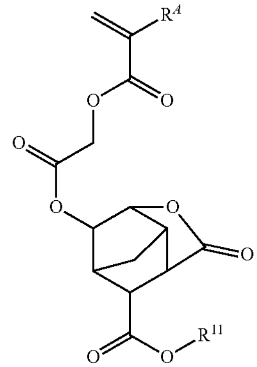
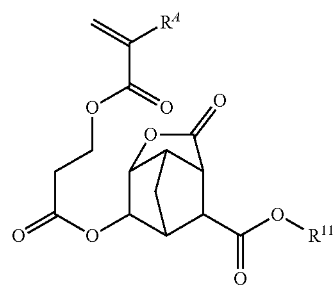
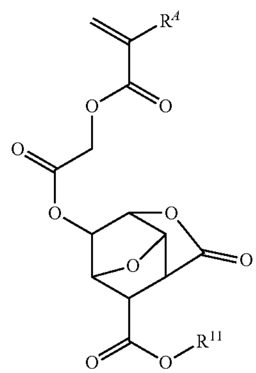
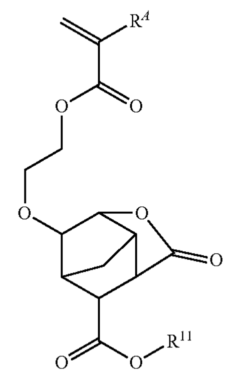
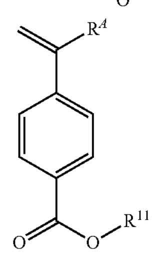
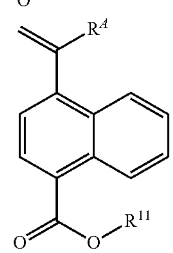
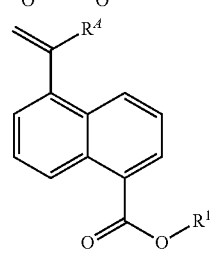
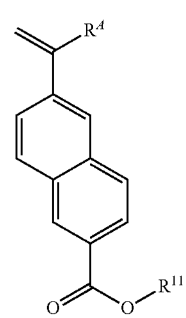
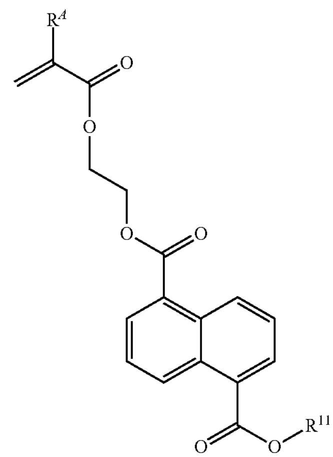

-continued
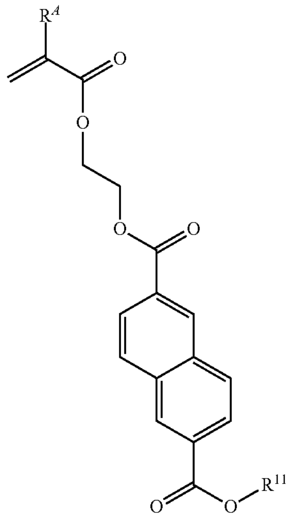
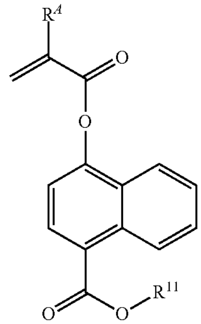
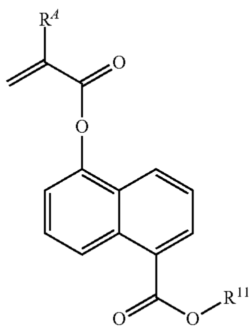
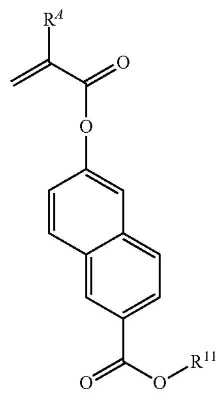
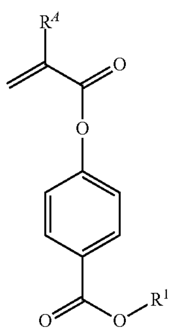
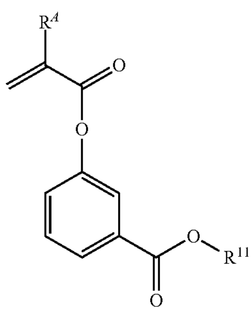
Examples of the monomer from which recurring units (b2) are derived are shown below, but not limited thereto. Herein $R^A$ and $R^{12}$ are as defined above.
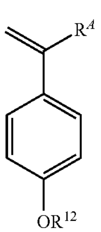
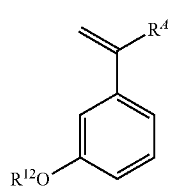
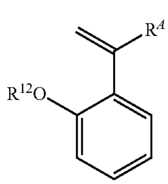
-continued
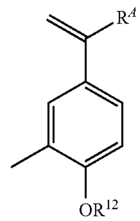
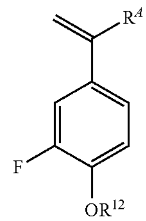
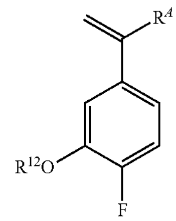
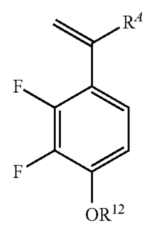
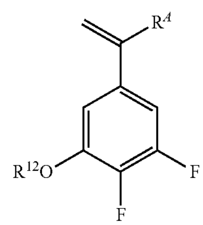
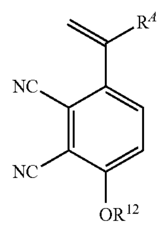
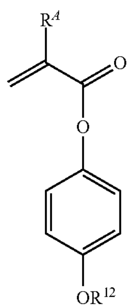
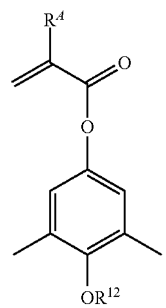
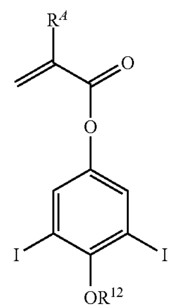
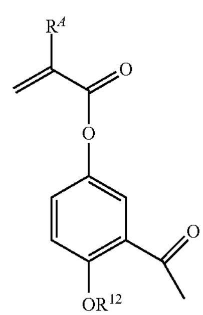
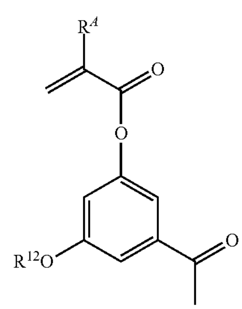
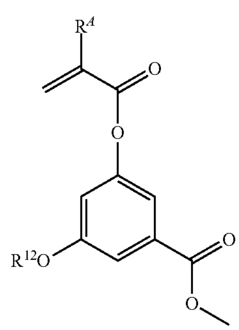
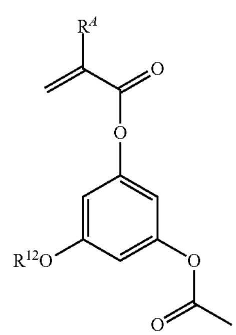

-continued

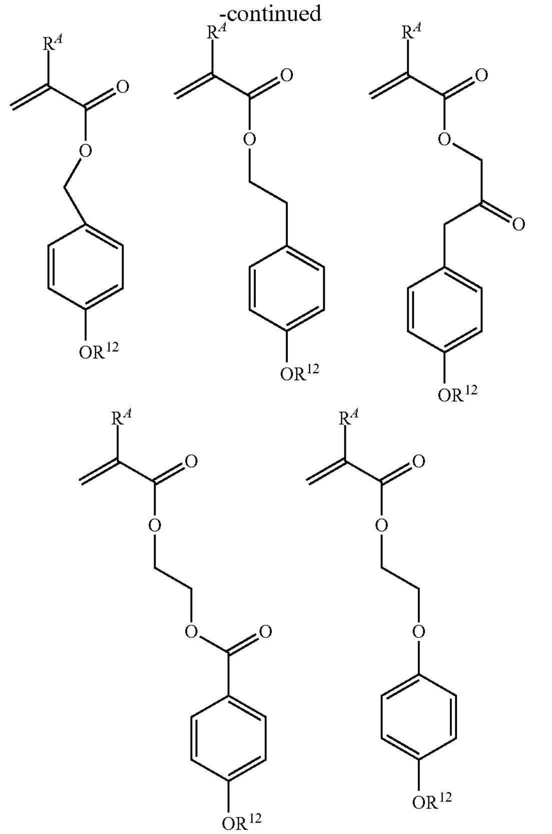

The acid labile groups represented by $R^{11}$ and $R^{12}$ may be selected from a variety of such groups, for example, groups of the following formulae (AL-1) to (AL-3).

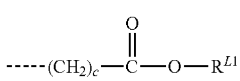

(AL-1)

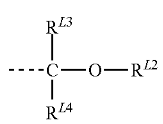

(AL-2)

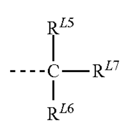

(AL-3)

In formula (AL-1), c is an integer of 0 to 6. $R^{L1}$ is a $C_4$-$C_{20}$, preferably $C_4$-$C_{15}$ tertiary hydrocarbyl group, a trihydrocarbylsilyl group in which each hydrocarbyl moiety is a $C_1$-$C_6$ saturated hydrocarbyl moiety, a $C_4$-$C_{20}$ saturated hydrocarbyl group containing a carbonyl moiety, ether bond or ester bond, or a group of formula (AL-3). The tertiary hydrocarbyl group refers to a group obtained by removing hydrogen on tertiary carbon atom in a hydrocarbon.

The tertiary hydrocarbyl group $R^{L1}$ may be saturated or unsaturated and branched or cyclic. Examples thereof include tert-butyl, tert-pentyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Examples of the trihydrocarbylsilyl group include trimethylsilyl, triethylsilyl, and dimethyl-tert-butylsilyl. The saturated hydrocarbyl group containing a carbonyl moiety, ether bond or ester bond may be straight, branched or cyclic, preferably cyclic, and examples thereof include 3-oxocyclohexyl, 4-methyl-2-oxooxan-4-yl, 5-methyl-2-oxooxolan-5-yl, 2-tetrahydropyranyl and 2-tetrahydrofuranyl.

Examples of the acid labile group having formula (AL-1) include tert-butoxycarbonyl, tert-butoxycarbonylmethyl, tert-pentyloxycarbonyl, tert-pentyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Other examples of the acid labile group having formula (AL-1) include groups having the formulae (AL-1)-1 to (AL-1)-10.

(AL-1)-1

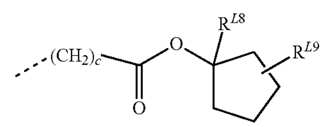

(AL-1)-2

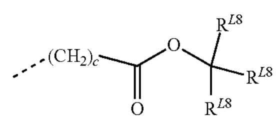

(AL-1)-3

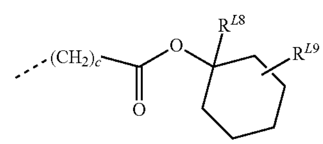

(AL-1)-4

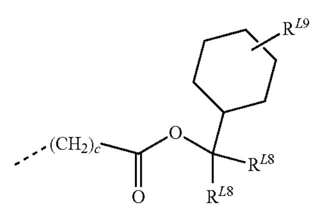

(AL-1)-5

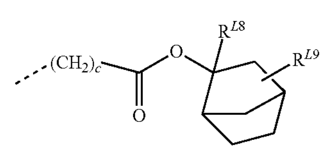

(AL-1)-6

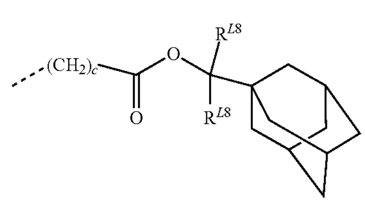

(AL-1)-7

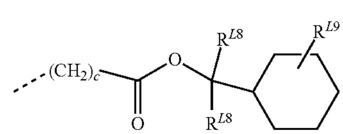

-continued (AL-1)-8

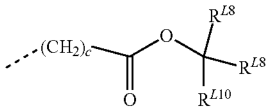

(AL-1)-9

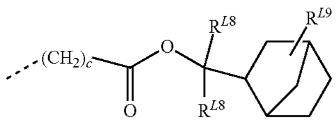

(AL-1)-10

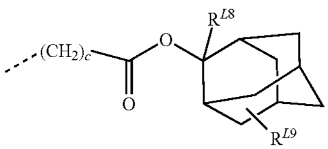

In formulae (AL-1)-1 to (AL-1)-10, c is as defined above. $R^{L8}$ is each independently a $C_1$-$C_{10}$ saturated hydrocarbyl group or $C_6$-$C_{20}$ aryl group. $R^{15}$ is hydrogen or a $C_1$-$C_{10}$ saturated hydrocarbyl group. $R^{L10}$ is a $C_2$-$C_{10}$ saturated hydrocarbyl group or $C_6$-$C_{20}$ aryl group. The saturated hydrocarbyl group may be straight, branched or cyclic.

In formula (AL-2), $R^{L2}$ and $R^{L3}$ are each independently hydrogen or a $C_1$-$C_{18}$, preferably $C_1$-$C_{10}$ saturated hydrocarbyl group. The saturated hydrocarbyl group may be straight, branched or cyclic and examples thereof include methyl, ethyl, propyl, isopropyl, n-butyl, sec-butyl, tert-butyl, cyclopentyl, cyclohexyl, 2-ethylhexyl and n-octyl.

In formula (AL-2), $R^{L4}$ is a $C_1$-$C_{18}$, preferably $C_1$-$C_{10}$ hydrocarbyl group which may contain a heteroatom. The hydrocarbyl group may be saturated or unsaturated and straight, branched or cyclic and typical examples thereof include $C_1$-$C_{18}$ saturated hydrocarbyl groups, in which some hydrogen may be substituted by hydroxyl, alkoxy, oxo, amino or alkylamino. Examples of the substituted saturated hydrocarbyl group are shown below.

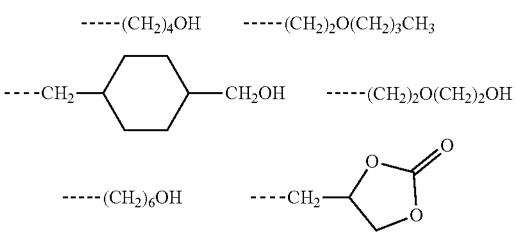

A pair of $R^{L2}$ and $R^{L3}$, $R^{L3}$, $R^{L2}$ and $R^{L4}$, or $R^{L3}$ and $R^{L4}$ may bond together to form a ring with the carbon atom or carbon and oxygen atoms to which they are attached. $R^{L2}$ and $R^{L3}$, $R^{L2}$ and $R^{L4}$, or $R^{L3}$ and $R^{L4}$ to form a ring are each independently a $C_1$-$C_{18}$, preferably $C_1$-$C_{10}$ alkanediyl group. The ring thus formed is preferably of 3 to 10, more preferably 4 to 10 carbon atoms.

Of the acid labile groups having formula (AL-2), suitable straight or branched groups include those having formulae (AL-2)-1 to (AL-2)-69, but are not limited thereto.

(AL-2)-1

$----CH_2—O—CH_3$ (AL-2)-2

$----CH_2—O—CH_2—CH_3$

-continued (AL-2)-3

$----CH_2—O—(CH_2)_2—CH_3$ (AL-2)-4

$----CH_2—O—(CH_2)_3—CH_3$ (AL-2)-5

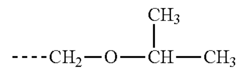

(AL-2)-6

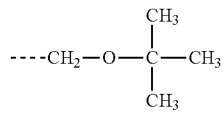

(AL-2)-7

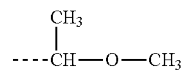

(AL-2)-8

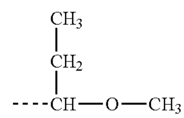

(AL-2)-9

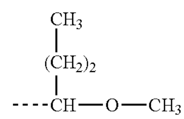

(AL-2)-10

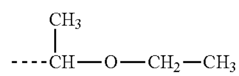

(AL-2)-11

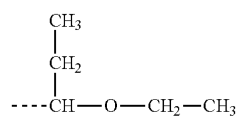

(AL-2)-12

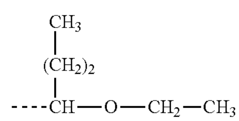

(AL-2)-13

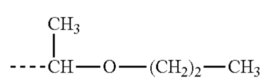

(AL-2)-14

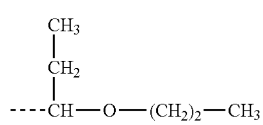

(AL-2)-15

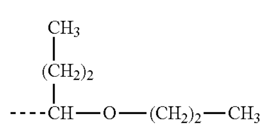

(AL-2)-16

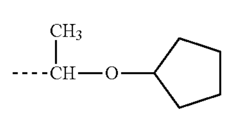

(AL-2)-17

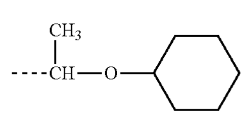

-continued
(AL-2)-18
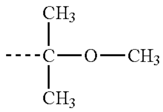
(AL-2)-19
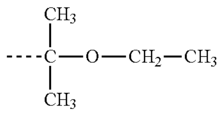
(AL-2)-20
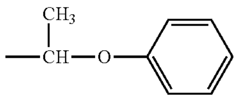
(AL-2)-21
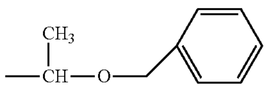
(AL-2)-22
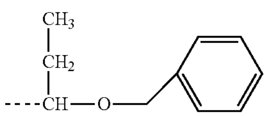
(AL-2)-23
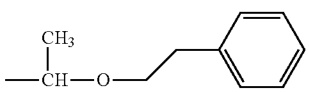
(AL-2)-24
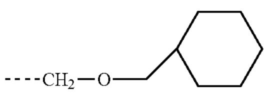
(AL-2)-25
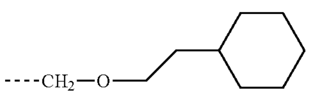
(AL-2)-26
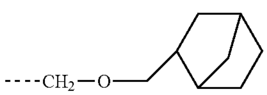
(AL-2)-27
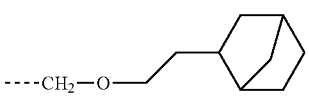
(AL-2)-28
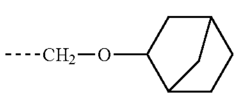
(AL-2)-29
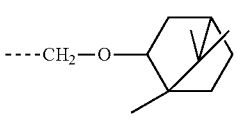
(AL-2)-30
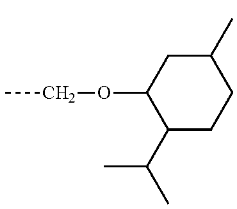
-continued
(AL-2)-31
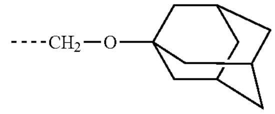
(AL-2)-32
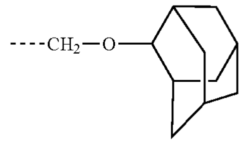
(AL-2)-33
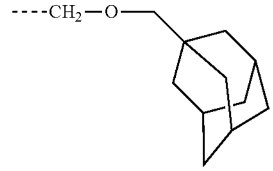
(AL-2)-34
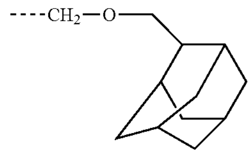
(AL-2)-35
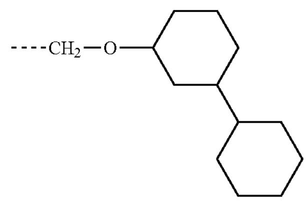
(AL-2)-36
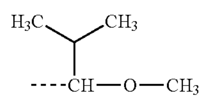
(AL-2)-37
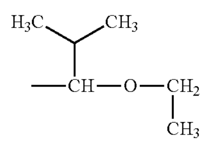
(AL-2)-38
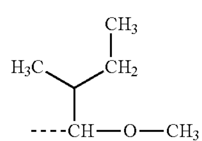
(AL-2)-39
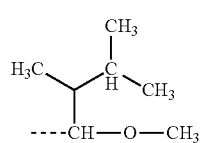
(AL-2)-40
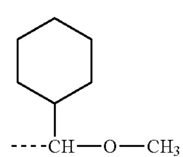

-continued
(AL-2)-41
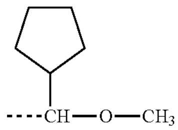
(AL-2)-42
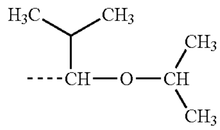
(AL-2)-43
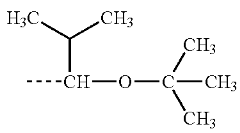
(AL-2)-44
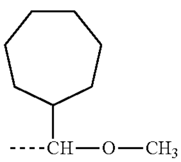
(AL-2)-45
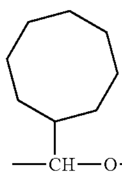
(AL-2)-46
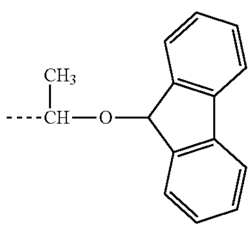
(AL-2)-47
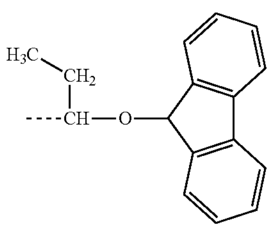
(AL-2)-48
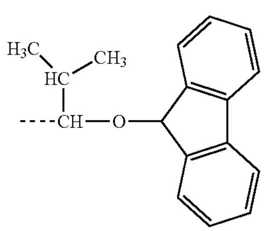
(AL-2)-49
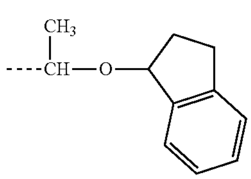
-continued
(AL-2)-50
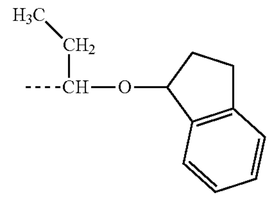
(AL-2)-51
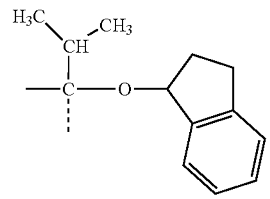
(AL-2)-52
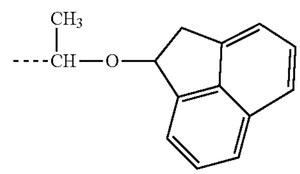
(AL-2)-53
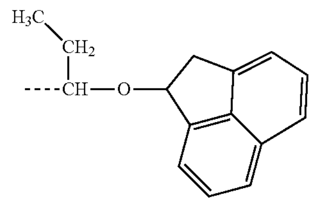
(AL-2)-54
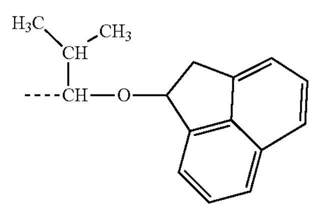
(AL-2)-55
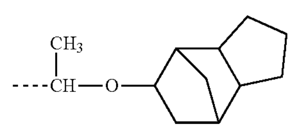
(AL-2)-56
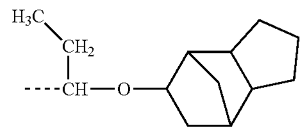
(AL-2)-57
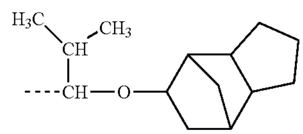
(AL-2)-58
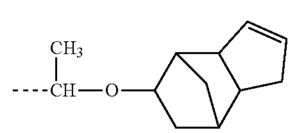

-continued (AL-2)-59

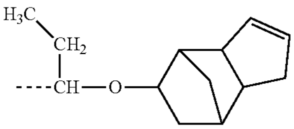

(AL-2)-60

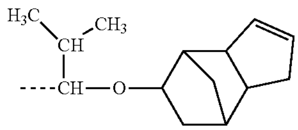

(AL-2)-61

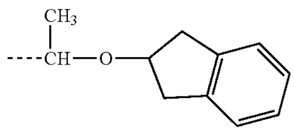

(AL-2)-62

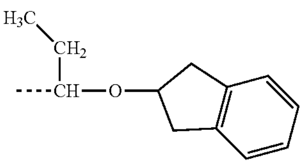

(AL-2)-63

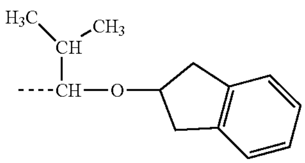

(AL-2)-64

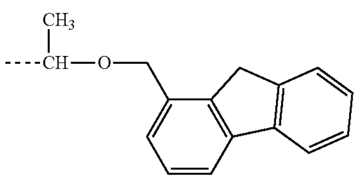

(AL-2)-65

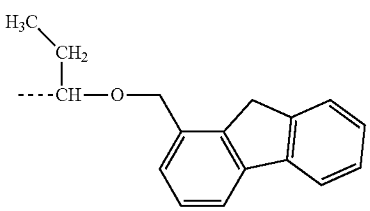

(AL-2)-66

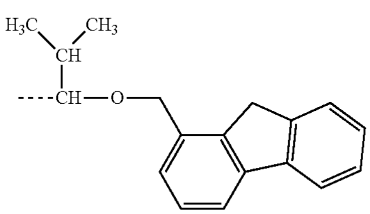

(AL-2)-67

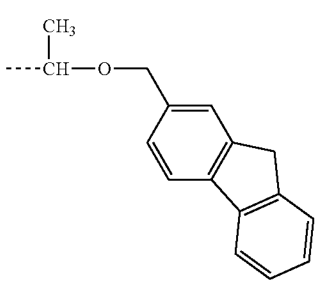

-continued (AL-2)-68

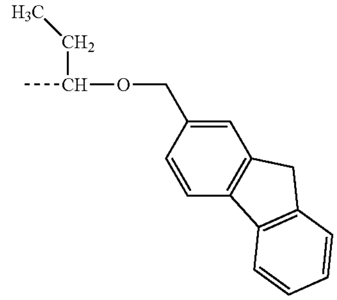

(AL-2)-69

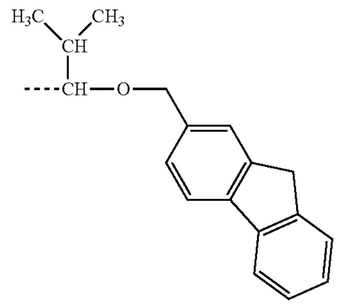

Of the acid labile groups having formula (AL-2), suitable cyclic groups include tetrahydrofuran-2-yl, 2-methyltetrahydrofuran-2-yl, tetrahydropyran-2-yl, and 2-methyltetrahydropyran-2-yl.

Also included are acid labile groups having the following formulae (AL-2a) and (AL-2b). The base polymer may be crosslinked within the molecule or between molecules with these acid labile groups.

(AL-2a)

$$\text{----}\underset{R^{L12}}{\overset{R^{L11}}{C}}\text{—}(O\text{—}R^{L13})_d\text{—}O\text{—}L^A\text{—}[O\text{—}(R^{L13}\text{—}O)_e\text{—}\underset{R^{L12}}{\overset{R^{L11}}{C}}\text{----}]_f$$

(AL-2b)

$$\text{----}\underset{R^{L12}}{\overset{R^{L11}}{C}}\text{—}O\text{—}R^{L13}\text{—}L^B\text{—}L^A\text{—}[L^B\text{—}(R^{L13}\text{—}O)_e\text{—}\underset{R^{L12}}{\overset{R^{L11}}{C}}\text{----}]_f$$

In formulae (AL-2a) and (AL-2b), $R^{L11}$ and $R^{L12}$ are each independently hydrogen or a $C_1$-$C_8$ saturated hydrocarbyl group which may be straight, branched or cyclic. Also, $R^{L11}$ and $R^{L12}$ may bond together to form a ring with the carbon atom to which they are attached, and in this case, $R^{L11}$ and $R^{L12}$ are each independently a $C_1$-$C_8$ alkanediyl group. $R^{L13}$ is each independently a $C_1$-$C_{10}$ saturated hydrocarbylene group which may be straight, blanched or cyclic. The subscripts d and e are each independently an integer of 0 to 10, preferably 0 to 5, and f is an integer of 1 to 7, preferably 1 to 3.

In formulae (AL-2a) and (AL-2b), $L^A$ is a (f+1)-valent $C_1$-$C_{50}$ aliphatic saturated hydrocarbon group, (f+1)-valent $C_3$-$C_{50}$ alicyclic saturated hydrocarbon group, (f+1)-valent $C_6$-$C_{50}$ aromatic hydrocarbon group or (f+1)-valent $C_3$-$C_{50}$ heterocyclic group. In these groups, some carbon may be replaced by a heteroatom-containing moiety, or some carbon-bonded hydrogen may be substituted by a hydroxyl, carboxyl, acyl moiety or fluorine. $L^A$ is preferably a $C_1$-$C_{20}$ saturated hydrocarbon group such as saturated hydrocarbylene, trivalent saturated hydrocarbon or tetravalent saturated hydrocarbon group, or $C_6$-$C_{30}$ arylene group. The saturated hydrocarbon group may be straight, branched or cyclic. $L^B$ is —C(═O)—O—, —NH—C(═O)—O— or —NH—C(═O)—NH—.

Examples of the crosslinking acetal groups having formulae (AL-2a) and (AL-2b) include groups having the formulae (AL-2)-70 to (AL-2)-77.

(AL-2)-70

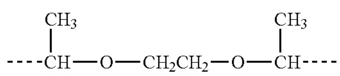

(AL-2)-71

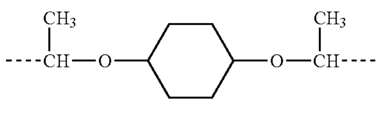

(AL-2)-72

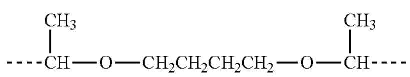

(AL-2)-73

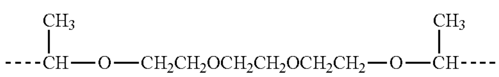

(AL-2)-74

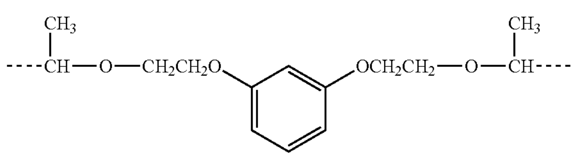

(AL-2)-75

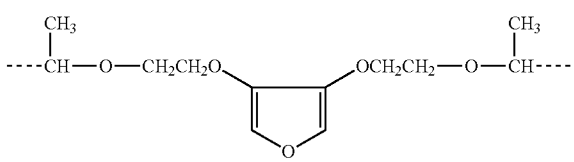

(AL-2)-76

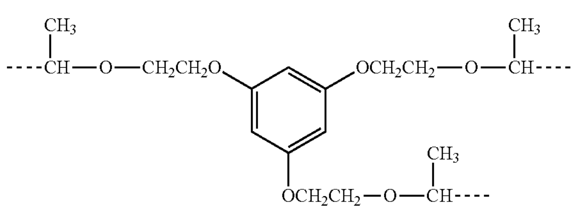

(AL-2)-77

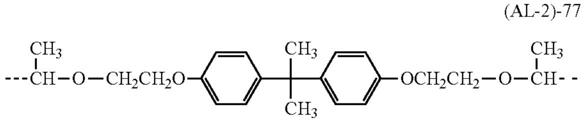

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Examples thereof include $C_1$-$C_{20}$ alkyl groups, $C_3$-$C_{20}$ cyclic saturated hydrocarbyl groups, $C_2$-$C_{20}$ alkenyl groups, $C_3$-$C_{20}$ cyclic unsaturated aliphatic hydrocarbyl groups, and $C_6$-$C_{10}$ aryl groups. A pair of $R^{L5}$ and $R^{L6}$, $R^{L5}$ and $R^{L7}$, or $R^{L6}$ and $R^{L7}$ may bond together to form a $C_3$-$C_{20}$ aliphatic ring with the carbon atom to which they are attached.

Examples of the group having formula (AL-3) include tert-butyl, 1,1-diethylpropyl, 1-ethylnorbornyl, 1-methylcyclopentyl, 1-ethylcyclopentyl, 1-isopropylcyclopentyl, 1-methylcyclohexyl, 2-(2-methyl)adamantyl, 2-(2-ethyl)adamantyl, and tert-pentyl.

Examples of the group having formula (AL-3) also include groups having the formulae (AL-3)-1 to (AL-3)-19.

(AL-3)-1

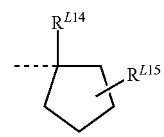

(AL-3)-2

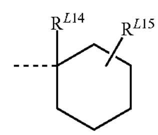

(AL-3)-3

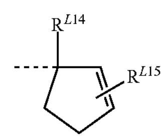

(AL-3)-4

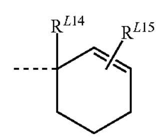

(AL-3)-5

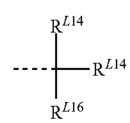

(AL-3)-6

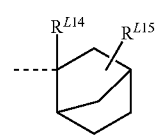

(AL-3)-7

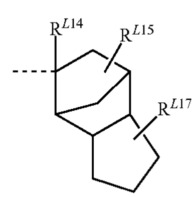

(AL-3)-8

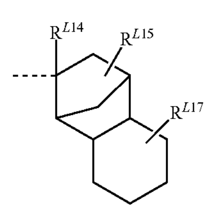

-continued (AL-3)-9

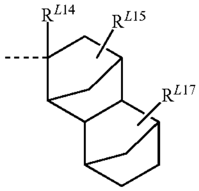

(AL-3)-10

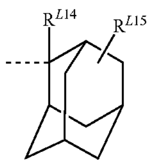

(AL-3)-11

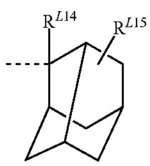

(AL-3)-12

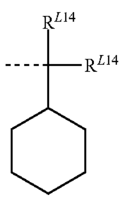

(AL-3)-13

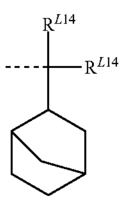

(AL-3)-14

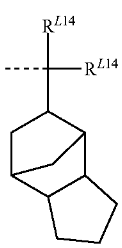

(AL-3)-15

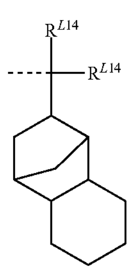

-continued (AL-3)-16

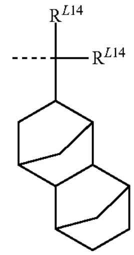

(AL-3)-17

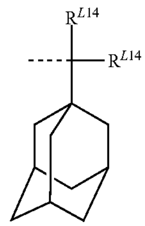

(AL-3)-18

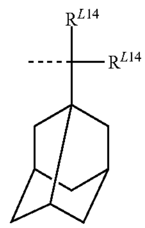

(AL-3)-19

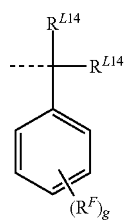

In formulae (AL-3)-1 to (AL-3)-19, $R^{L14}$ is each independently a $C_1$-$C_8$ saturated hydrocarbyl group or $C_6$-$C_{20}$ aryl group. $R^{L15}$ and $R^{L17}$ are each independently hydrogen or a $C_1$-$C_{20}$ saturated hydrocarbyl group. $R^{L16}$ is a $C_6$-$C_{20}$ aryl group. The saturated hydrocarbyl group may be straight, branched or cyclic. Typical of the aryl group is phenyl. $R^F$ is fluorine or trifluoromethyl, and g is an integer of 1 to 5.

Other examples of the group having formula (AL-3) include groups having the formulae (AL-3)-20 and (AL-3)-21. The base polymer may be crosslinked within the molecule or between molecules with these acid labile groups.

(AL-3)-20

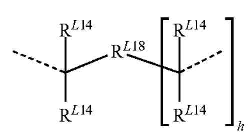

(AL-3)-21

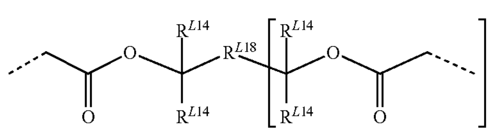

In formulae (AL-3)-20 and (AL-3)-21, $R^{L14}$ is as defined above. $R^{L18}$ is a $C_1$-$C_{20}$ (h+1)-valent saturated hydrocarbylene group or $C_6$-$C_{20}$ (h+1)-valent arylene group, which may contain a heteroatom such as oxygen, sulfur or nitrogen, wherein h is an integer of 1 to 3. The saturated hydrocarbylene group may be straight, branched or cyclic.

Examples of the monomer from which recurring units containing an acid labile group of formula (AL-3) are derived include (meth)acrylates having an exo-form structure represented by the formula (AL-3)-22.

(AL-3)-22

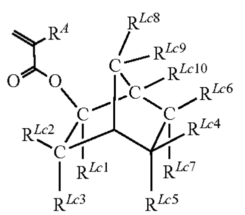

In formula (AL-3)-22, $R^A$ is as defined above. $R^{Lc1}$ is a $C_1$-$C_8$ saturated hydrocarbyl group or an optionally substituted $C_6$-$C_{20}$ aryl group; the saturated hydrocarbyl group may be straight, branched or cyclic. $R^{Lc2}$ to $R^{Lc11}$ are each independently hydrogen or a $C_1$-$C_{15}$ hydrocarbyl group which may contain a heteroatom; oxygen is a typical heteroatom. Suitable hydrocarbyl groups include $C_1$-$C_{15}$ alkyl groups and $C_6$-$C_{15}$ aryl groups. Alternatively, a pair of $R^{Lc2}$ and $R^{Lc3}$, $R^{Lc4}$ and $R^{Lc6}$, $R^{Lc4}$ and $R^{Lc7}$, $R^{Lc5}$ and $R^{Lc7}$, $R^{Lc3}$ and $R^{Lc11}$, $R^{Lc6}$ and $R^{Lc10}$, $R^{Lc8}$ and $R^{Lc9}$, or $R^{Lc9}$ and $R^{Lc10}$, taken together, may form a ring with the carbon atom to which they are attached, and in this event, the ring-forming group is a $C_1$-$C_{15}$ hydrocarbylene group which may contain a heteroatom. Also, a pair of $R^{Lc2}$ and $R^{Lc11}$, $R^{Lc8}$ and $R^{Lc11}$, or $R^{Lc4}$ and $R^{Lc6}$ which are attached to vicinal carbon atoms may bond together directly to form a double bond. The formula also represents an enantiomer.

Examples of the monomer from which reclining units having formula (AL-3)-22 are derived are described in U.S. Pat. No. 6,448,420 (JP-A 2000-327633). Illustrative non-limiting examples of suitable monomers are given below. $R^A$ is as defined above.

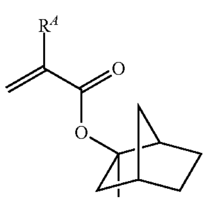

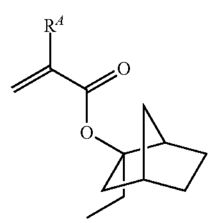

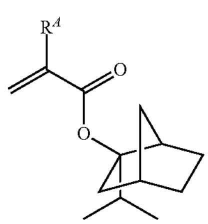

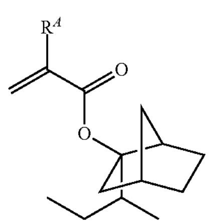

-continued

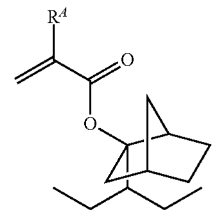

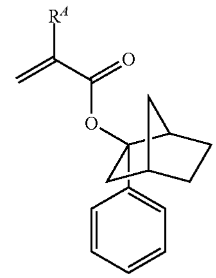

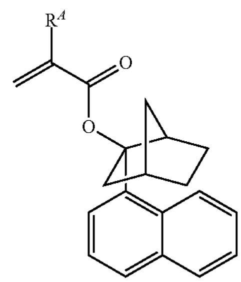

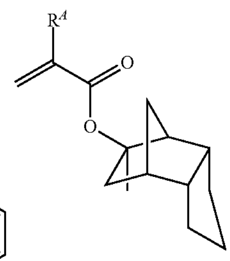

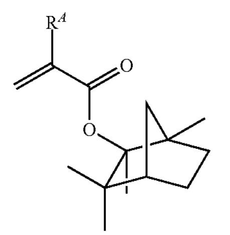

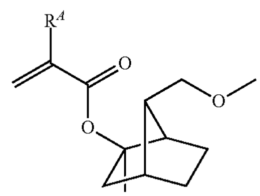

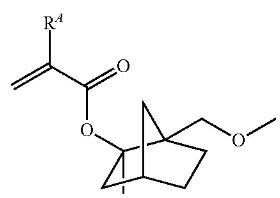

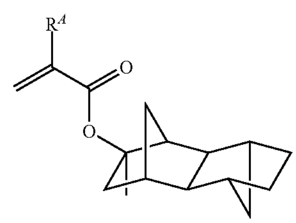

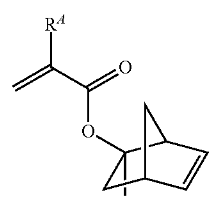

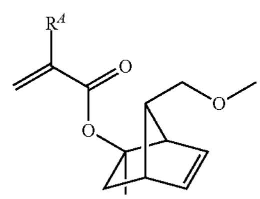

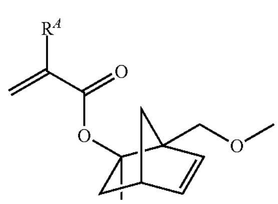

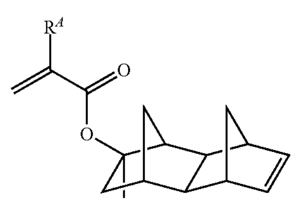

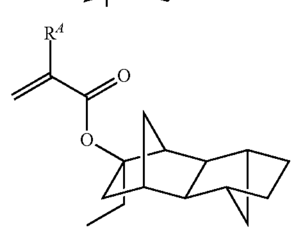

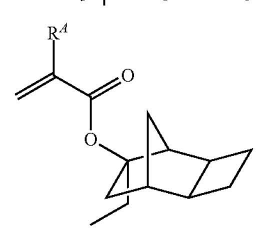

-continued

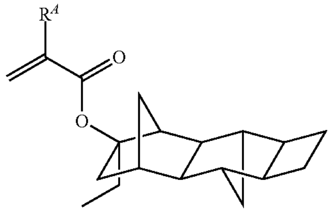

Examples of the monomer from which the recurring units having an acid labile group of formula (AL-3) are derived include (meth)acylates having a furandiyl, tetrahydrofurandiyl or oxanorbornanediyl group as represented by the following formula (AL-3)-23.

(AL-3)-23

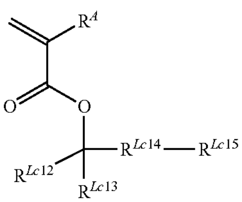

In formula (AL-3)-23, $R^A$ is as defined above. $R^{Lc12}$ and $R^{Lc13}$ are each independently a $C_1$-$C_{10}$ hydrocarbyl group, or $R^{Lc12}$ and $R^{Lc13}$, taken together, may form an aliphatic ring with the carbon atom to which they are attached. $R^{Lc14}$ is furandiyl, tetrahydrofurandiyl or oxanorbornanediyl. $R^{Lc15}$ is hydrogen or a $C_1$-$C_{10}$ hydrocarbyl group which may contain a heteroatom. The hydrocarbyl group may be straight, branched or cyclic, and is typically a $C_1$-$C_{10}$ saturated hydrocarbyl group.

Examples of the monomer from which the recurring units having formula (AL-3)-23 are derived are shown below, but not limited thereto. Herein $R^A$ is as defined above.

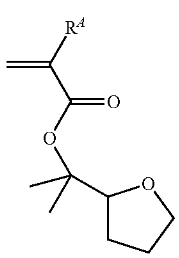
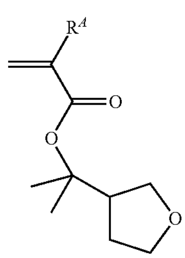
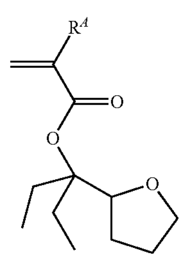

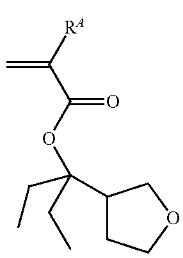
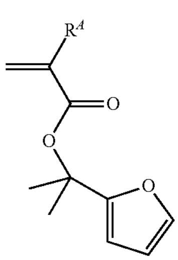
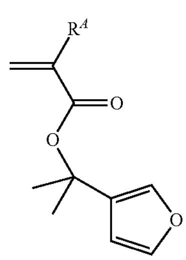

-continued

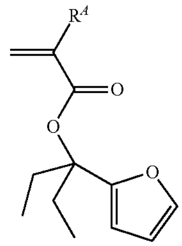
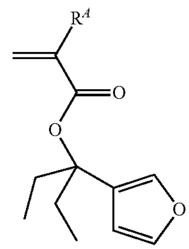
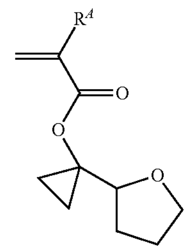

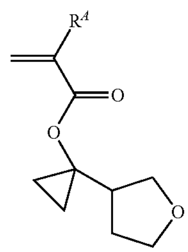
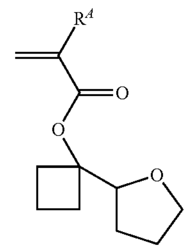
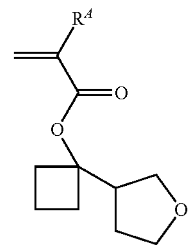

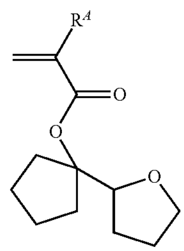
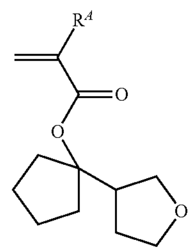
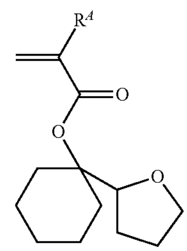

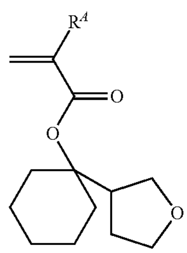
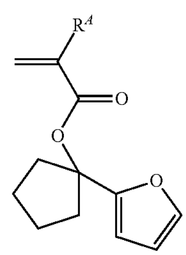
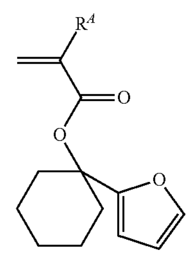

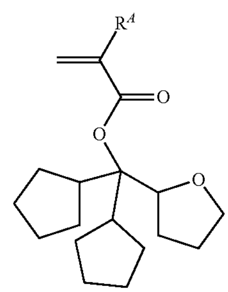
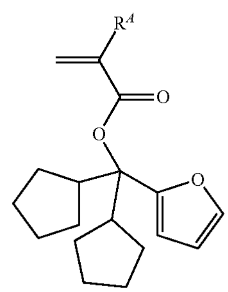

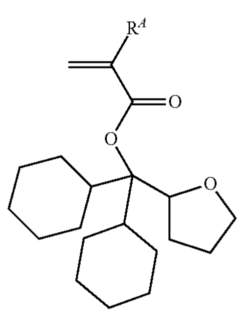
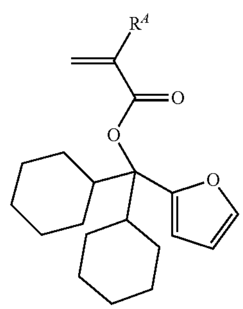

-continued
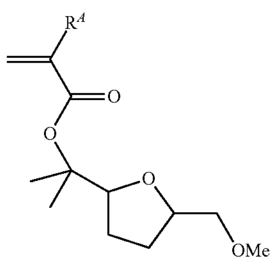
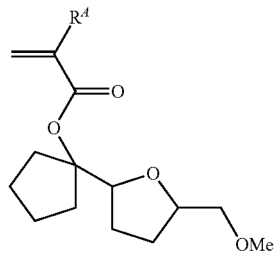
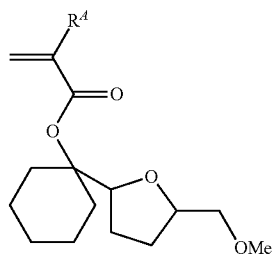
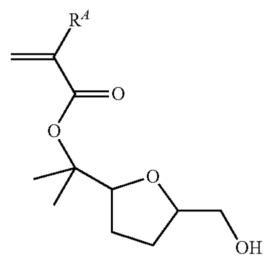
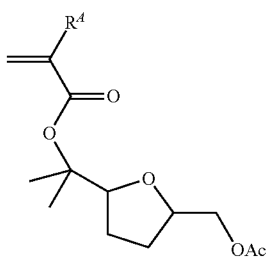
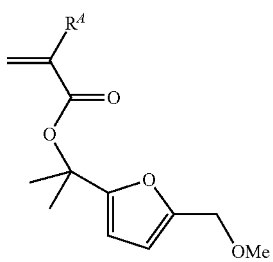
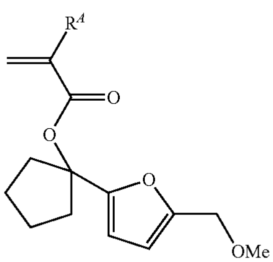
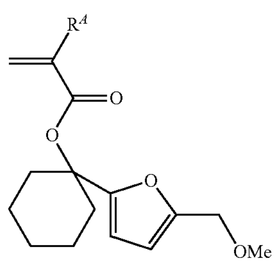
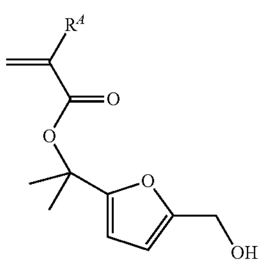
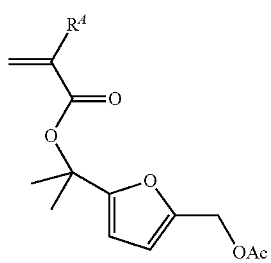
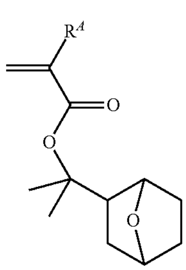
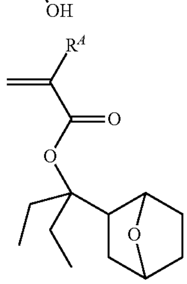
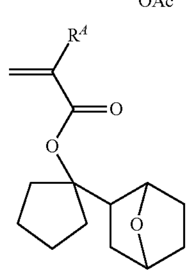
-continued
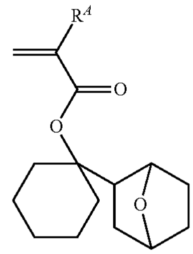
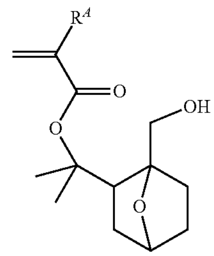
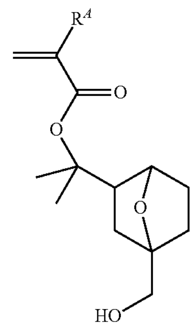
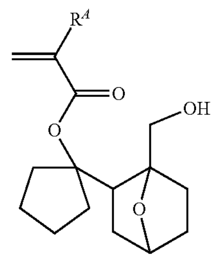
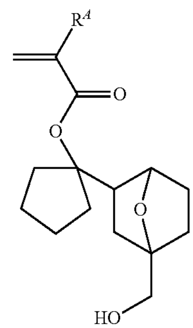
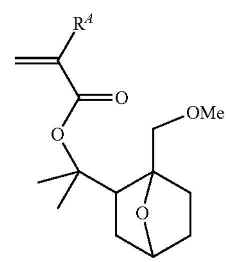
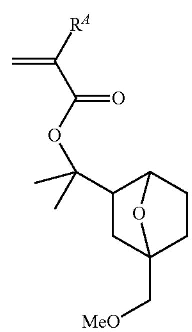
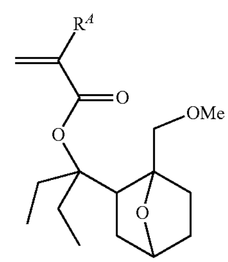
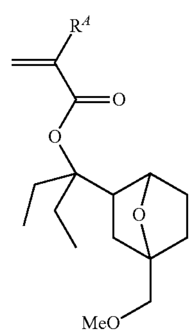
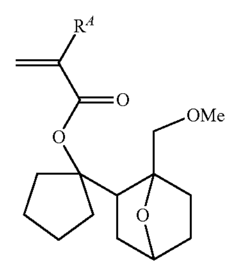

-continued

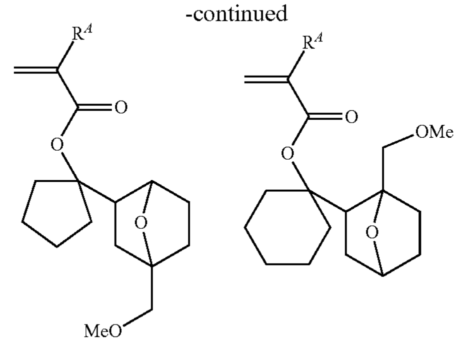

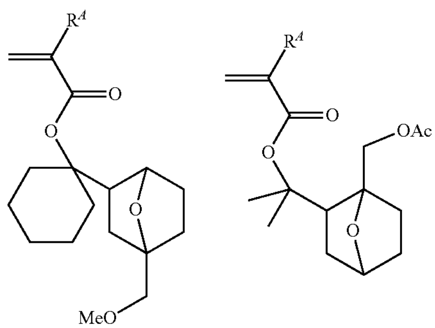

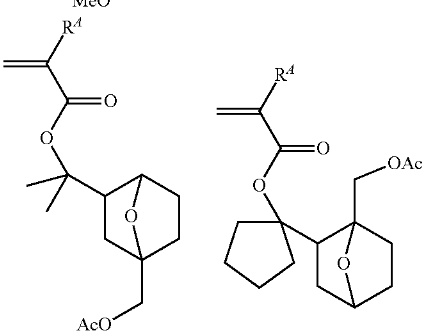

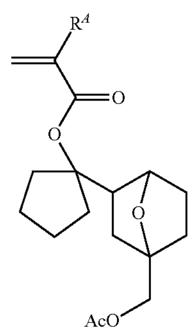

In the base polymer, recurring units (c) having an adhesive group may be incorporated. The adhesive group is selected from hydroxyl, carboxyl, lactone ring, carbonate, thiocarbonate, carbonyl, cyclic acetal, ether bond, ester bond, sulfonic acid ester bond, cyano, amide, —O—C(═O)—S— and —O—C(═O)—NH—.

Examples of the monomer from which recurring units (c) are derived are given below, but not limited thereto. Herein $R^A$ is as defined above.

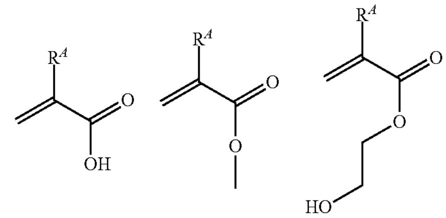

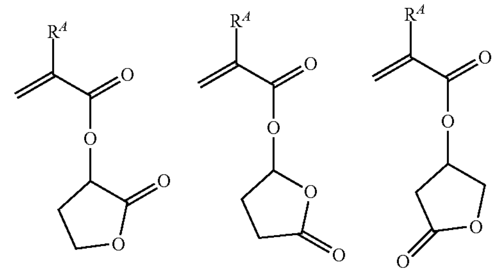

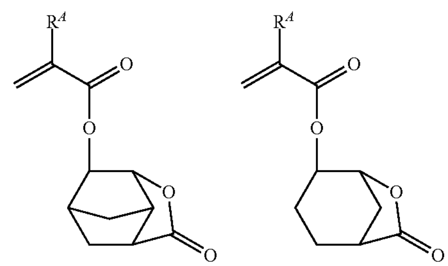

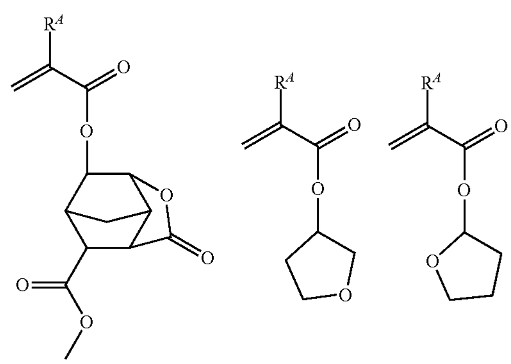

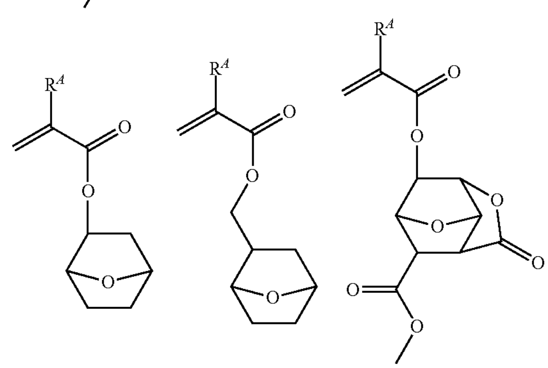

-continued
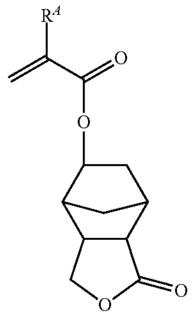
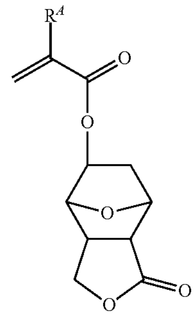
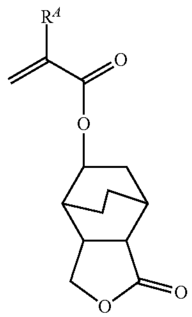
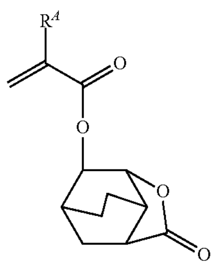
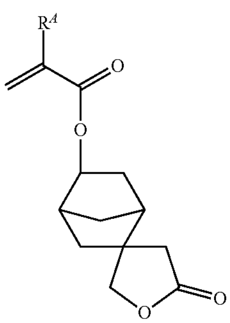
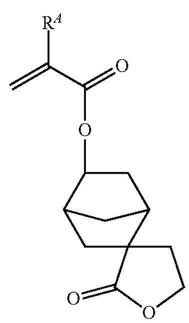
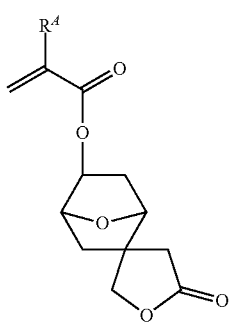
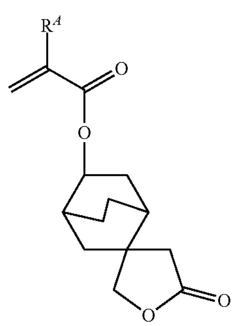
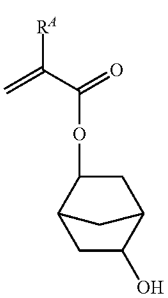
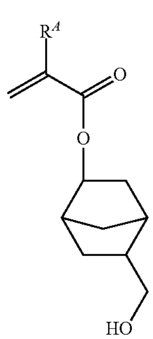
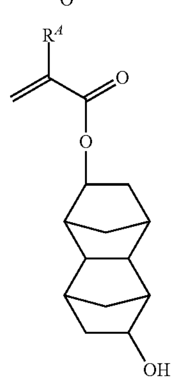
-continued
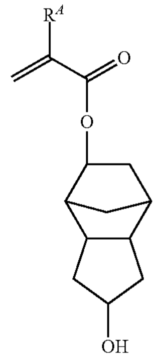
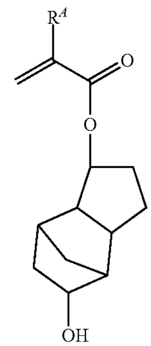
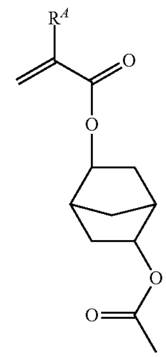
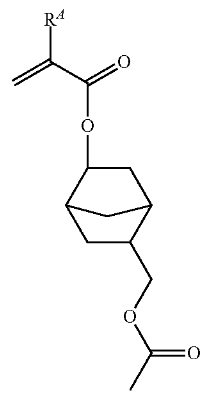
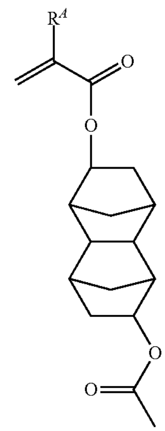
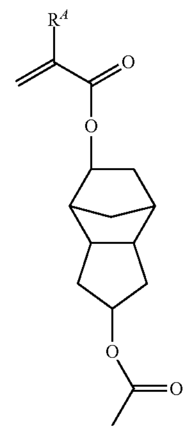
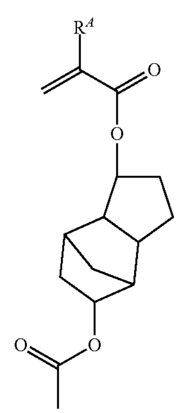
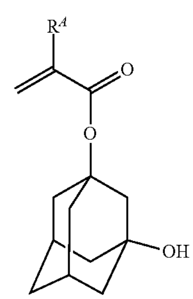
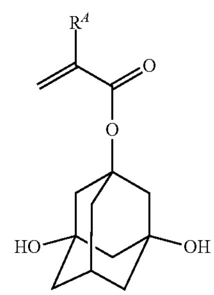
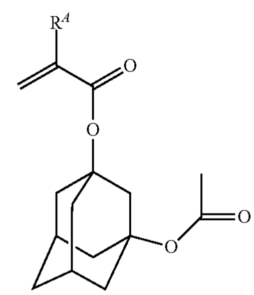

-continued
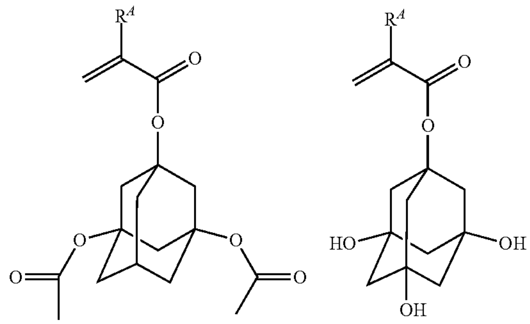
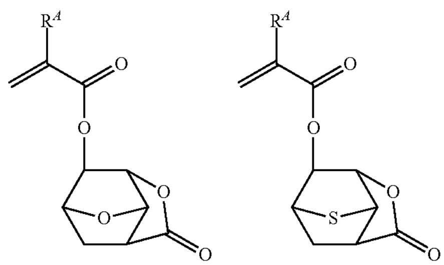
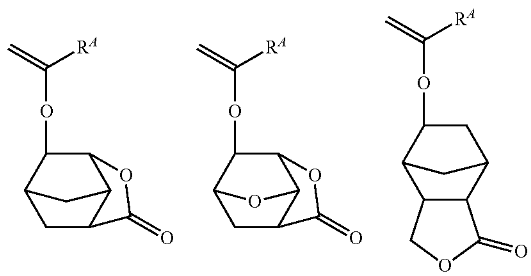
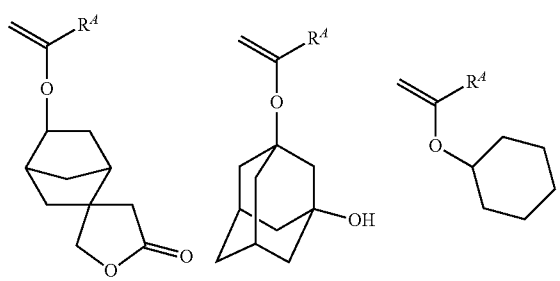
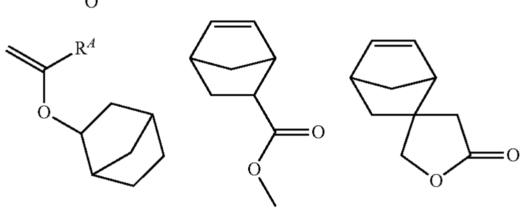
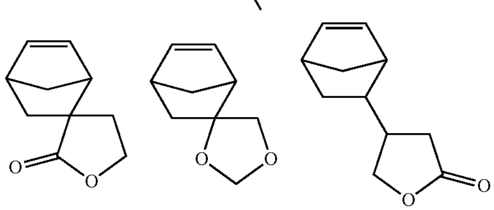
-continued
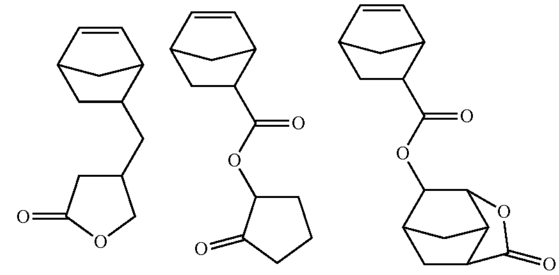
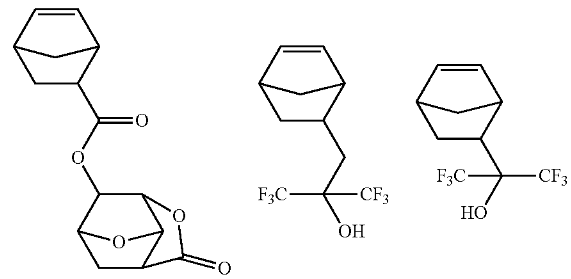
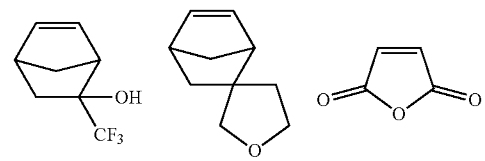
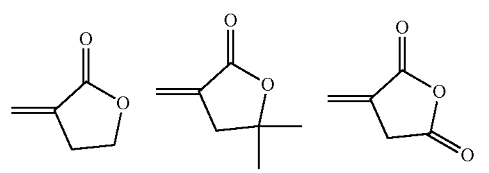
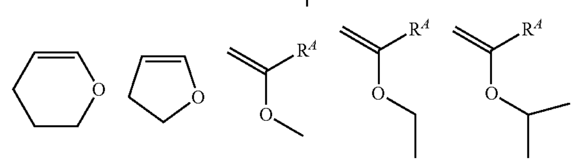
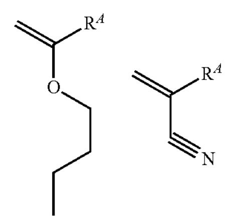
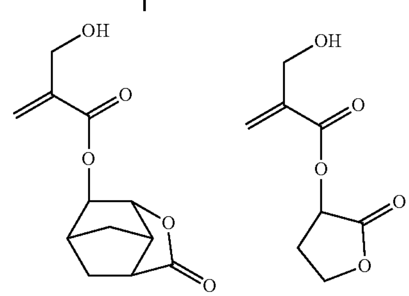

-continued
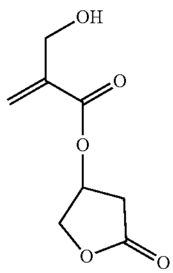
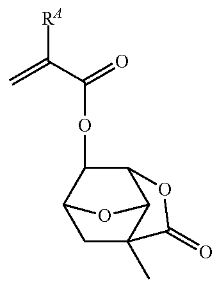
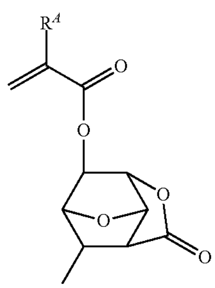
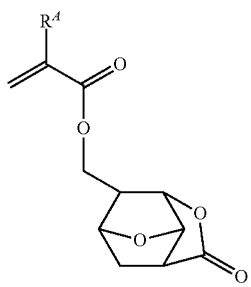
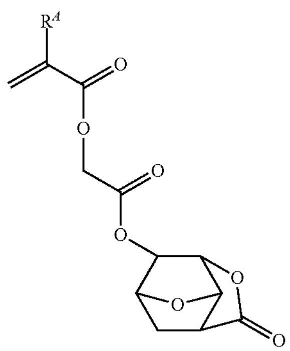
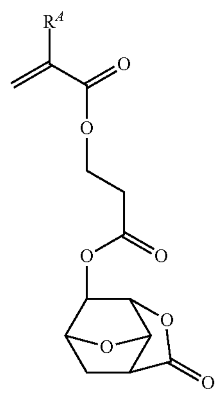
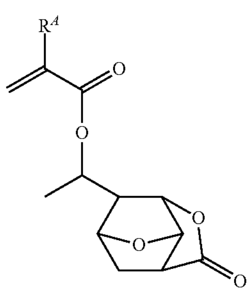
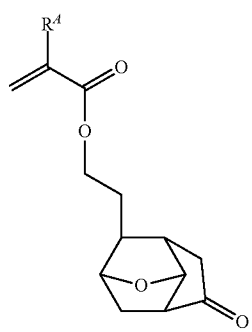
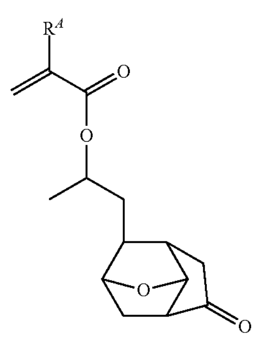
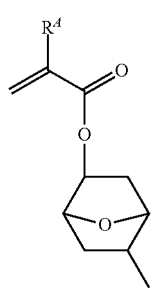
-continued
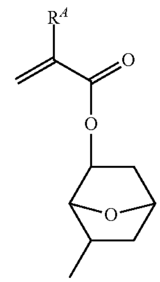
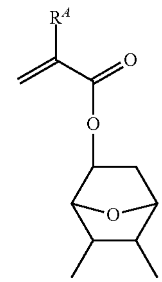
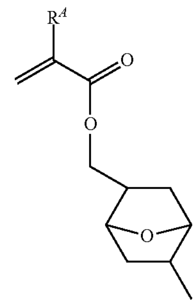
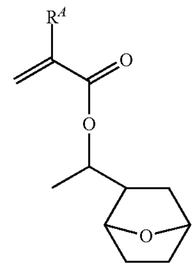
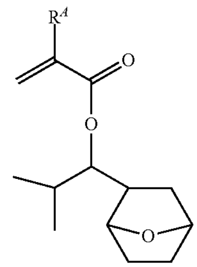
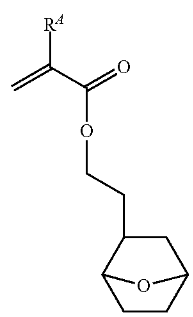
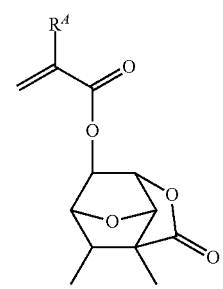
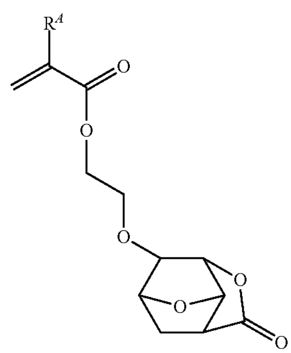
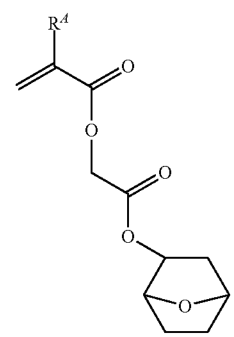
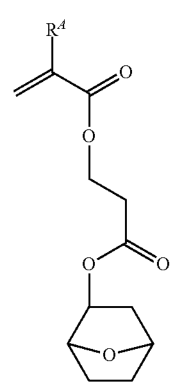
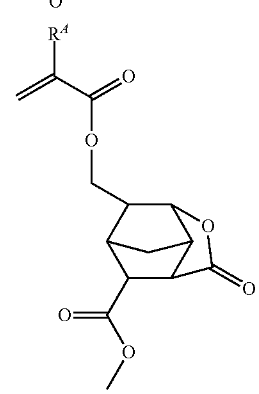

-continued
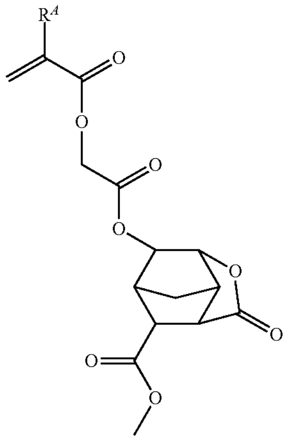
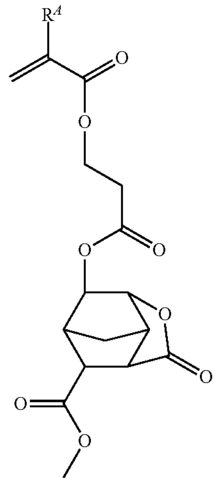
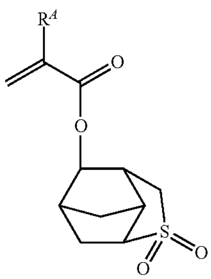
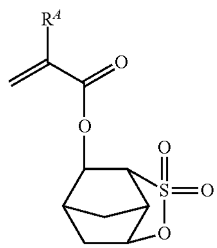
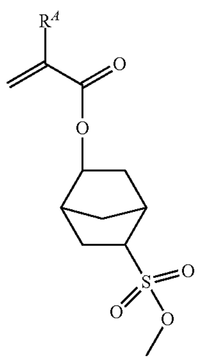
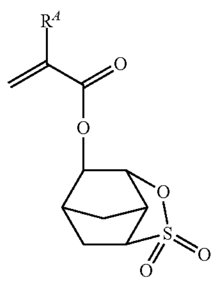
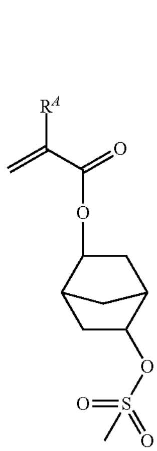
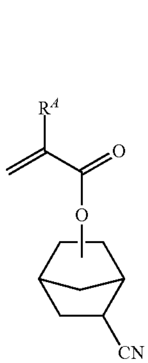
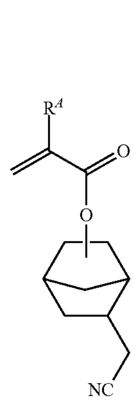
-continued
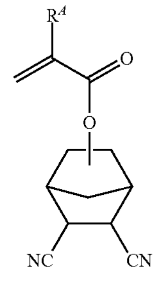
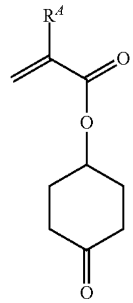
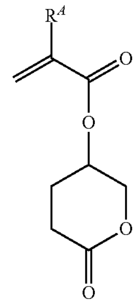
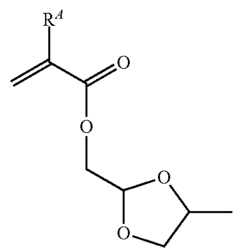
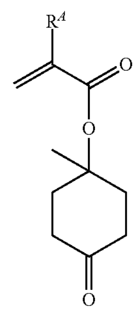
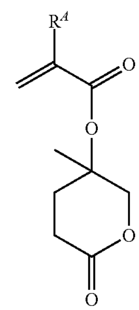
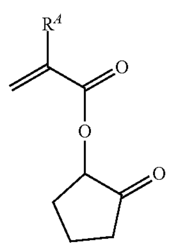
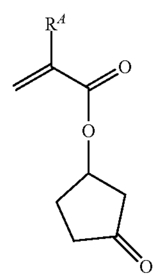
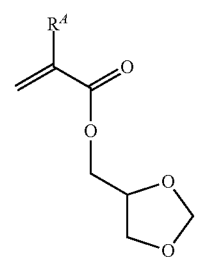
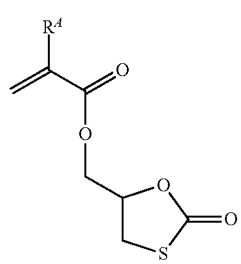
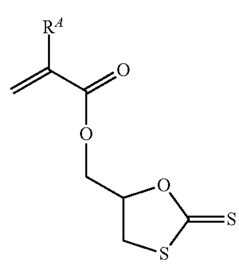
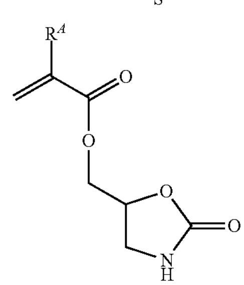
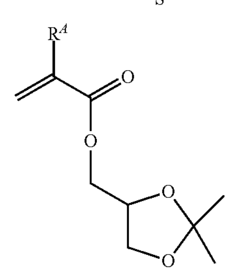

-continued
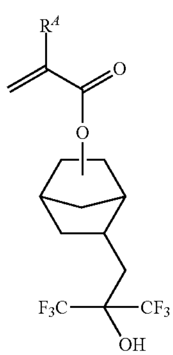
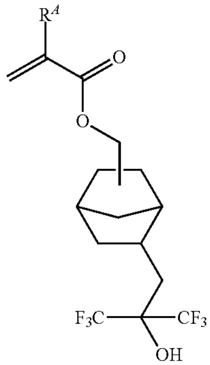
-continued
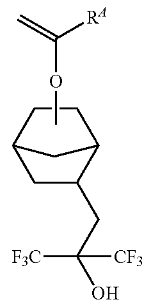
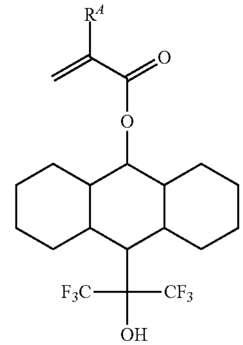
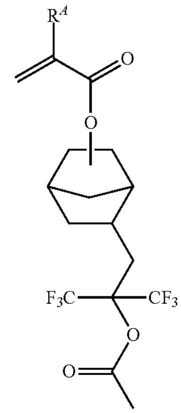
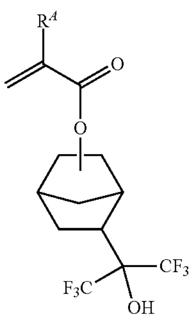
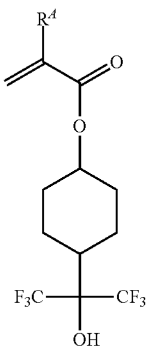
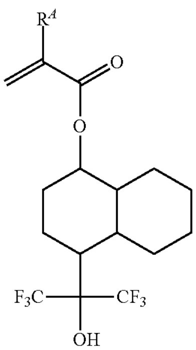
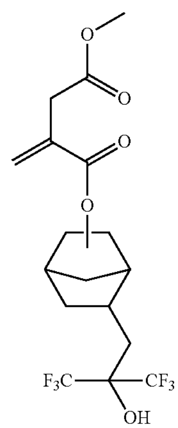
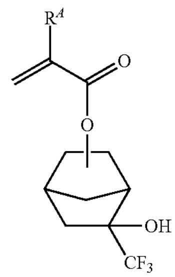
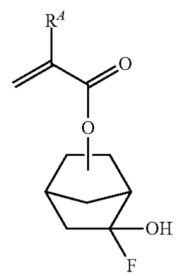
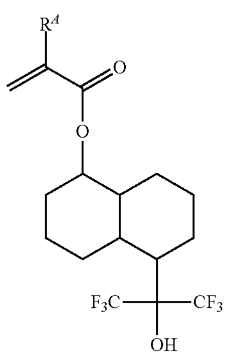
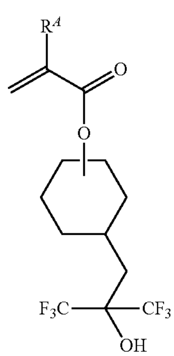
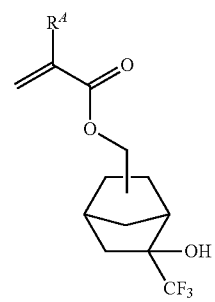
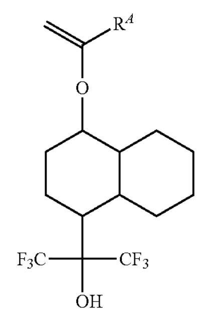
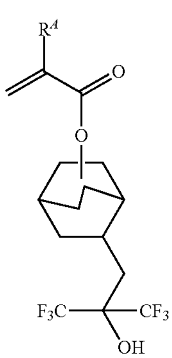
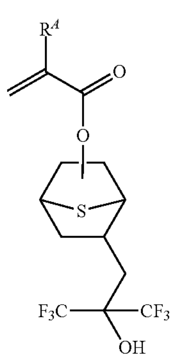
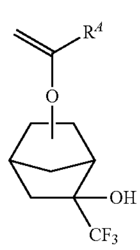
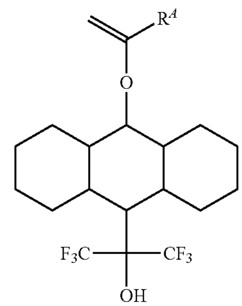
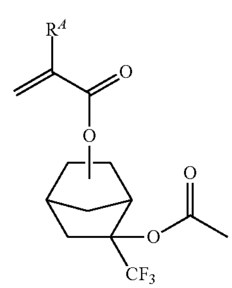

-continued
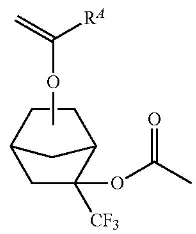
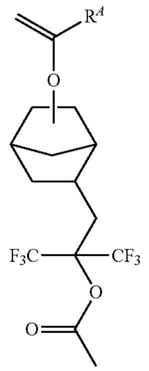
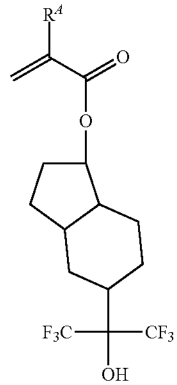
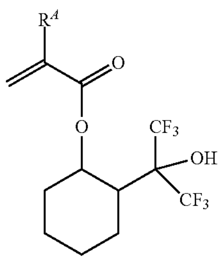
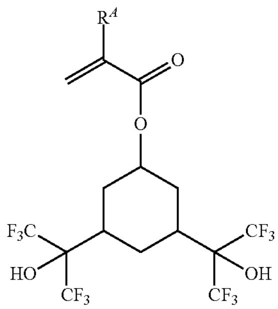
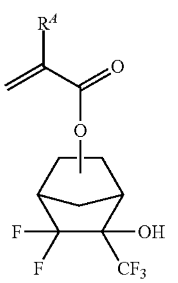
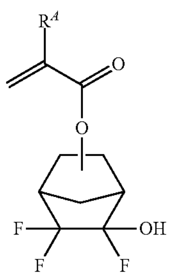
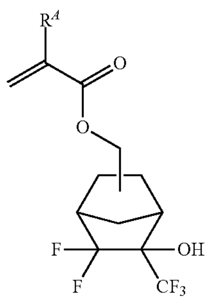
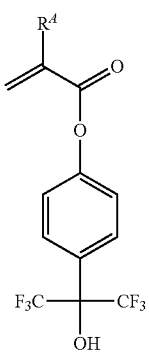
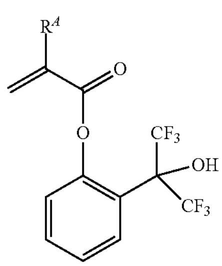
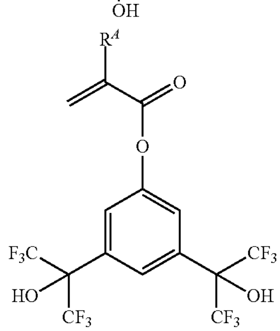
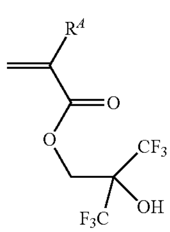
-continued
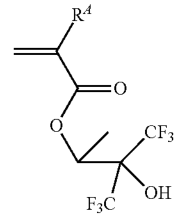
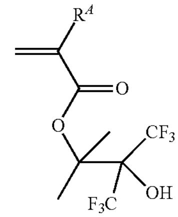
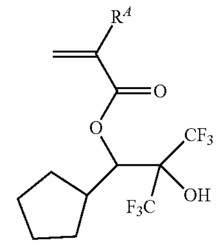
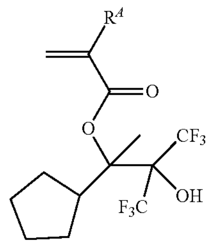
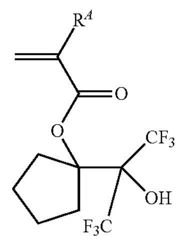
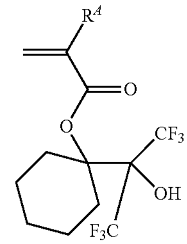
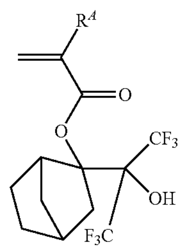
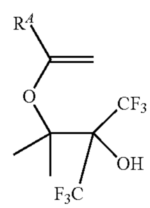
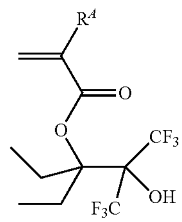
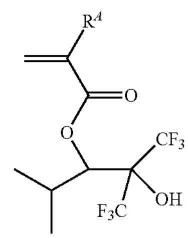
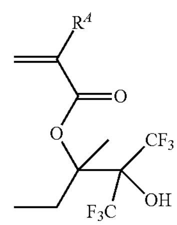
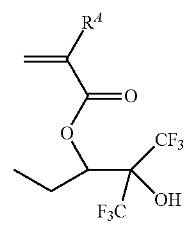
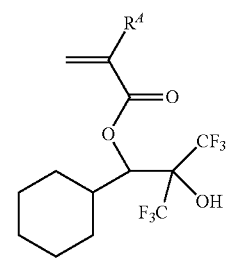
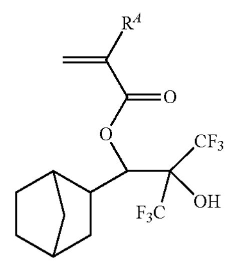
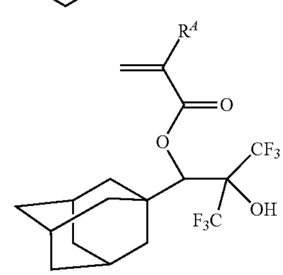
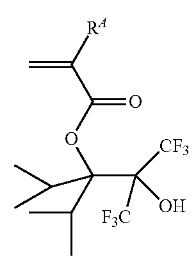
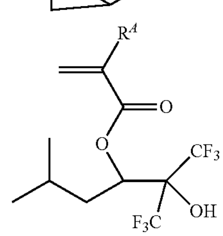
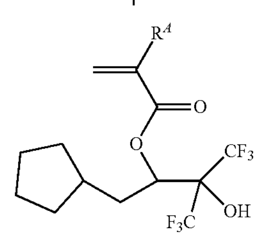

-continued
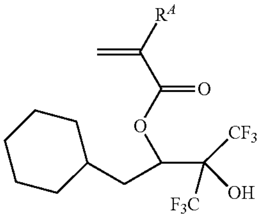
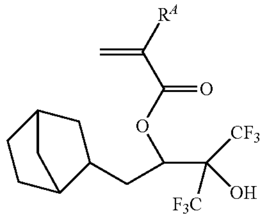
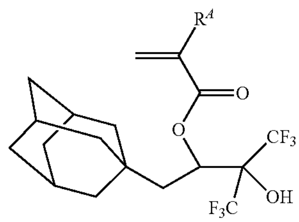
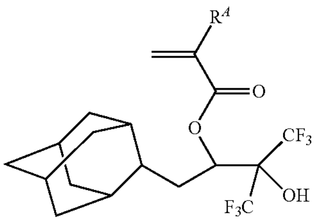
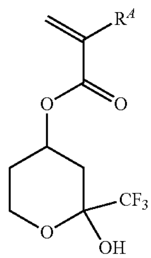
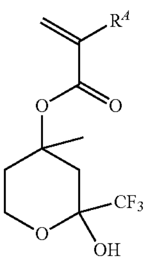
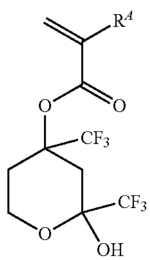
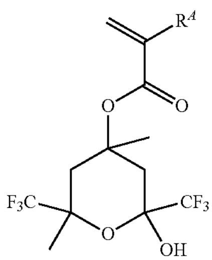
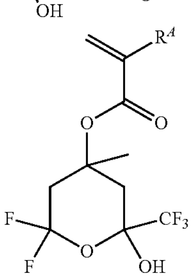
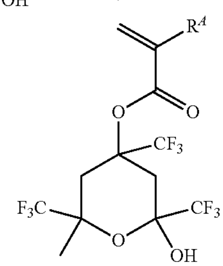
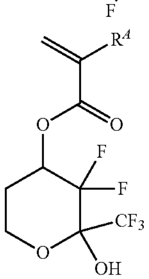
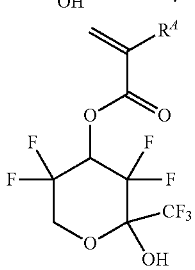
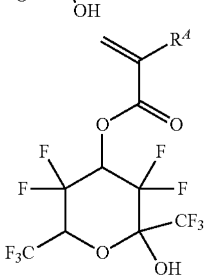
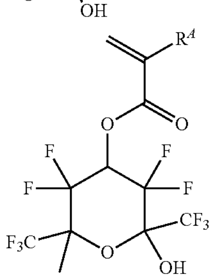
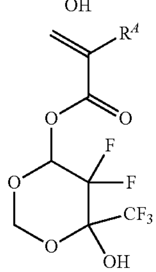
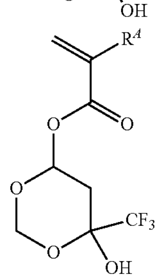
-continued
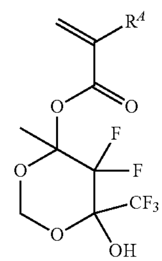
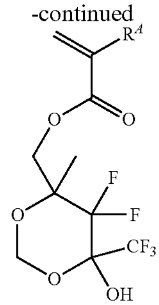
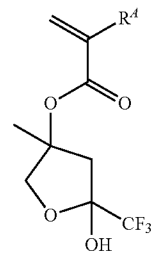
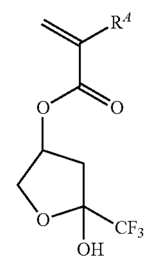
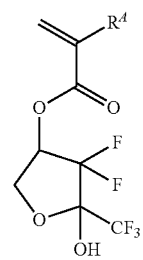
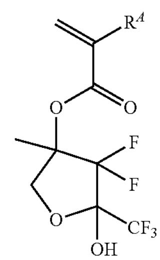
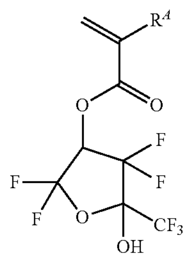
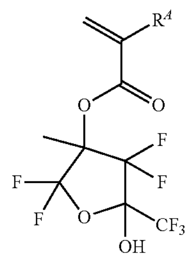
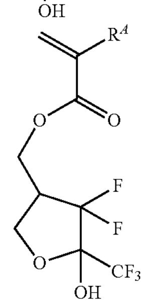
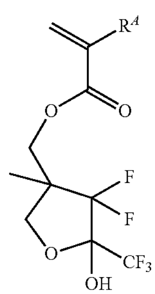
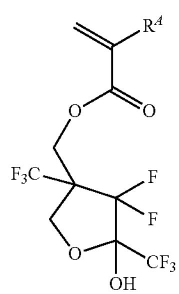
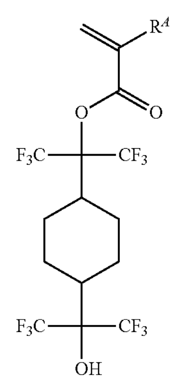
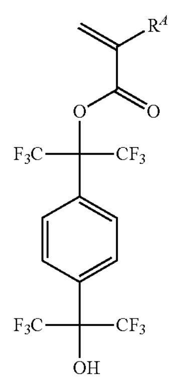
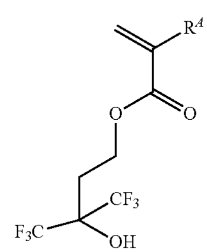

-continued
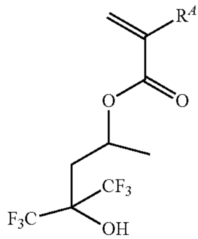
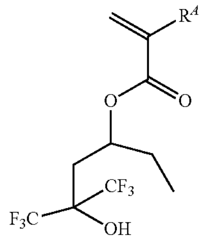
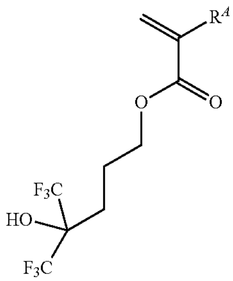
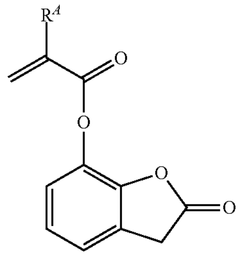
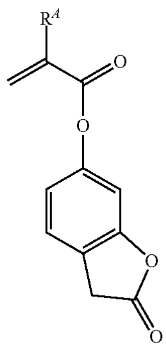
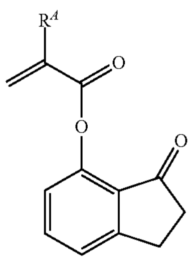
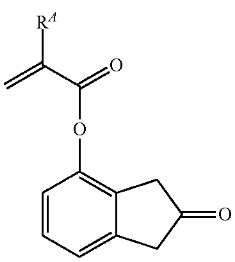
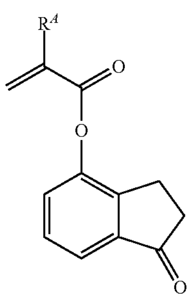
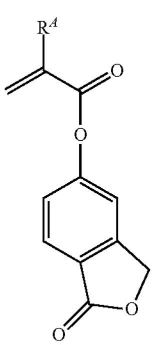
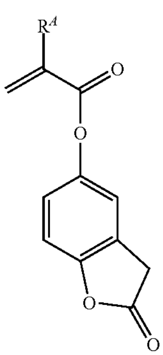
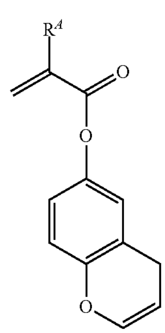
-continued
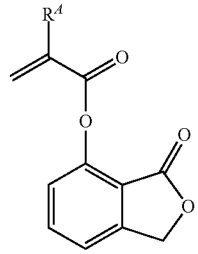
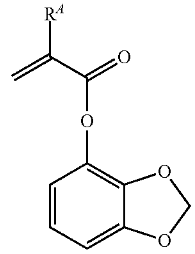
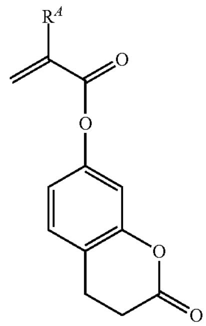
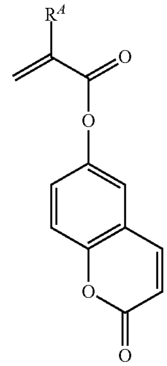
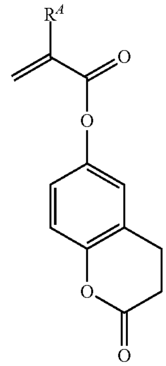
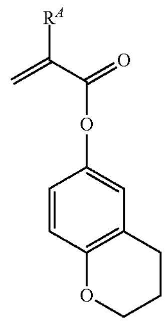
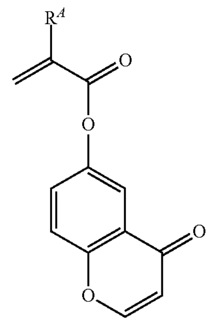
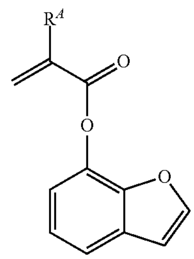
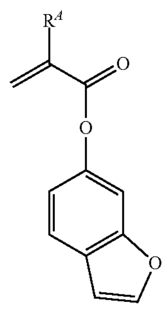
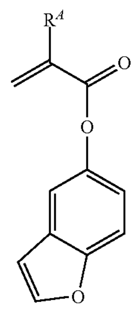
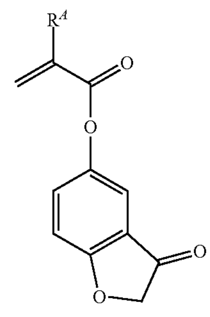
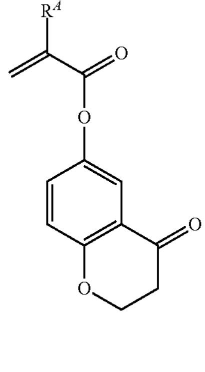
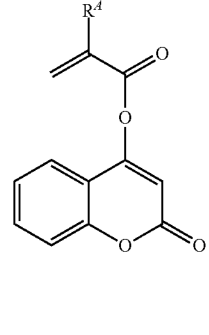

-continued
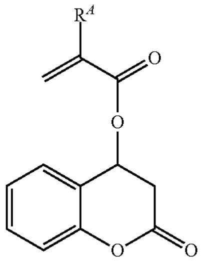
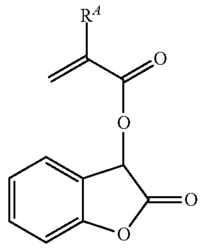
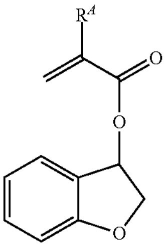
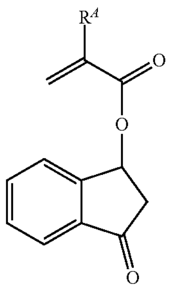
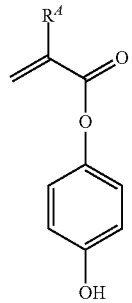
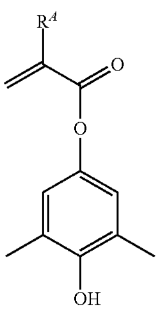
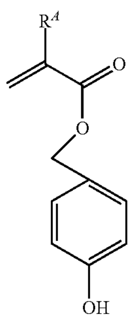
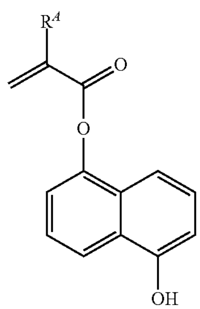
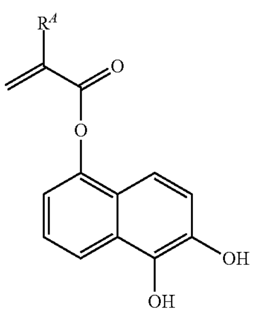
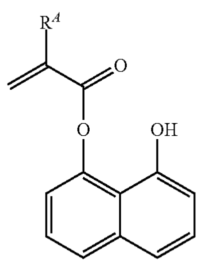
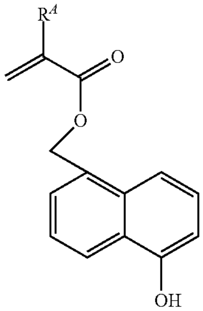
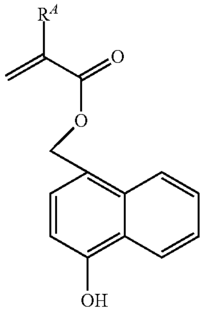
-continued
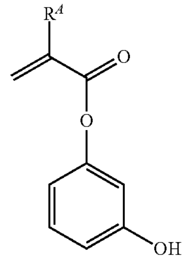
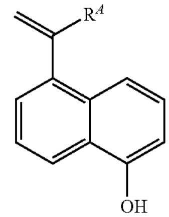
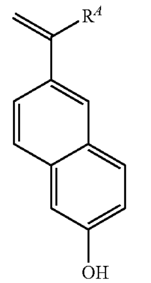
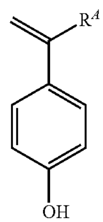
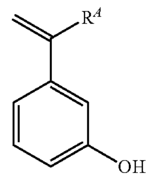
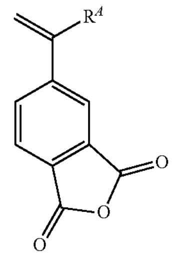
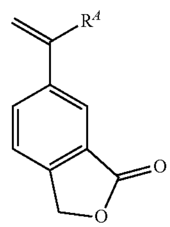
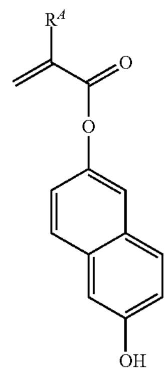
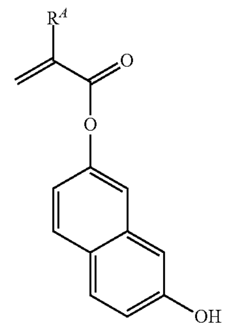
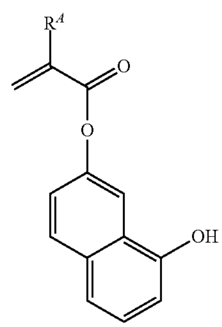
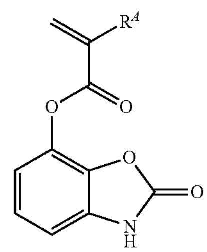
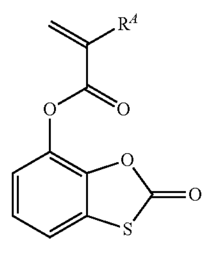
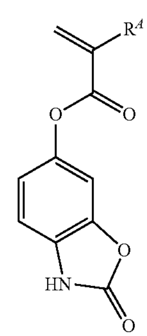
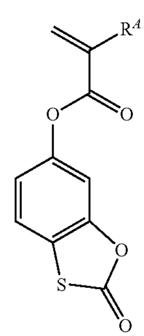

-continued
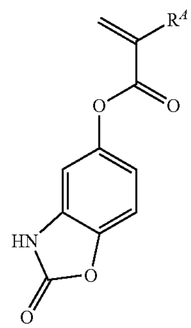
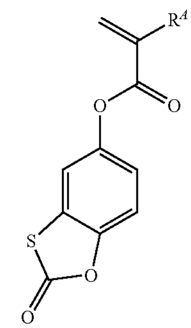
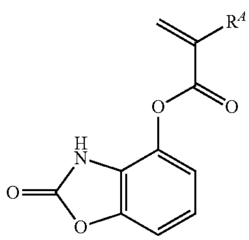
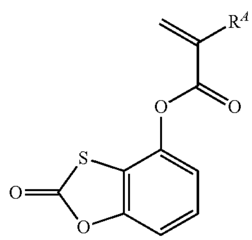
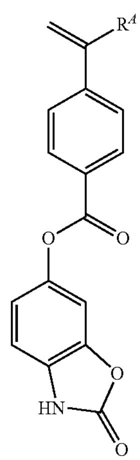
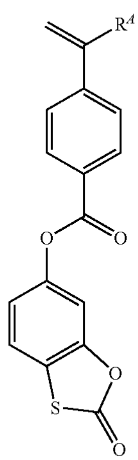
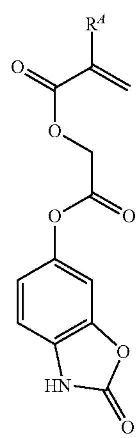
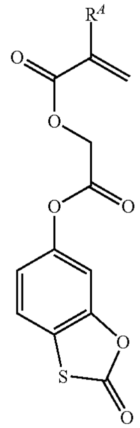
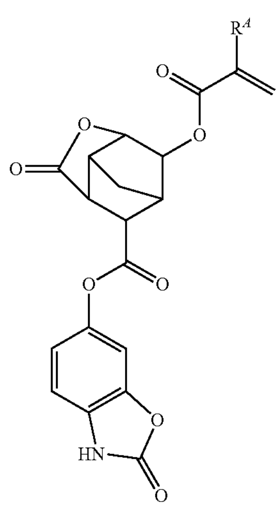
-continued
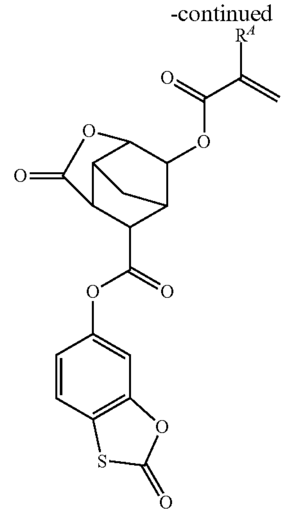
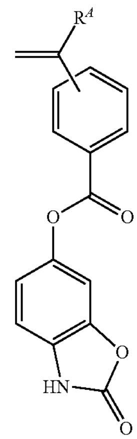
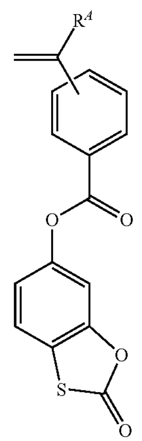
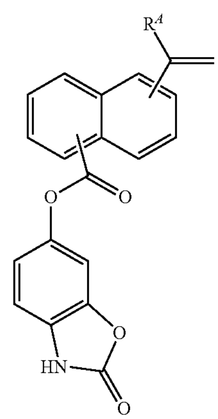
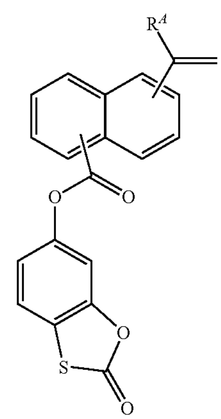
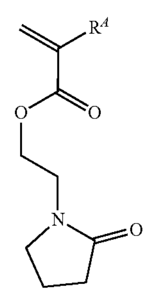
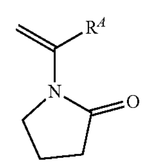
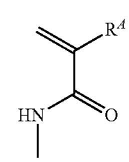
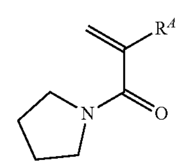
In a further embodiment, recurring units (d) of at least one type selected from recurring units having the following formulae (d1), (d2) and (d3) may be incorporated in the base polymer. These units are simply referred to as recurring units (d1), (d2) and (d3), which may be used alone or in combination of two or more types.

(d1)

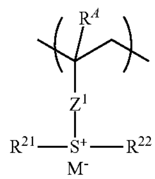

(d2)

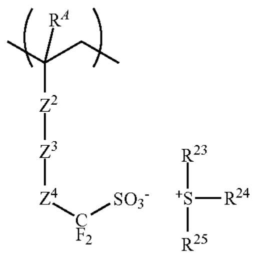

(d3)

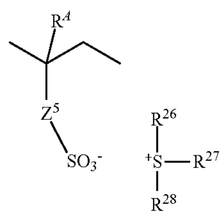

In formulae (d1) to (d3), $R^A$ is each independently hydrogen or methyl. $Z^1$ is a single bond, or a $C_1$-$C_6$ aliphatic hydrocarbylene group, phenylene group, naphthylene group, or a $C_7$-$C_{18}$ group obtained by combining the foregoing, or —O—$Z^{11}$—, —C(═O)—O—$Z^{11}$— or —C(═O)—NH—$Z^{11}$—, wherein $Z^{11}$ is a $C_1$-$C_6$ aliphatic hydrocarbylene group, phenylene group, naphthylene group, or a $C_7$-$C_{18}$ group obtained by combining the foregoing, which may contain a carbonyl moiety, ester bond, ether bond or hydroxyl moiety. $Z^2$ is a single bond or ester bond. $Z^3$ is a single bond, —$Z^{31}$—C(═O)—O—, —$Z^{31}$—O—, or —$Z^{31}$—O—C(═O)—, wherein $Z^{31}$ is a $C_1$-$C_{12}$ hydrocarbylene group, phenylene group or a $C_7$-$C_{18}$ group obtained by combining the foregoing, which may contain a carbonyl moiety, ester bond, ether bond, bromine or iodine $Z^4$ is methylene, 2,2,2-trifluoro-1,1-ethanediyl or carbonyl. $Z^5$ is a single bond, methylene, ethylene, phenylene, fluorinated phenylene, trifluoromethyl-substituted phenylene group, —O—$Z^{51}$—, —C(═O)—O—$Z^{51}$— or —C(═O)—NH—$Z^{51}$—, wherein $Z^{51}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxyl moiety.

In formulae (d1) to (d3), $R^{21}$ to $R^{28}$ are each independently a $C_1$-$C_{20}$ hydrocarbyl group which may contain a heteroatom. The hydrocarbyl group may be straight, branched or cyclic and examples thereof are as exemplified above for the hydrocarbyl group represented by $R^{101}$ to $R^{105}$ in formulae (1-1) and (1-2).

Also, a pair of $R^{23}$ and $R^{24}$, or $R^{26}$ and $R^{27}$ may bond together to form a ring with the sulfur atom to which they are attached. Examples of the ring are as will be exemplified later for the ring that $R^{101}$ and $R^{102}$ in formula (1-1), taken together, form with the sulfur atom to which they are attached.

In formula (d1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (d1-1) and sulfonate ions having fluorine substituted at α-position and trifluoromethyl at β-position as represented by the formula (d1-2).

$$R^{31}—CF_2—SO_3^- \quad \text{(d1-1)}$$

(d1-2)

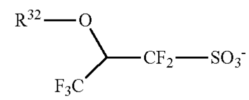

In formula (d1-1), $R^{31}$ is hydrogen, or a $C_1$-$C_{20}$ hydrocarbyl group which may contain an ether bond, ester bond, carbonyl moiety, lactone ring, or fluorine atom. The hydrocarbyl group may be saturated or unsaturated and straight, branched or cyclic and examples thereof are as will be exemplified later for the hydrocarbyl group $R^{111}$ in formula (1A').

In formula (d1-2), $R^{32}$ is hydrogen, or a $C_1$-$C_{30}$ hydrocarbyl group or $C_2$-$C_{30}$ hydrocarbylcarbonyl group which may contain an ether bond, ester bond, carbonyl moiety or lactone ring. The hydrocarbyl group and hydrocarbyl moiety in the hydrocarbylcarbonyl group may be saturated or unsaturated and straight, branched or cyclic and examples thereof are as will be exemplified later for the hydrocarbyl group $R^{111}$ in formula (1A').

Examples of the cation in the monomer from which recurring unit (d1) is derived are shown below, but not limited thereto. $R^A$ is as defined above.

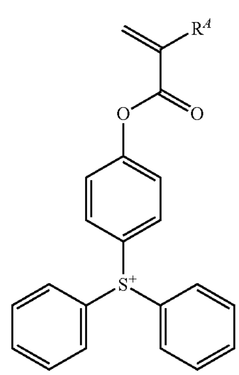

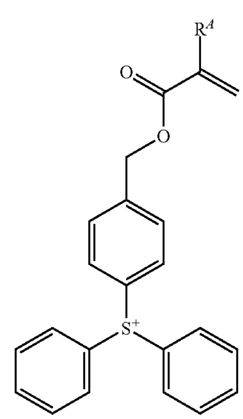

-continued
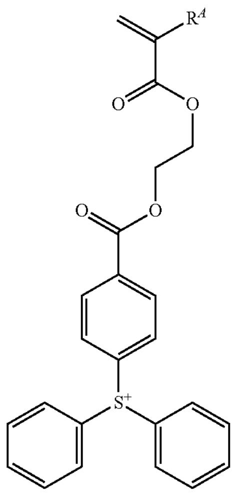
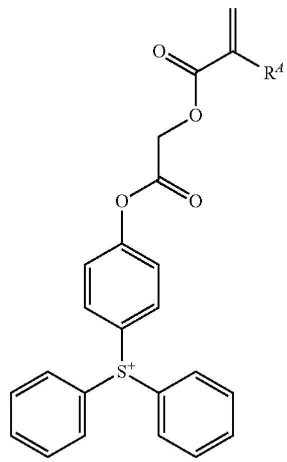
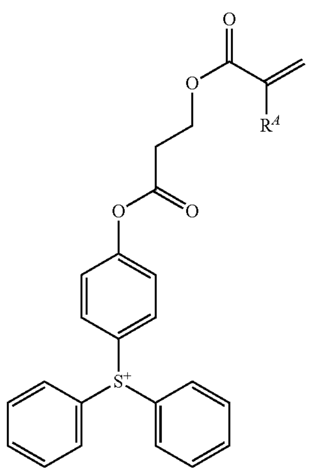
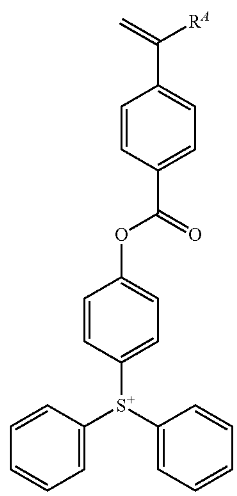
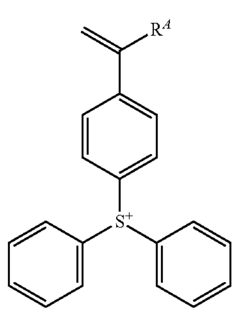
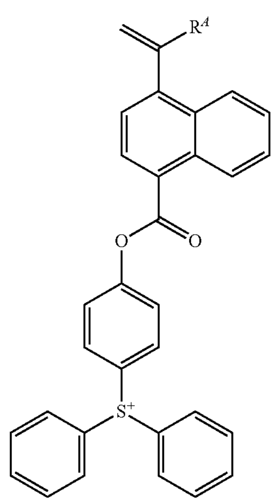
-continued
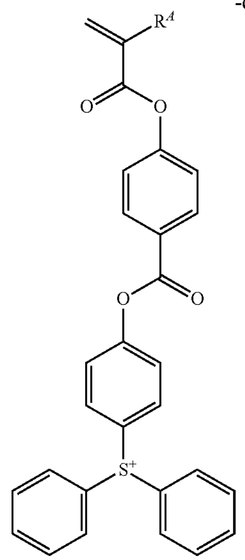
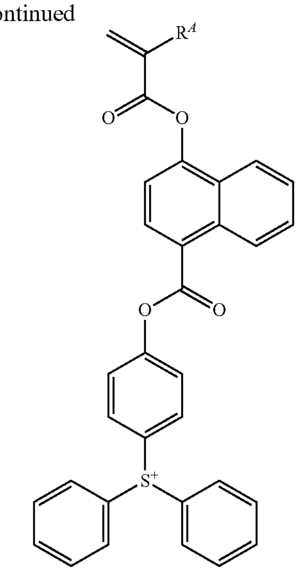
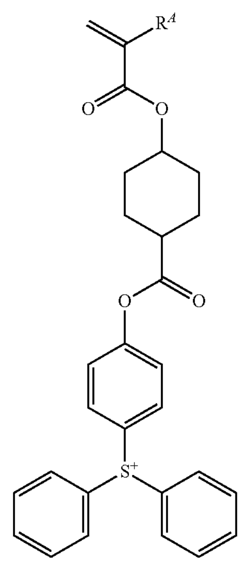
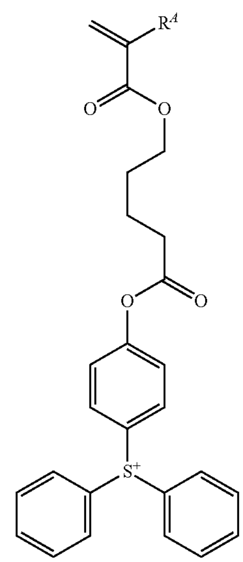
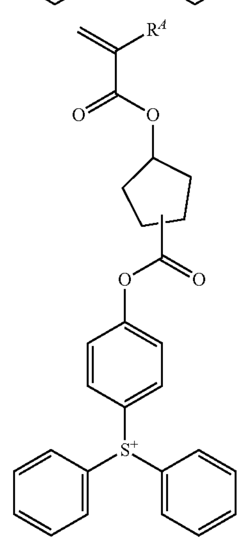

-continued
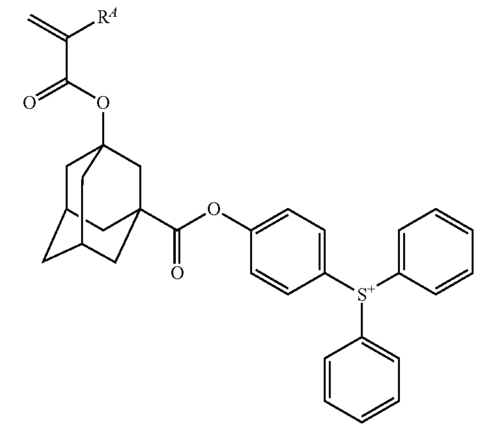
Examples of the cation in the monomer from which recurring unit (d2) or (d3) is derived are as will be exemplified later for the cation in the sulfonium salt having formula (1-1).
Examples of the anion in the monomer from which recurring unit (d2) is derived are shown below, but not limited thereto. $R^A$ is as defined above.
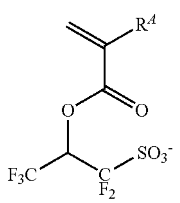
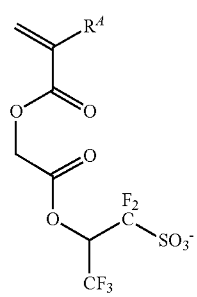
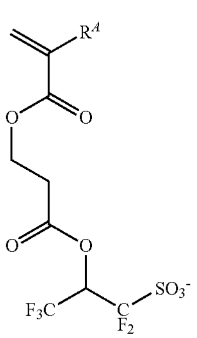
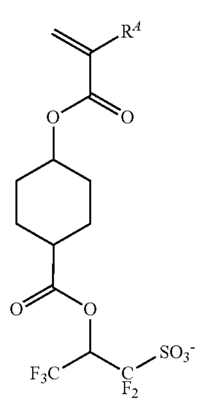
-continued
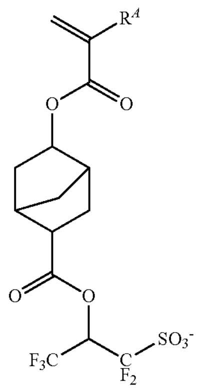
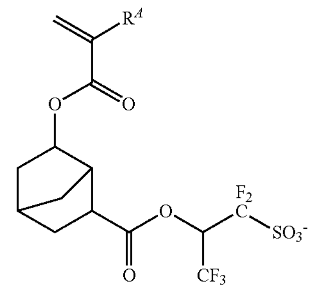
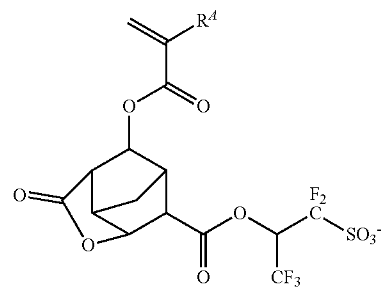
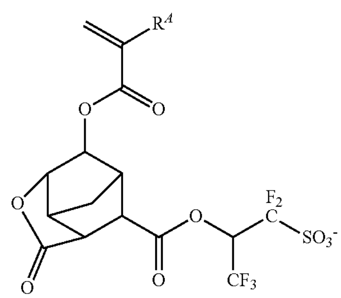
lp;2p
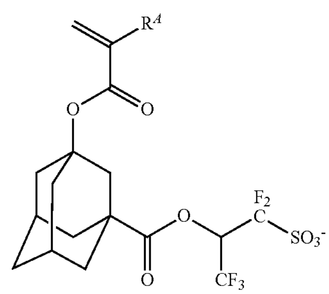
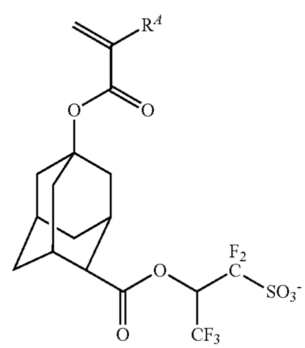

-continued
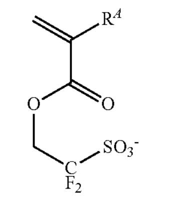
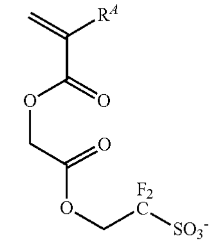
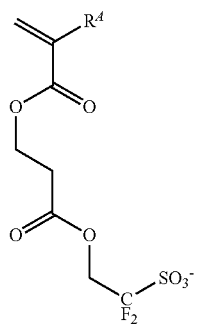
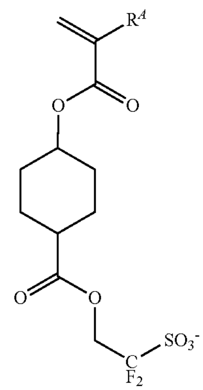
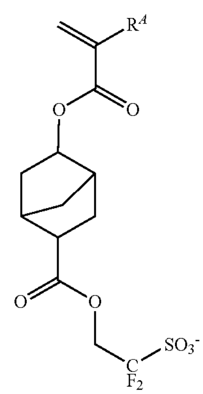
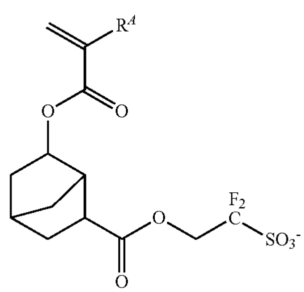
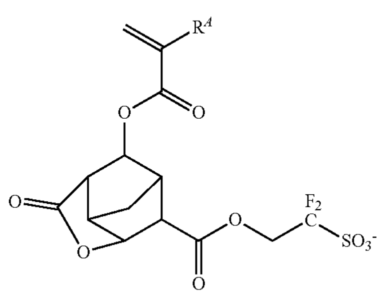
-continued
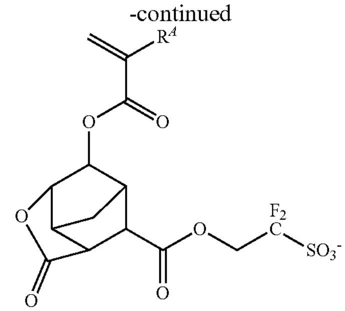
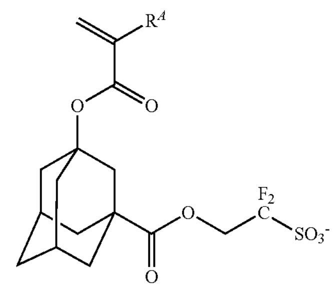
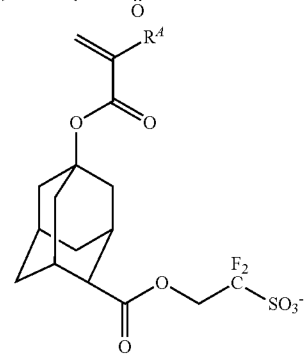
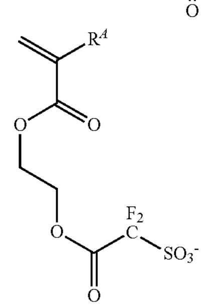
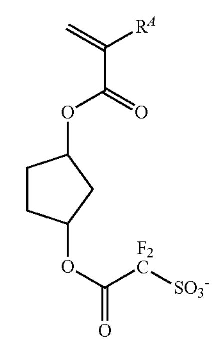
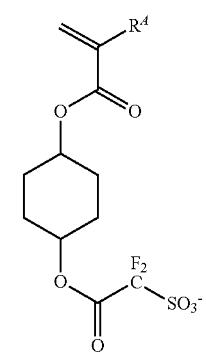
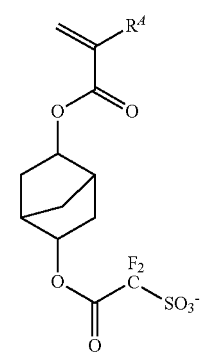

-continued
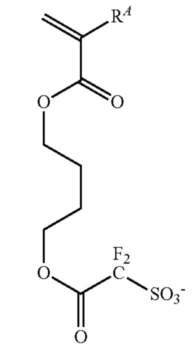
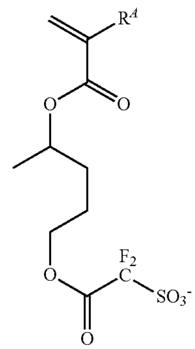
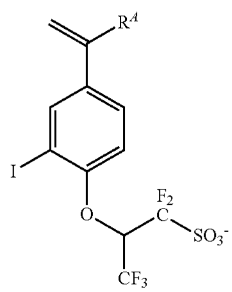
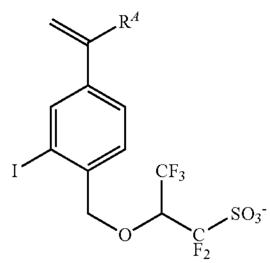
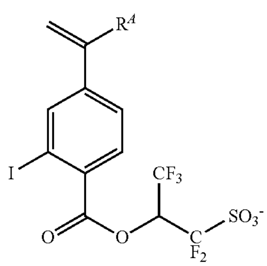
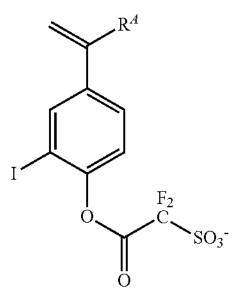
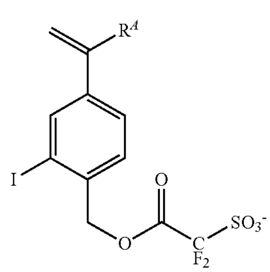
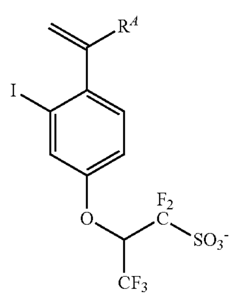
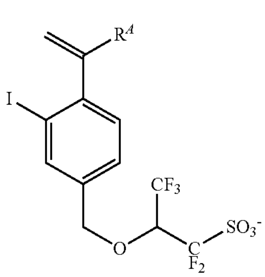
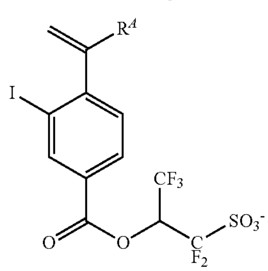
-continued
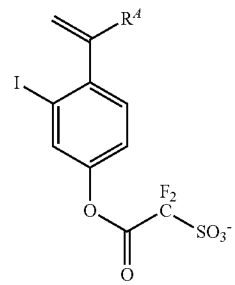
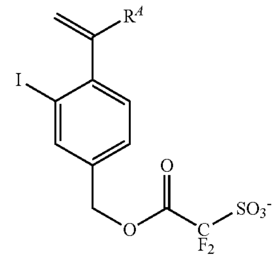
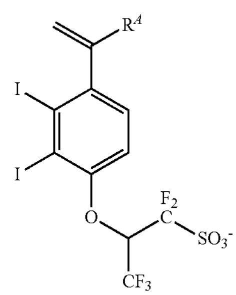
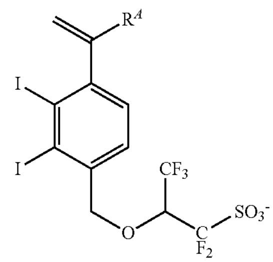
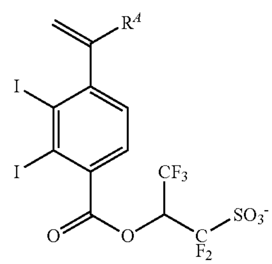
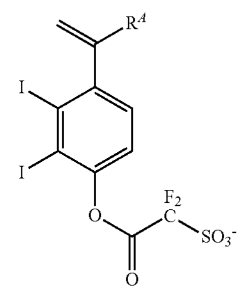
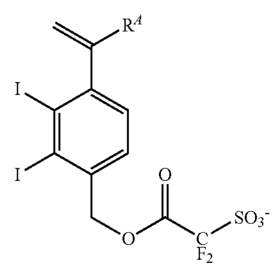
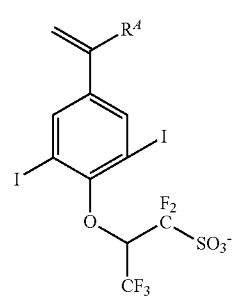
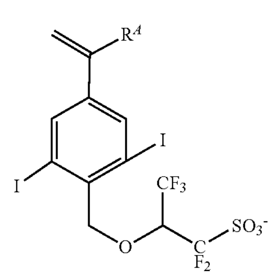
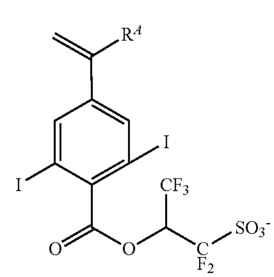

-continued
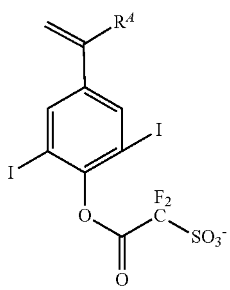
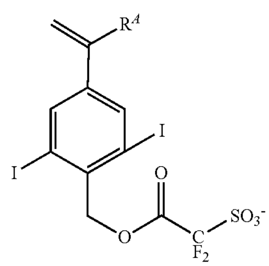
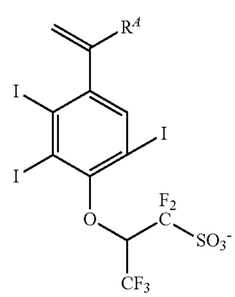
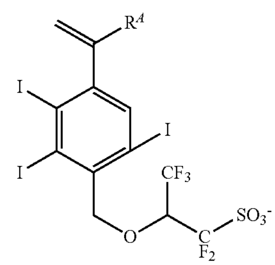
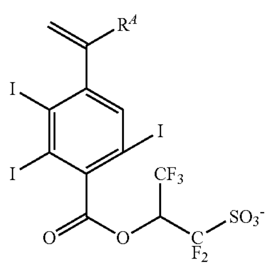
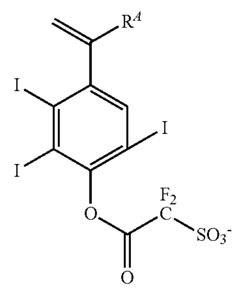
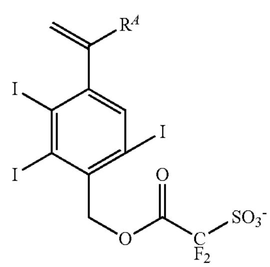
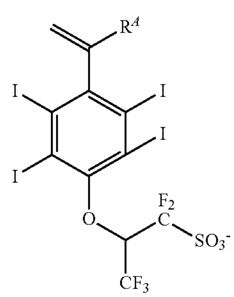
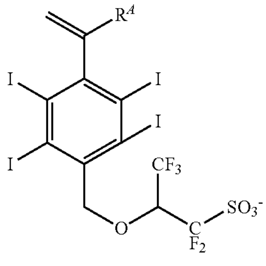
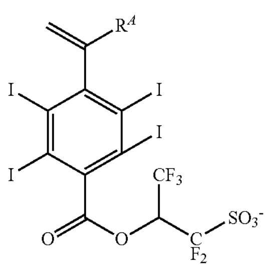
-continued
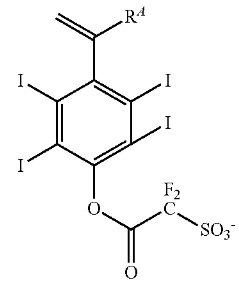
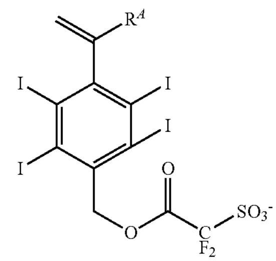
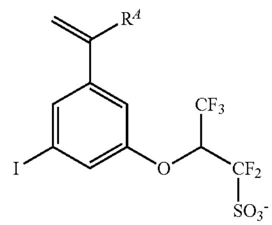
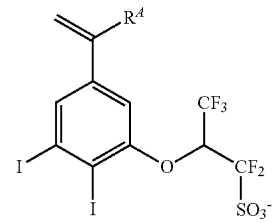
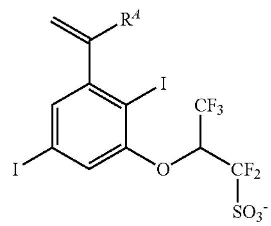
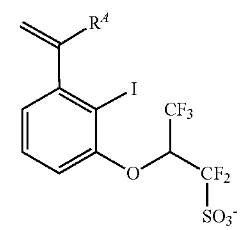
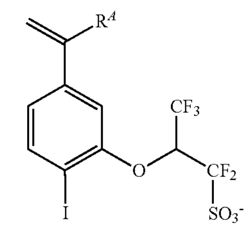
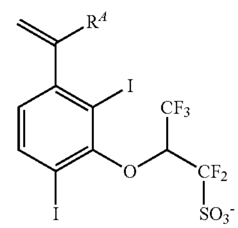
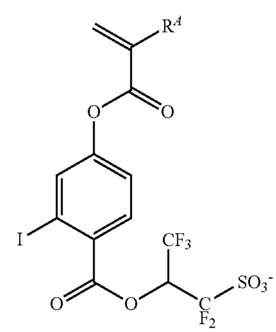
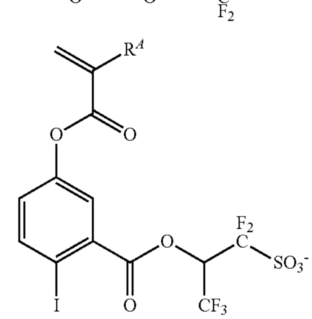

-continued
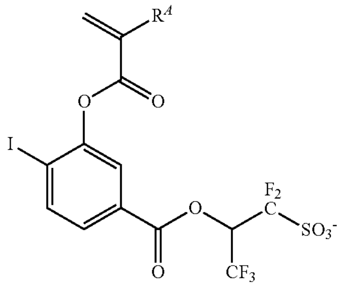
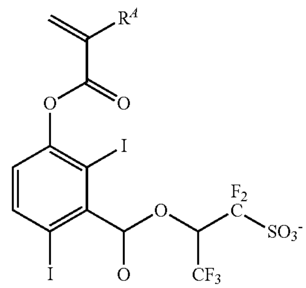
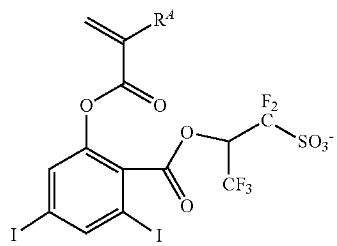
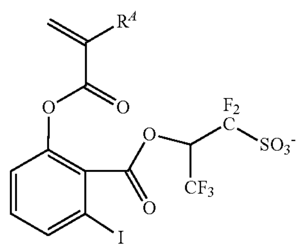
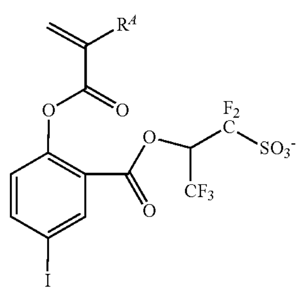
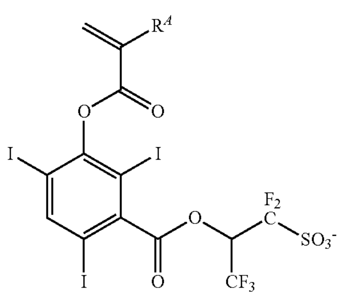
-continued
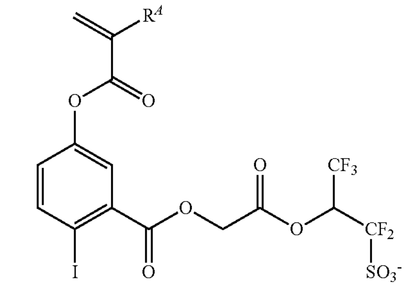
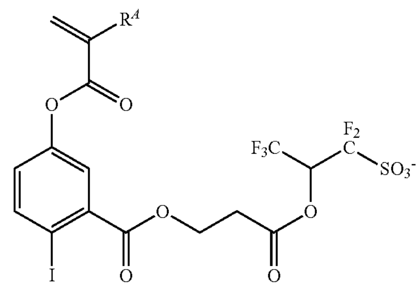
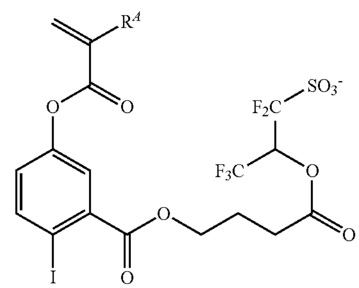
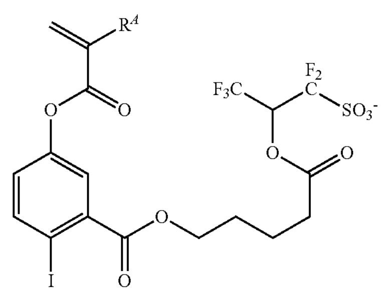
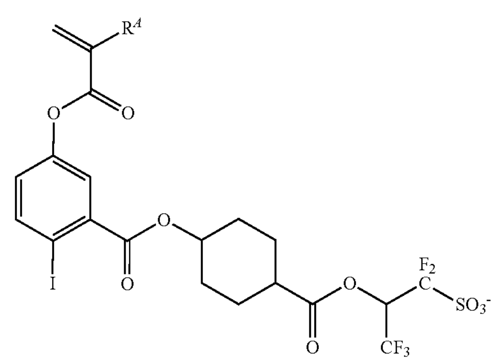

-continued
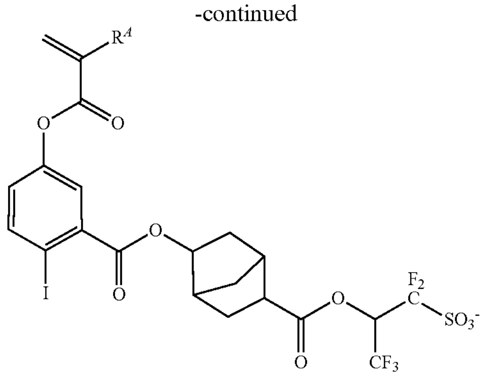
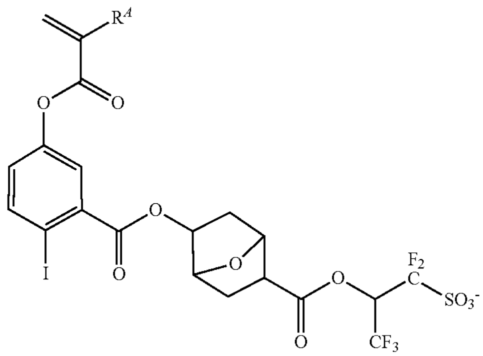
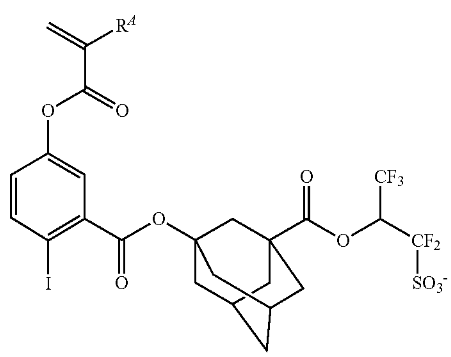
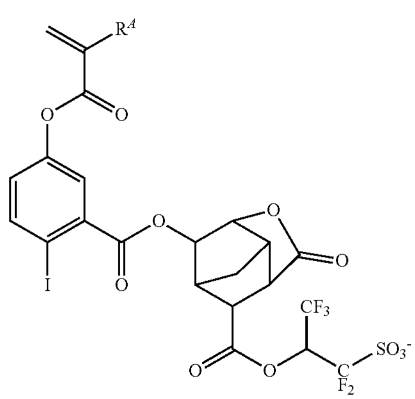
-continued
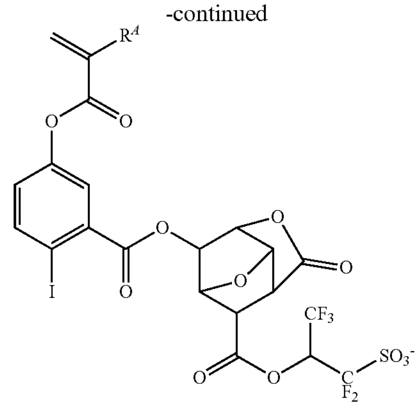
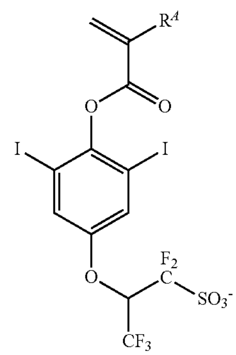
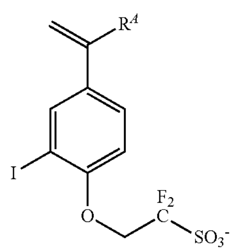
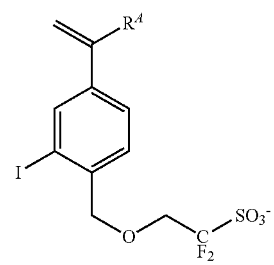
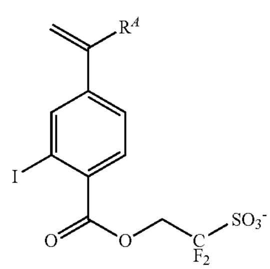
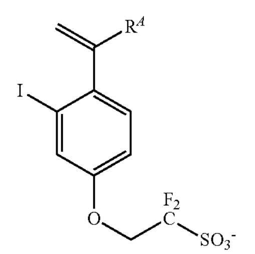
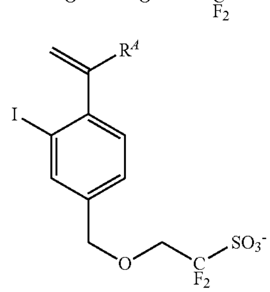
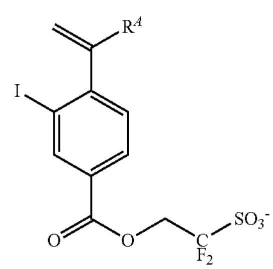

-continued
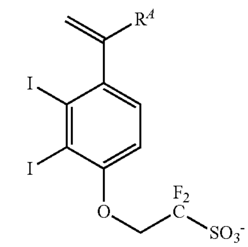
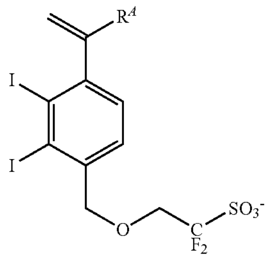
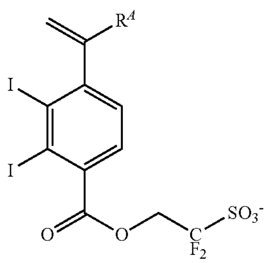
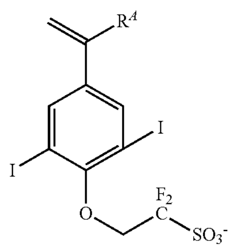
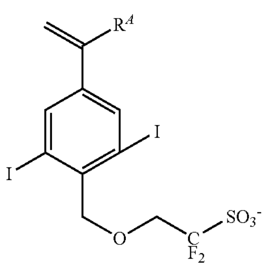
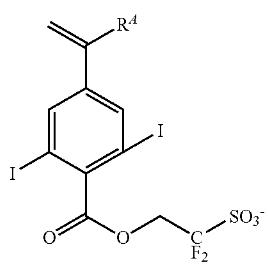
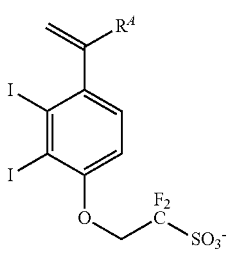
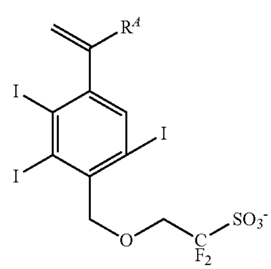
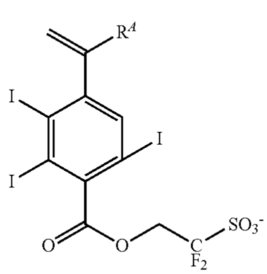
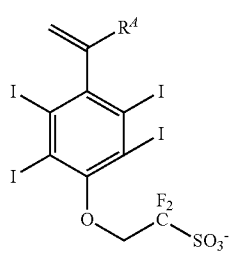
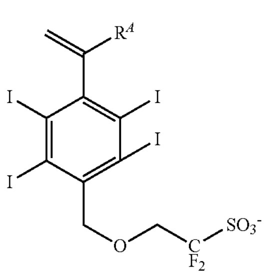
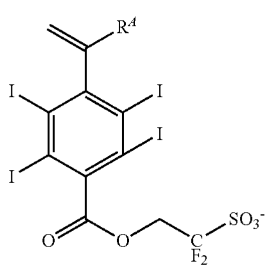
-continued
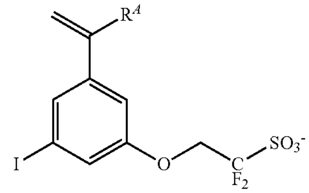
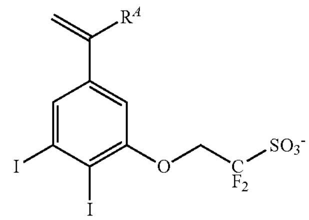
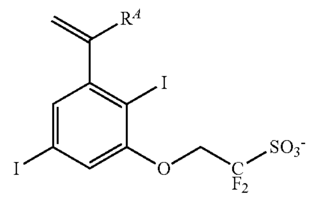
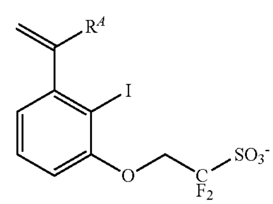
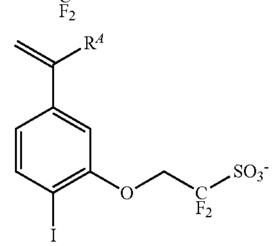
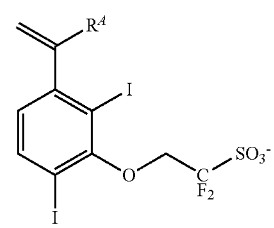
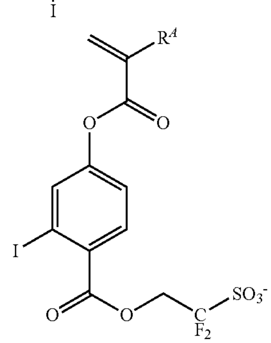
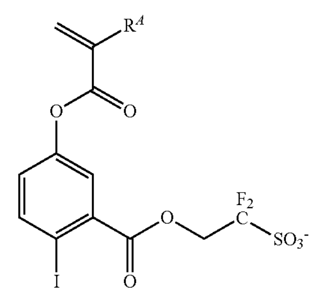
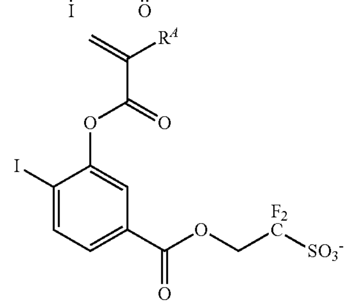

-continued
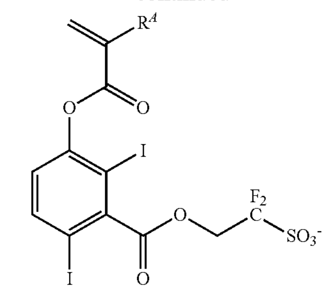
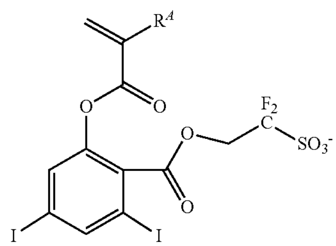
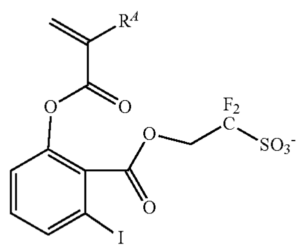
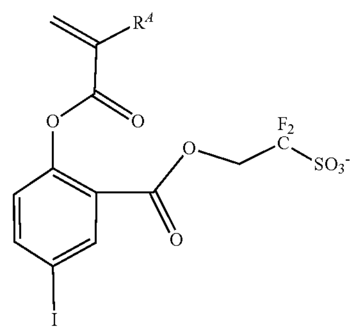
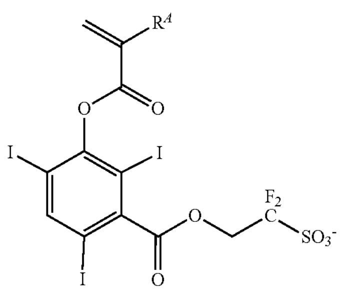
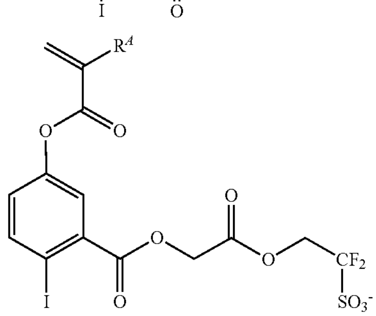
-continued
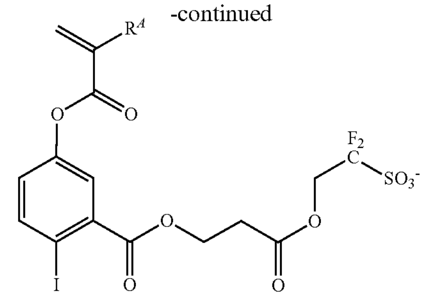
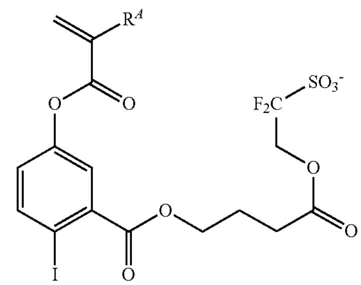
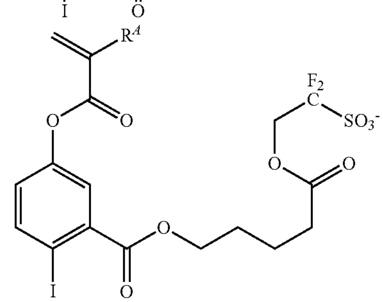
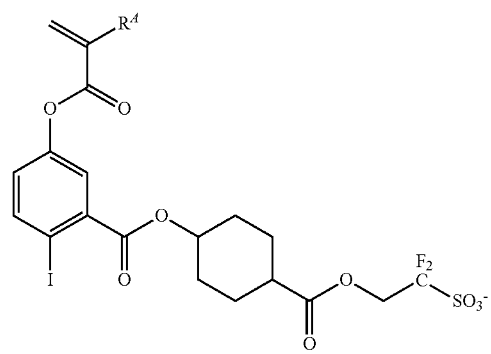
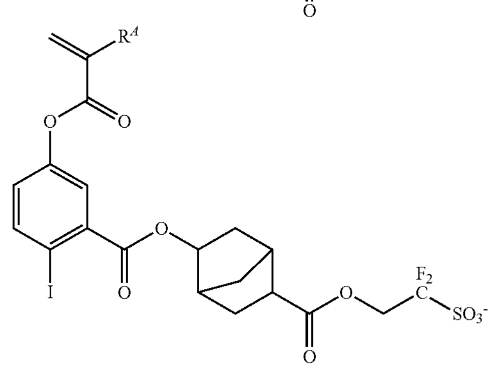

-continued
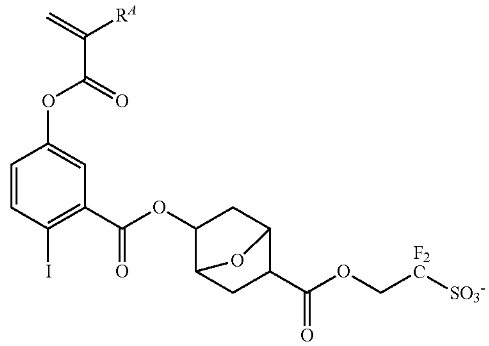
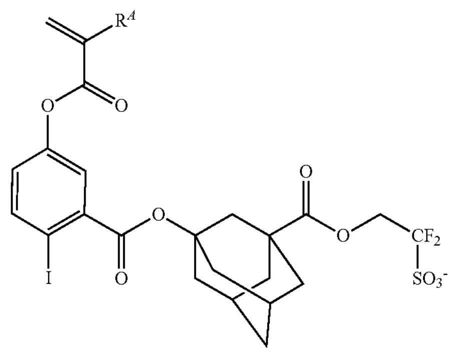
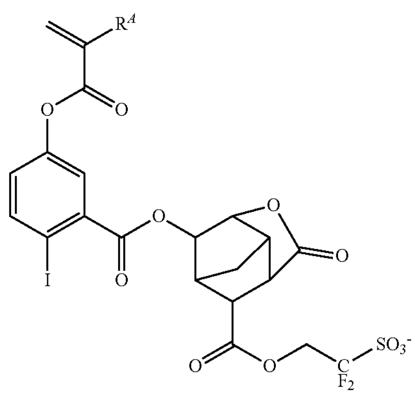
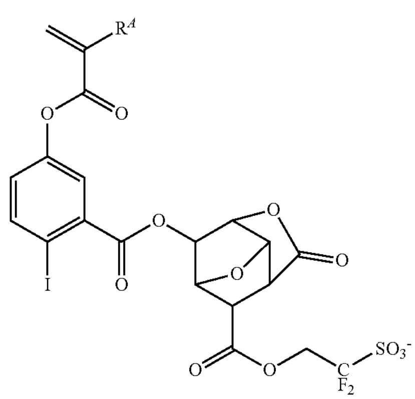
-continued
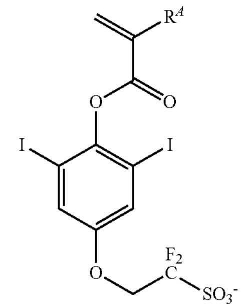
Examples of the anion in the monomer from which recurring unit (d3) is derived are shown below, but not limited thereto. $R^A$ is as defined above.
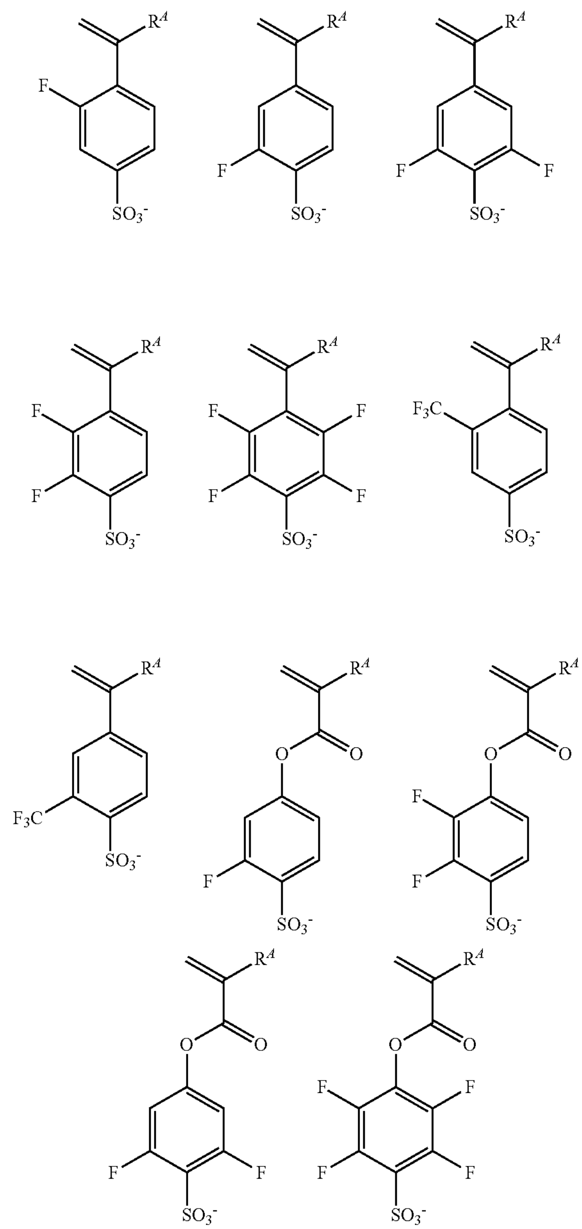

-continued

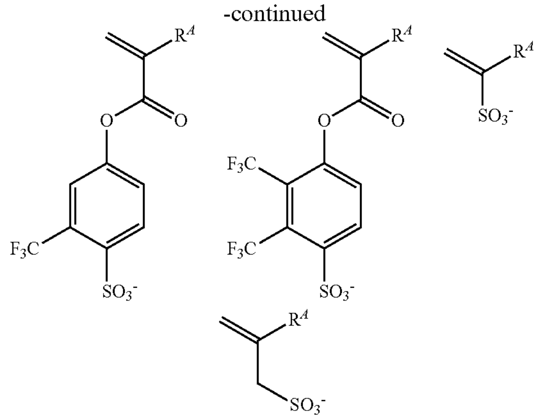

Recurring units (d1) to (d3) have the function of acid generator. The attachment of an acid generator to the polymer main chain is effective in restraining acid diffusion, thereby preventing a reduction of resolution due to blur by acid diffusion. Also LER, LWR and CDU are improved since the acid generator is uniformly distributed. When a base polymer comprising recurring units (d), i.e., polymer-bound acid generator is used, an acid generator of addition type (to be described later) may be omitted.

The base polymer may further include recurring units (e) which contain iodine, but not amino group. Examples of the monomer from which recurring units (e) are derived are shown below, but not limited thereto. $R^A$ is as defined above.

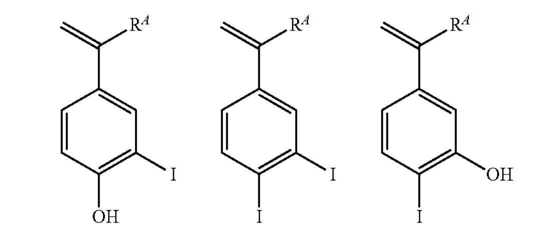

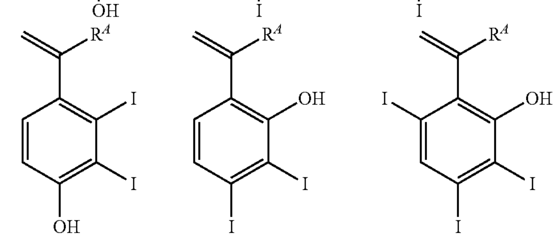

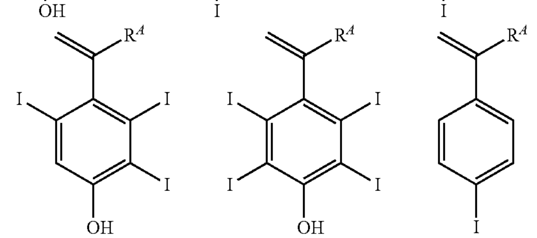

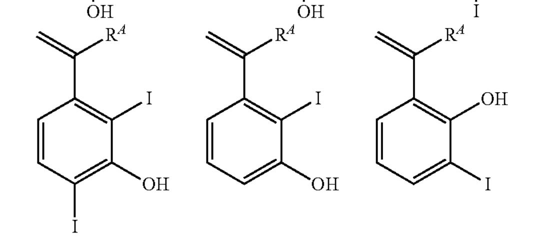

-continued

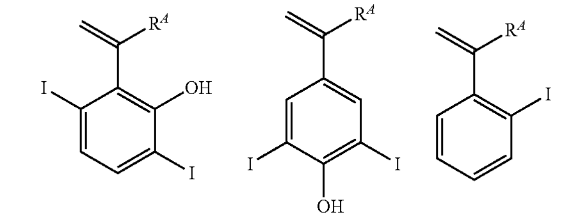

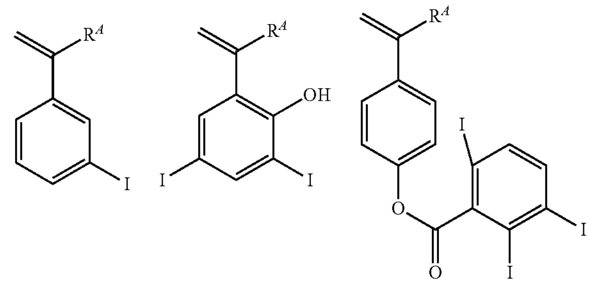

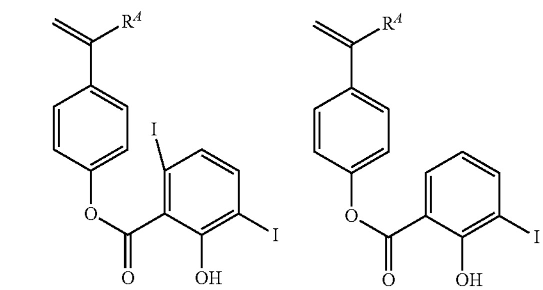

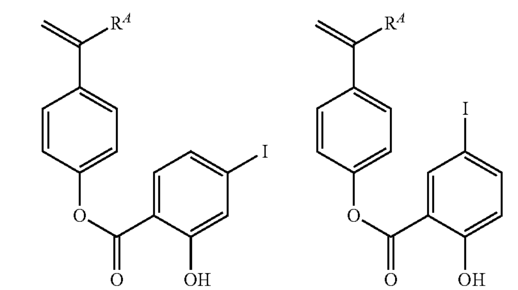

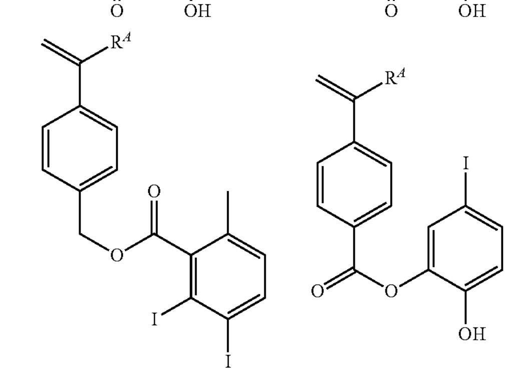

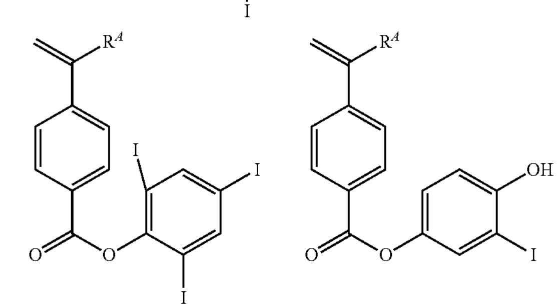

-continued

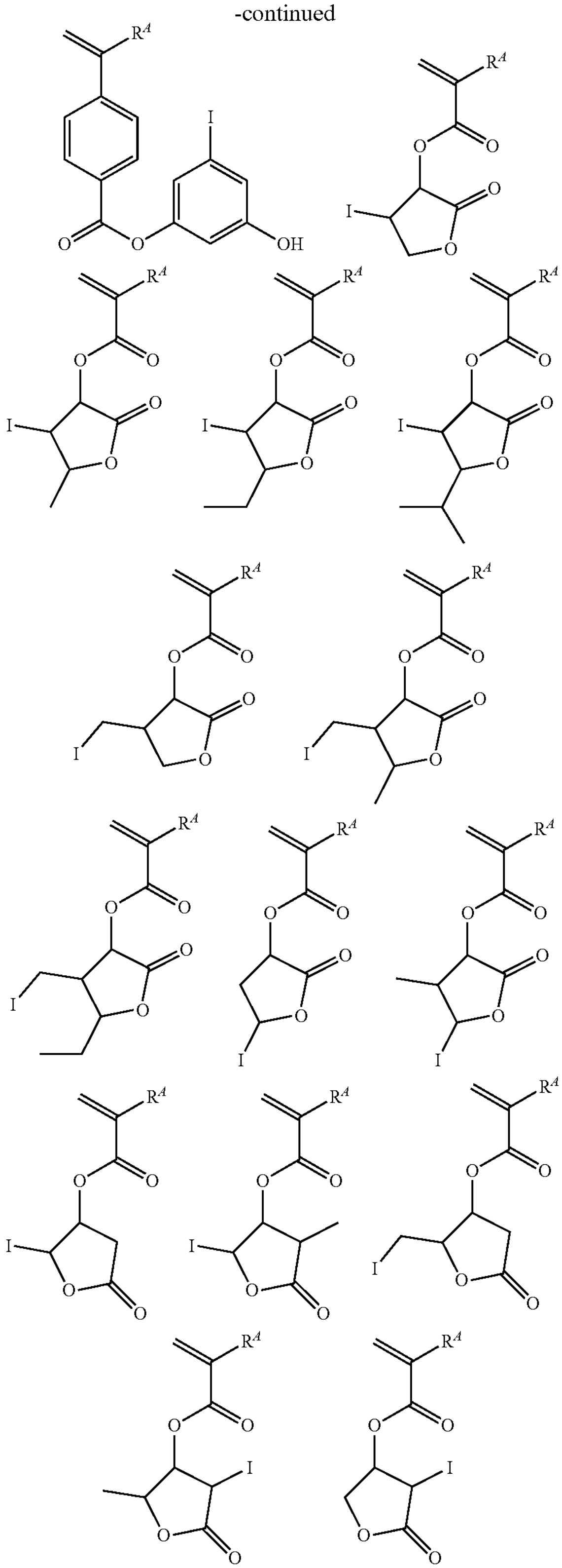

Besides the reclining units described above, further recurring units (f) may be incorporated in the base polymer, which are derived from such monomers as styrene, vinylnaphthalene, indene, acenaphthylene, coumarin, and coumarone.

In the base polymer comprising recurring units (a), (b1), (b2), (c), (d1), (d2), (d3), (e), and (f), a fraction of these units is: preferably $0<a<1.0$, $0\le b1\le 0.9$, $0\le b2\le 0.9$, $0<b1+b2\le 0.9$, $0\le c\le 0.9$, $0\le d1\le 0.5$, $0\le d2\le 0.5$, $0\le d3\le 0.5$, $0\le d1+d2+d3\le 0.5$, $0\le e\le 0.5$, and $0\le f\le 0.5$;

more preferably $0.001\le a\le 0.8$, $0\le b1\le 0.8$, $0<b2\le 0.8$, $0\le b1+b2\le 0.8$, $0\le c\le 0.8$, $0\le d1\le 0.4$, $0\le d2\le 0.4$, $0\le d3\le 0.4$, $0\le d1+d2+d3\le 0.4$, $0\le e\le 0.4$, and $0\le f\le 0.4$; and even more preferably $0.01\le a\le$; 0.7, $0<b1\le 0.7$, $0\le b2\le 0.7$, $0\le b1+b2\le 0.7$, $0\le$; $c\le 0.7$, $0\le d1\le 0.3$, $0\le d2\le 0.3$, $0\le d3\le 0.3$, $0\le d1+d2+d3\le 0.3$, $0\le e\le 0.3$, and $0\le f\le 0.3$. Notably, $a+b1+b2+c+d1+d2+d3+e+f=1.0$.

The base polymer may be synthesized by any desired methods, for example, by dissolving suitable monomer's selected from the monomers corresponding to the foregoing recurring units in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 80° C., and the reaction time is 2 to 100 hours, more preferably 5 to 20 hours.

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 horns.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rale becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

The base polymer may be a blend of two or more polymers which differ in compositional ratio, Mw or Mw/Mn. It may also be a blend of a polymer containing recurring units (a) and a polymer not containing reclining units (a).

Acid Generator

The positive resist composition may contain an acid generator capable of generating a strong acid, also referred to as acid generator of addition type. As used herein, the "strong acid" is a compound having a sufficient acidity to induce deprotection reaction of acid labile groups on the base polymer. The acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imidic acid (imide acid) or methide acid are preferred. Suitable PAGs include sulfonium salts, iodonium salts, sulfonyldiazomethane, N-sulfonyloxyimide, and oxime-O-sulfonate acid generators. Suitable PAGs are as exemplified in U.S. Pat. No. 7,537,880 (JP-A 2008-111103, paragraphs [0122]-[0142]).

Also sulfonium salts having the formula (1-1) and iodonium salts having the formula (1-2) are useful PAGs.

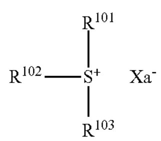

(1-1)

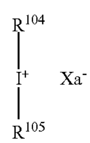

(1-2)

In formulae (1-1) and (1-2), $R^{101}$ to $R^{105}$ are each independently a halogen atom or a $C_1$-$C_{20}$ hydrocarbyl group which may contain a heteroatom.

Suitable halogen atoms include fluorine, chlorine, bromine and iodine.

The $C_1$-$C_{20}$ hydrocarbyl group represented by $R^{101}$ to $R^{105}$ may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl, adamantyl; $C_2$-$C_{20}$ alkenyl groups such as vinyl, propenyl, butenyl, hexenyl; $C_2$-$C_{20}$ alkynyl groups such as ethynyl, propynyl, butynyl; $C_3$-$C_{20}$ unsaturated alicyclic hydrocarbyl groups such as cyclohexenyl and norbornenyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl; and $C_7$-$C_{20}$ aralkyl groups such as benzyl and phenethyl as well as groups obtained by combining the foregoing.

In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl moiety, cyano moiety, carbonyl moiety, ether bond, ester bond, sulfonate bond, carbonate bond, lactone ring, sultone ring, carboxylic anhydride or haloalkyl moiety.

Also, a pair of $R^{101}$ and $R^{102}$ may bond together to form a ring with the sulfur atom to which they are attached. Preferred examples of the ring include the following structures.

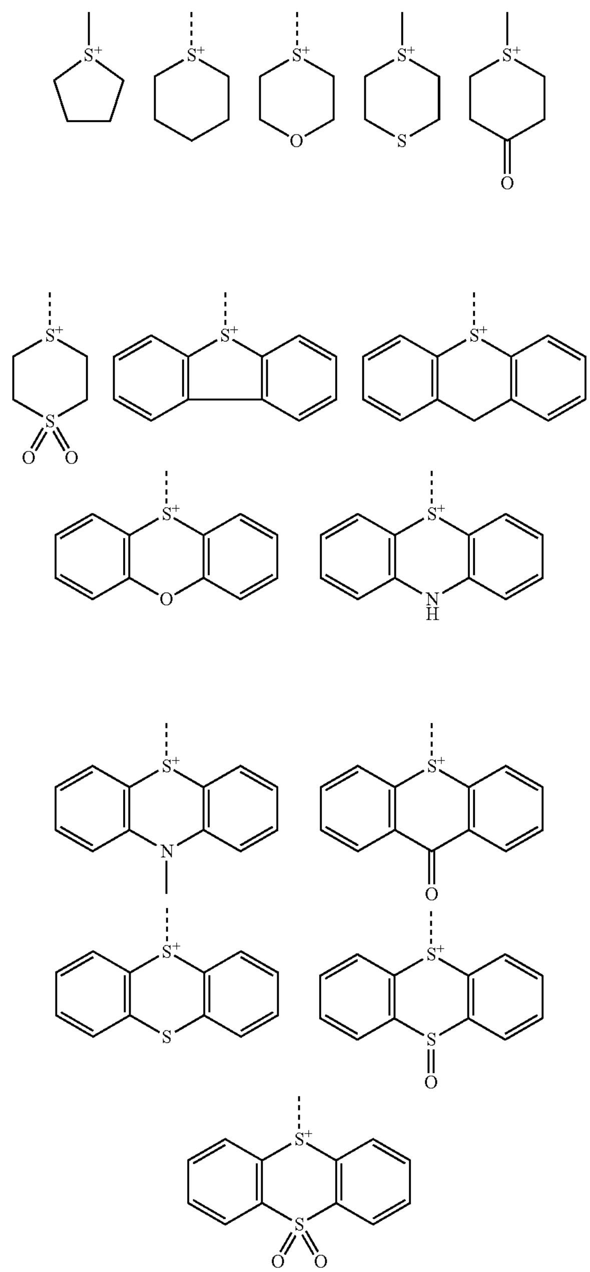

Herein the broken line denotes a point of attachment to $R^{103}$.

Examples of the cation of the sulfonium salt having formula (1-1) are shown below, but not limited thereto.

-continued
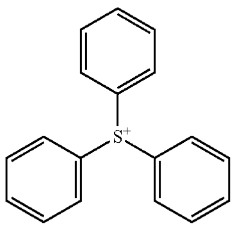
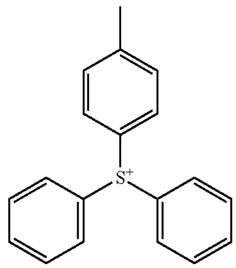
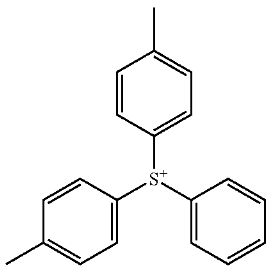
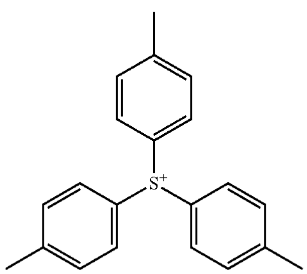
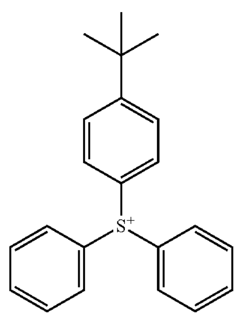
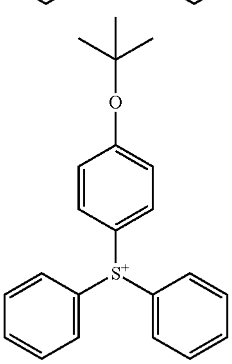
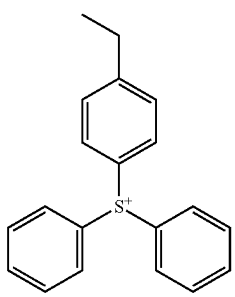
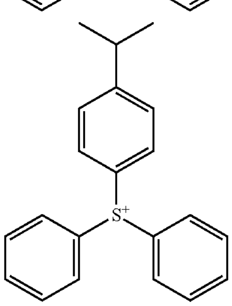
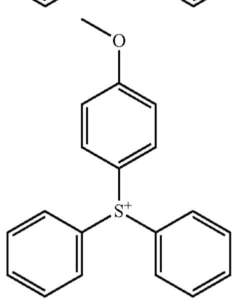
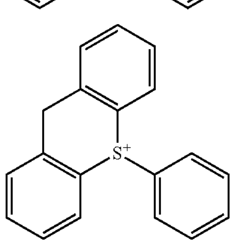
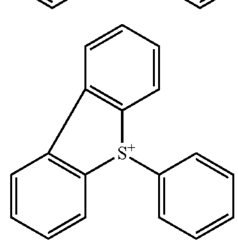
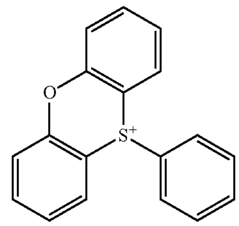
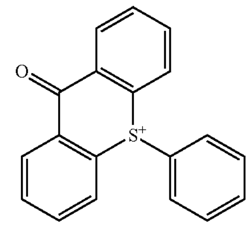
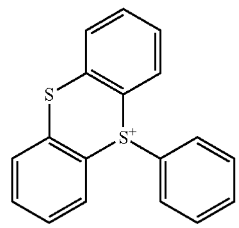
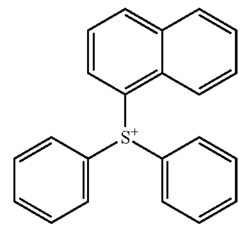
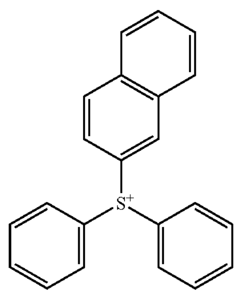
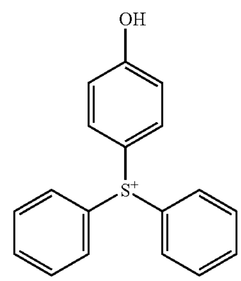
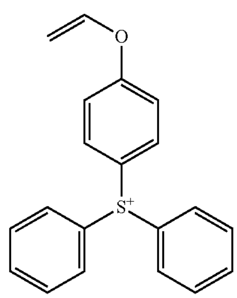
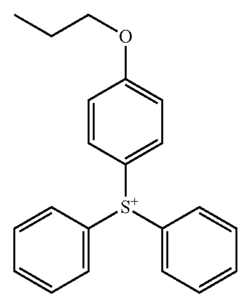
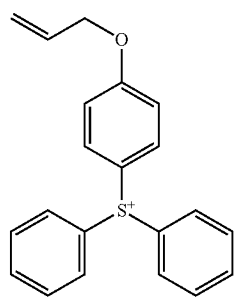
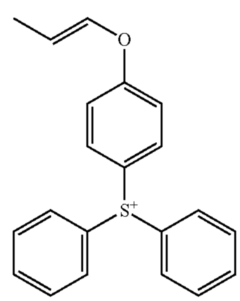
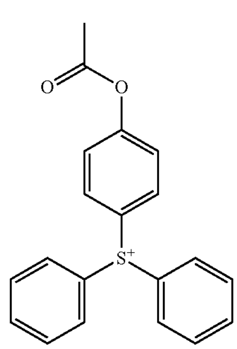
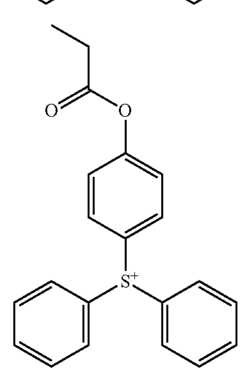

-continued
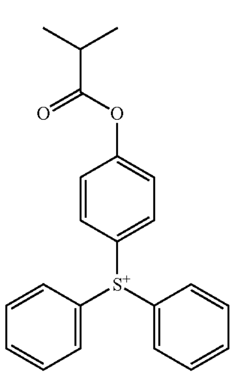
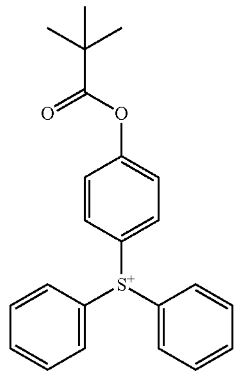
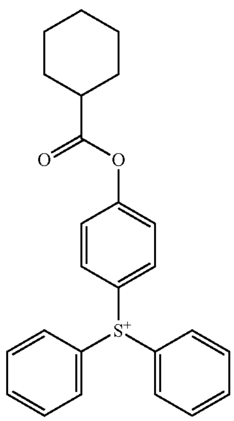
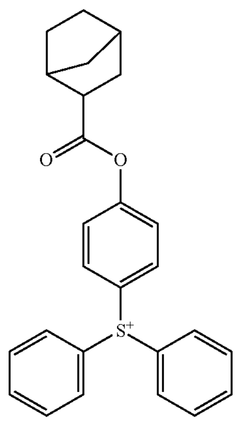
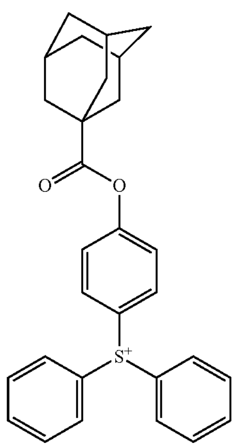
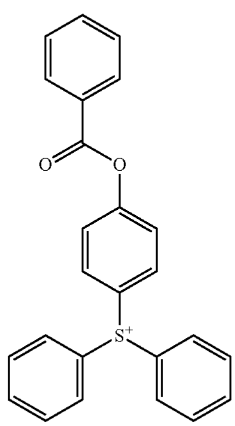
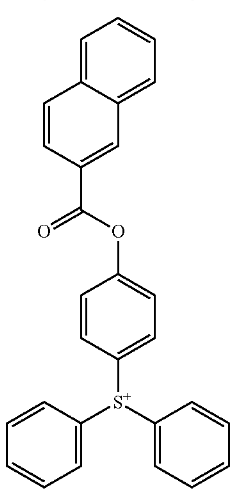
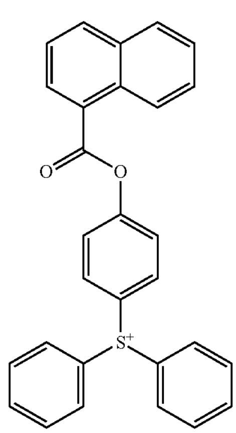
-continued
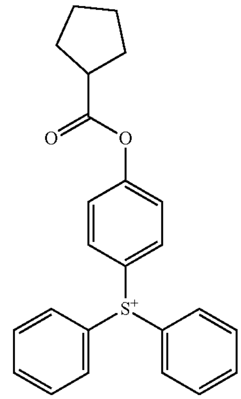
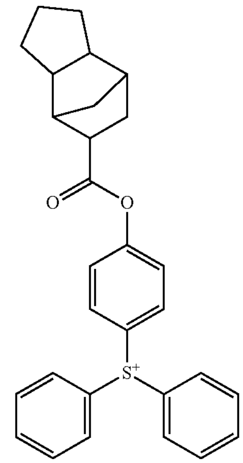
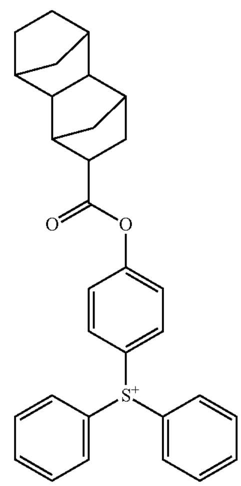
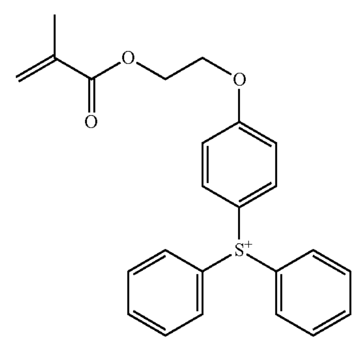
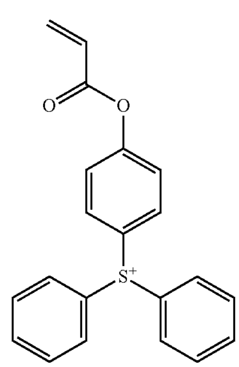
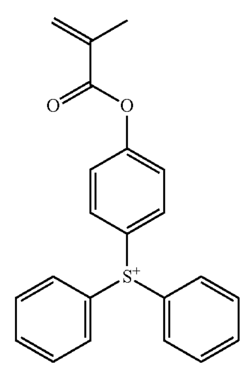

-continued
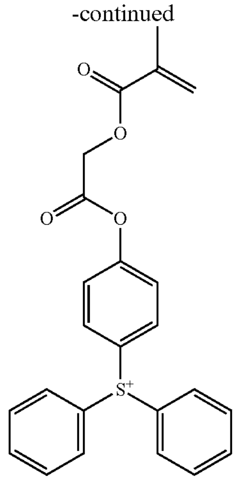
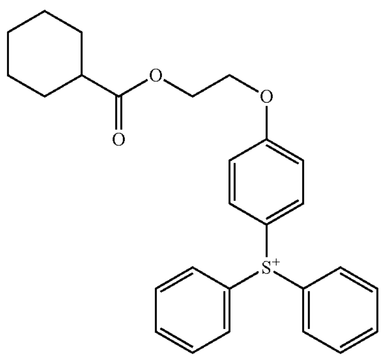
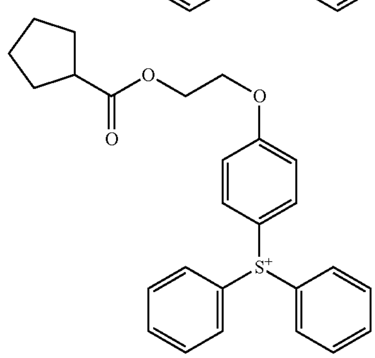
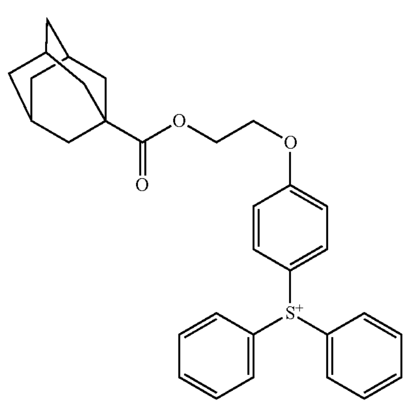
-continued
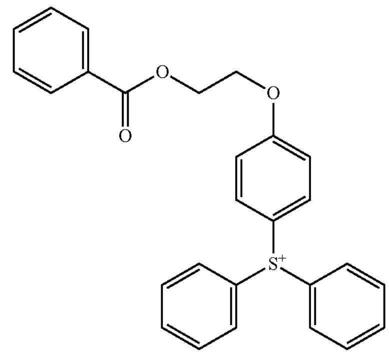
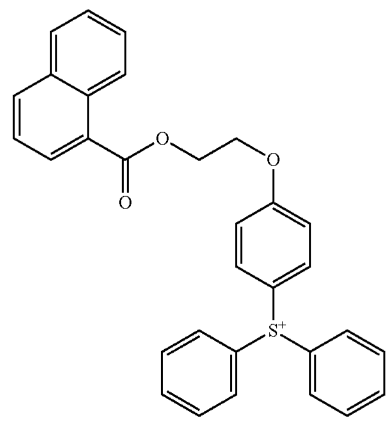
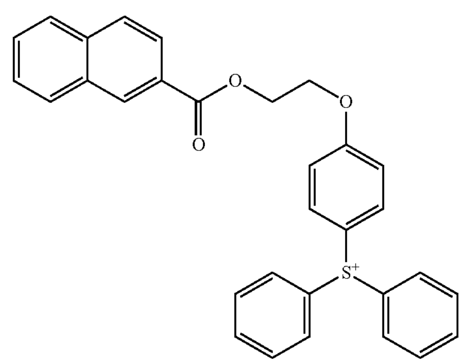
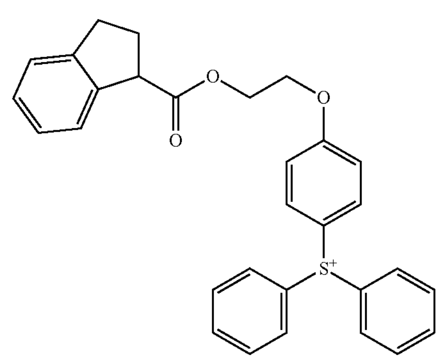

-continued
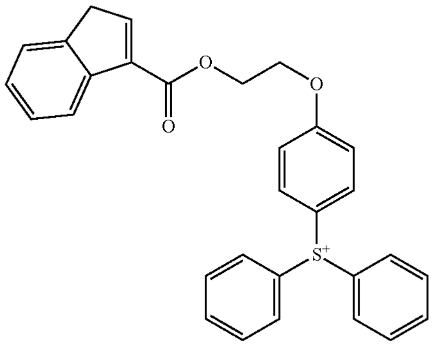
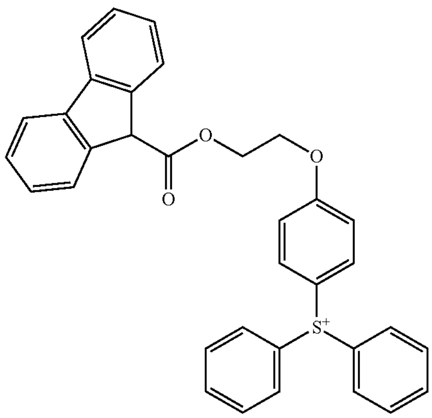
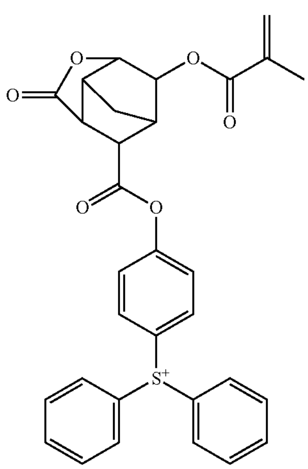
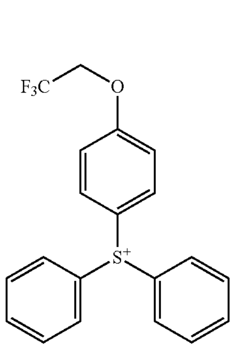
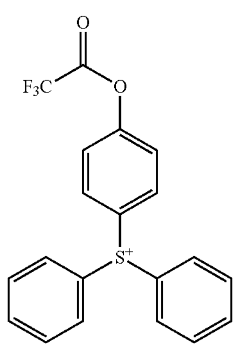
-continued
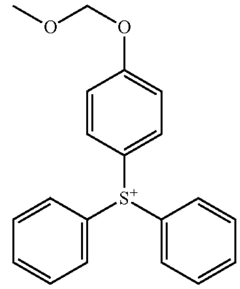
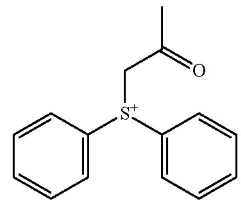
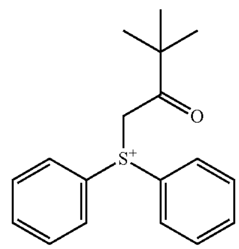
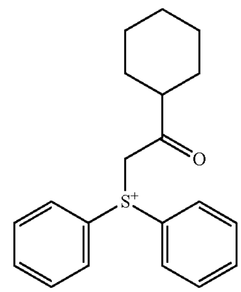
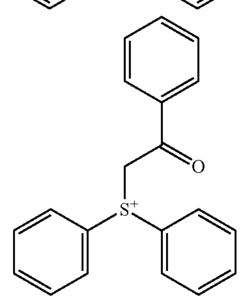
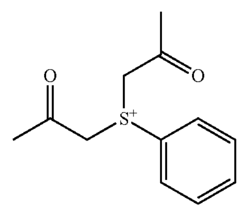
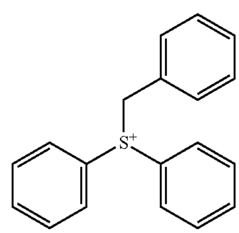
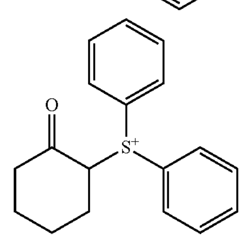
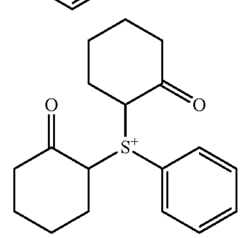
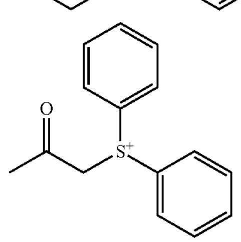
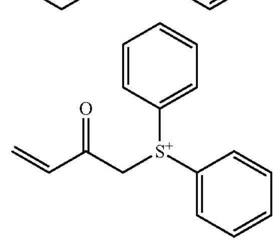

-continued
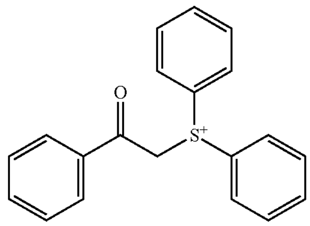
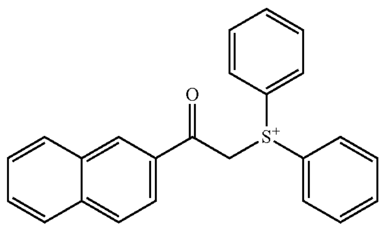
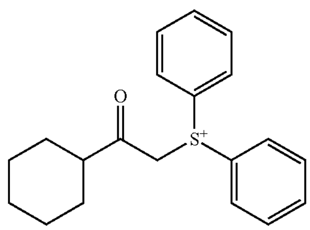
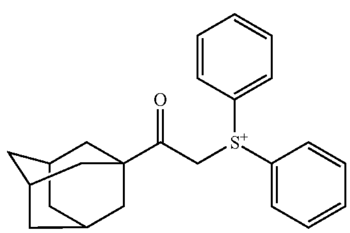
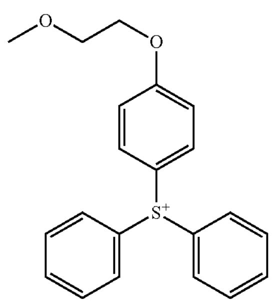
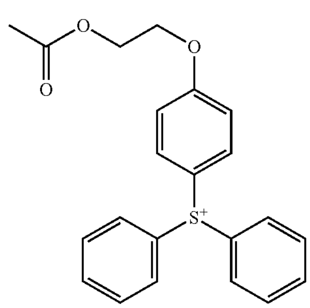
-continued
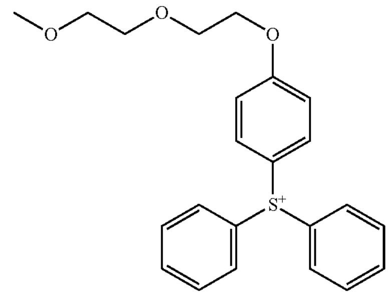
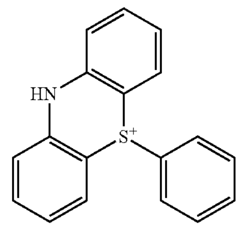
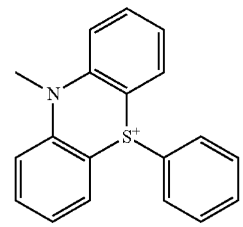
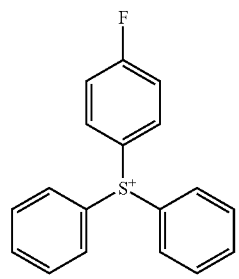
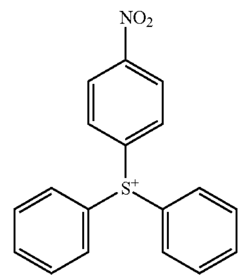
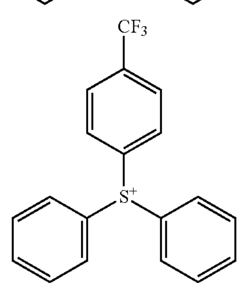
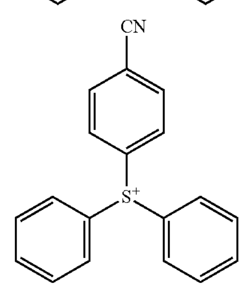
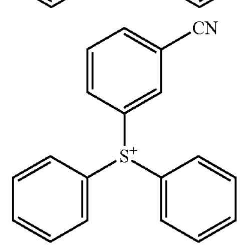
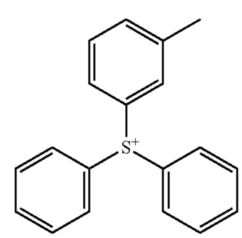
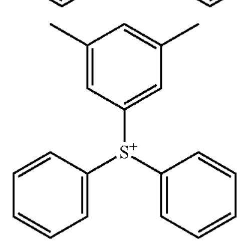
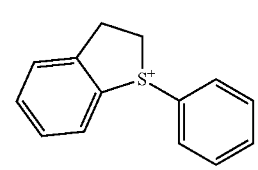
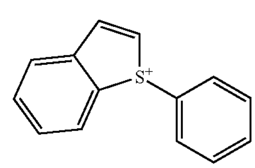
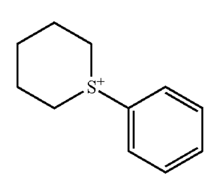

-continued
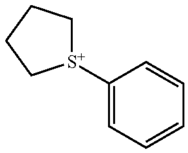
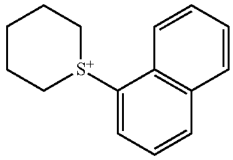
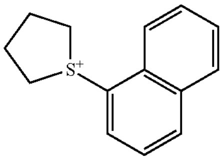
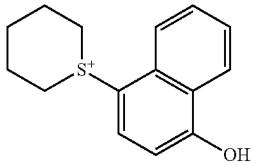
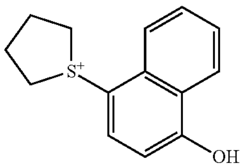
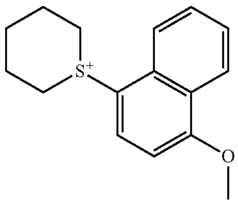
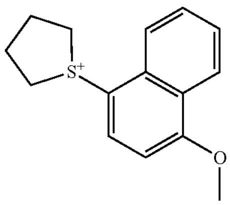
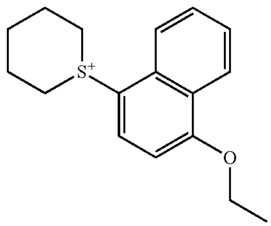
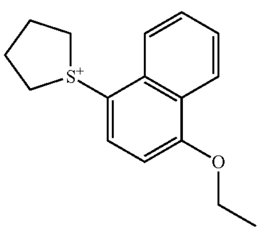
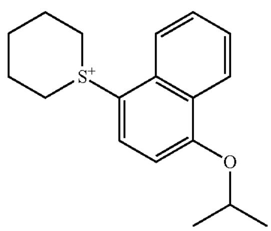
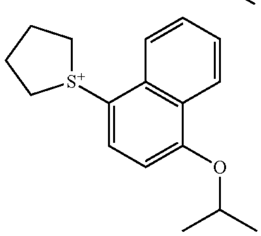
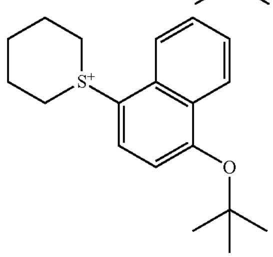
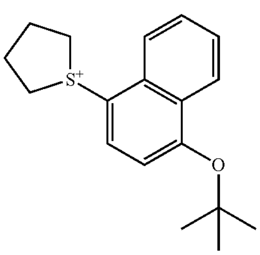
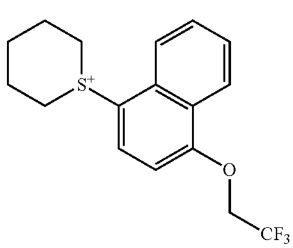
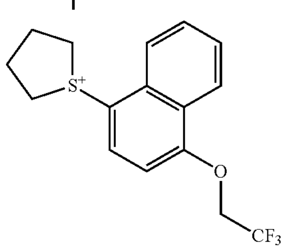
-continued
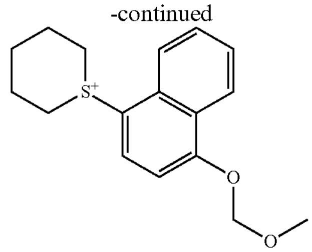
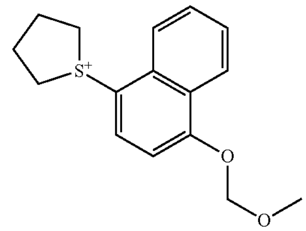
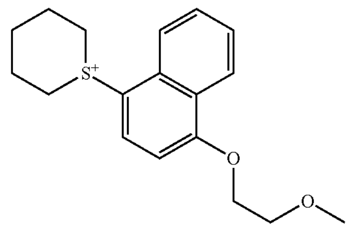
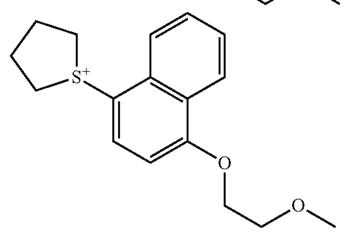
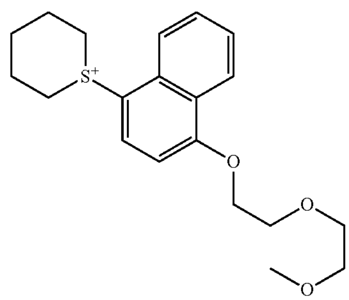
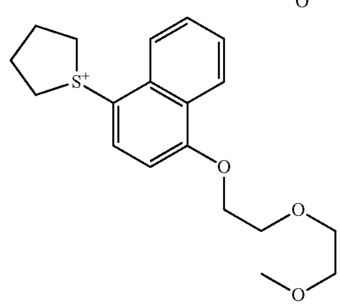
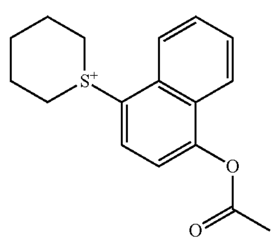
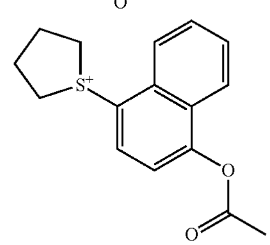

-continued
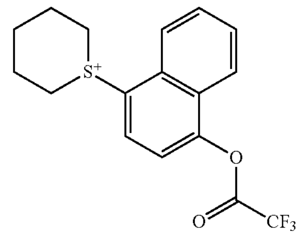
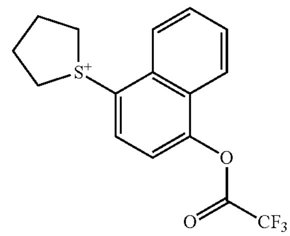
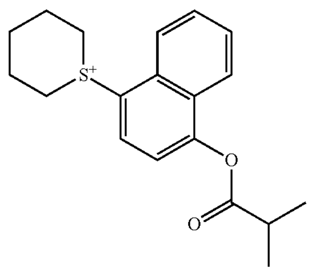
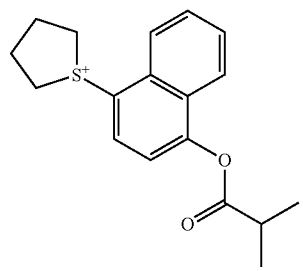
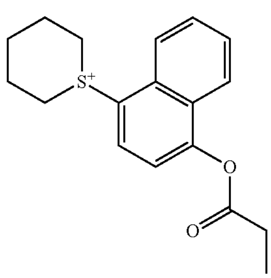
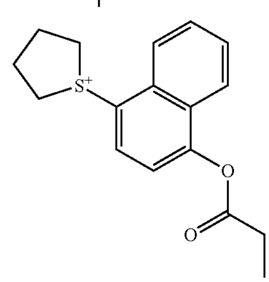
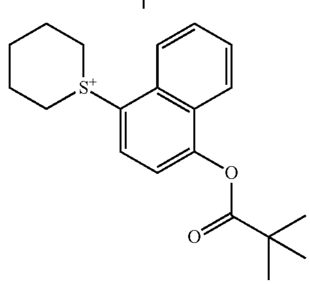
-continued
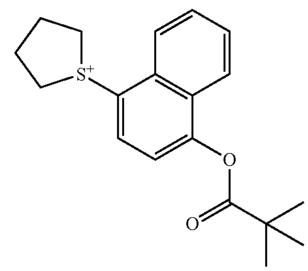
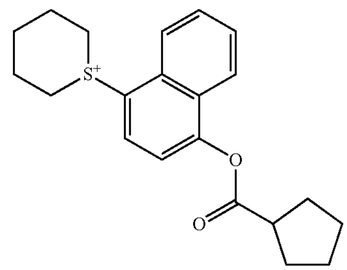
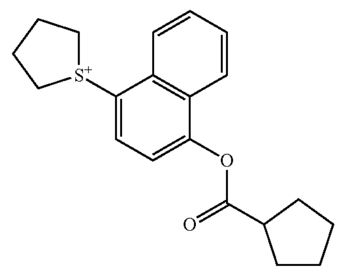
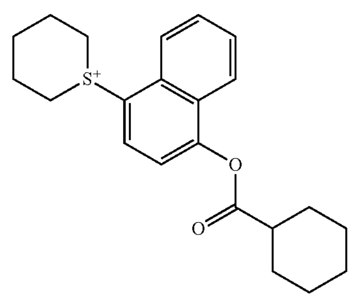
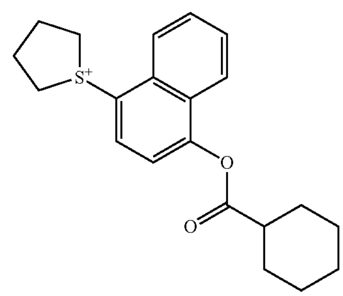
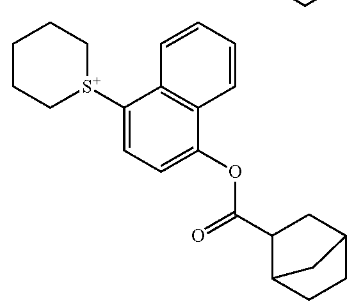

-continued
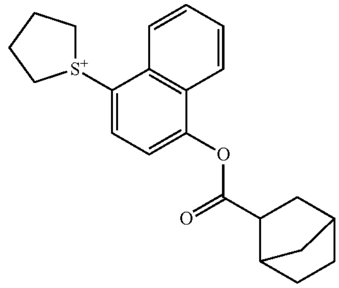
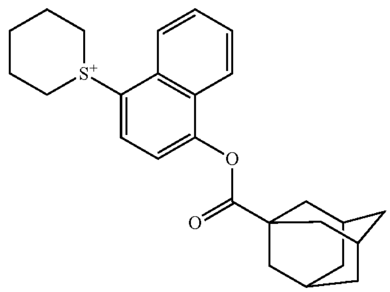
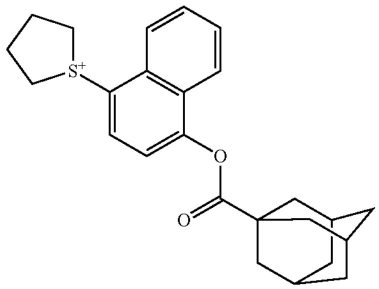
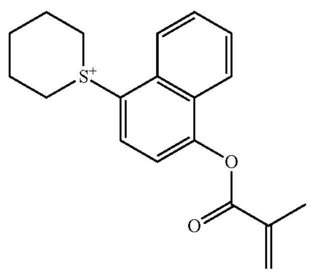
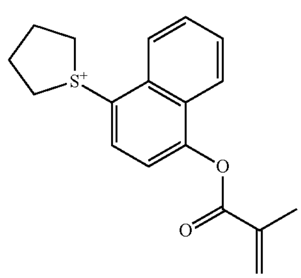
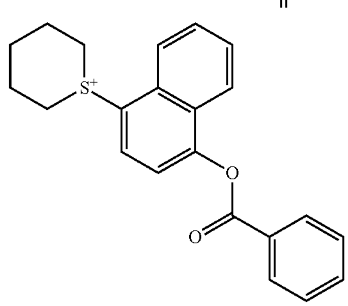
-continued
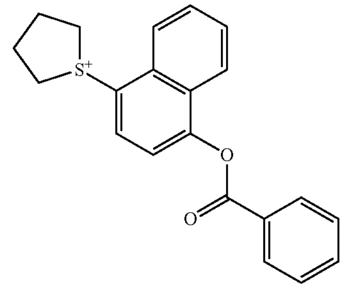
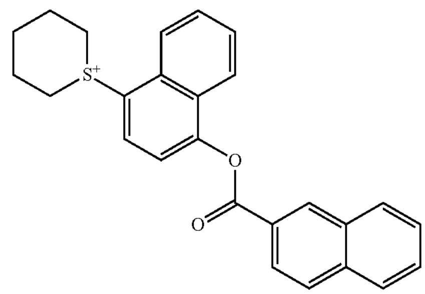
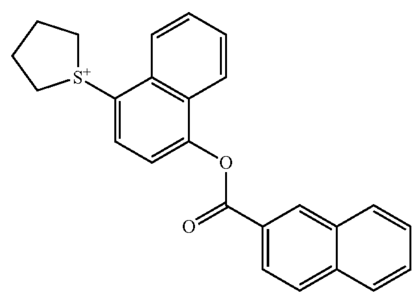
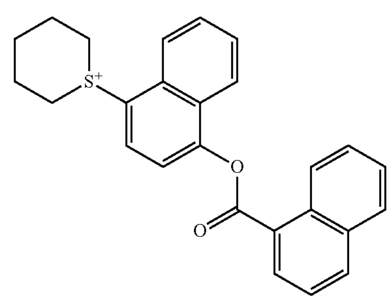
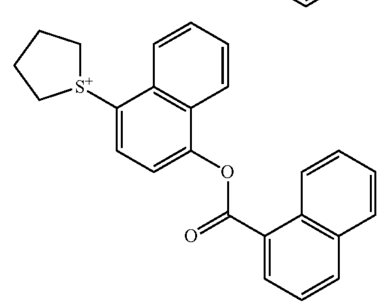

-continued
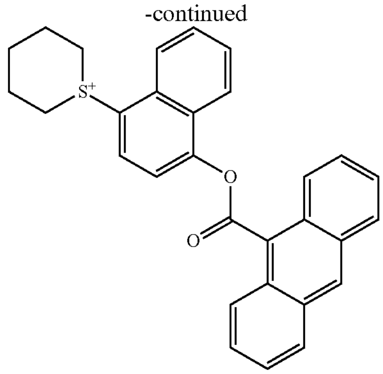
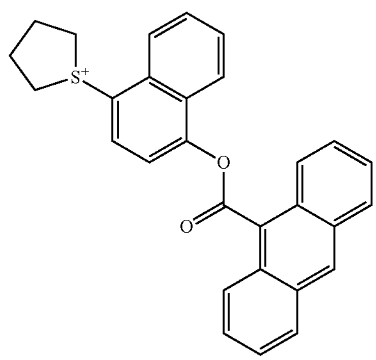
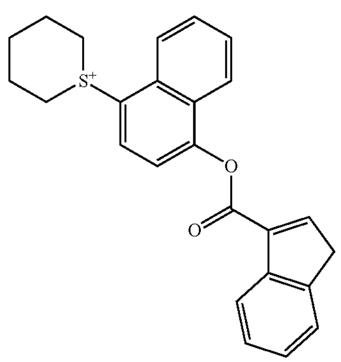
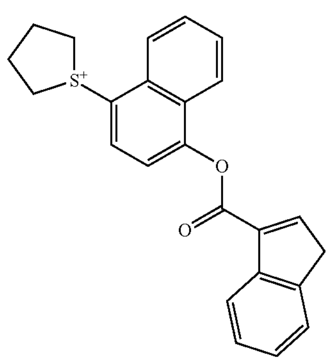
-continued
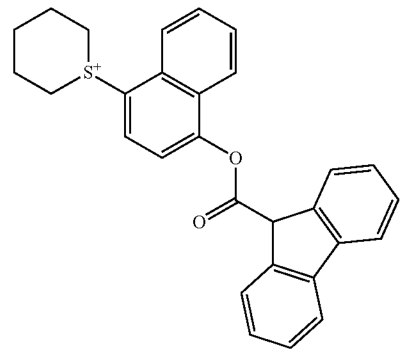
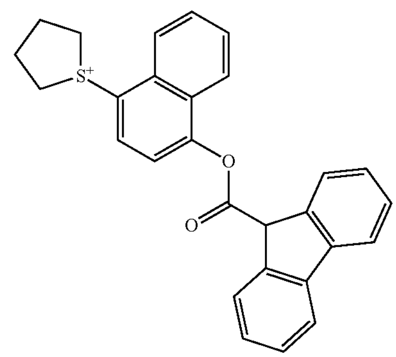
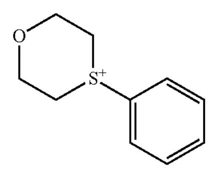
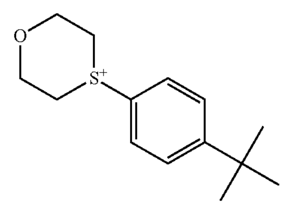
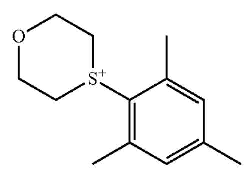
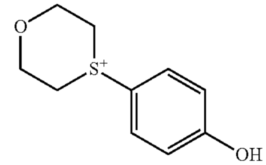
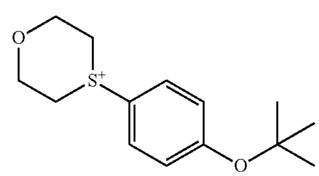
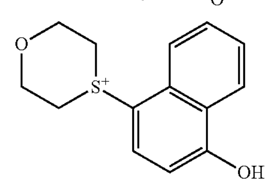
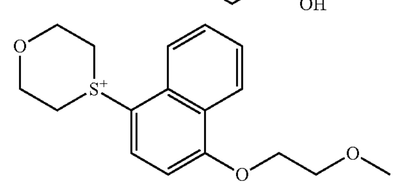

-continued
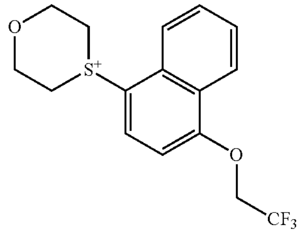
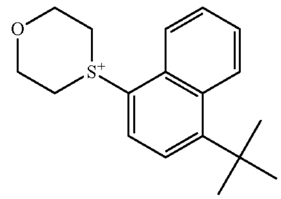
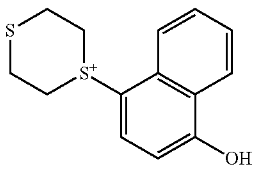
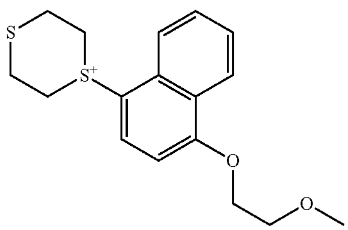
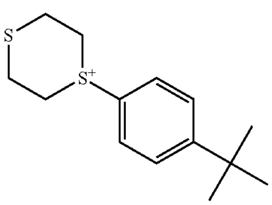
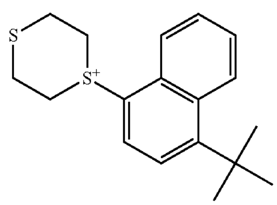
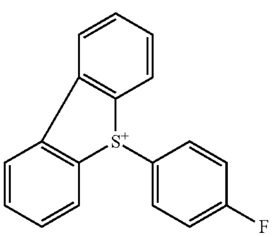
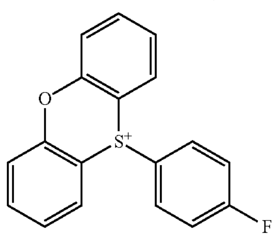
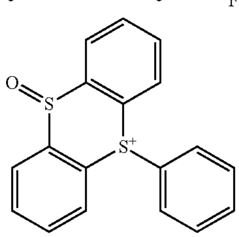
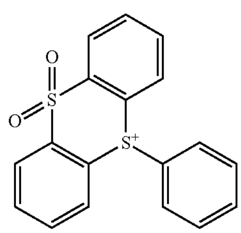
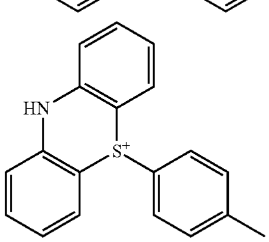
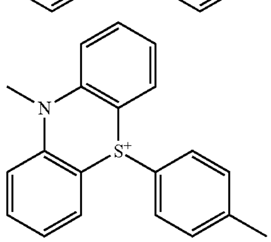
-continued
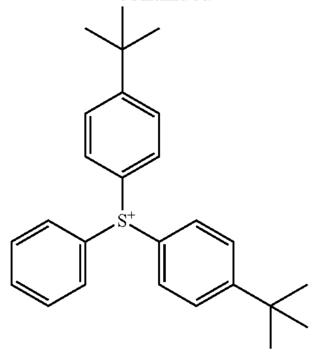
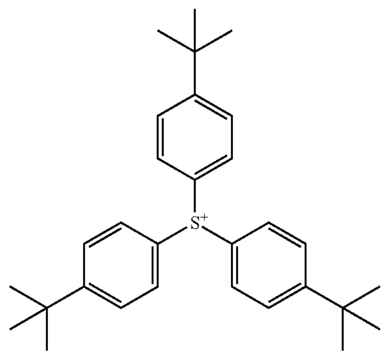
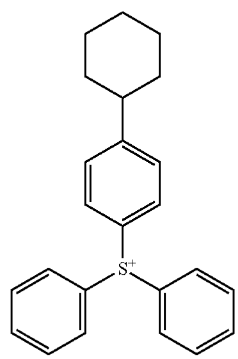
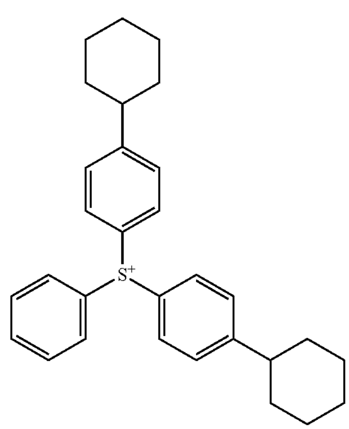

-continued
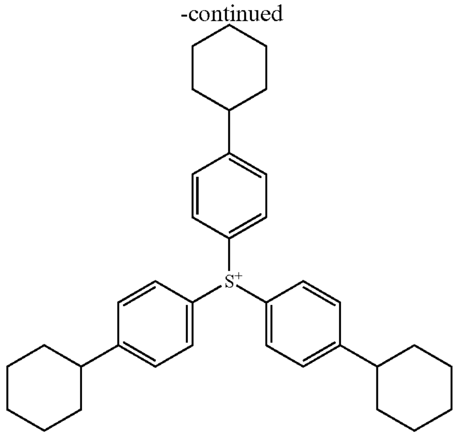
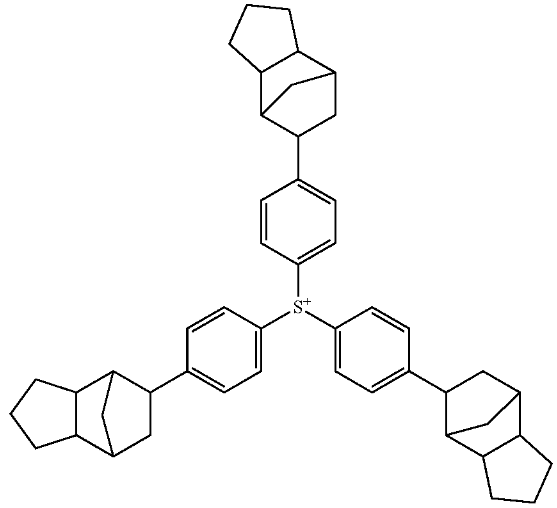
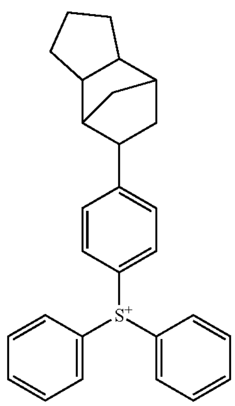
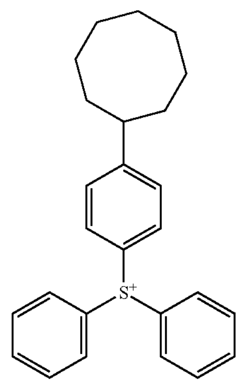
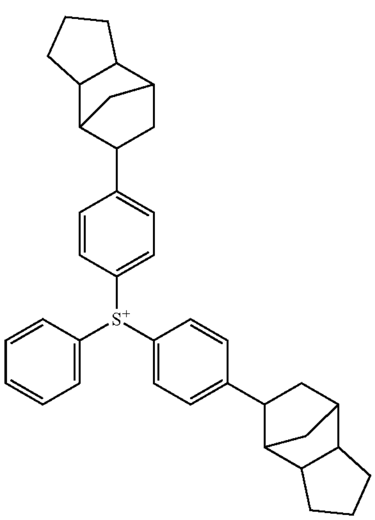
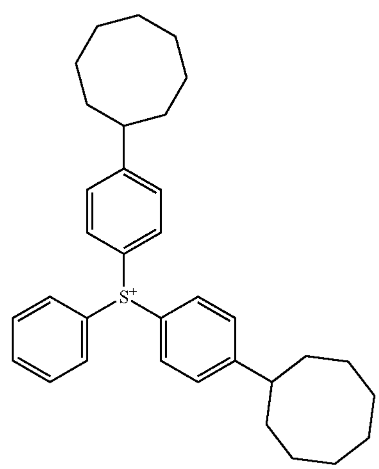

-continued
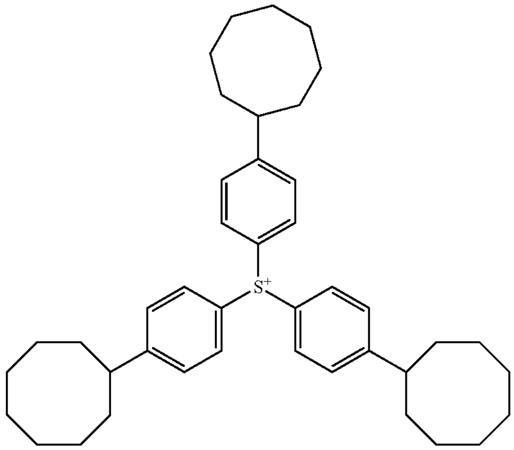
-continued
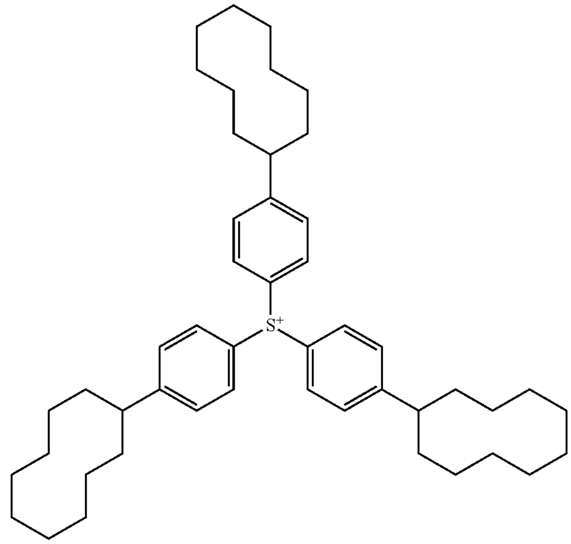
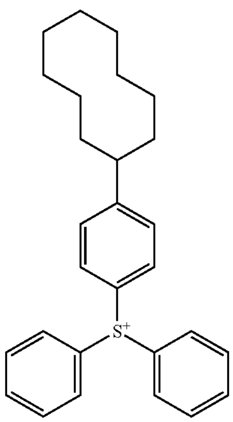
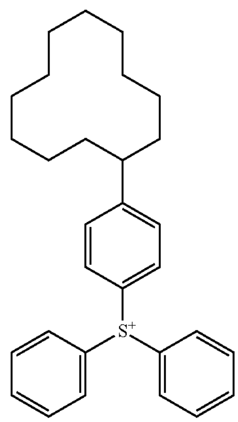
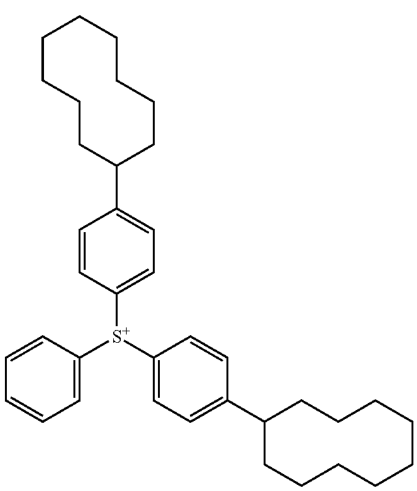
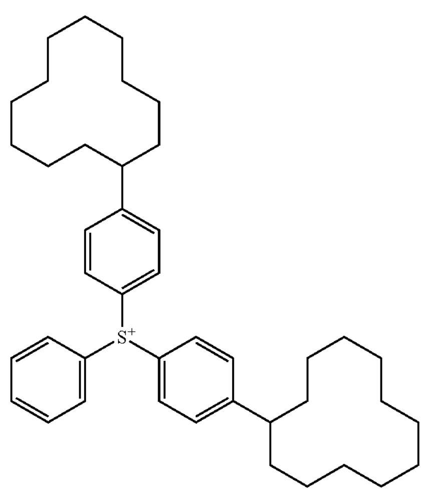

-continued
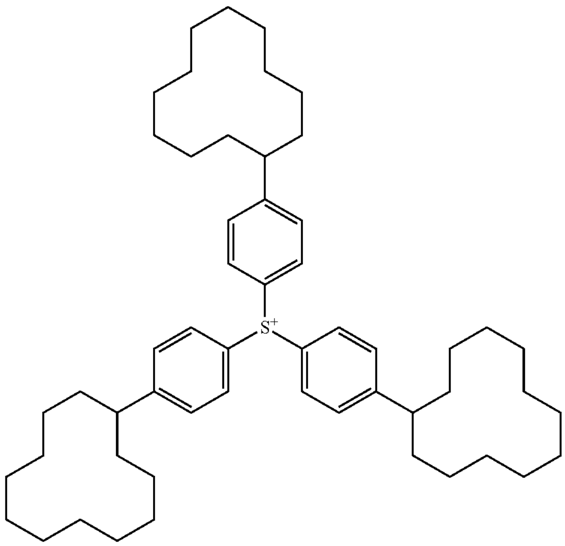
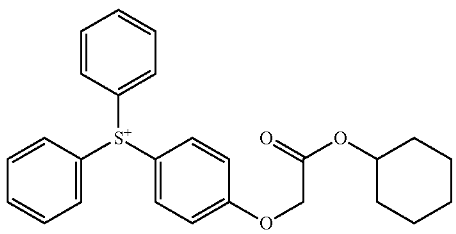
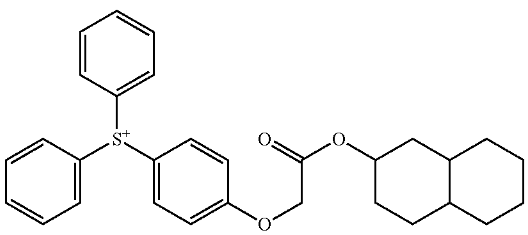
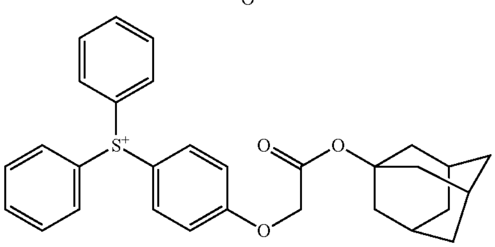
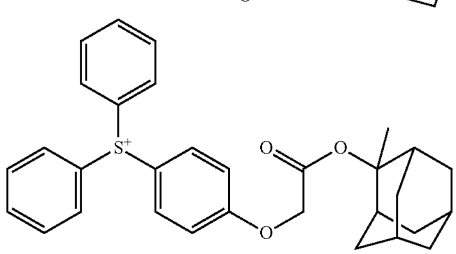
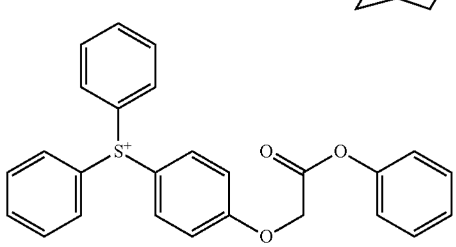
-continued
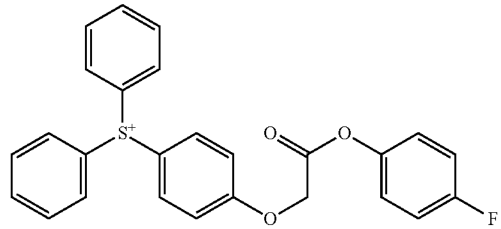
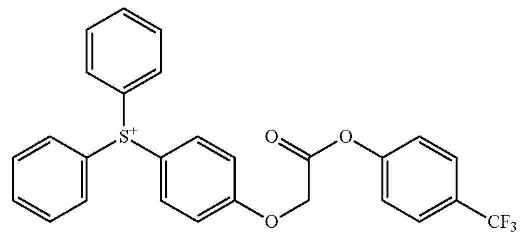
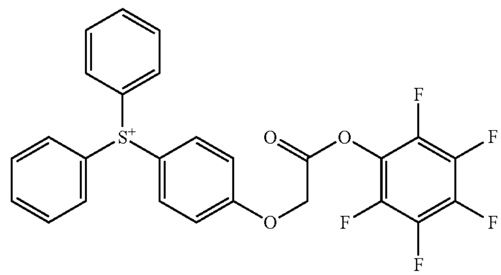
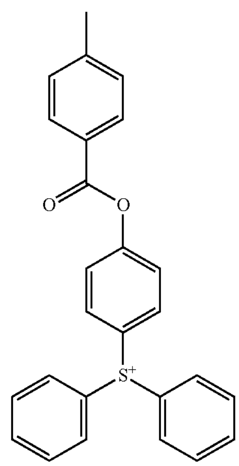
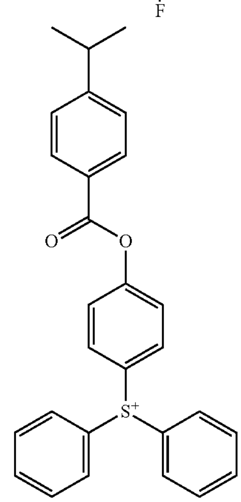
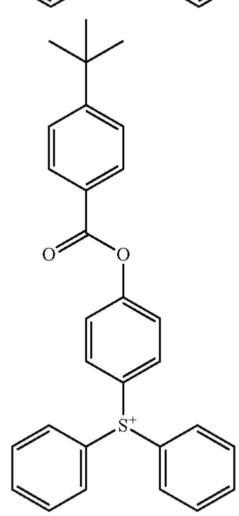
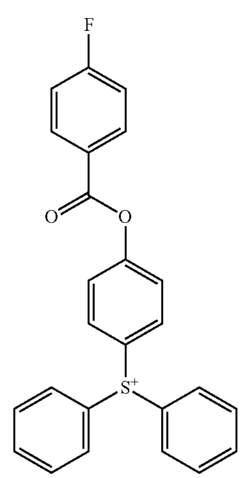

-continued
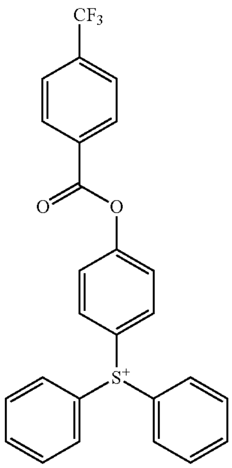
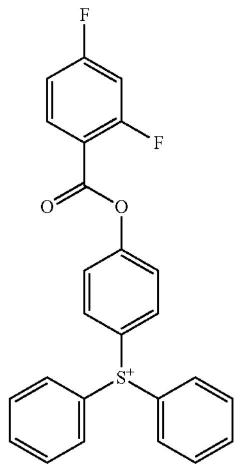
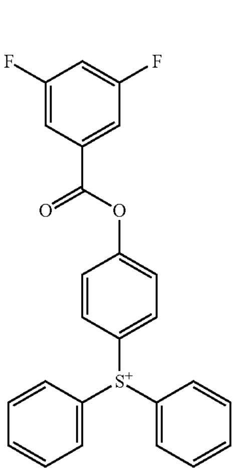
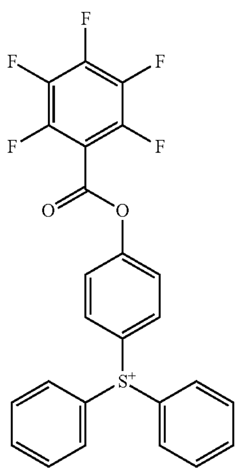
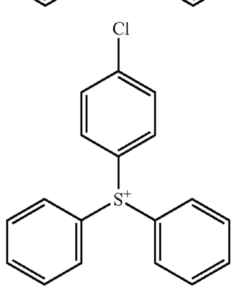
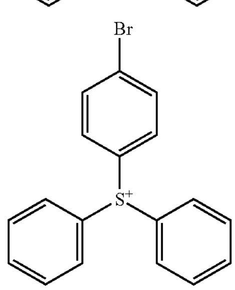
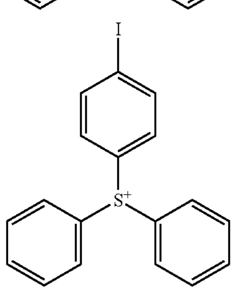
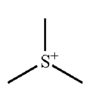
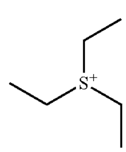
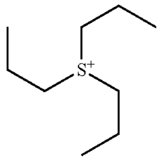
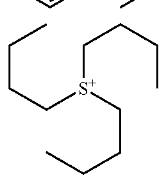
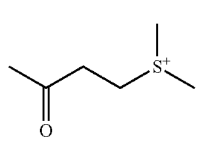
-continued
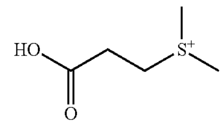
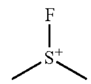
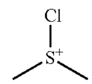
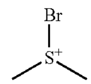
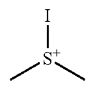
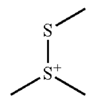
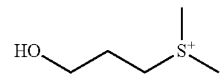
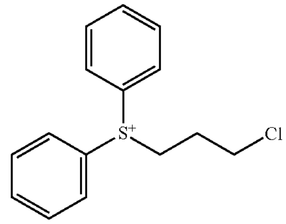
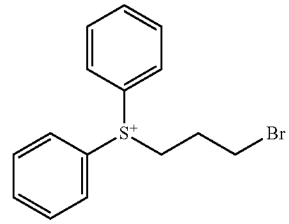
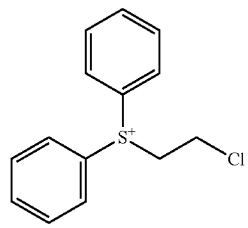
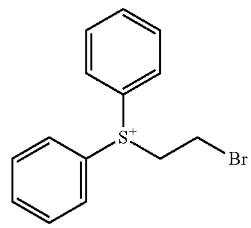
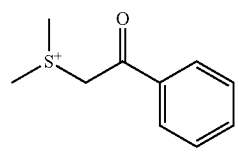
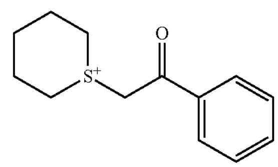
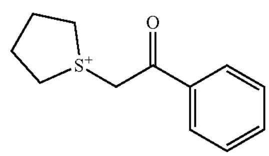
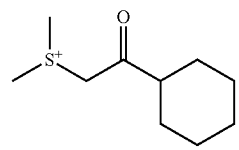
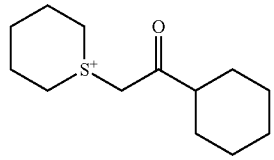
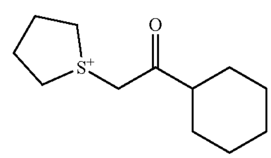
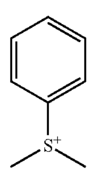
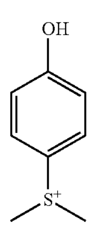
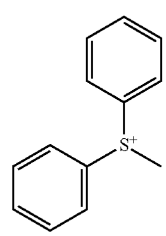
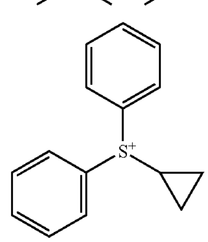
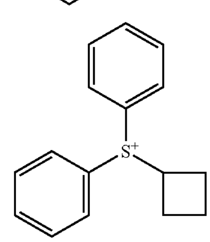

-continued
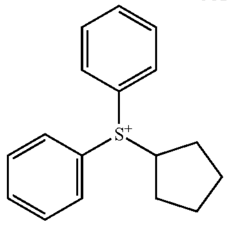
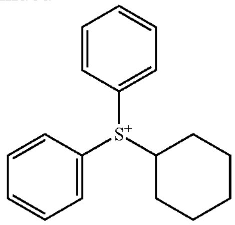
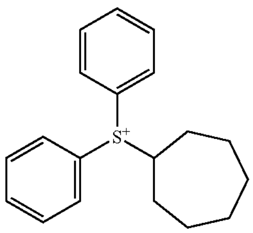
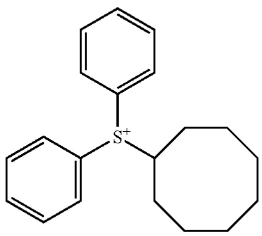
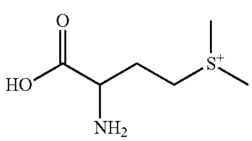
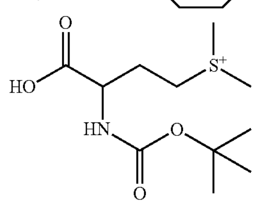
Examples of the cation of the iodonium salt having formula (1-2) are shown below, but not limited thereto.
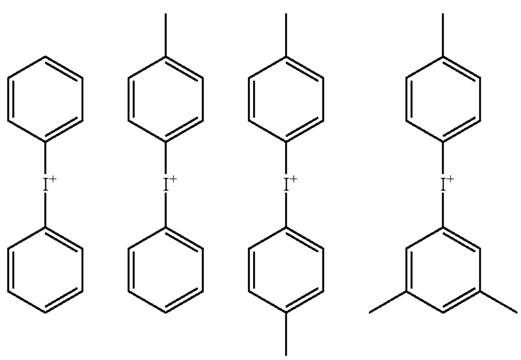
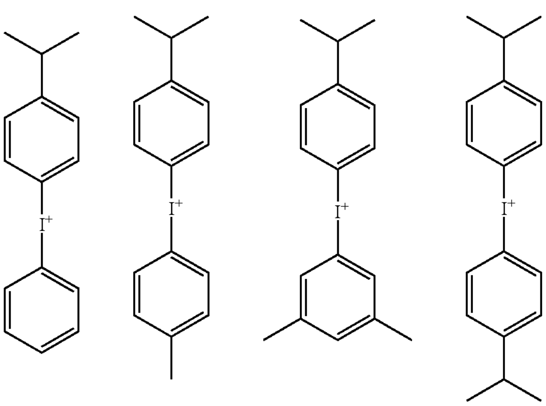
-continued
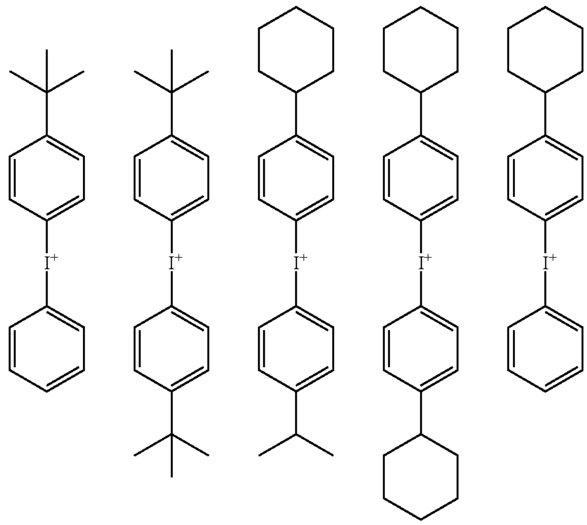
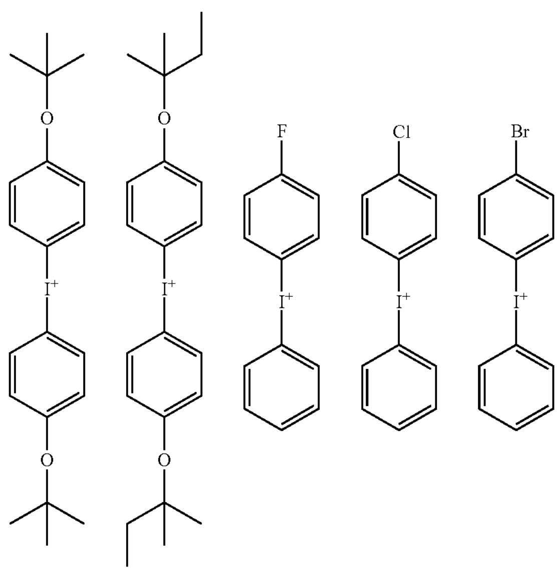
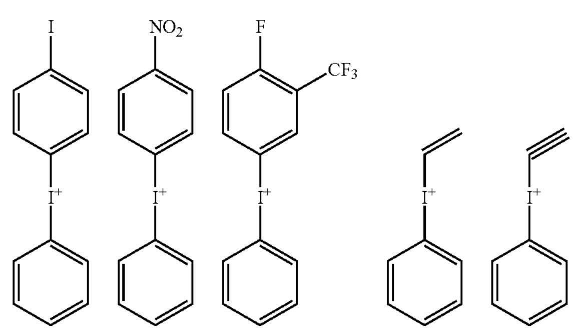

-continued

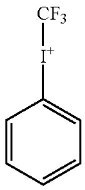

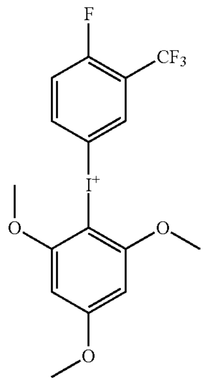

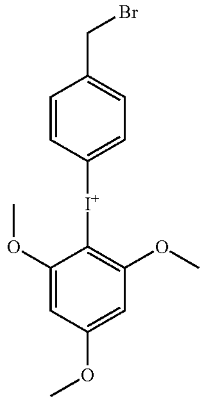

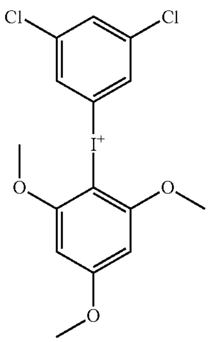

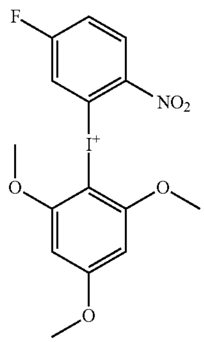

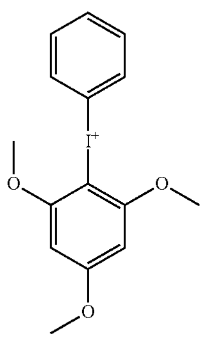

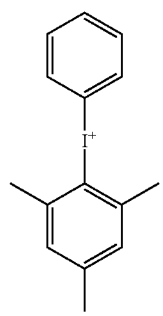

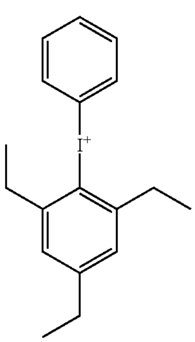

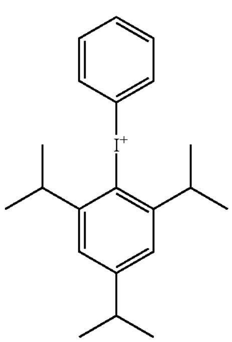

-continued

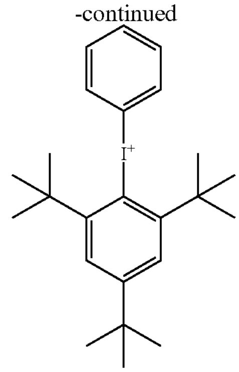

In formulae (1-1) and (1-2), Xa⁻ is an anion selected from the formulae (1A) to (1D).

$$R^{fa}—CF_2—SO_3^- \quad (1A)$$

$$(R^{fb1}—CF_2—SO_2)_2N^- \quad (1B)$$

$$R^{fc1}—CF_2—SO_2—C^-(SO_2—CF_2—R^{fc2})(SO_2—CF_2—R^{fc3}) \quad (1C)$$

$$R^{fd}—C(=O)—O—C(CF_3)_2—CH_2—SO_3^- \quad (1D)$$

In formula (1A), $R^{fa}$ is fluorine or a $C_1$-$C_{40}$ hydrocarbyl group which may contain a heteroatom. The hydrocarbyl group may be saturated or unsaturated and straight, branched or cyclic, and examples thereof are as will be exemplified below for the hydrocarbyl group $R^{111}$ in formula (1A').

Of the anions of formula (1A), a structure having formula (1A') is preferred.

(1A')

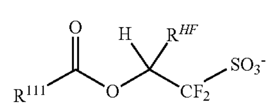

In formula (1A'), $R^{HF}$ is hydrogen or trifluoromethyl, preferably trifluoromethyl.

$R^{111}$ is a $C_1$-$C_{38}$ hydrocarbyl group which may contain a heteroatom. Suitable heteroatoms include oxygen, nitrogen, sulfur and halogen, with oxygen being preferred. Of the hydrocarbyl groups, those of 6 to 30 carbon atoms are preferred because a high resolution is available in fine pattern formation.

The hydrocarbyl group $R^{111}$ may be saturated or unsaturated and straight, branched or cyclic. Examples thereof include $C_1$-$C_{38}$ alkyl groups such as methyl, ethyl, propyl, isopropyl, butyl, isobutyl, sec-butyl, tert-butyl, pentyl, neopentyl, hexyl, heptyl, 2-ethylhexyl, nonyl, undecyl, tridecyl, pentadecyl, heptadecyl, icosanyl; $C_3$-$C_{38}$ cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl; $C_2$-$C_{38}$ unsaturated aliphatic hydrocarbyl groups such as allyl and 3-cyclohexenyl; $C_2$-$C_{38}$ aryl groups such as phenyl, 1-naphthyl and 2-naphthyl; $C_7$-$C_{38}$ aralkyl groups such as benzyl and diphenylmethyl; and groups obtained by combining the foregoing.

In the foregoing groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic anhydride or haloalkyl moiety. Examples of the heteroatom-containing hydrocarbyl group include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having an anion of formula (1A'), reference is made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (1A) are as exemplified for the anion having formula (1A) in US 20180335696 (JP-A 2018-197853).

In formula (IB), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic, and examples thereof are as exemplified above for the hydrocarbyl group $R^{111}$ in formula (1A'). Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage ($—CF_2—SO_2—N—SO_2—CF_2—$) to which they are attached, and preferably the pair is a fluorinated ethylene or fluorinated propylene group.

In formula (1C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic, and examples thereof are as exemplified above for the hydrocarbyl group $R^{111}$ in formula (1A'). Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage ($—CF_2—SO_2—C^-—SO_2—CF_2—$) to which they are attached, and preferably the pair is a fluorinated ethylene or fluorinated propylene group.

In formula (1D), $R^{fd}$ is a $C_1$-$C_{40}$ hydrocarbyl group which may contain a heteroatom. The hydrocarbyl group may be saturated or unsaturated and straight, branched or cyclic, and examples thereof are as exemplified above for the hydrocarbyl group $R^{111}$ in formula (1A').

With respect to the synthesis of the sulfonium salt having an anion of formula (1D), reference is made to JP-A 2010-215608 and JP-A 2014-133723.

Examples of the anion having formula (1D) are as exemplified for the anion having formula (1D) in US 20180335696 (JP-A 2018-197853).

The compound having the anion of formula (1D) has a sufficient acid strength to cleave acid labile groups in the base polymer because it is free of fluorine at α-position of sulfo group, but has two trifluoromethyl groups at β-position. Thus the compound is a useful PAG.

A compound having the formula (2) is also a useful PAG.

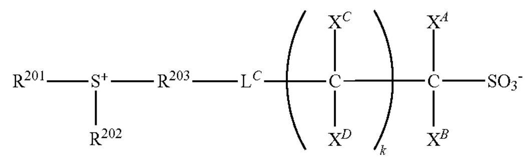

(2)

In formula (2), $R^{201}$ and $R^{202}$ are each independently a halogen atom or a $C_1$-$C_{30}$ hydrocarbyl group which may contain a heteroatom. $R^{203}$ is a $C_1$-$C_{30}$ hydrocarbylene group which may contain a heteroatom. Any two of $R^{201}$, $R^{202}$ and $R^{203}$ may bond together to form a ring with the sulfur atom to which they are attached. Examples of the ring are as exemplified above for the ring that $R^{101}$ and $R^{102}$ in formula (1-1), taken together, form with the sulfur atom to which they are attached.

The hydrocarbyl group represented by $R^{201}$ and $R^{202}$ may be saturated or unsaturated and straight, branched or cyclic. Examples thereof include $C_1$-$C_{30}$ alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, and n-decyl; $C_3$-$C_{30}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, and adamantyl; $C_6$-$C_{30}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl and anthracenyl; and groups obtained by combining the foregoing. Also included are substituted forms of the foregoing groups in which SOUK or all of the hydrogen atoms are substituted by a moiety containing a heteroatom such as oxygen, sulfur, nitrogen or halogen, and some carbon is replaced by a moiety containing a heteroatom such as oxygen, sulfur or nitrogen, so that the group may contain a hydroxyl moiety, cyano moiety, carbonyl moiety, ether bond, ester bond, sulfonate bond, carbonate bond, lactone ring, sultone ring, carboxylic anhydride or haloalkyl moiety.

The hydrocarbylene group represented by $R^{203}$ may be saturated or unsaturated and straight, branched or cyclic. Examples thereof include $C_1$-$C_{30}$ alkanediyl groups such as methanediyl, ethane-1,1-diyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15- diyl, hexadecane-1,16-diyl and heptadecane-1,17-diyl; $C_3$-$C_{30}$ cyclic saturated hydrocarbylene groups such as cyclopentanediyl, cyclohexanediyl, norbomanediyl and adamantanediyl; $C_6$-$C_{30}$ arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene, and tert-butylnaphthylene; and groups obtained by combining the foregoing groups. Also included are substituted forms of the foregoing groups in which some or all of the hydrogen atoms are substituted by a moiety containing a heteroatom such as oxygen, sulfur, nitrogen or halogen, and some carbon is replaced by a moiety containing a heteroatom such as oxygen, sulfur or nitrogen, so that the group may contain a hydroxyl moiety, cyano moiety, carbonyl moiety, ether bond, ester bond, sulfonate bond, carbonate bond, lactone ring, sultone ring, carboxylic anhydride or haloalkyl moiety. The preferred heteroatom is oxygen.

In formula (2), $L^C$ is a single bond, ether bond or a $C_1$-$C_{20}$ hydrocarbylene group which may contain a heteroatom. The hydrocarbylene group may be saturated or unsaturated and straight, branched or cyclic. Examples thereof are as exemplified above for the hydrocarbylene group $R^{203}$.

In formula (2), $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

Of the PAGs having formula (2), those having formula (2') are preferred.

(2')

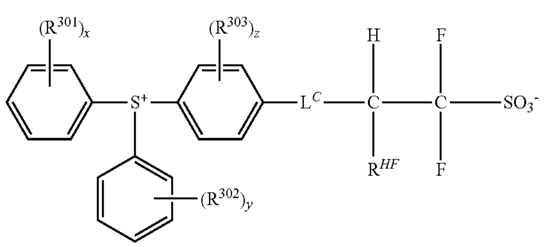

In formula (2'), $L^C$ is as defined above. $R^{HF}$ is hydrogen or trifluoromethyl, preferably trifluoromethyl. $R^{301}$, $R^{302}$ and $R^{303}$ are each independently hydrogen or a $C_1$-$C_{20}$ hydrocarbyl group which may contain a heteroatom. The hydrocarbyl group may be saturated or unsaturated and straight, branched or cyclic. Examples thereof are as exemplified above for the hydrocarbyl group $R^{111}$ in formula (1A'). The subscripts x and y each are an integer of 0 to 5, and z is an integer of 0 to 4.

Examples of the PAG having formula (2) are as described for the PAG of formula (2) in U.S. Pat. No. 9,720,324 (JP-A 2017-026980).

Of the foregoing PAGs, those compounds having an anion of formula (1A') or (1D) are especially preferred because of reduced acid diffusion and high solubility in solvent, and those compounds having an anion of formula (2') are especially preferred because of minimized acid diffusion.

Also sulfonium and iodonium salts having an anion containing an iodized or brominated aromatic ring are useful PAGs. These salts typically have the formulae (3-1) and (3-2).

(3-1)

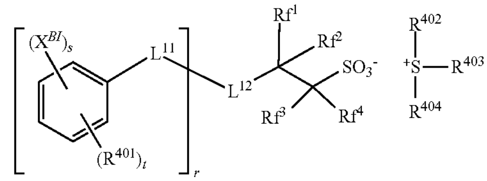

(3-2)

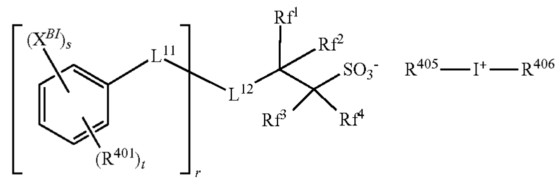

In formulae (3-1) and (3-2), r is an integer of 1 to 3; s is an integer of 1 to 5, and t is an integer of 0 to 3, meeting $1 \le s+t \le 5$. Preferably, s is an integer of 1 to 3, more preferably 2 or 3, and t is an integer of 0 to 2.

$X^{BI}$ is iodine or bromine, and groups $X^{BI}$ may be identical or different when s is 2 or more.

$L^{11}$ is a single bond, ether bond, ester bond, or a $C_1$-$C_6$ saturated hydrocarbylene group which may contain an ether bond or ester bond. The saturated hydrocarbylene group may be straight, branched or cyclic.

$L^{12}$ is a single bond or $C_1$-$C_{20}$ divalent linking group in case of r=1, and a $C_1$-$C_{20}$ (r+1)-valent linking group in case of r=2 or 3. The linking group may contain oxygen, sulfur or nitrogen.

$R^{401}$ is hydroxyl, carboxyl, fluorine, chlorine, bromine, amino or a $C_1$-$C_{20}$ saturated hydrocarbyl group, $C_1$-$C_{20}$ saturated hydrocarbyloxy group, $C_2$-$C_{20}$ saturated hydrocarbylcarbonyl, $C_2$-$C_{20}$ saturated hydrocarbyloxycarbonyl group, $C_2$-$C_{20}$ saturated hydrocarbylcarbonyloxy group, or $C_1$-$C_{20}$ saturated hydrocarbylsulfonyloxy group, which may contain fluorine, chlorine, bromine, hydroxyl, amino or ether bond, or —N($R^{401A}$)($R^{401B}$), —N($R^{401C}$)—C(═O)—$R^{401D}$ or —N($R^{401C}$)—C(═O)—O—$R^{401D}$. $R^{401A}$ and $R^{401B}$ are each independently hydrogen or a $C_1$-$C_6$ saturated hydrocarbyl group. $R^{401C}$ is hydrogen or a $C_1$-$C_6$ saturated hydrocarbyl group which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. $R^{401D}$ is a $C_1$-$C_{16}$ aliphatic hydrocarbyl group, $C_6$-$C_{14}$ aryl group or $C_7$-$C_{15}$ aralkyl group, which may contain halogen, hydroxyl, a $C_1$-$C_6$ saturated hydrocarbyloxy, $C_2$-$C_6$ saturated hydrocarbylcarbonyl or $C_2$-$C_6$ saturated hydrocarbylcarbonyloxy moiety. The aliphatic hydrocarbyl group may be saturated or unsaturated and straight, branched or cyclic. The saturated hydrocarbyl, saturated hydrocarbyloxy, saturated hydrocarbyloxycarbonyl, saturated hydrocarbylcarbonyl and saturated hydrocarbylcarbonyloxy groups may be straight, branched or cyclic. Groups $R^{401}$ may be identical or different when r and/or t is 2 or 3. Inter alia, $R^{401}$ is preferably selected from hydroxyl, —N($R^{401C}$)—C(═O)—$R^{401D}$, —N($R^{401C}$)—C(═O)—O—$R^{401D}$, fluorine, chlorine, bromine, methyl, and methoxy.

$Rf^1$ to $Rf^4$ are each independently hydrogen, fluorine or trifluoromethyl, at least one thereof being fluorine or trifluoromethyl. Also $Rf^1$ and $Rf^2$, taken together, may form a carbonyl group. Most preferably both $Rf^3$ and $Rf^4$ are fluorine.

$R^{402}$ to $R^{406}$ are each independently halogen or a $C_1$-$C_{20}$ hydrocarbyl group which may contain a heteroatom. The hydrocarbyl group may be saturated or unsaturated and straight, branched or cyclic. Examples thereof are as exemplified above for the hydrocarbyl groups $R^{101}$ to $R^{105}$ in formulae (1-1) and (1-2). In these groups, some or all hydrogen may be substituted by hydroxyl, carboxyl, halogen, cyano, nitro, mercapto, sultone, sulfone, or sulfonium salt-containing moiety; or some carbon may be replaced by an ether bond, ester bond, carbonyl, amide, carbonate or sulfonic acid ester bond. $R^{402}$ and $R^{403}$ may bond together to form a ring with the sulfur atom to which they are attached. Examples of the ring are as exemplified above for the ring that $R^{101}$ and $R^{102}$ in formula (1-1), taken together, form with the sulfur atom to which they are attached.

The cation in the sulfonium salt having formula (3-1) is as exemplified above for the cation in the sulfonium salt having formula (1-1). The cation in the iodonium salt having formula (3-2) is as exemplified above for the cation in the iodonium salt having formula (1-2).

Examples of the anion in the onium salts having formulae (3-1) and (3-2) are given below, but not limited thereto. Herein $X^{BI}$ is as defined above.

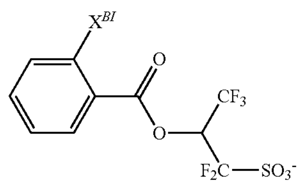

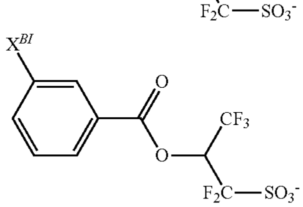

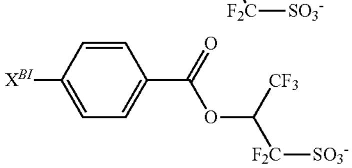

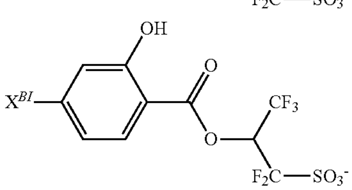

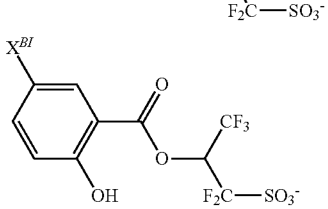

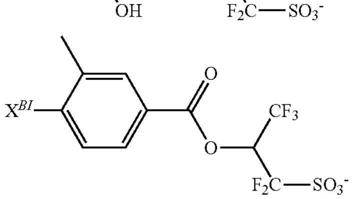

-continued

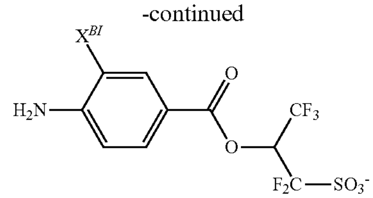

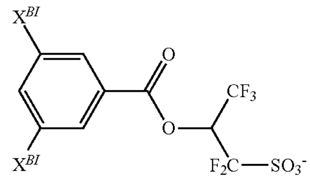

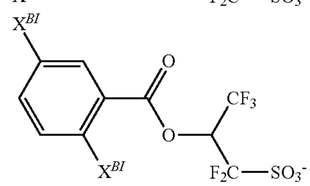

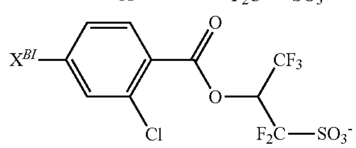

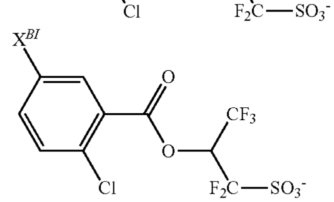

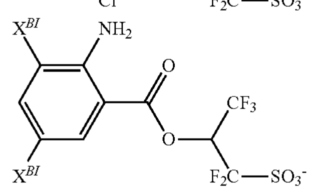

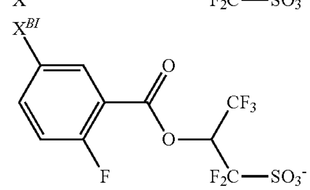

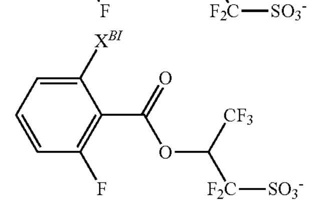

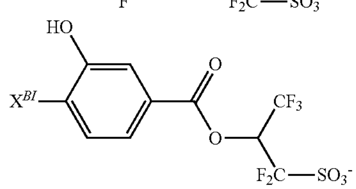

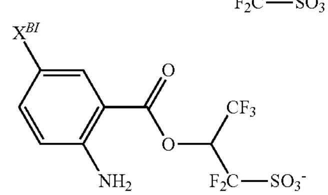

-continued
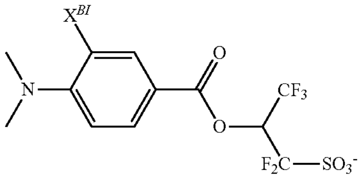
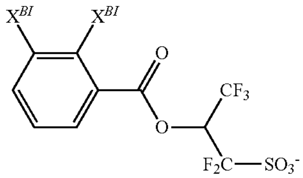
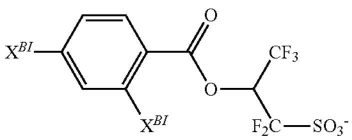
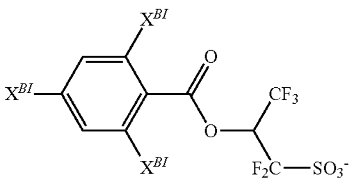
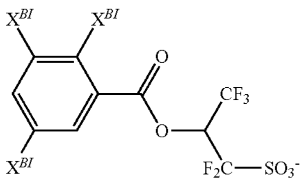
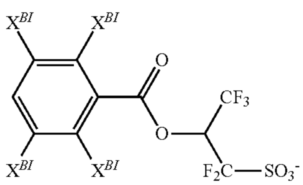
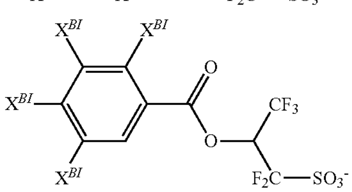
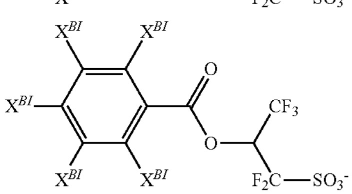
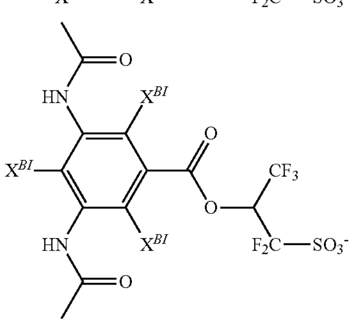
-continued
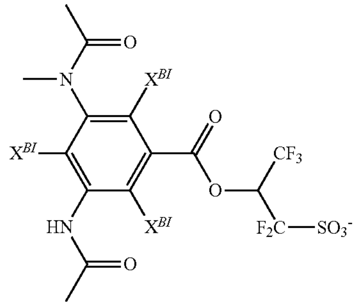
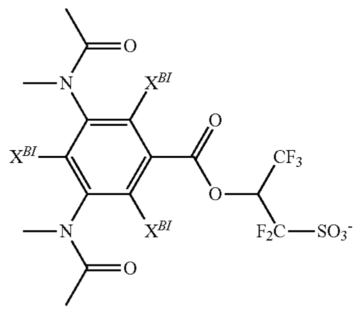
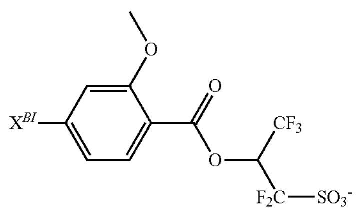
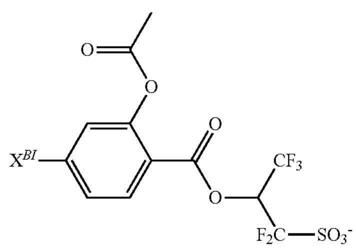
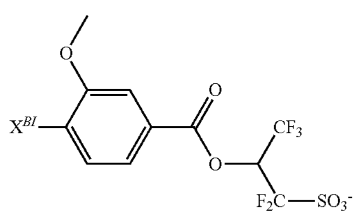
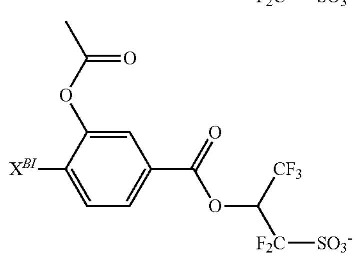

-continued
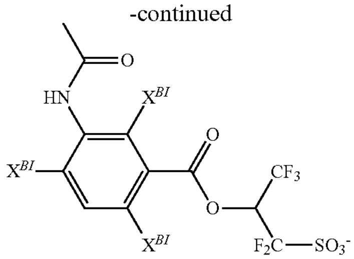
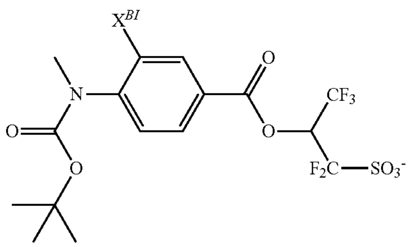
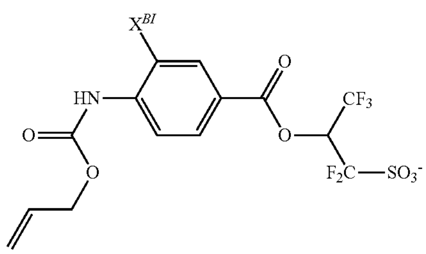
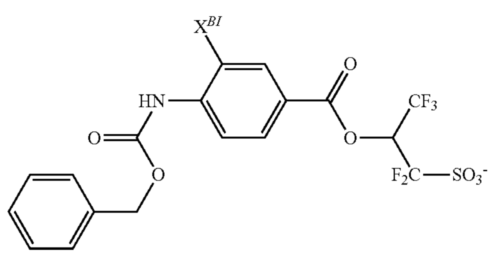
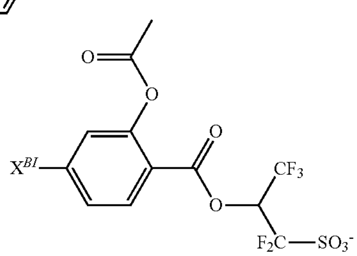
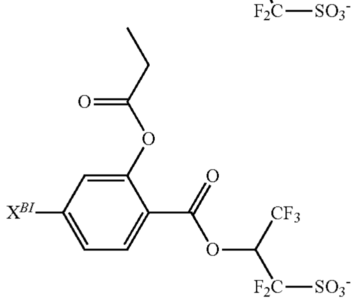
-continued
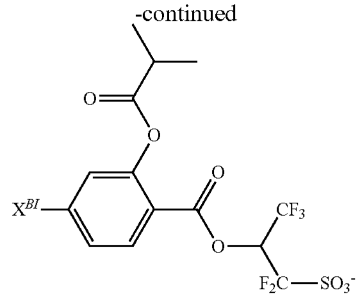
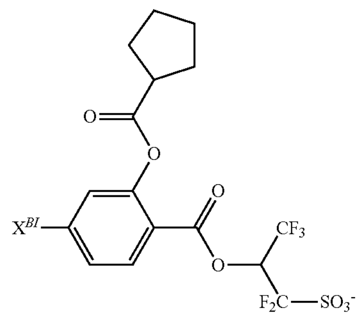
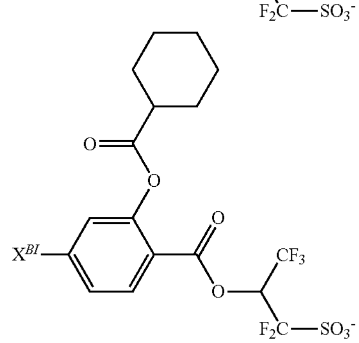
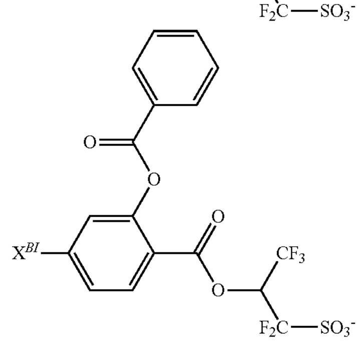
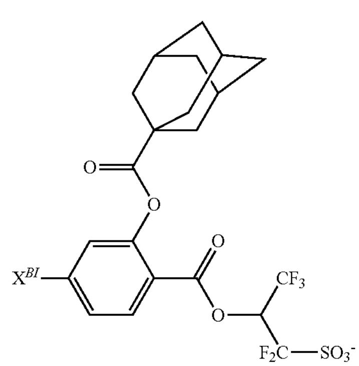

-continued
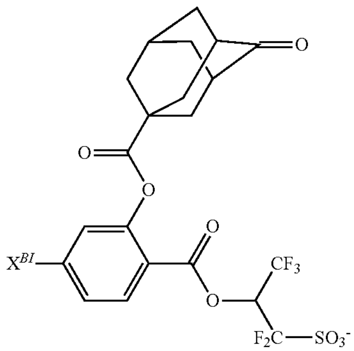
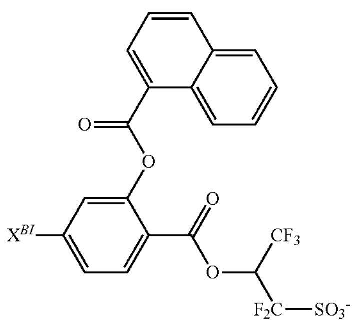
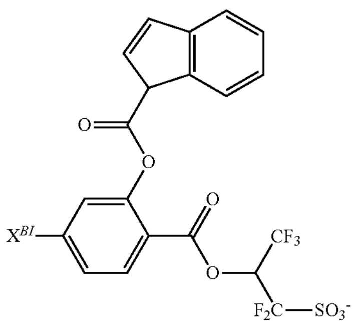
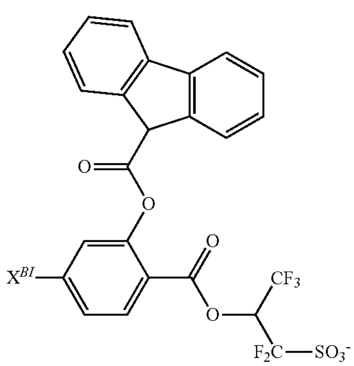
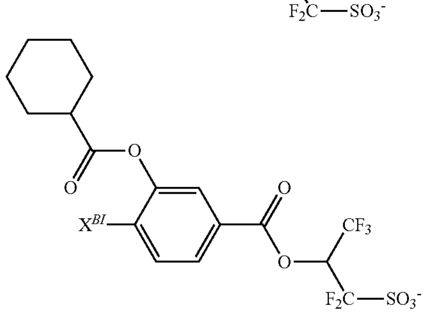
-continued
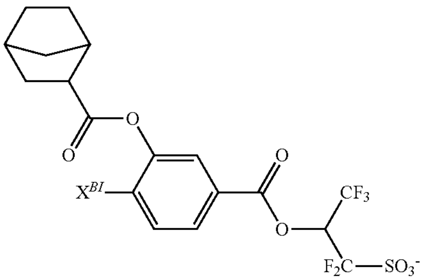
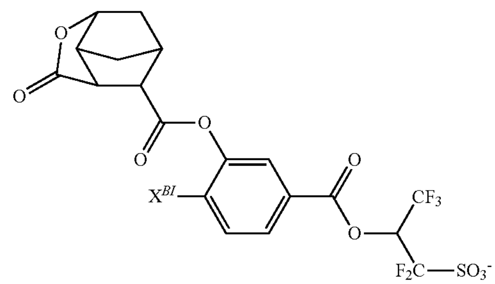
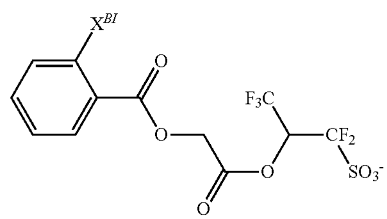
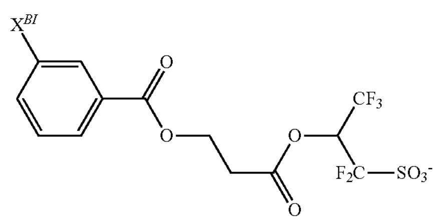
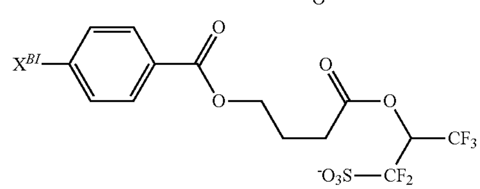
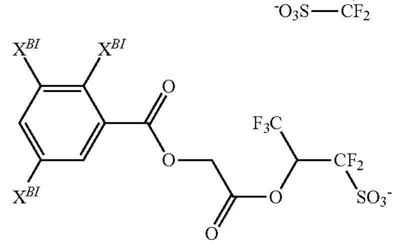
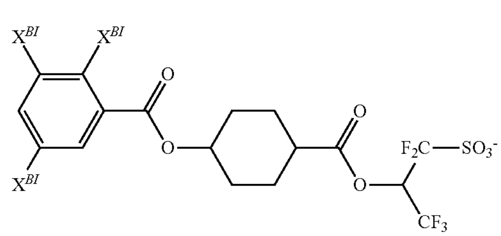

-continued
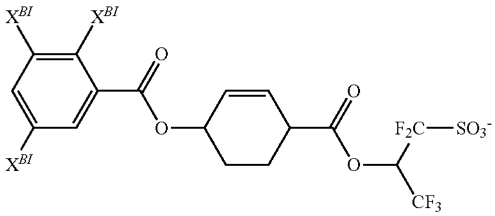
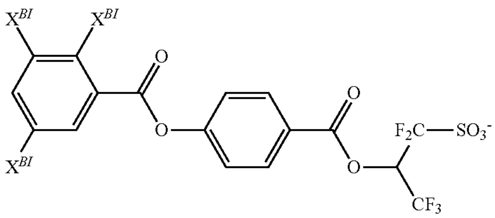
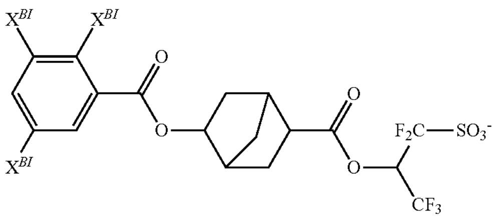
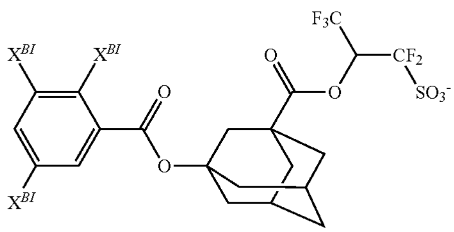
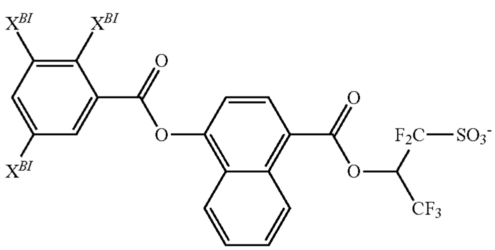
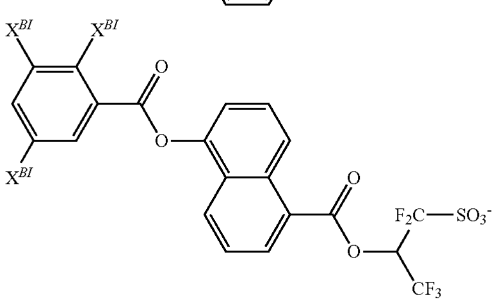
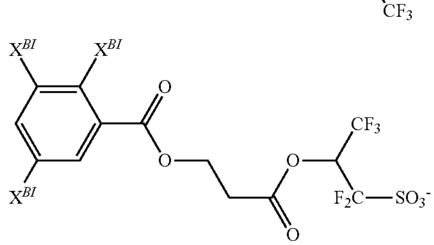
-continued
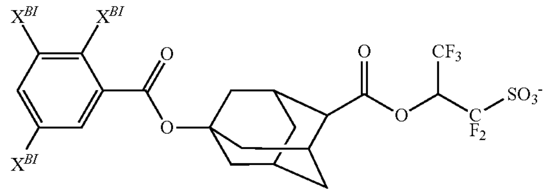
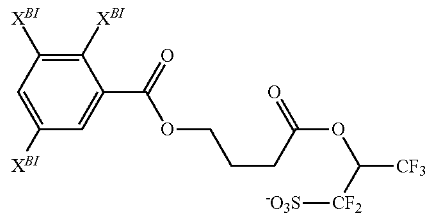
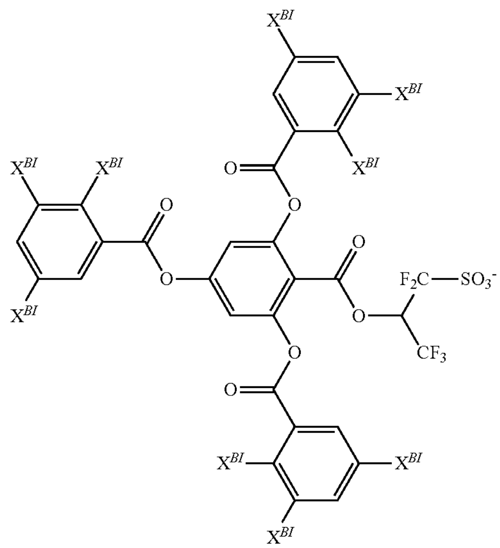
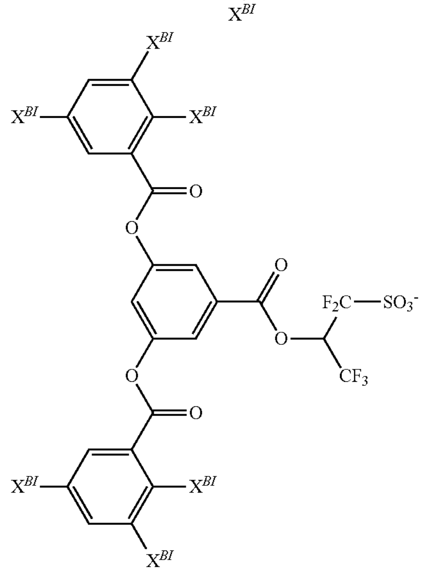
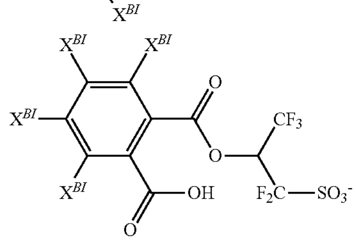

-continued
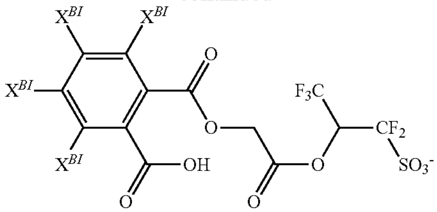
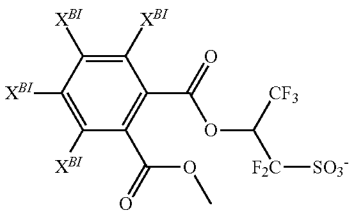
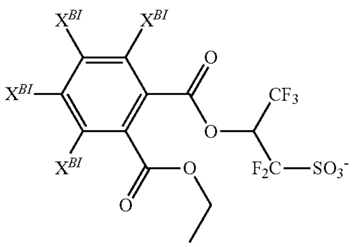
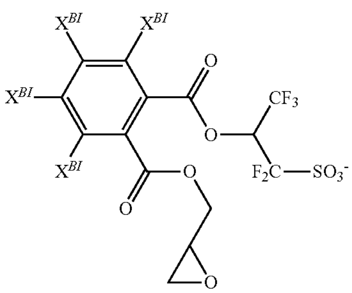
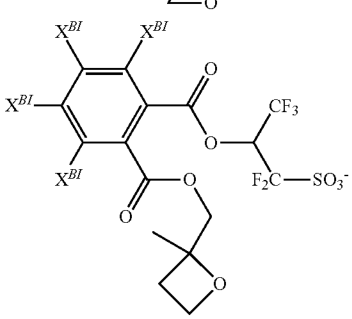
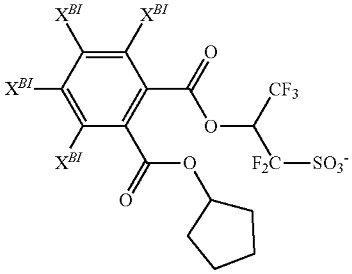
-continued
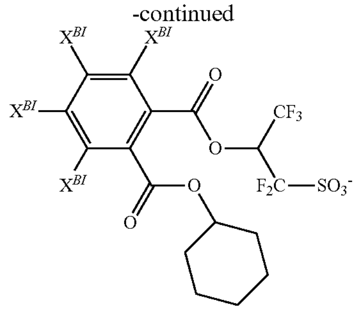
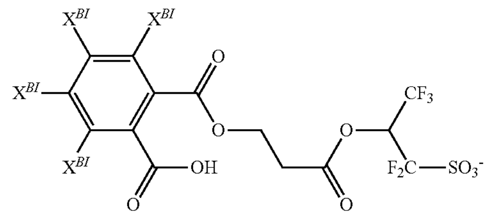
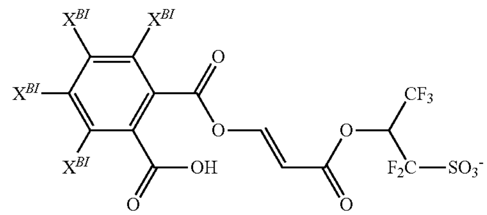
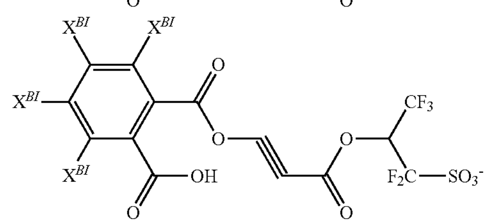
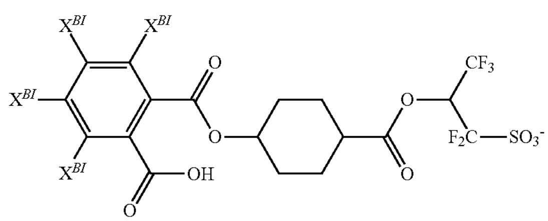
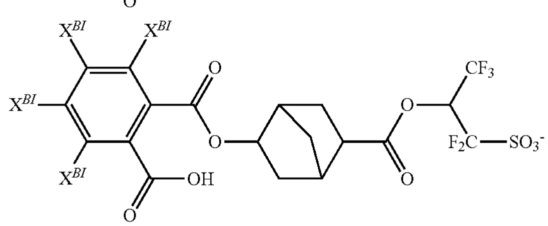
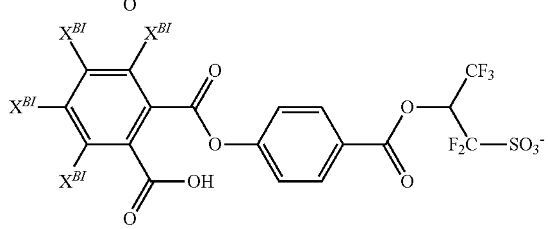

-continued
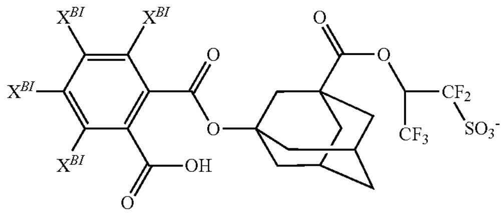
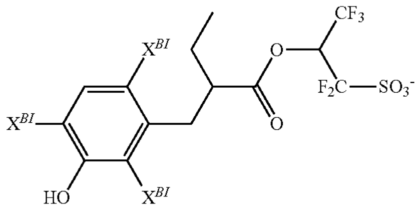
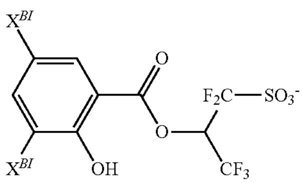
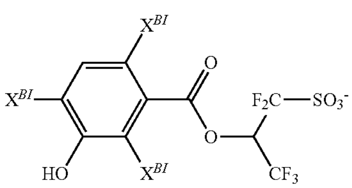
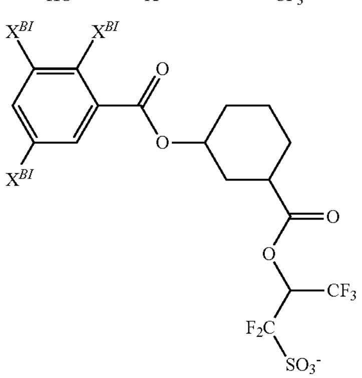
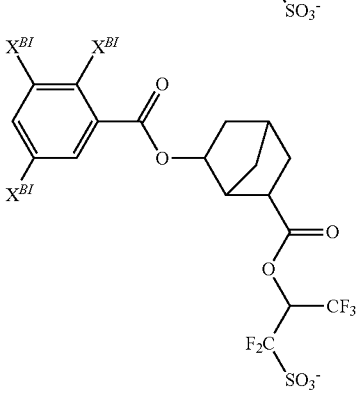
-continued
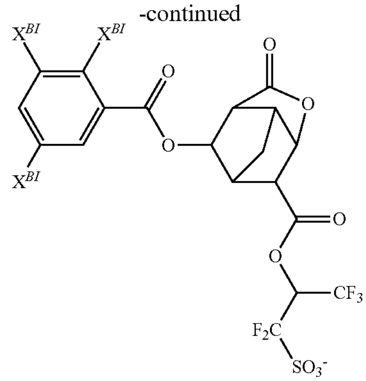
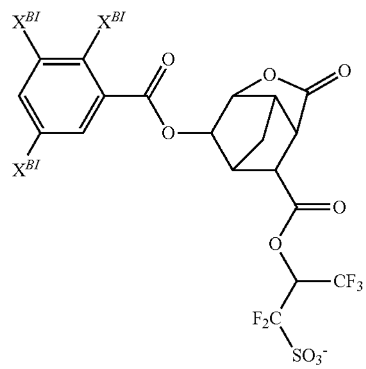
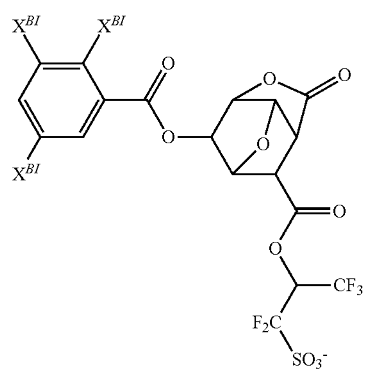
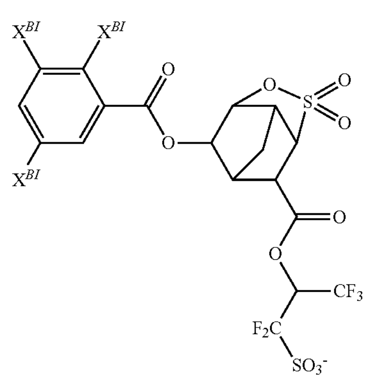

-continued
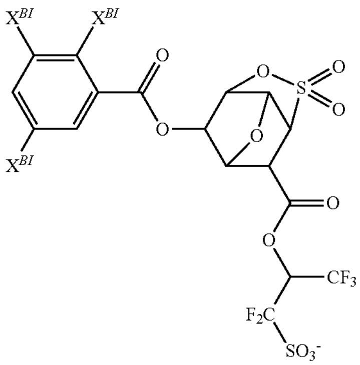
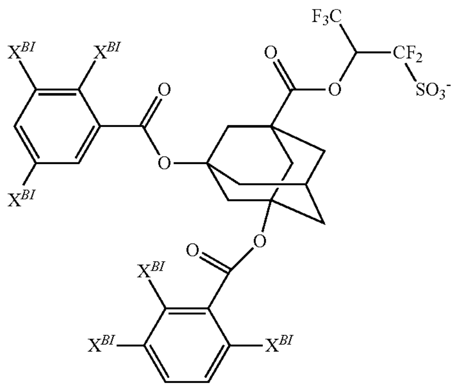
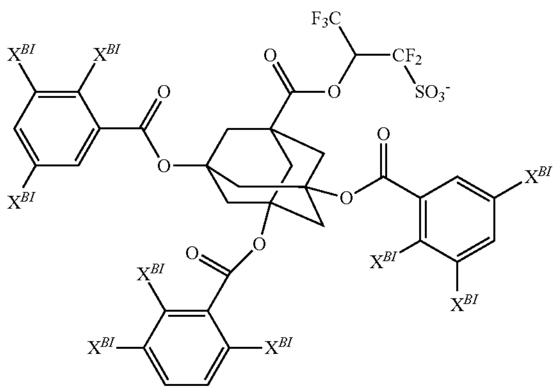
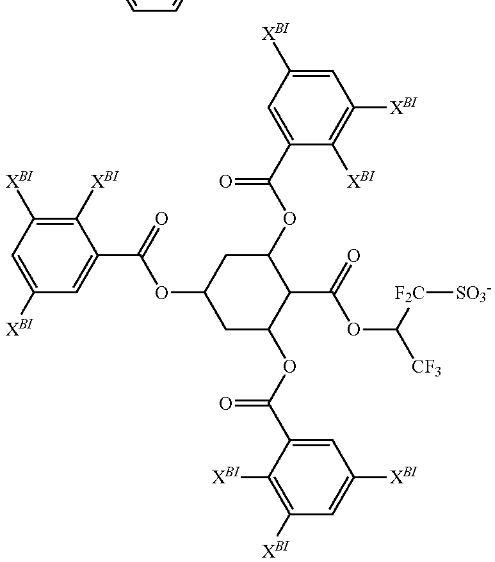
-continued
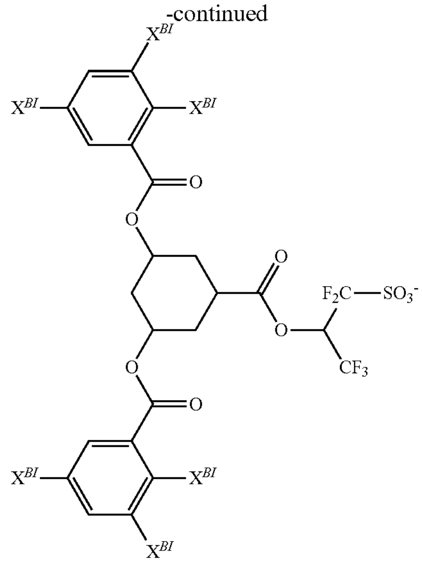
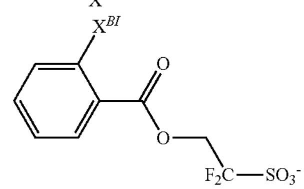
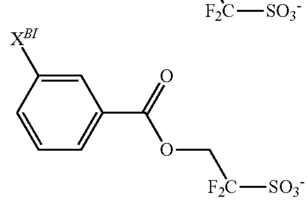
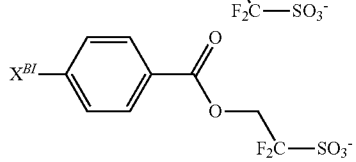
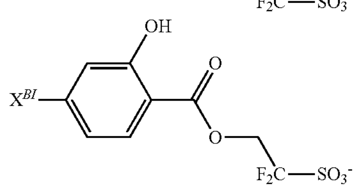
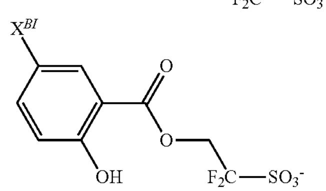
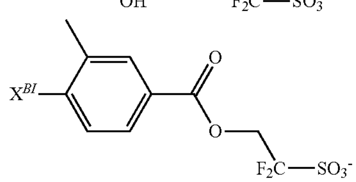
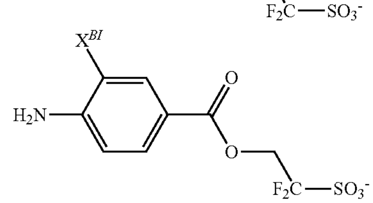

-continued
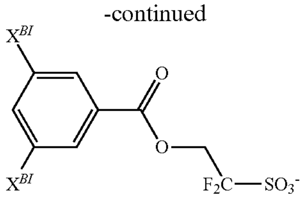
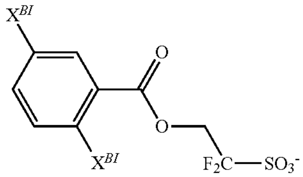
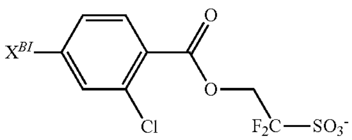
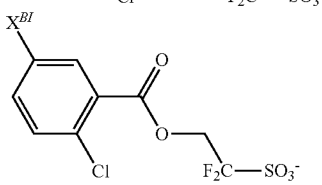
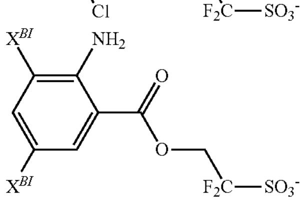
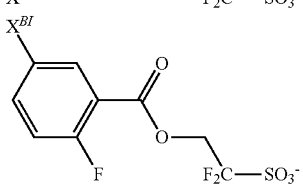
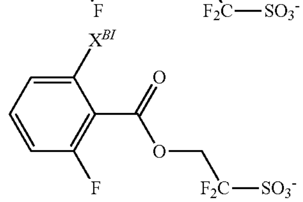
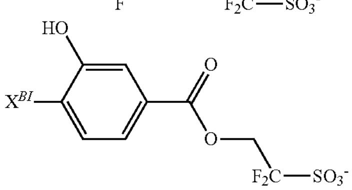
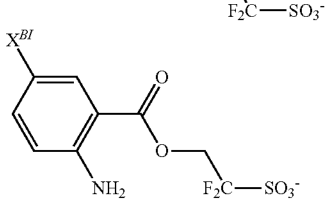
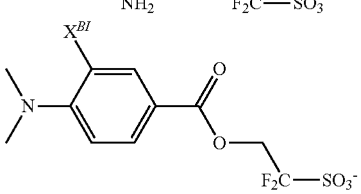
-continued
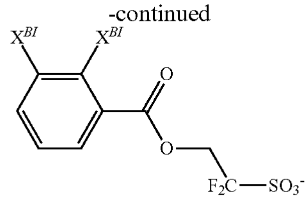
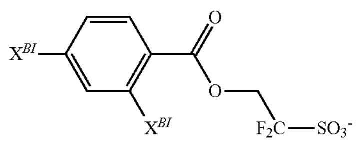
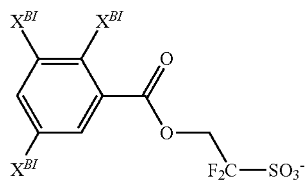
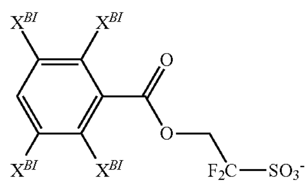
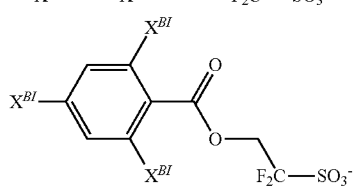
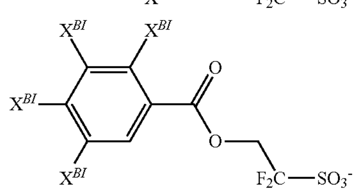
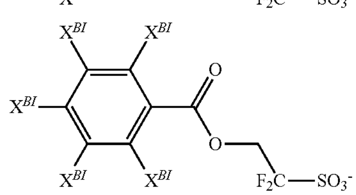
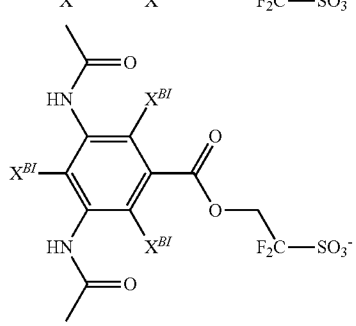

-continued
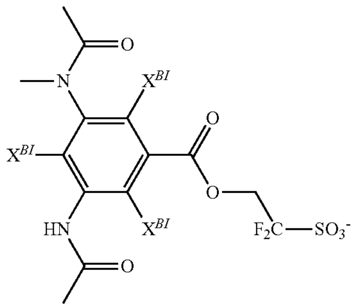
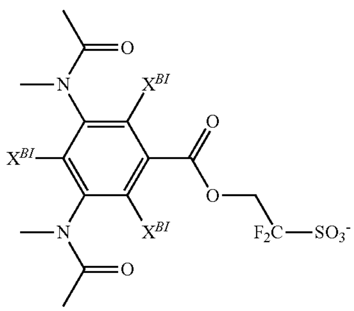
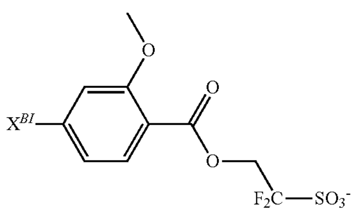
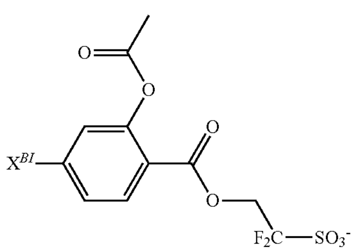
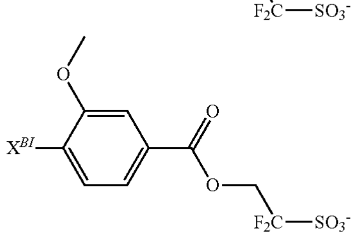
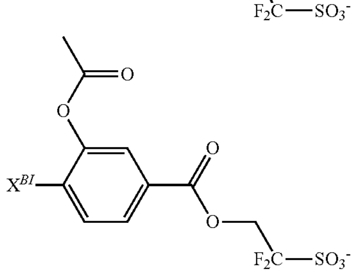
-continued
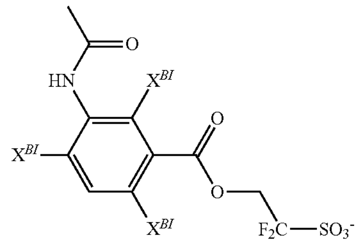
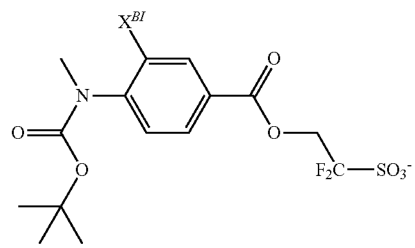
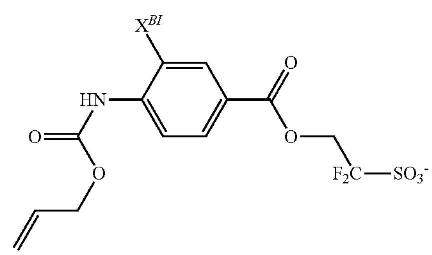
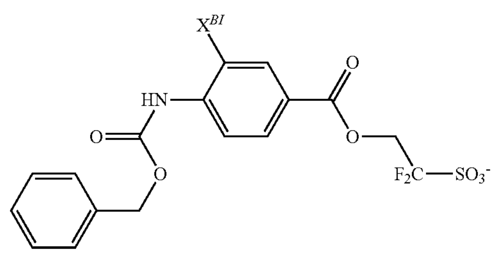
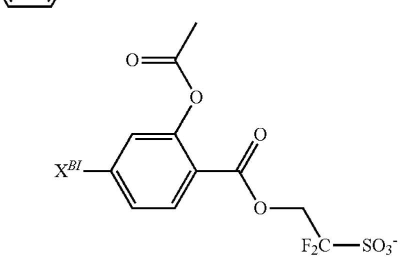
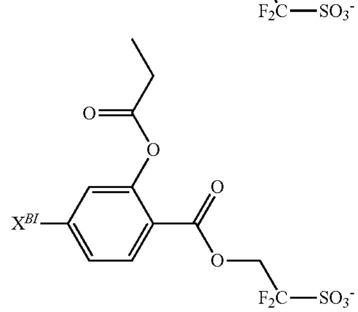

-continued
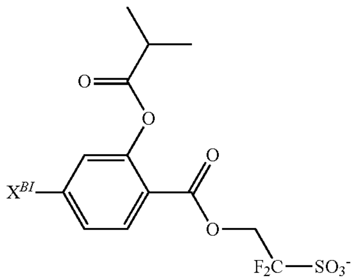
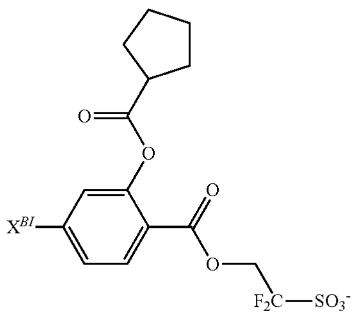
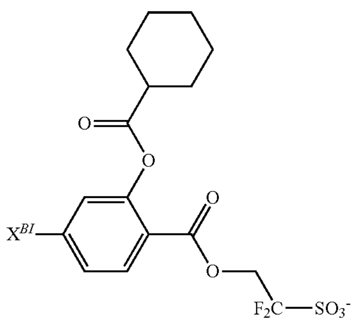
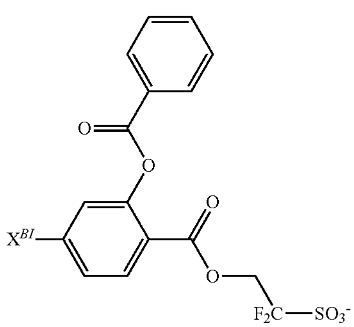
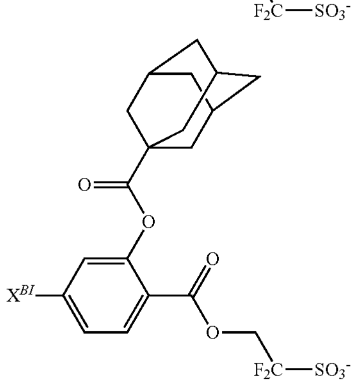
-continued
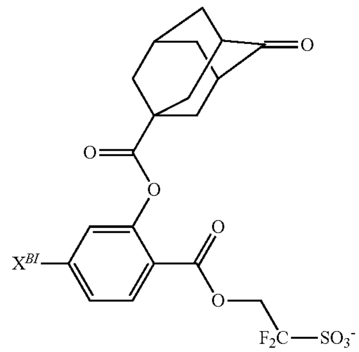
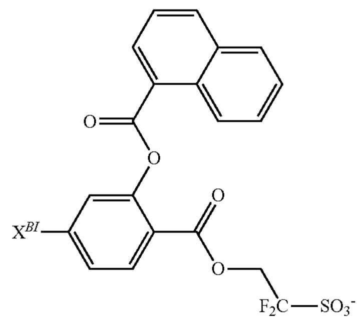
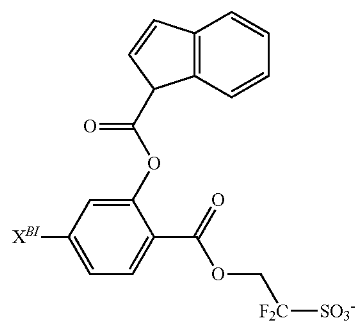
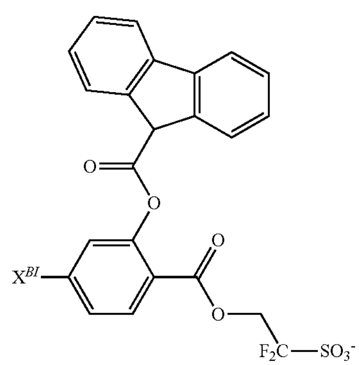
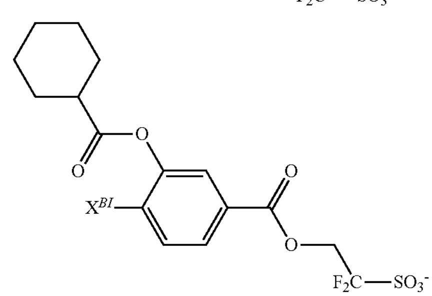

-continued
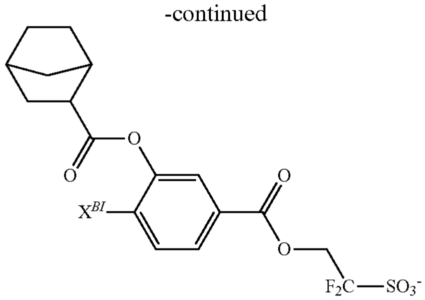
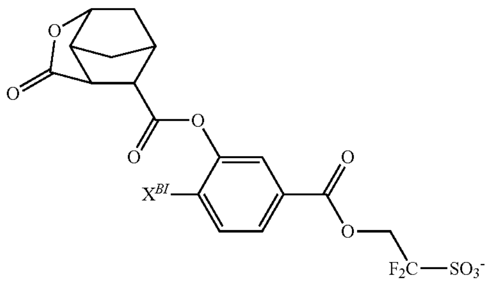
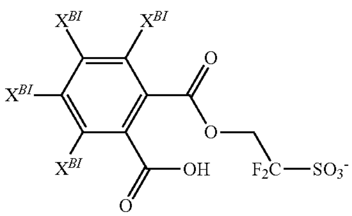
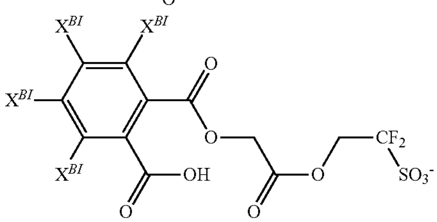
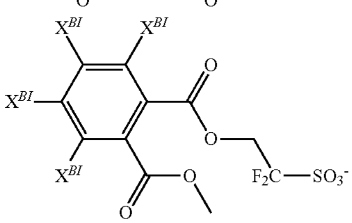
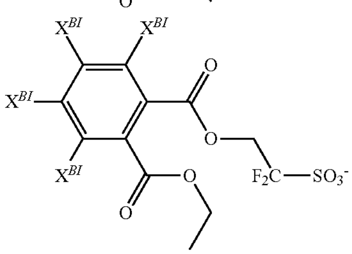
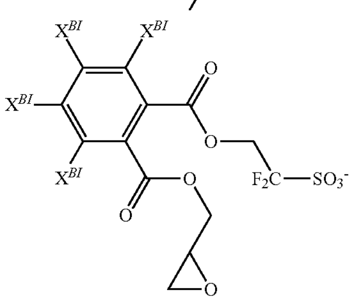
-continued
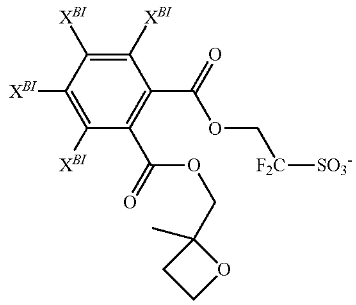
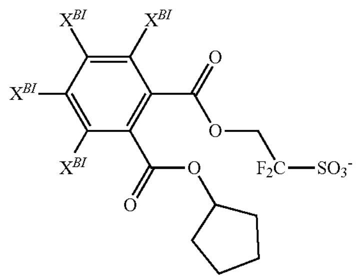
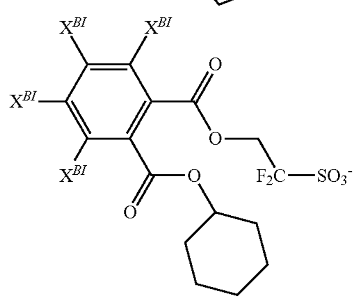
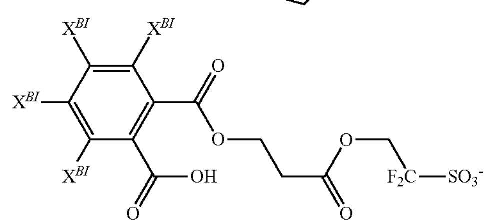
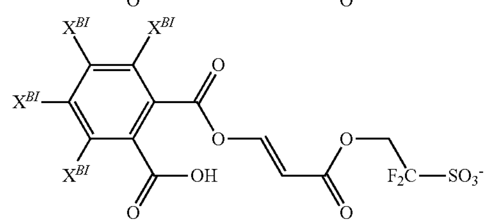
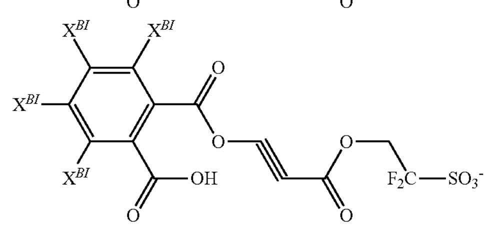
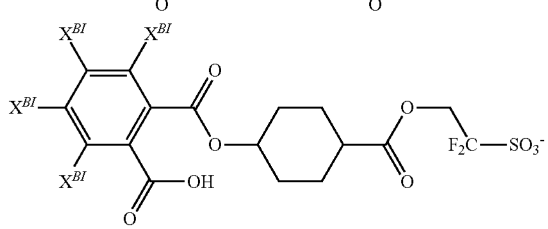

-continued
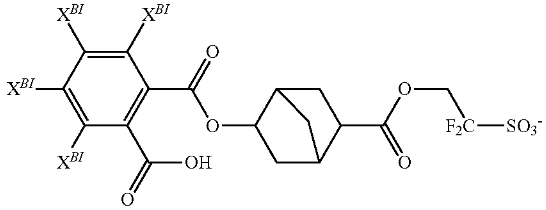
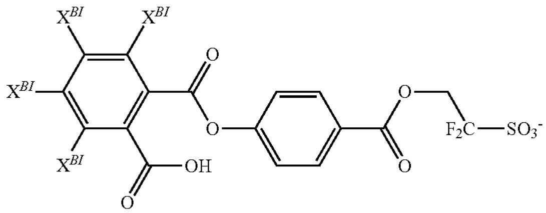
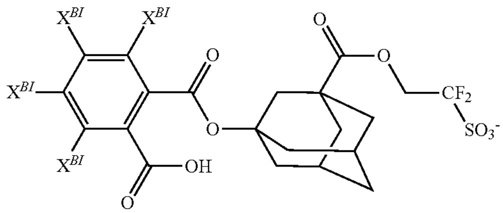
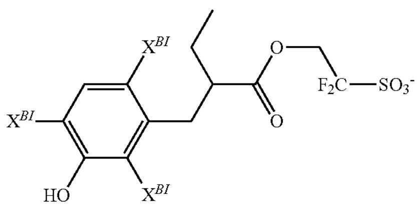
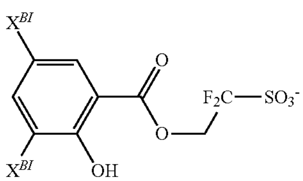
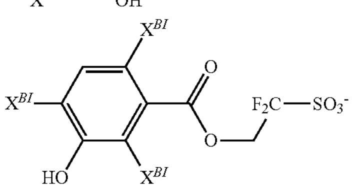
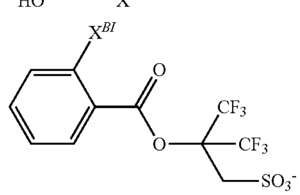
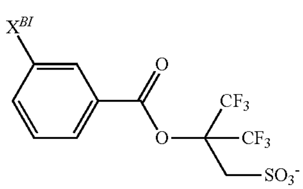
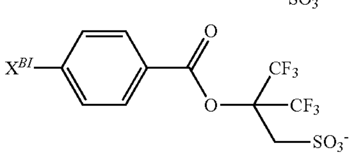
-continued
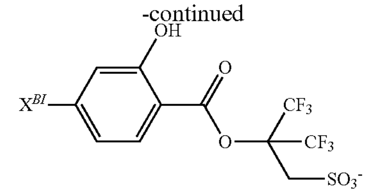
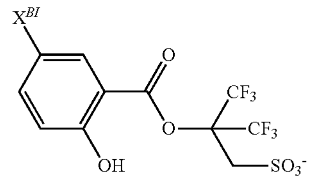
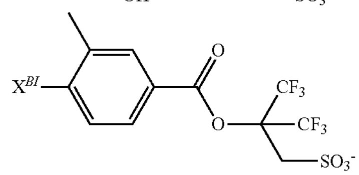
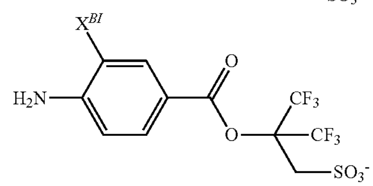
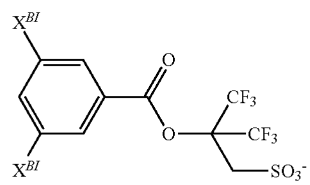
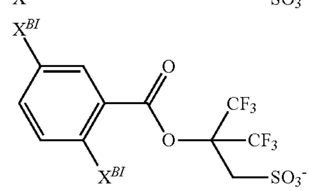
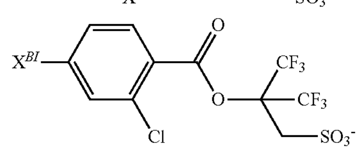
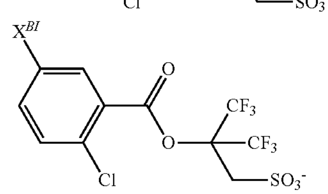
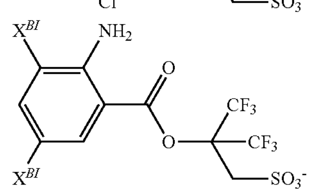
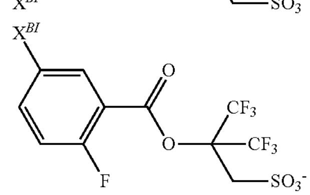

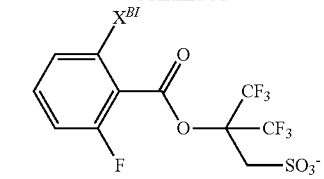
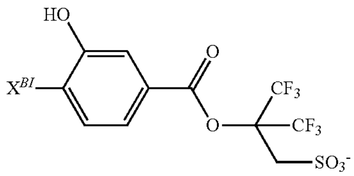
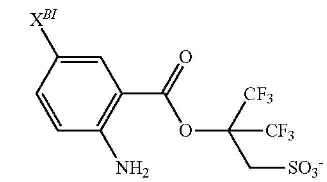
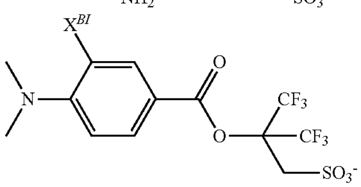
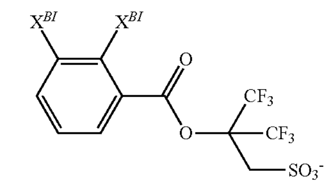
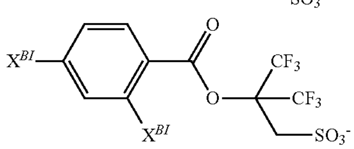
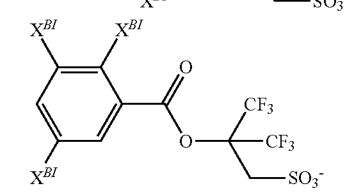
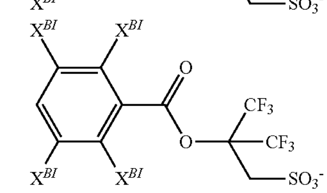
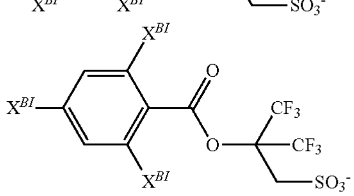
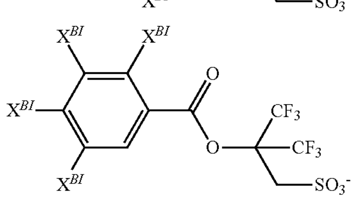
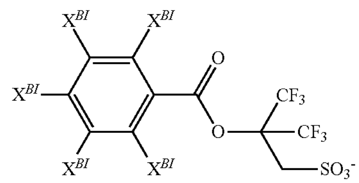
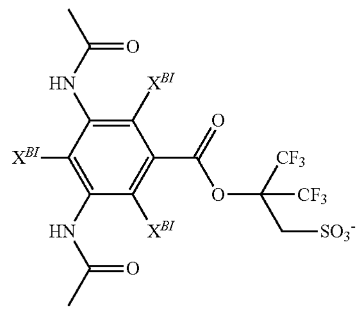
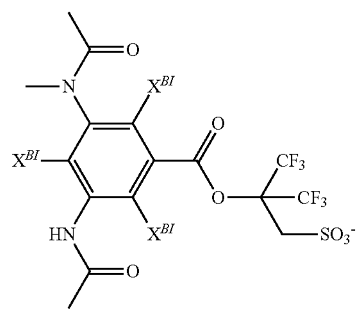
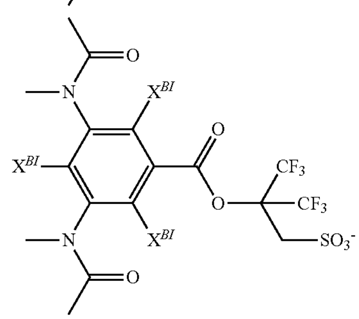
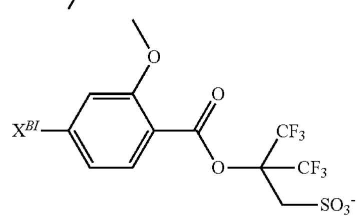
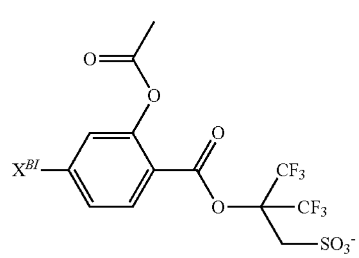

-continued
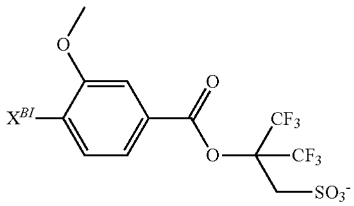
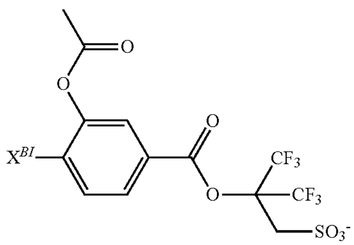
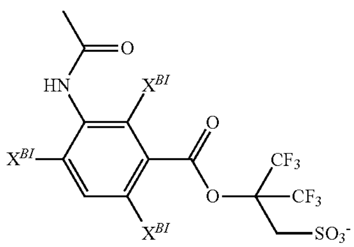
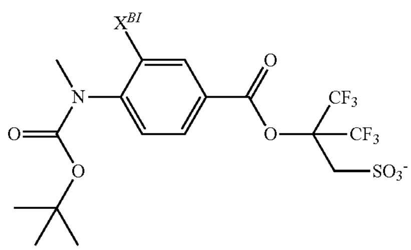
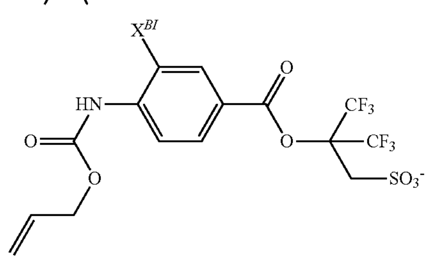
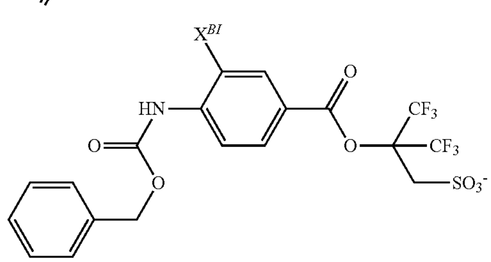
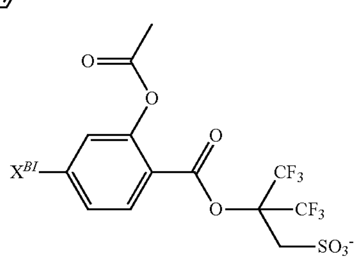
-continued
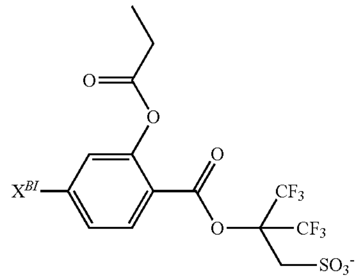
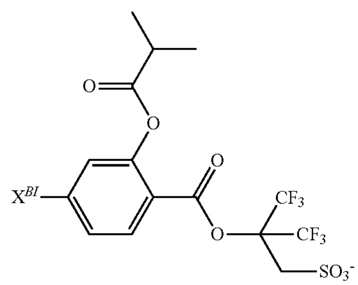
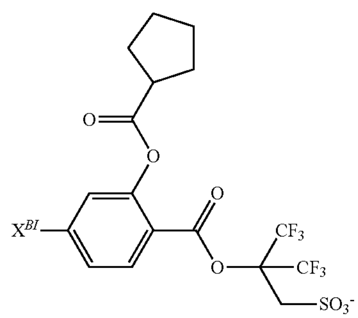
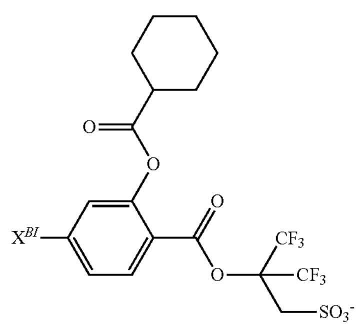
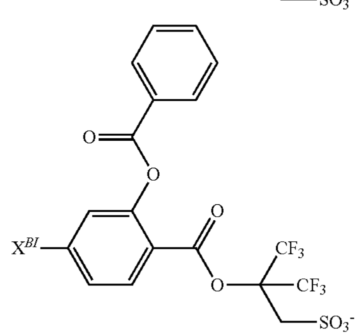

-continued
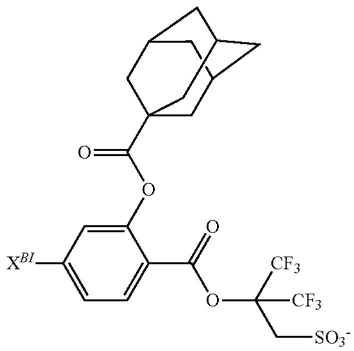
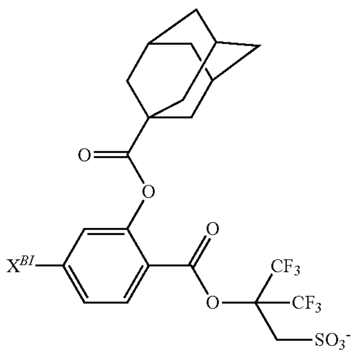
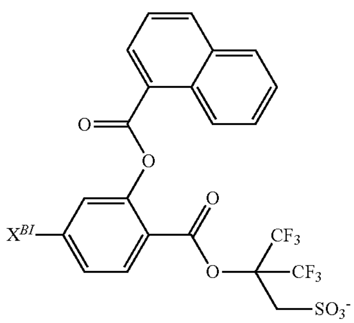
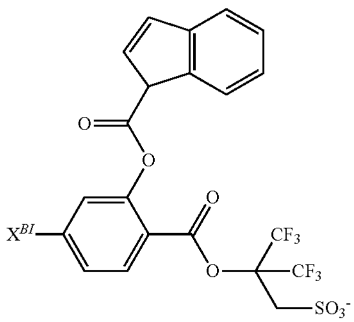
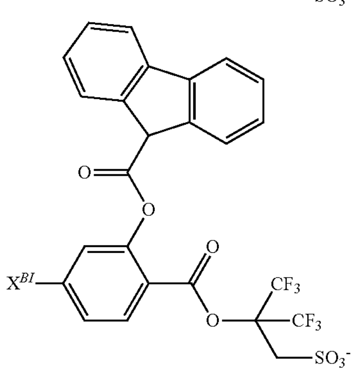
-continued
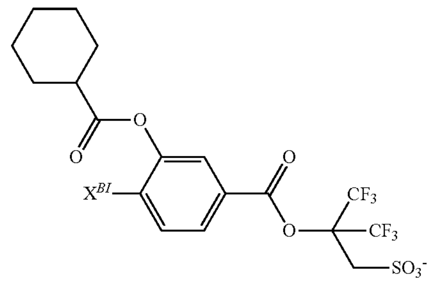
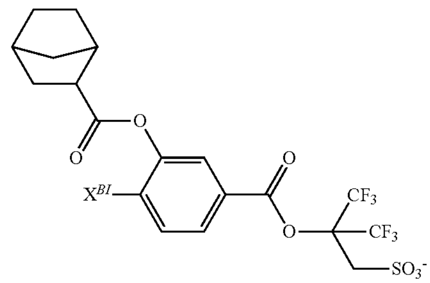
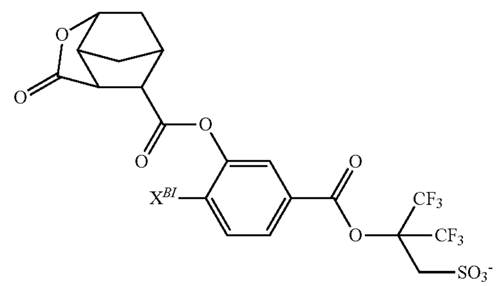
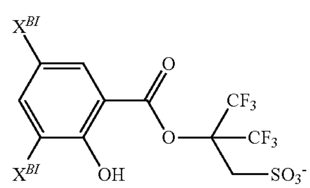
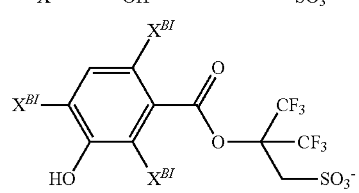
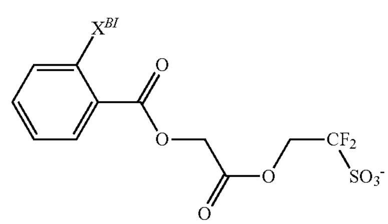
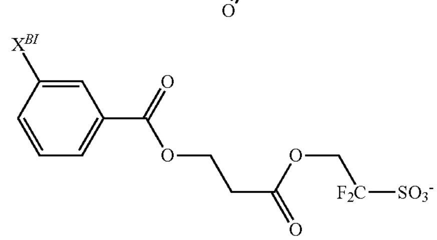

-continued
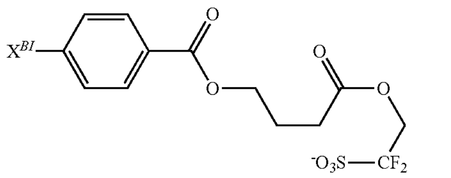
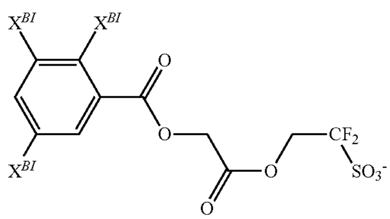
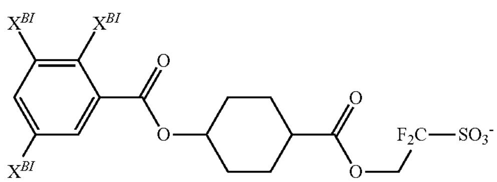
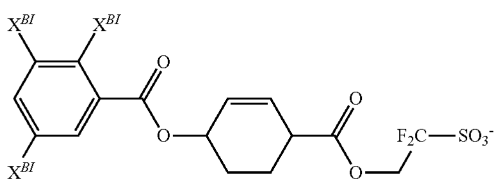
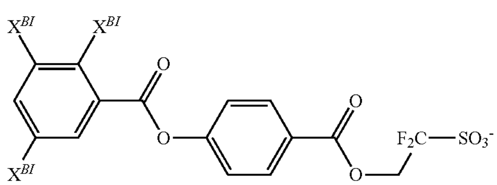
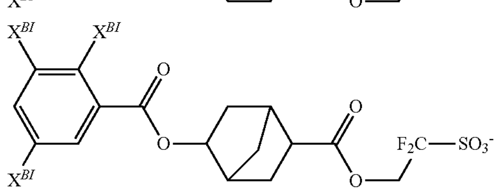
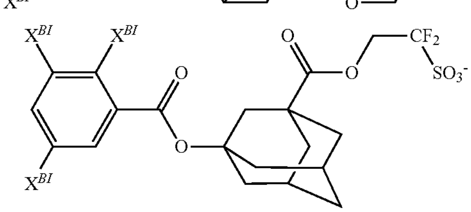
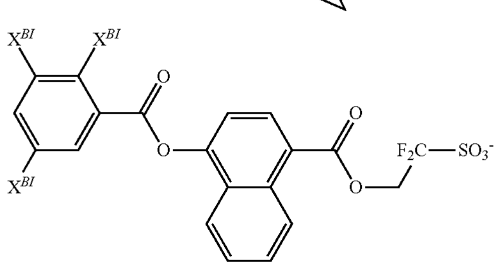
-continued
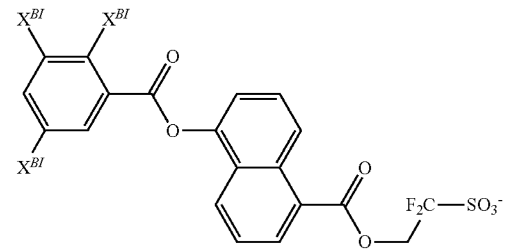
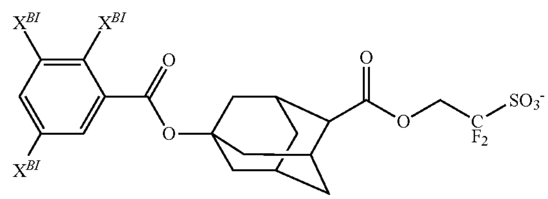
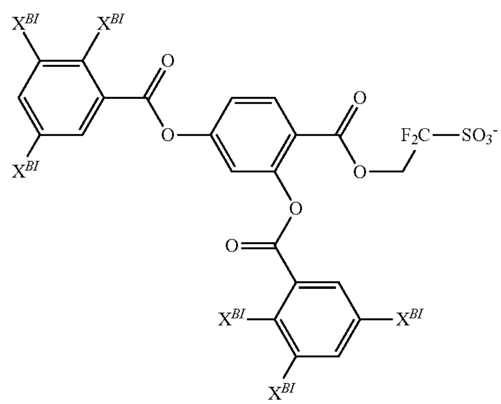
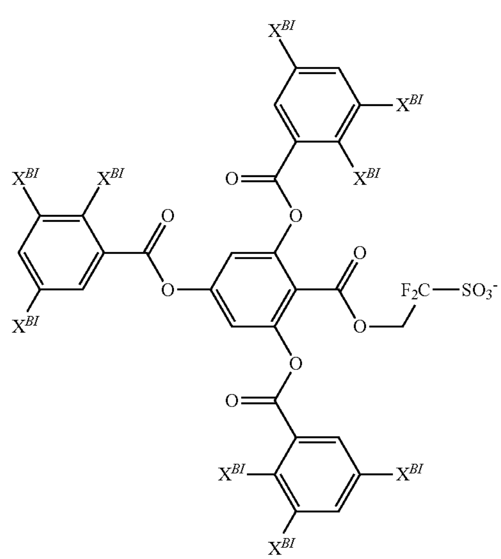

-continued
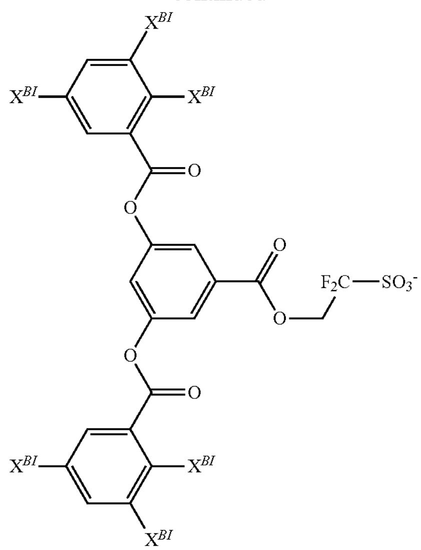
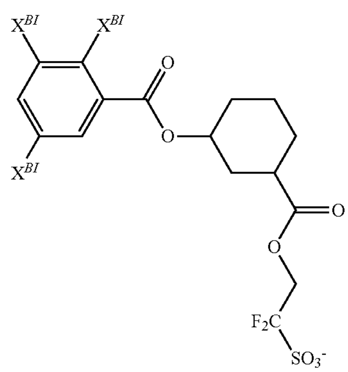
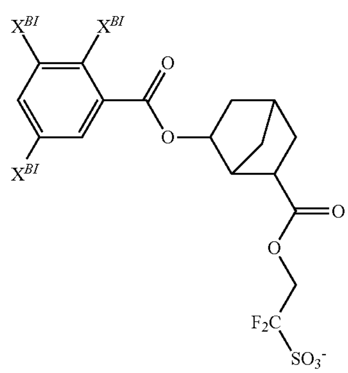
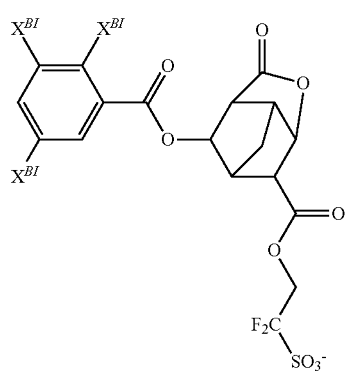
-continued
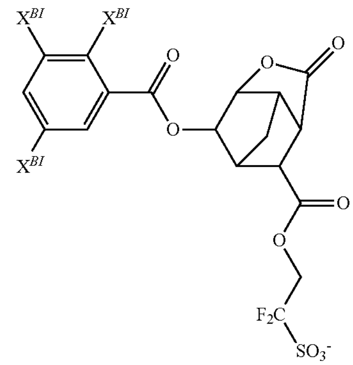
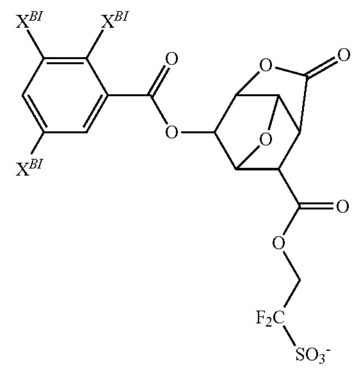
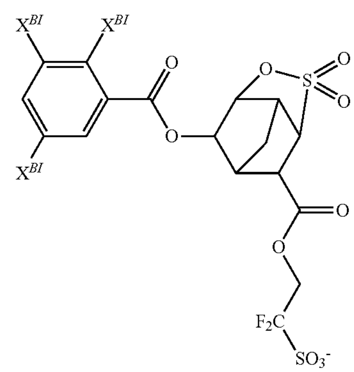
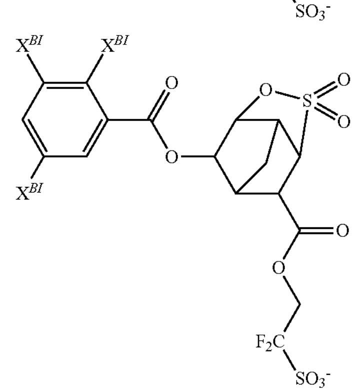

-continued
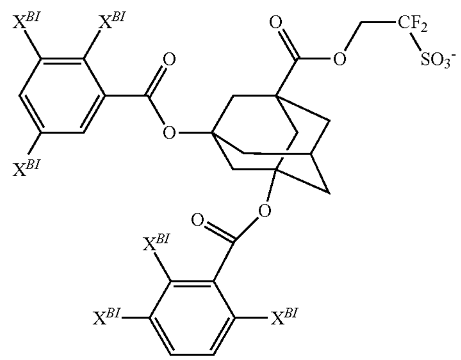
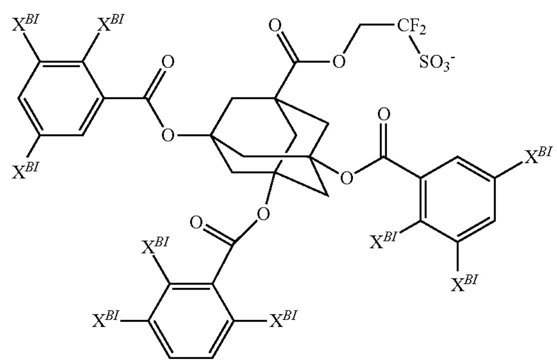
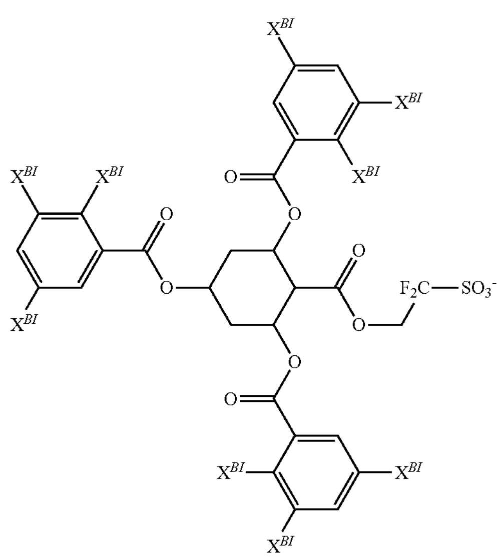
-continued
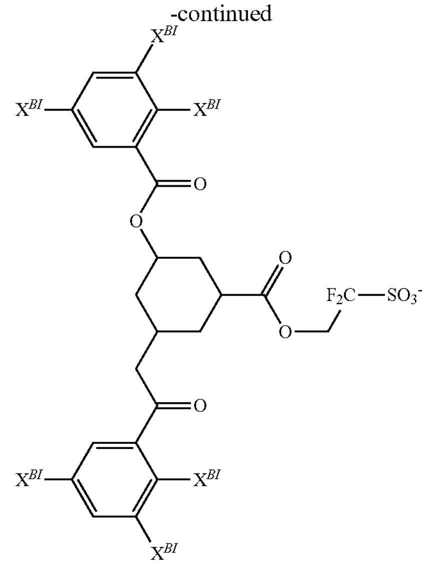
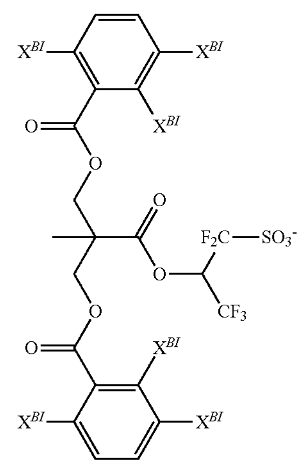
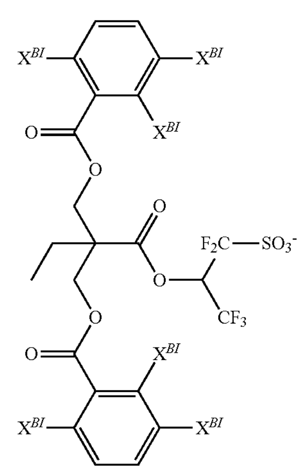

-continued
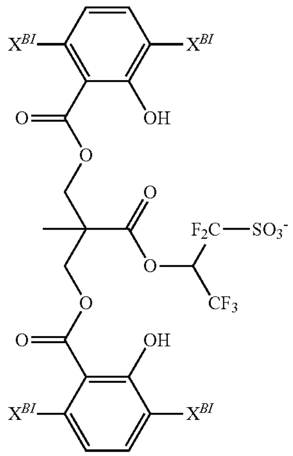
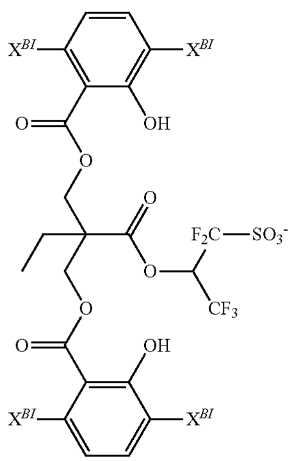
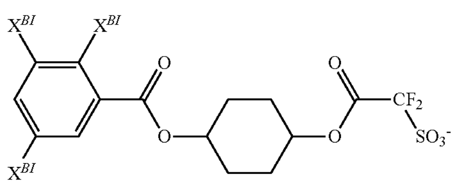
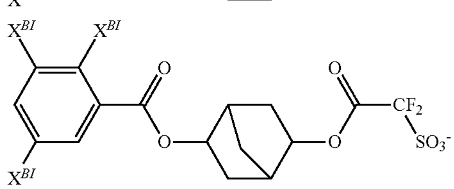
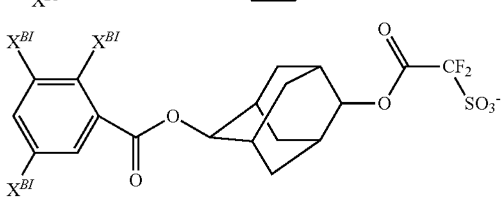
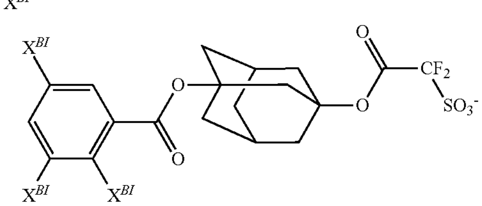
-continued
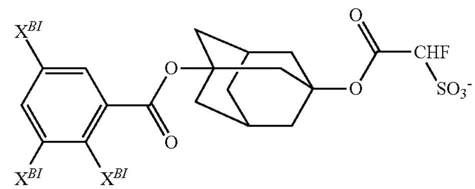
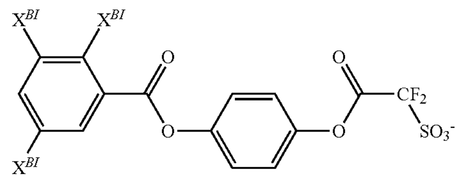
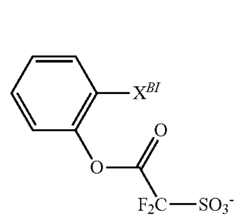
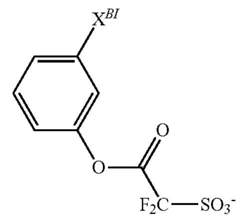
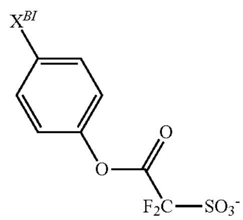
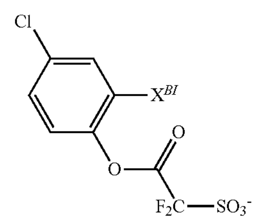
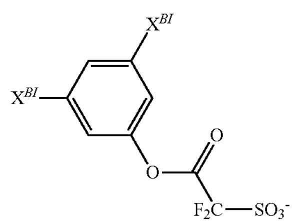
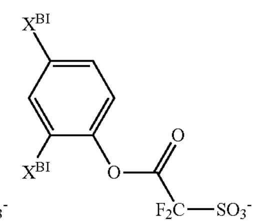
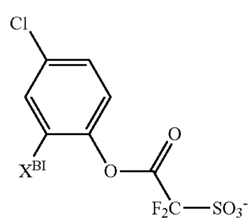
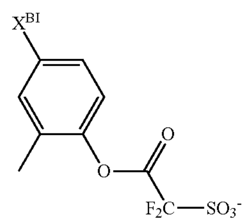
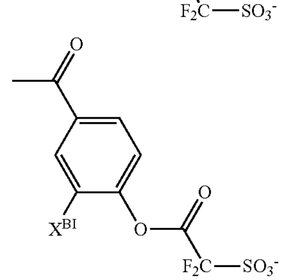
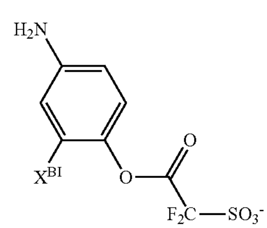

-continued
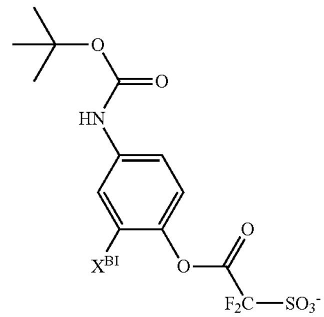
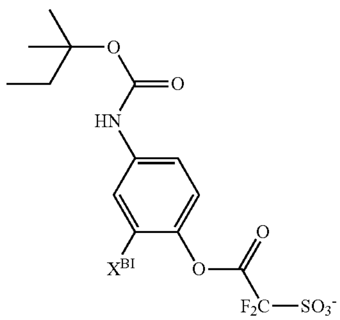
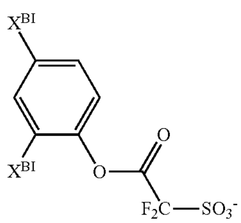
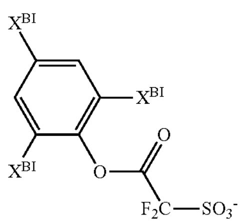
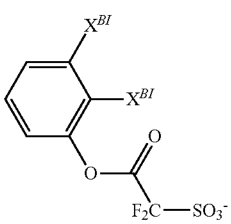
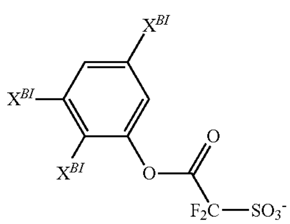
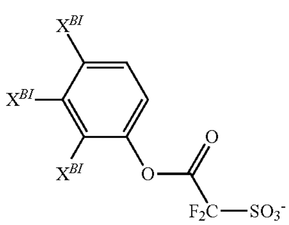
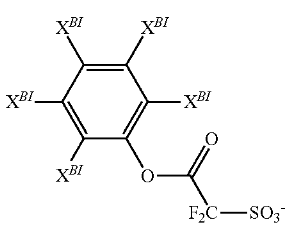
-continued
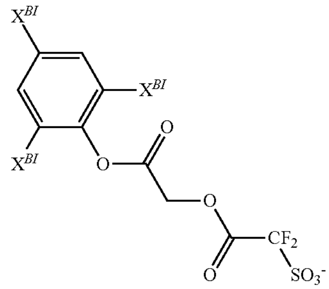
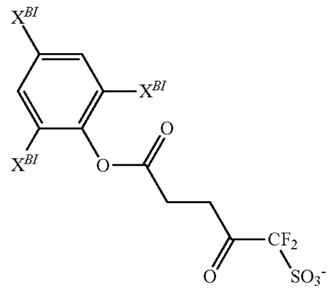
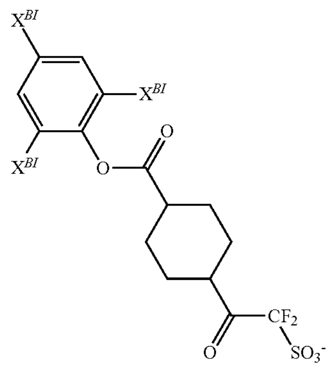
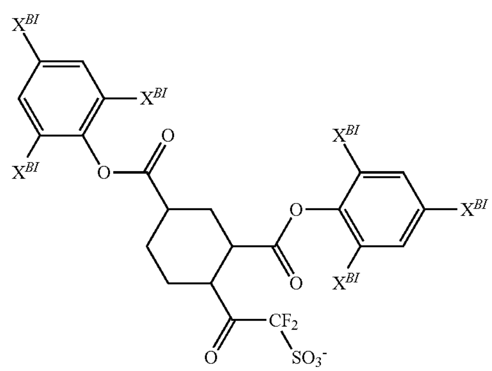
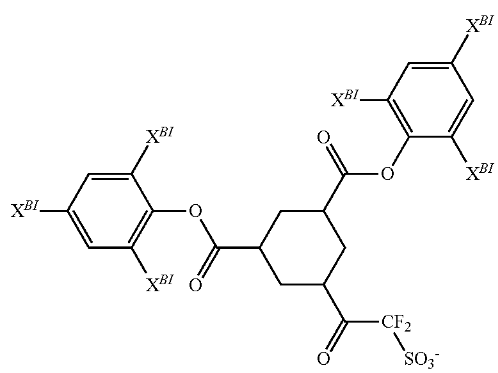

-continued
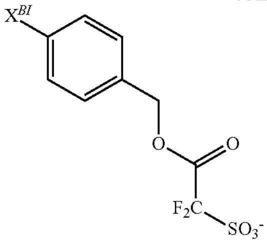
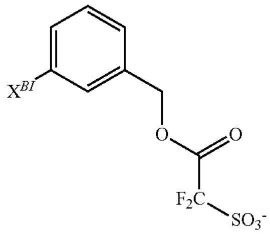
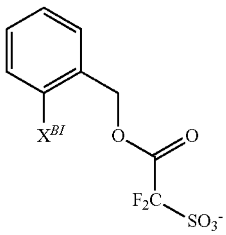
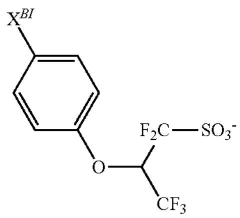
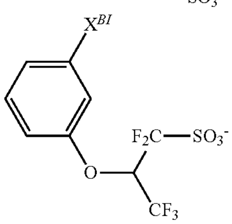
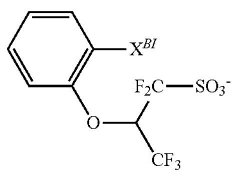
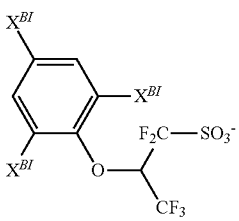
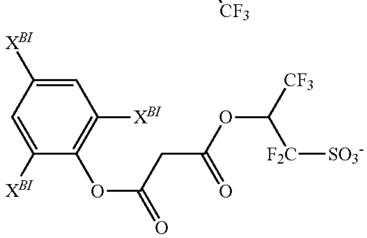
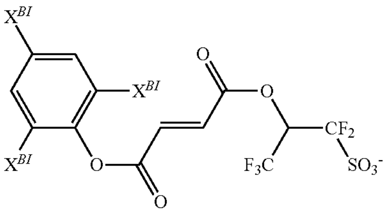
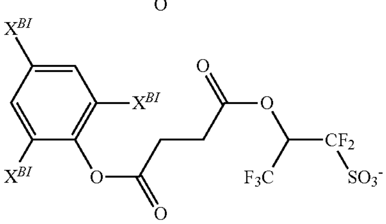
-continued
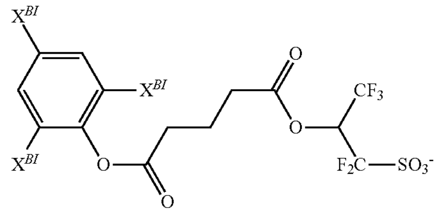
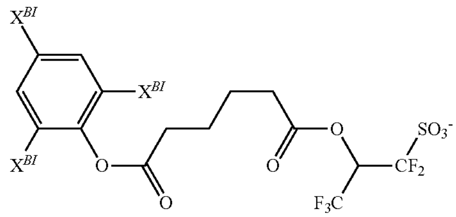
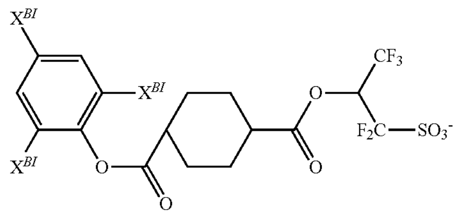
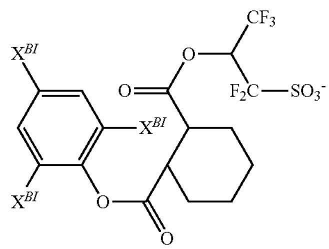
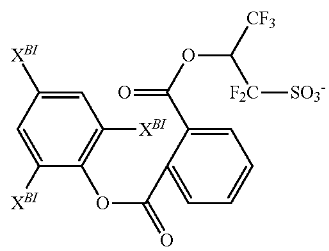
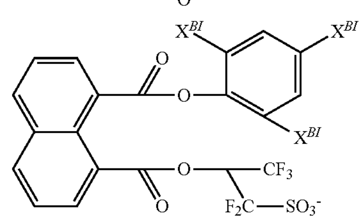
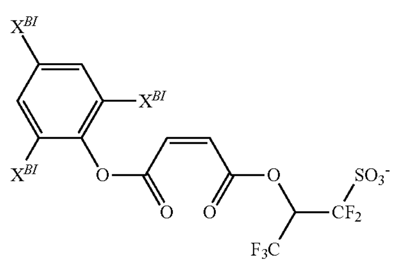

-continued
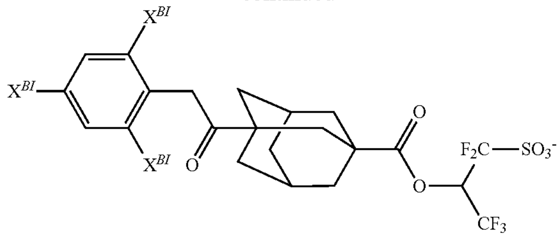
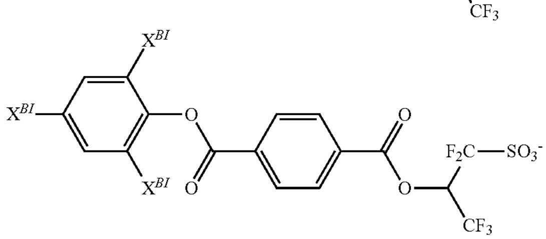
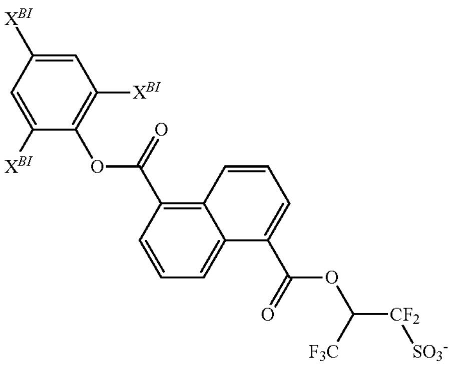
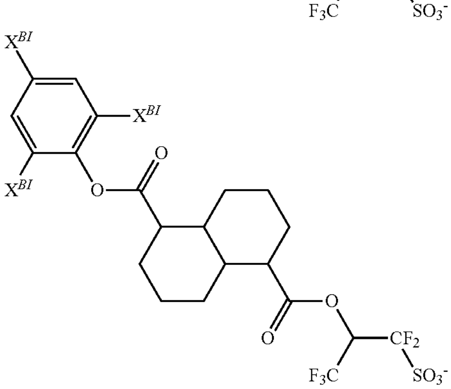
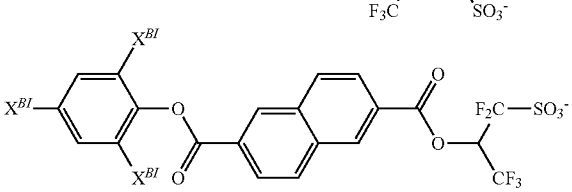
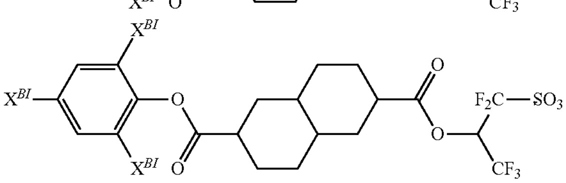
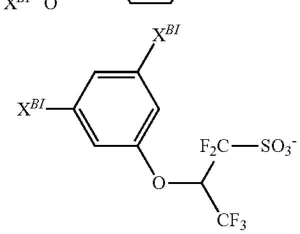
-continued
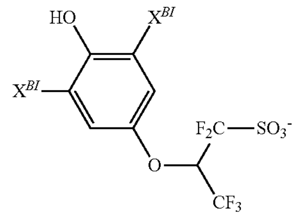
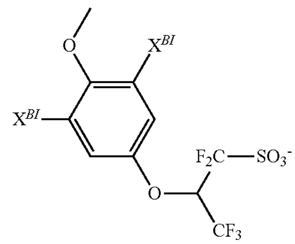
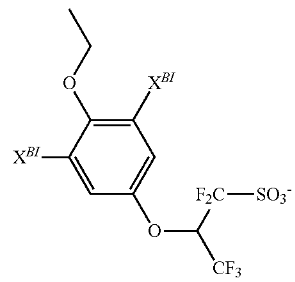
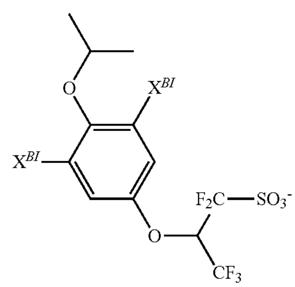
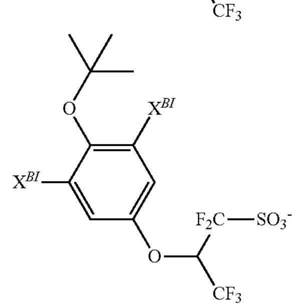
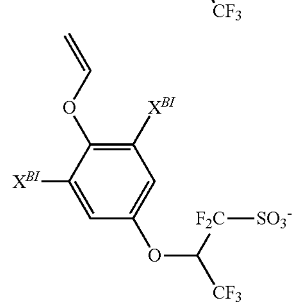

-continued
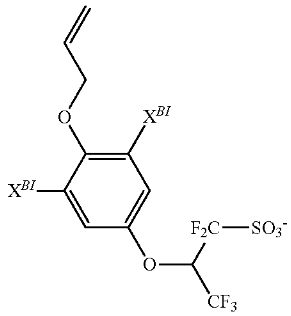
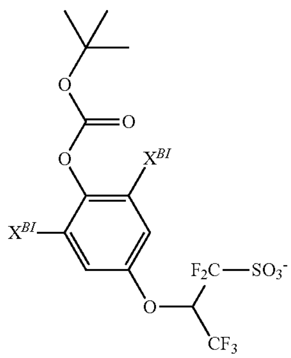
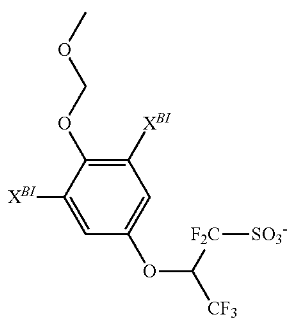
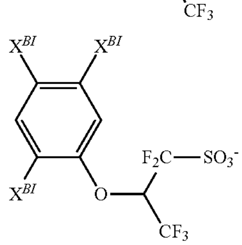
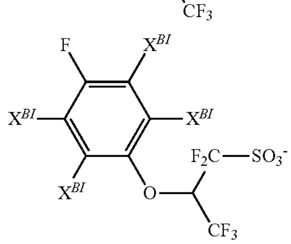
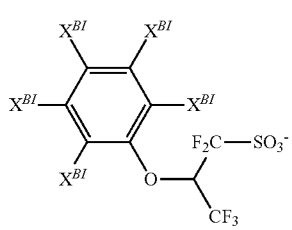
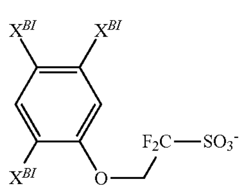
-continued
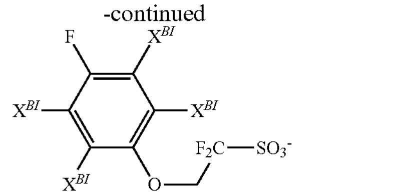
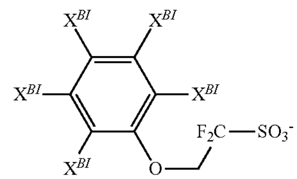
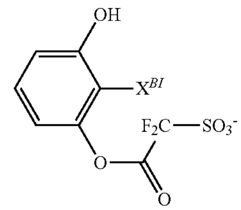
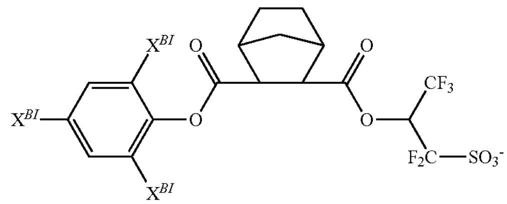
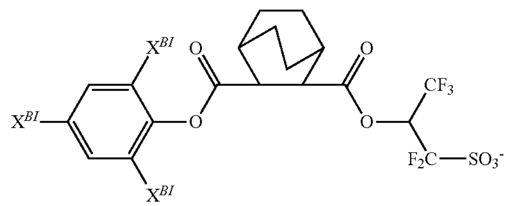
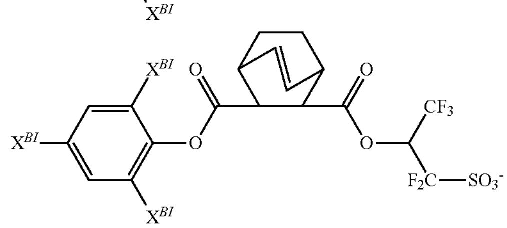
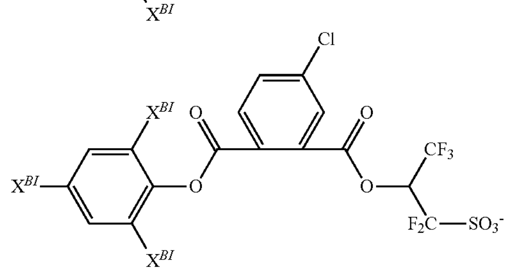
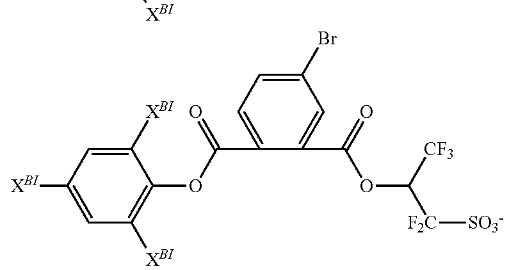
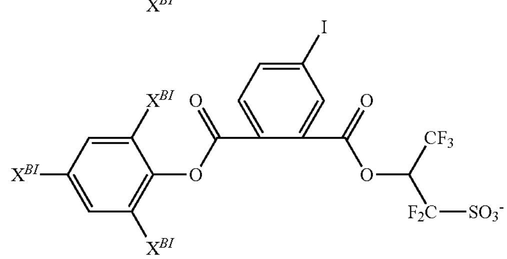

-continued
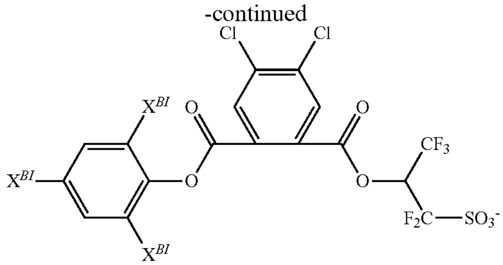
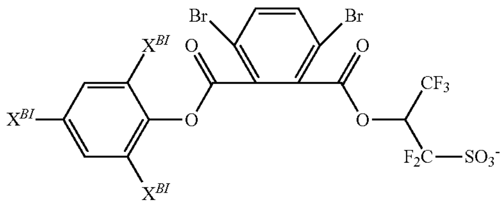
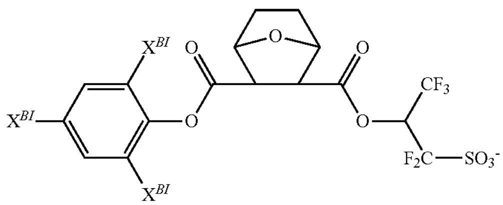
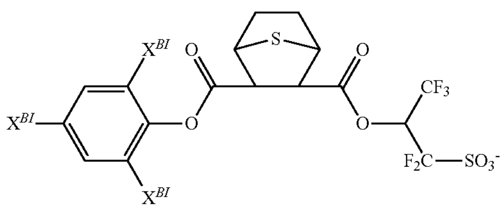
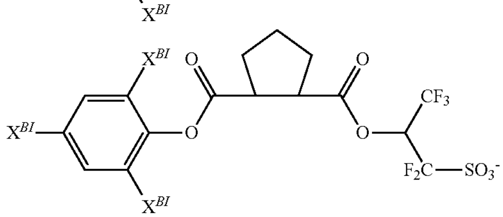
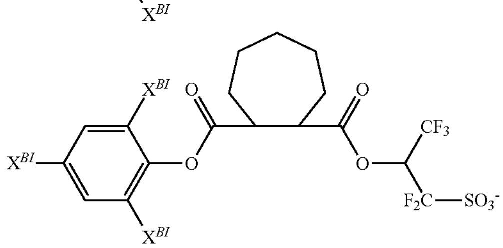
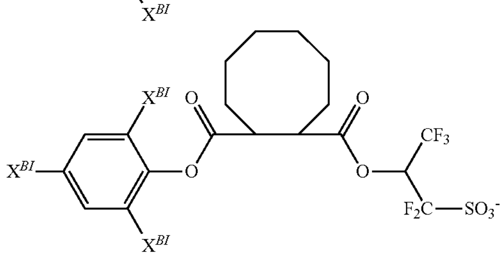
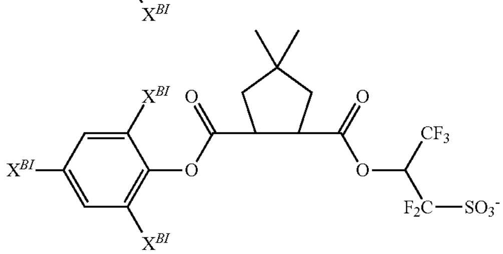
-continued
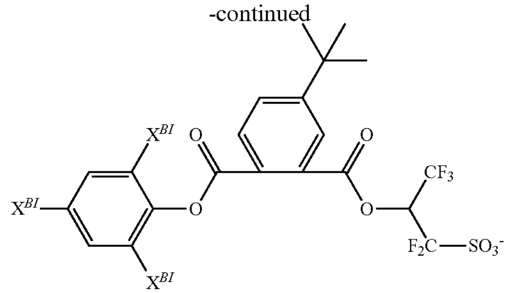
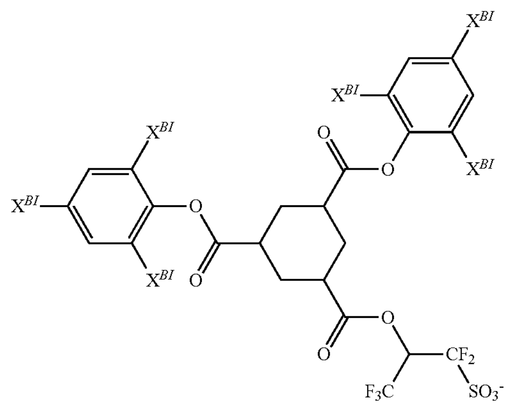
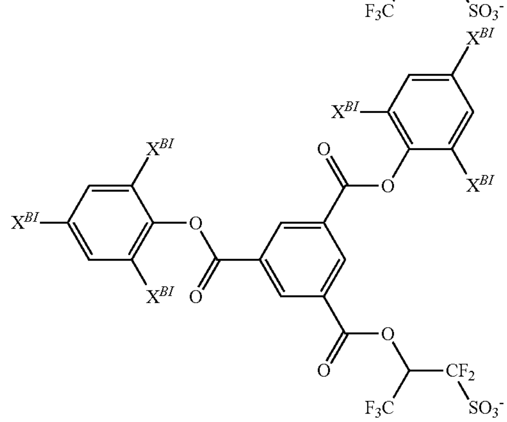
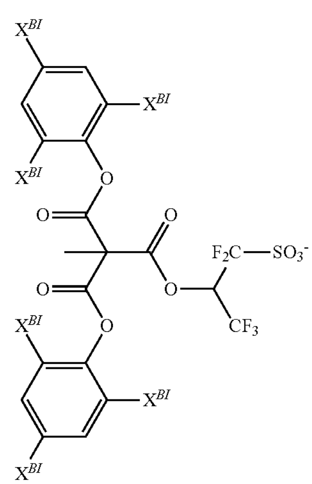

-continued
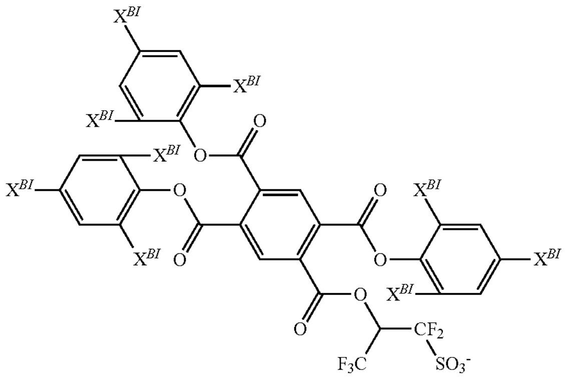
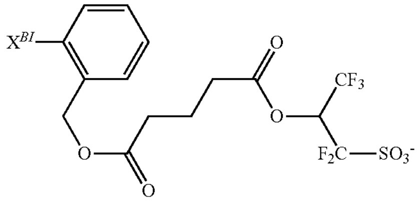
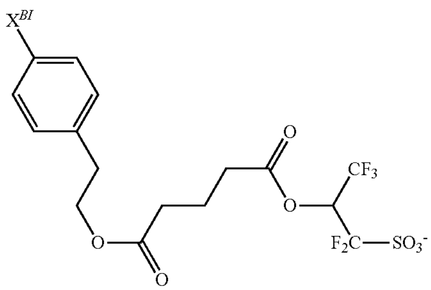
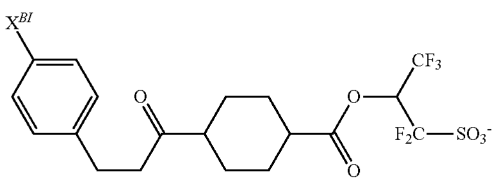
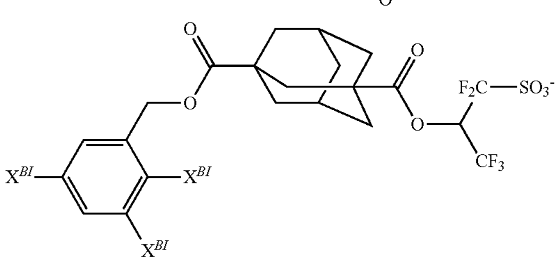
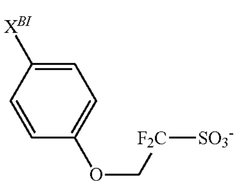
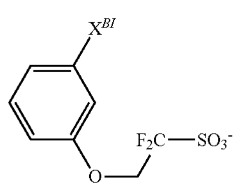
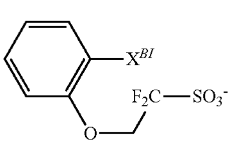
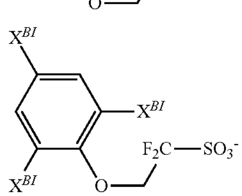
-continued
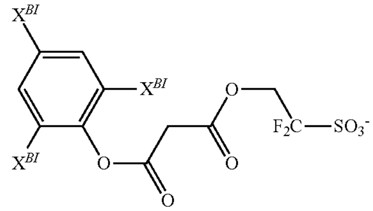
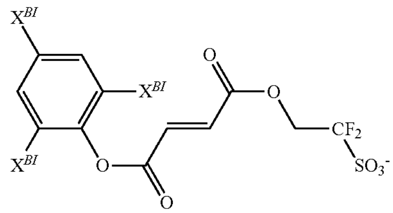
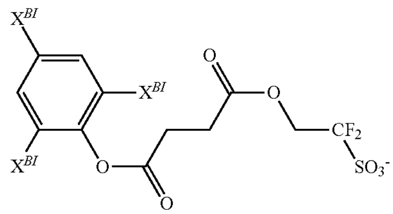
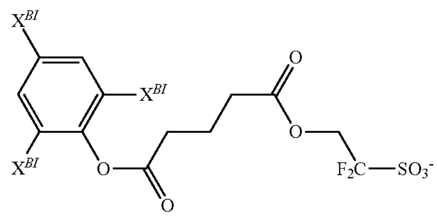
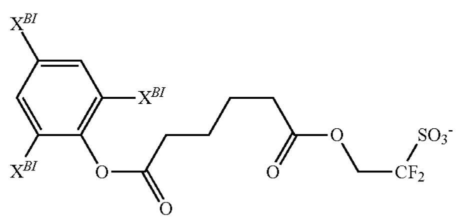
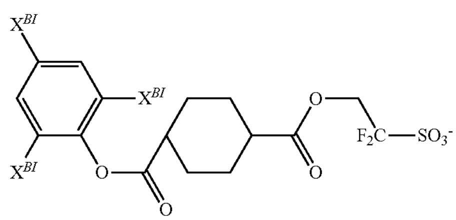
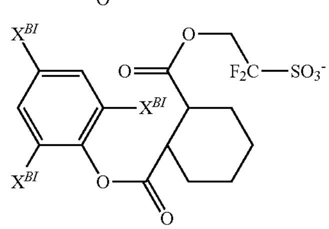
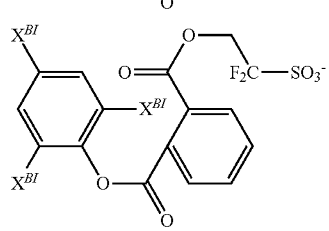

-continued
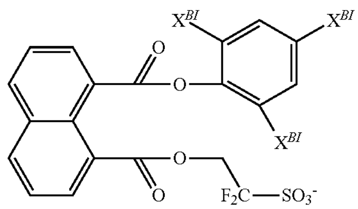
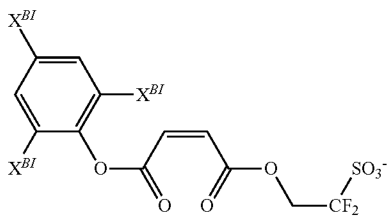
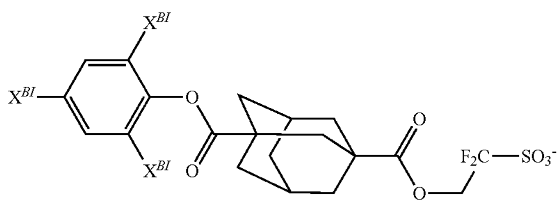
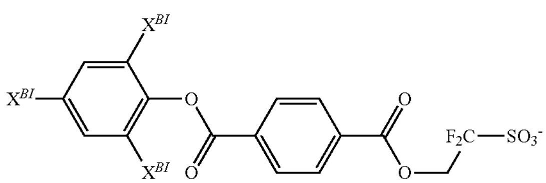
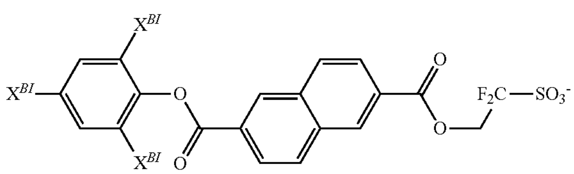
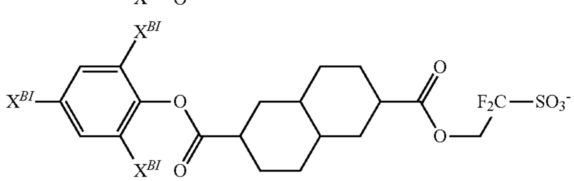
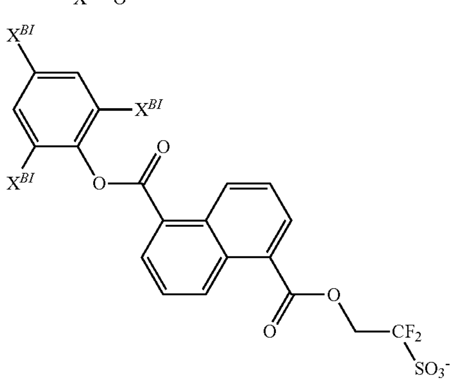
-continued
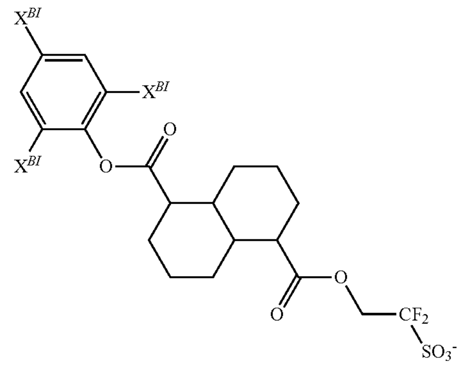
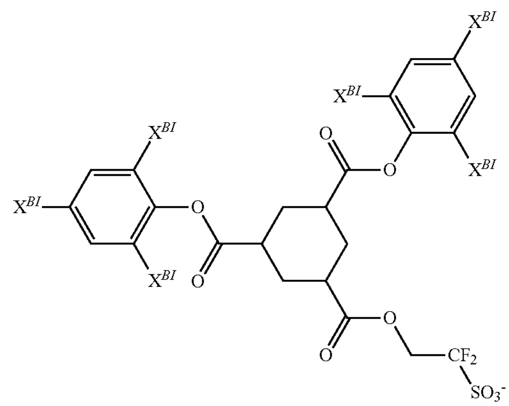
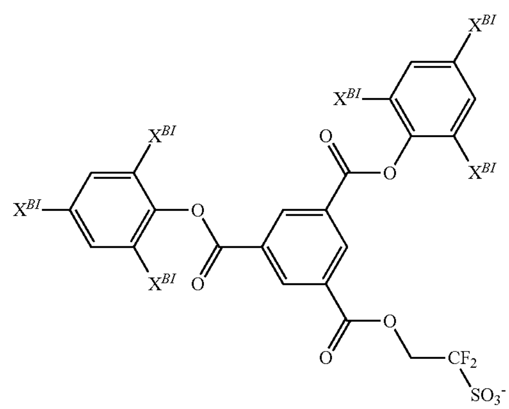
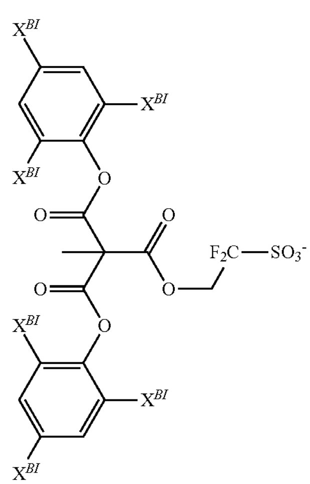

-continued
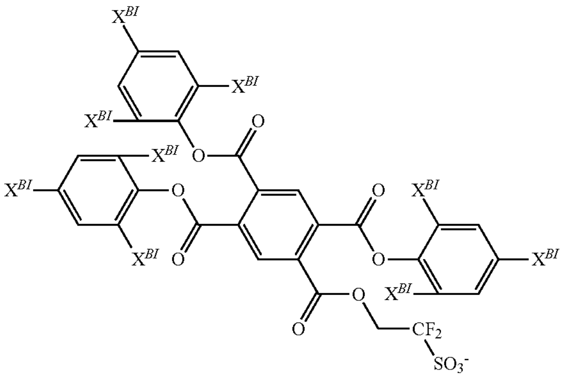
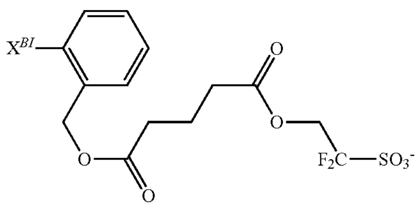
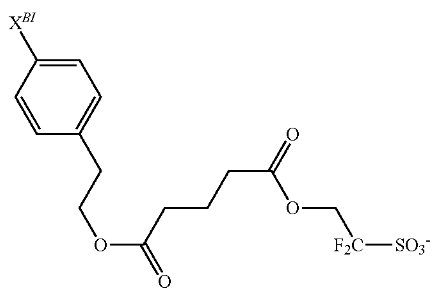
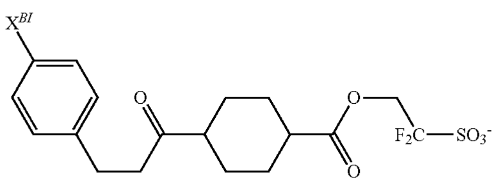
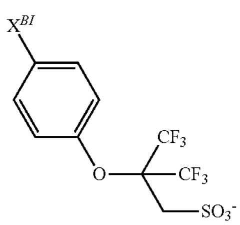
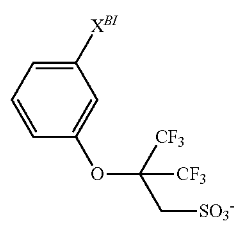
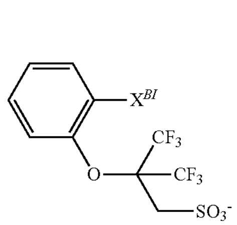
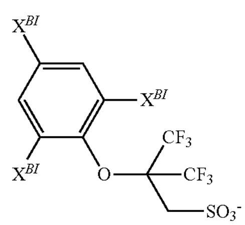
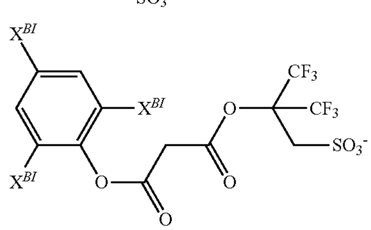
-continued
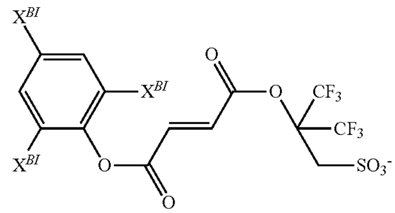
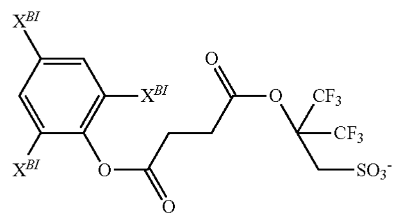
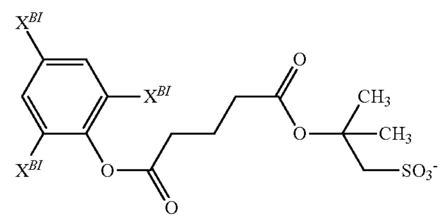
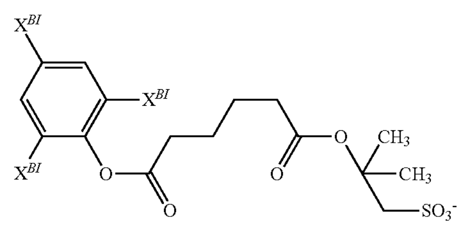
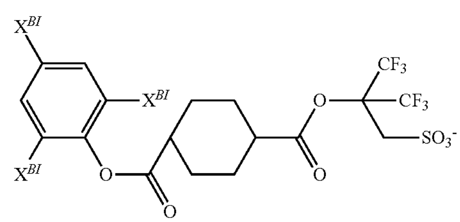
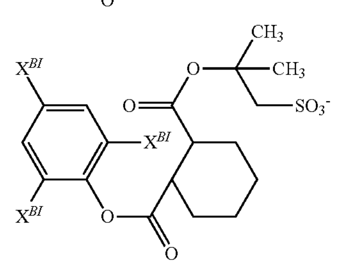
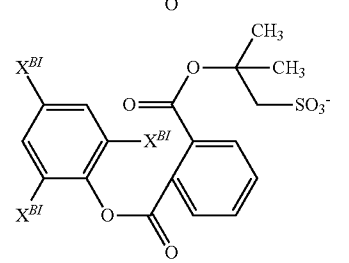

-continued
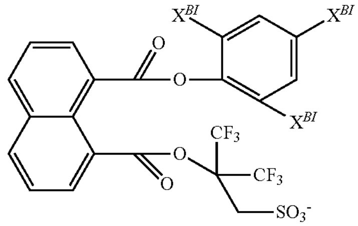
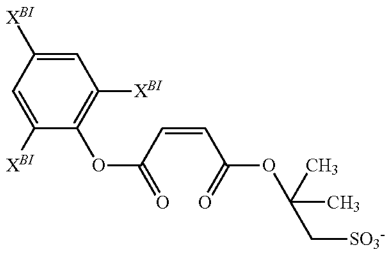
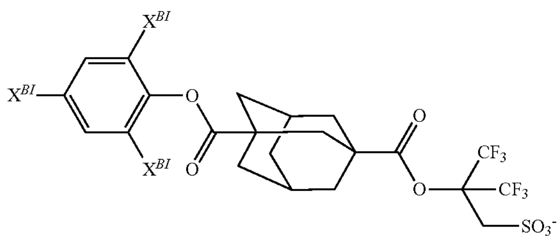
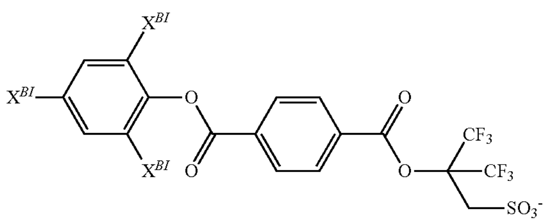
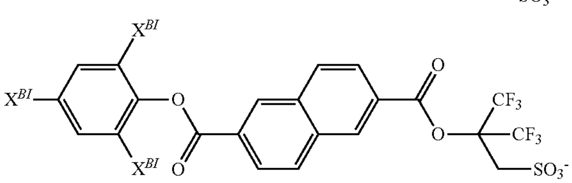
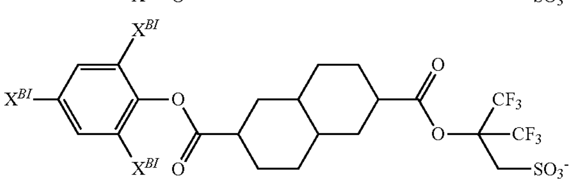
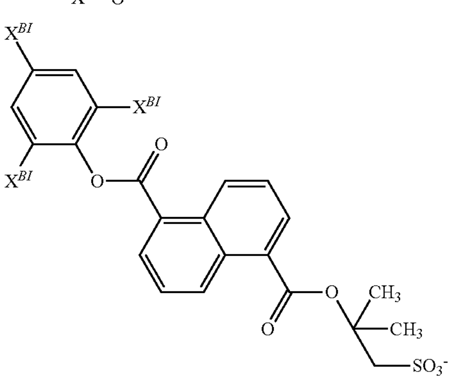
-continued
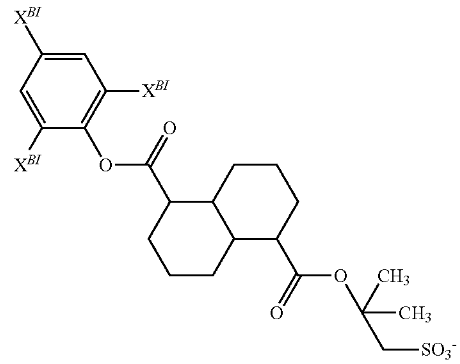
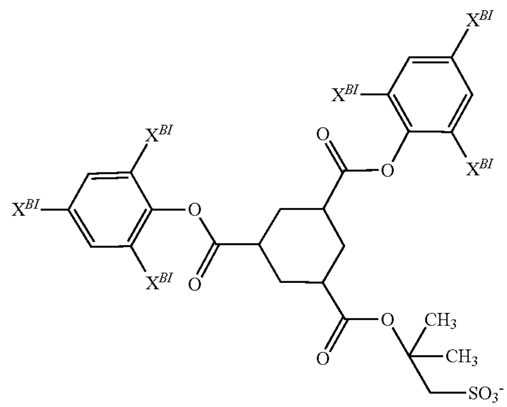
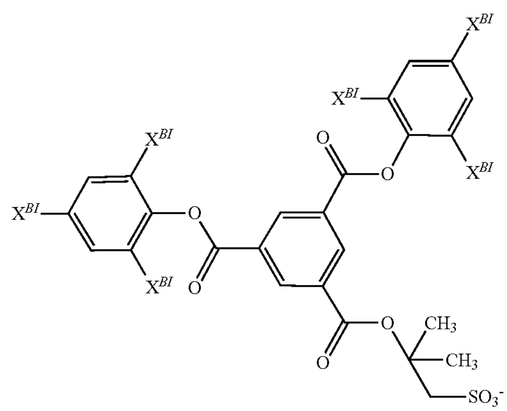
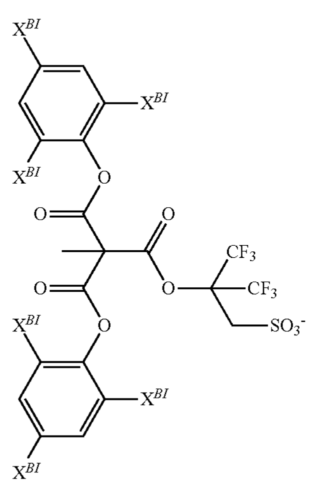

-continued

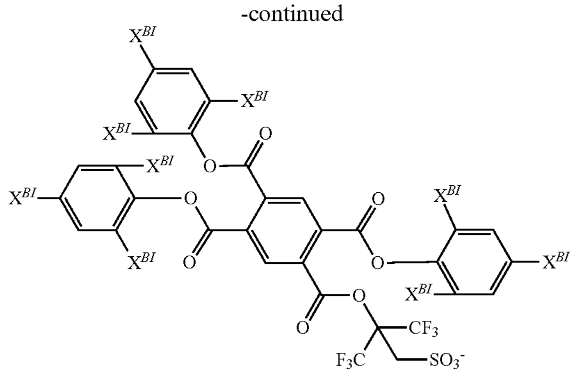

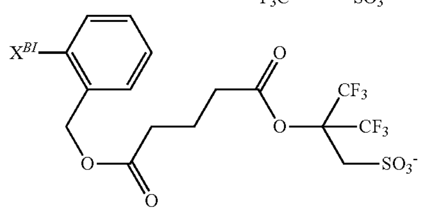

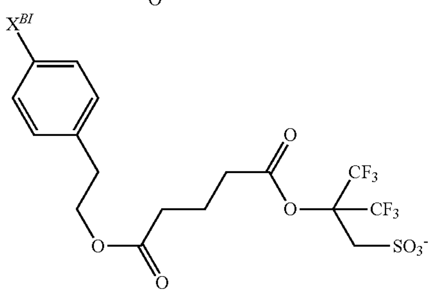

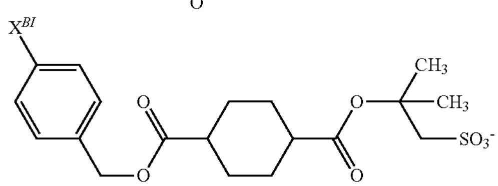

In the positive resist composition, the acid generator of addition type is preferably used in an amount of 0.1 to 50 parts, more preferably 1 to 40 parts by weight per 100 parts by weight of the base polymer. When the base polymer contains recurring units (d1) to (d3) and/or the acid generator of addition type is added, the positive resist composition functions as a chemically amplified positive resist composition.

Organic Solvent

The positive resist composition may contain an organic solvent. The organic solvent is not particularly limited as long as the foregoing components and other components are dissolvable therein. Examples of the organic solvent used herein are described in U.S. Pat. No. 7,537,880 (JP-A 2008-111103, paragraphs [0144]-[0145]). Exemplary solvents include ketones such as cyclohexanone, cyclopentanone, methyl-2-n-pentyl ketone, and 2-heptanone; alcohols such as 3-methoxybutanol, 3-methyl-3-methoxybutanol, 1-methoxy-2-propanol, 1-ethoxy-2-propanol, and diacetone alcohol (DAA); ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof.

The organic solvent is preferably added in an amount of 100 to 10,000 parts, and more preferably 200 to 8,000 parts by weight per 100 parts by weight of the base polymer.

Other Components

In addition to the foregoing components, other components such as quencher, surfactant, dissolution inhibitor and water repellency improver may be blended in any desired combination to formulate a positive resist composition. This positive resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs.

The quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl, ether bond, ester bond, lactone ring, cyano, or sulfonic acid ester bond as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Suitable quenchers also include onium salts such as sulfonium salts, iodonium salts and ammonium salts of sulfonic acids which are not fluorinated at α-position and similar onium salts of carboxylic acid, as described in JP-A 2008-158339. While an α-fluorinated sulfonic acid, imide acid, and methide acid are necessary to deprotect the acid labile group of carboxylic acid ester, an α-non-fluorinated sulfonic acid or a carboxylic acid is released by salt exchange with an α-non-fluorinated onium salt. An α-non-fluorinated sulfonic acid and a carboxylic acid function as a quencher because they do not induce deprotection reaction.

Examples of the quencher include a compound (onium salt of α-non-fluorinated sulfonic acid) having the formula (4) and a compound (onium salt of carboxylic acid) having the formula (5).

$$R^{501}—SO_3^- \ Mq^+$$

$$R^{502}—CO_2^- \ Mq^+$$

In formula (4), $R^{501}$ is hydrogen or a $C_1$-$C_{40}$ hydrocarbyl group which may contain a heteroatom, exclusive of the hydrocarbyl group in which the hydrogen bonded to the carbon atom at α-position of the sulfone group is substituted by fluorine or fluoroalkyl group.

The hydrocarbyl group may be saturated or unsaturated and straight, branched or cyclic. Examples thereof include alkyl groups such as methyl, ethyl, propyl, isopropyl, n-butyl, sec-butyl, tert-butyl, tert-pentyl, n-pentyl, n-hexyl, n-octyl, 2-ethylhexyl, n-nonyl, n-decyl; cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.$0^{2,6}$]decanyl, adamantyl, and adamantylmethyl; alkenyl groups such as vinyl, allyl, propenyl, butenyl and hexenyl; cyclic unsaturated aliphatic hydrocarbyl groups such as cyclohexenyl; aryl groups such as phenyl, naphthyl, alkylphenyl groups (e.g., 2-methylphenyl, 3-methylphenyl, 4-methylphenyl, 4-ethylphenyl, 4-tert-butylphenyl, 4-n-butylphenyl), dialkylphenyl groups (e.g., 2,4-dimethylphenyl and 2,4,6-triisopropylphenyl), alkylnaphthyl groups (e.g., methylnaphthyl and ethylnaphthyl), dialkylnaphthyl groups (e.g., dimethylnaphthyl and diethylnaphthyl); heteroaryl groups such as thienyl; and aralkyl groups such as benzyl, 1-phenylethyl and 2-phenylethyl.

In these groups, some hydrogen may be substituted by a moiety containing a heteroatom such as oxygen, sulfur, nitrogen or halogen, and some carbon may be replaced by a moiety containing a heteroatom such as oxygen, sulfur or nitrogen, so that the group may contain a hydroxyl moiety, cyano moiety, carbonyl moiety, ether bond, ester bond sulfonic acid ester bond, carbonate bond, lactone ring, sultone ring, carboxylic anhydride, or haloalkyl moiety. Suitable heteroatom-containing hydrocarbyl groups include 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, 3-tert-butoxyphenyl; alkoxynaphthyl groups such as methoxynaphthyl, ethoxynaphthyl, n-propoxynaphthyl and n-butoxynaphthyl; dialkoxynaphthyl groups such as dimethoxynaphthyl and diethoxynaphthyl; and aryloxoalkyl groups, typically 2-aryl-2-oxoethyl groups such as 2-phenyl-2-oxoethyl, 2-(l-naphthyl)-2-oxoethyl and 2-(2-naphthyl)-2-oxoethyl.

In formula (5), $R^{502}$ is a $C_1$-$C_{40}$ hydrocarbyl group which may contain a heteroatom. Examples of the hydrocarbyl group $R^{502}$ are as exemplified above for the hydrocarbyl group $R^{501}$. Also included are fluorinated alkyl groups such as trifluoromethyl, trifluoroethyl, 2,2,2-trifluoro-1-methyl-1-hydroxyethyl, 2,2,2-trifluoro-1-(trifluoromethyl)-1-hydroxyethyl, and fluorinated aryl groups such as pentafluorophenyl and 4-trifluoromethylphenyl.

In formulae (4) and (5), $Mq^-$ is an onium cation. The onium cation is preferably a sulfonium, iodonium or ammonium cation, more preferably sulfonium or iodonium cation. Examples of the sulfonium cation are as exemplified above for the cation in the sulfonium salt having formula (1-1). Examples of the iodonium cation are as exemplified above for the cation in the iodonium salt having formula (1-2).

A sulfonium salt of iodized benzene ring-containing carboxylic acid having the formula (6) is also useful as the quencher.

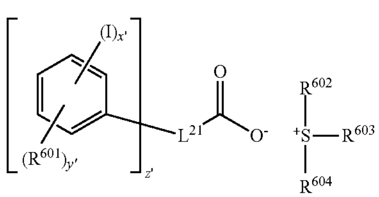

(6)

In formula (6), $R^{601}$ is hydroxyl, fluorine, chlorine, bromine, amino, nitro, cyano, or a $C_1$-$C_6$ saturated hydrocarbyl, $C_1$-$C_6$ saturated hydrocarbyloxy, $C_2$-$C_6$ saturated hydrocarbylcarbonyloxy or $C_1$-$C_4$ saturated hydrocarbylsulfonyloxy group, in which some or all hydrogen may be substituted by halogen, or —N($R^{601A}$)—C(═O)—$R^{601B}$, or —N($R^{601A}$)—C(═O)—O—$R^{601B}$. $R^{601A}$ is hydrogen or a $C_1$-$C_6$ saturated hydrocarbyl group. $R^{601B}$ is a $C_1$-$C_6$ saturated hydrocarbyl or $C_2$-$C_8$ unsaturated aliphatic hydrocarbyl group.

In formula (6), x' is an integer of 1 to 5, y' is an integer of 0 to 3, and z' is an integer of 1 to 3. $L^{21}$ is a single bond, or a $C_1$-$C_{20}$ (z'+1)-valent linking group which may contain at least one moiety selected from ether bond, carbonyl moiety, ester bond, amide bond, sultone ring, lactam ring, carbonate bond, halogen, hydroxyl moiety, and carboxyl moiety. The saturated hydrocarbyl, saturated hydrocarbyloxy, saturated hydrocarbylcarbonyloxy, and saturated hydrocarbylsulfonyloxy groups may be straight, branched or cyclic. Groups $R^{601}$ may be the same or different when y' and/or z' is 2 or 3.

In formula (6), $R^{602}$, $R^{603}$ and $R^{604}$ are each independently halogen or a $C_1$-$C_{20}$ hydrocarbyl group which may contain a heteroatom. The hydrocarbyl group may be saturated or unsaturated and straight, branched or cyclic. Examples thereof include $C_1$-$C_{20}$ alkyl, $C_2$-$C_{20}$ alkenyl, $C_6$-$C_{20}$ aryl, and $C_7$-$C_{20}$ aralkyl groups. In these groups, some or all hydrogen may be substituted by hydroxyl, carboxyl, halogen, oxo, cyano, nitro, sultone, sulfone, or sulfonium salt-containing moiety, or some carbon may be replaced by an ether bond, ester bond, carbonyl moiety, amide bond, carbonate moiety or sulfonic acid ester bond. Also $R^{602}$ and $R^{603}$ may bond together to form a ring with the sulfur atom to which they are attached.

Examples of the compound having formula (6) include those described in U.S. Pat. No. 10,295,904 (JP-A 2017-219836). These compounds are highly absorptive and exert a high sensitizing effect and acid diffusion controlling effect.

Also useful are quenchers of polymer type as described in U.S. Pat. No. 7,598,016 (JP-A 2008-239918). The polymeric quencher segregates at the resist film surface and thus enhances the rectangularity of resist pattern. When a protective film is applied as is often the case in the immersion lithography, the polymeric quencher is also effective for preventing a film thickness loss of resist pattern or rounding of pattern top.

In the resist composition, the quencher is preferably added in an amount of 0 to 5 parts, more preferably 0 to 4 parts by weight per 100 parts by weight of the base polymer. The quenchers may be used alone or in admixture.

Exemplary surfactants are described in JP-A 2008-111103, paragraphs [0165]-[0166], Inclusion of a surfactant may improve or control the coating characteristics of the resist composition. The surfactant may be used alone or in admixture. The surfactant is preferably added in an amount of 0.0001 to 10 parts by weight per 100 parts by weight of the base polymer.

The inclusion of a dissolution inhibitor may lead to an increased difference in dissolution rate between exposed and unexposed areas and a further improvement in resolution. The dissolution inhibitor which can be used herein is a compound having at least two phenolic hydroxyl groups on the molecule, in which an average of from 0 to 100 mol % of all the hydrogen atoms on the phenolic hydr oxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

The dissolution inhibitor is preferably added in an amount of 0 to 50 parts, more preferably 5 to 40 parts by weight per 100 parts by weight of the base polymer. The dissolution inhibitor may be used alone or in admixture.

To the resist composition, a water repellency improver may also be added for improving the water repellency on surface of a resist film. The water repellency improver may be used in the topcoatless immersion lithography. Suitable water repellency unprovers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the alkaline developer or organic solvent developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. An appropriate amount of the water repellency improver is 0 to parts, preferably 0.5 to 10 parts by weight per 100 parts by weight of the base polymer. The water repellency improver may be used alone or in admixture.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer. The acetylene alcohol may be used alone or in admixture.

Process

The positive resist composition is used in the fabrication of various integrated circuits. Pattern formation using the resist composition may be performed by well-known lithography processes. The process generally involves the steps of applying the positive resist composition to form a resist film on a substrate, exposing the resist film to high-energy radiation, and developing the exposed resist film in a developer.

First, the positive resist composition is applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hotplate preferably at a temperature of 60 to 150° C. for 10 seconds to 30 minutes, more preferably at 80 to 120° C. for 30 seconds to 20 minutes. The resulting resist film is generally 0.01 to 2 μm thick.

The resist film is then exposed to a desired pattern of high-energy radiation such as UV, deep-UV, EB, EUV of wavelength 3 to 15 nm, x-ray, soft x-ray, excimer laser fight, γ-ray or synchrotron radiation. When UV, deep-UV, EUV, x-ray, soft x-ray, excimer laser light, γ-ray or synchrotron radiation is used as the high-energy radiation, the resist film is exposed thereto through a mask having a desired pattern in a dose of preferably about 1 to 200 mJ/$cm^2$, more preferably about 10 to 100 mJ/$cm^2$. When EB is used as the high-energy radiation, the resist film is exposed thereto through a mask having a desired pattern or directly in a dose of preferably about 0.1 to 100 μC/$cm^2$, more preferably about 0.5 to 50 μC/$cm^2$. It is appreciated that the inventive resist composition is suited in micropatterning using KrF excimer laser, ArF excimer laser, EB, EUV, x-ray, soft x-ray, γ-ray or synchrotron radiation, especially in micropatterning using EB or EUV.

After the exposure, the resist film may be baked (PEB) on a hotplate or in an oven to preferably at 50 to 150° C. for 10 seconds to 30 minutes, more preferably at 60 to 120° C. for seconds to 20 minutes.

After the exposure or PEB, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonimn hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-pentyl ether, and di-n-hexyl ether.

Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, tert-butylbenzene and mesitylene.

Rinsing is effective for minimizing the risks of resist pattern collapse and defect formation. However, rinsing is not essential. If rinsing is omitted, the amount of solvent used may be reduced.

A hole or trench pattern after development may be shrunk by tire thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is shipped and the hole pattern is shrunk.

EXAMPLES

Examples of the invention are given below by way of illustration and not by way of limitation. All parts are by weight (pbw). Mw and Mw/Mn are determined by GPC versus polystyrene standards using THF solvent.

[1] Synthesis of Monomers

Synthesis Examples 1-1 to 1-12

Synthesis of Monomers M-1 to M-12

Each of Monomers M-1 to M-12 of the formula shown below was prepared by mixing a nitrogen-containing monomer with a sulfonamide having iodized aromatic ring.

M-1

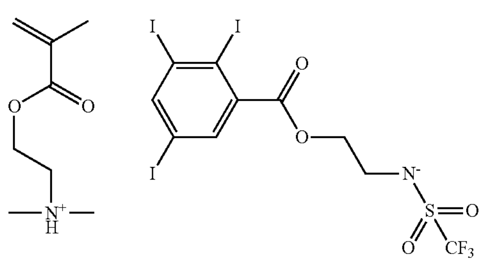

M-2

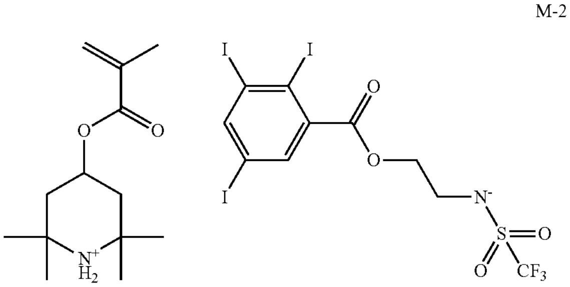

-continued

M-3

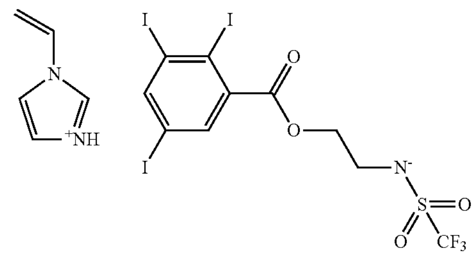

M-4

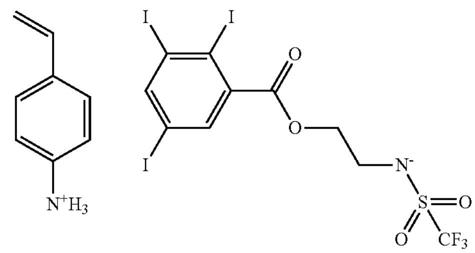

M-5

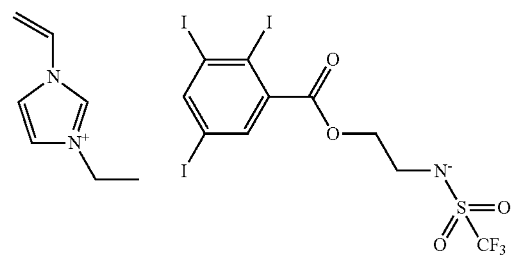

M-6

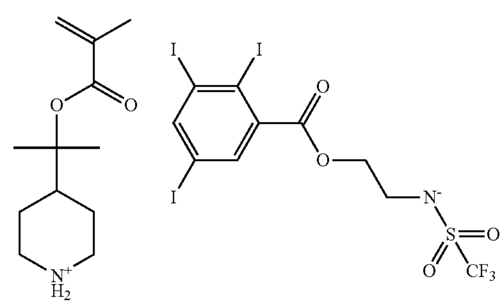

M-7

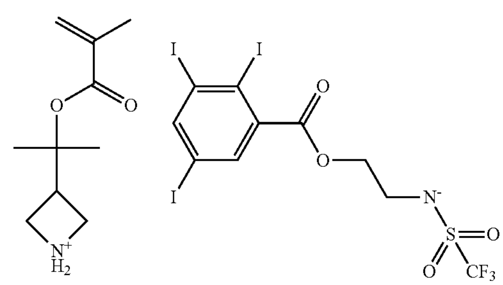

M-8

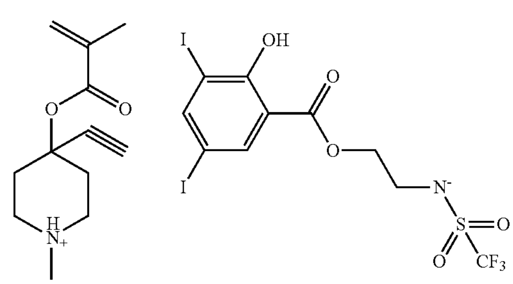

-continued
M-9
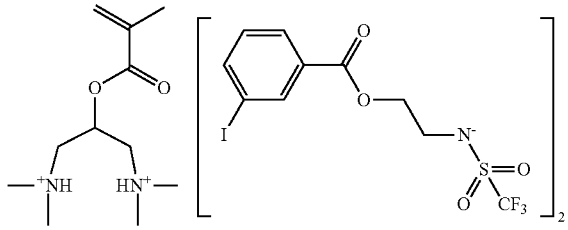
M-10
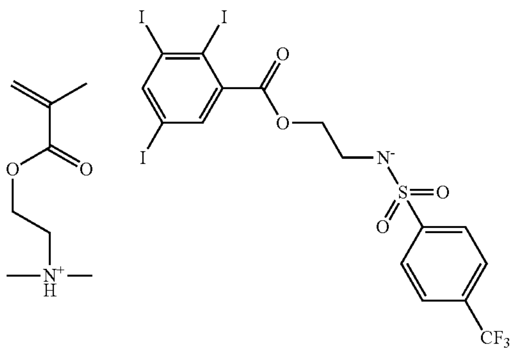
M-11
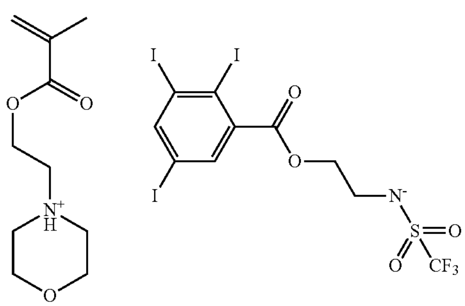
M-12
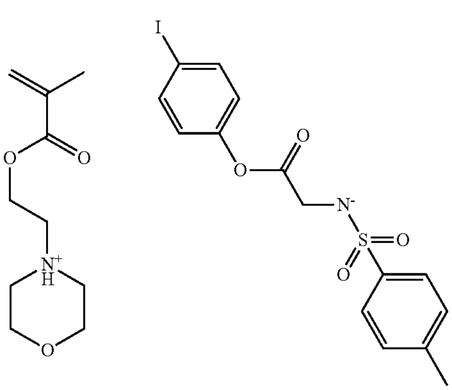
[2] Synthesis of Polymers
PAG Monomers 1 to 3 identified below were used in the synthesis of polymers.
PAG Monomer 1
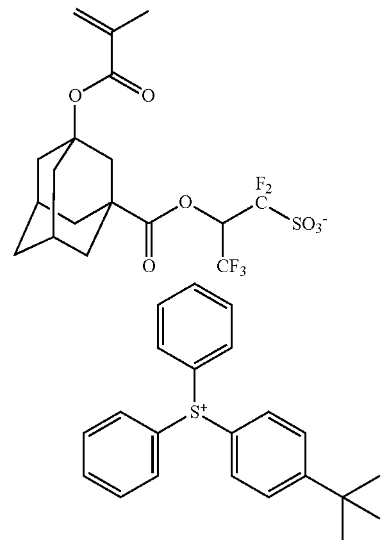
PAG Monomer 2
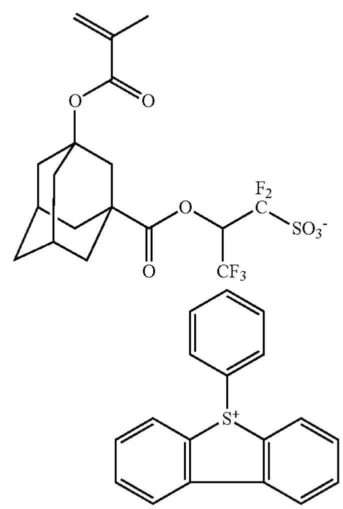
PAG Monomer 3
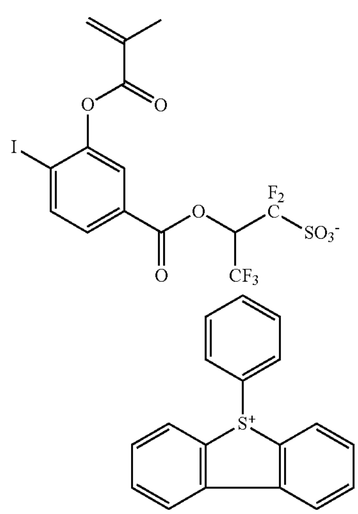

Synthesis Example 2-1

Synthesis of Polymer P-1

A 2-L flask was charged with 4.2 g of Monomer M-1, 8.4 g of 1-methyl-1-cyclopentyl methacrylate, 5.4 g of 4-hydroxystyrene, and 40 g of tetrahydrofuran (THF) as solvent. The reactor was cooled at −70° C. in nitrogen atmosphere, after which vacuum pumping and nitrogen blow were repeated three times. The reactor was warmed up to room temperature, whereupon 1.2 g of azobisisobutyronitrile (AIBN) was added. The reactor was heated at 60° C., whereupon reaction ran for 15 hours. The reaction solution was poured into 1 L of isopropyl alcohol for precipitation. The precipitated white solid was collected by filtration and vacuum dried at 60° C., yielding Polymer P-1. Polymer P-1 was analyzed for composition by $^{13}$C- and $^{1}$H-NMR and for Mw and Mw/Mn by GPC.

P-1
Mw = 7,800
Mw/Mn = 1.69

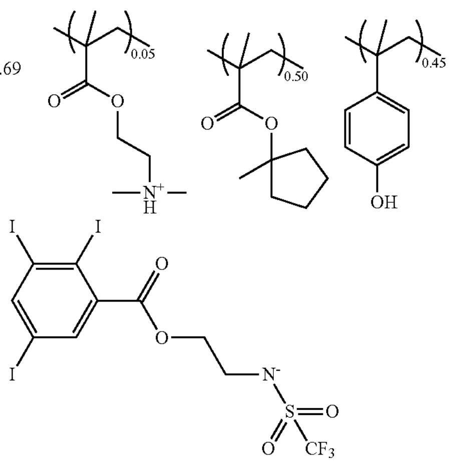

-continued

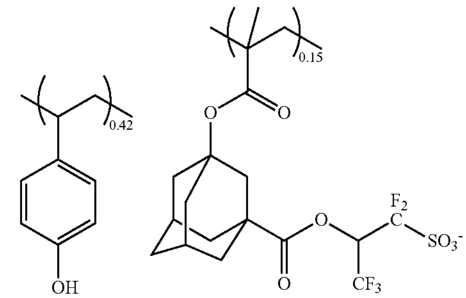

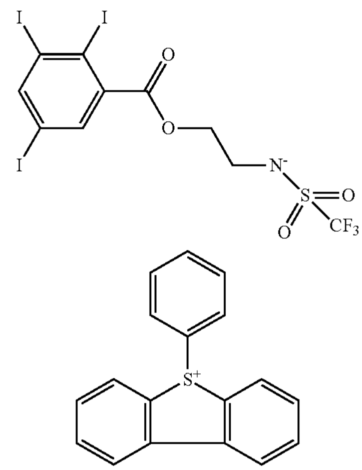

Synthesis Example 2-2

Synthesis of Polymer P-2

A 2-L flask was charged with 2.7 g of M-2, 7.3 g of 1-methyl-1-cyclohexyl methacrylate, 5.0 g of 4-hydroxystyrene, 11.0 g of PM-2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The precipitated white solid was collected by filtration and vacuum dried at 60° C., yielding Polymer P-2. Polymer P-2 was analyzed for composition by $^{13}$C- and $^{1}$H-NMR and for Mw and Mw/Mn by GPC.

P-2
Mw = 9,300
Mw/Mn = 1.91

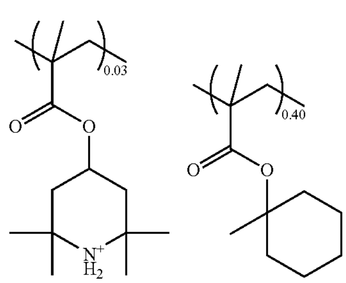

Synthesis Example 2-3

Synthesis of Polymer P-3

A 2-L flask was charged with 3.8 g of M-3, 8.4 g of 1-methyl-1-cyclopentyl methacrylate, 3.6 g of 3-hydroxystyrene, 11.9 g of PM-1, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The precipitated white solid was collected by filtration and vacuum dried to at 60° C., yielding Polymer P-3. Polymer P-3 was analyzed for composition by $^{13}$C- and $^{1}$H-NMR and for Mw and Mw/Mn by GPC.

P-3

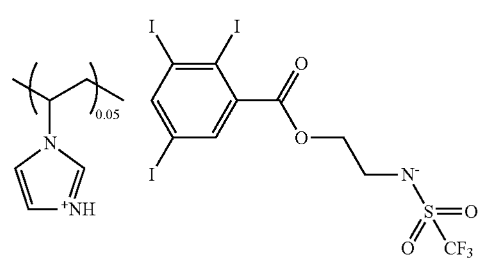

-continued

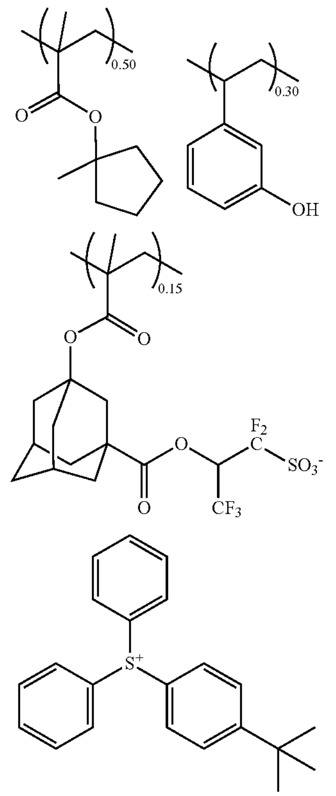

Mw = 9,900
Mw/Mn = 1.91

-continued

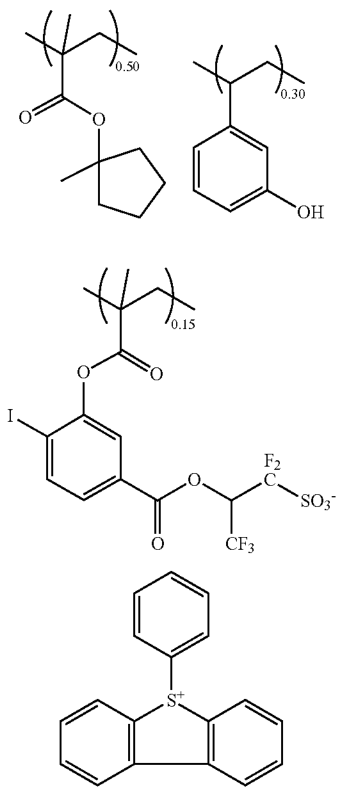

Mw = 9,100
Mw/Mn = 1.71

Synthesis Example 2-4

Synthesis of Polymer P-4

A 2-L flask was charged with 4.0 g of M-4, 8.4 g of 1-methyl-1-cyclopentyl methacrylate, 3.6 g of 3-hydroxystyrene, 12.1 g of PM-3, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The precipitated white solid was collected by filtration and vacuum dried at 60° C., yielding Polymer P-4. Polymer P-4 was analyzed for composition by $^{13}C$- and $^{1}H$-NMR and for Mw and Mw/Mn by GPC.

P-4

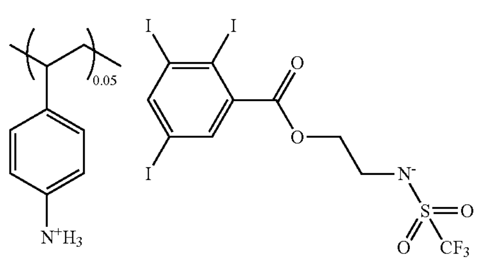

Synthesis Example 2-5

Synthesis of Polymer P-5

A 2-L flask was charged with 4.0 g of M-5, 8.4 g of 1-methyl-1-cyclopentyl methacrylate, 3.6 g of 3-hydroxystyrene, 11.0 g of PM-2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The precipitated white solid was collected by filtration and vacuum dried at 60° C., yielding Polymer P-5. Polymer P-5 was analyzed for composition by $^{13}C$- and $^{1}H$-NMR and for Mw and Mw/Mn by GPC.

P-5

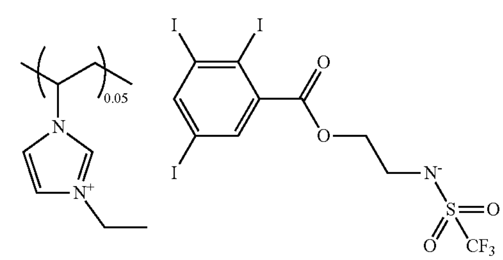

-continued

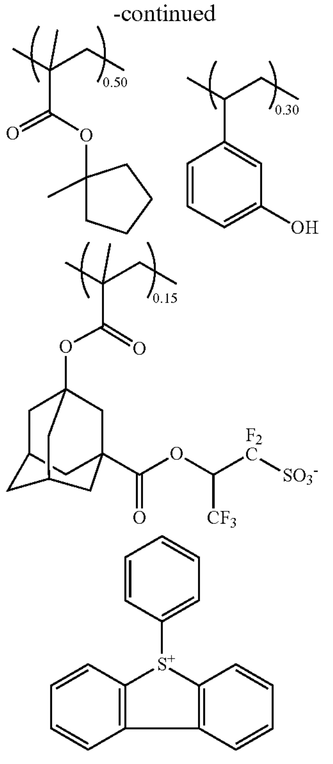

Mw = 9,600
Mw/Mn = 1.77

Synthesis Example 2-6

Synthesis of Polymer P-6

A 2-L flask was charged with 6.2 g of M-6, 8.4 g of 1-methyl-1-cyclopentyl methacrylate, 3.4 g of 3-hydroxystyrene, 11.0 g of PM-2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 horn s. The reaction solution was poured into 1 L of isopropyl alcohol for precipitation. The precipitated white solid was collected by filtration and vacuum dried at 60° C., yielding Polymer P-6. Polymer P-6 was analyzed for composition by $^{13}C$- and $^{1}H$-NMR and for Mw and Mw/Mn by GPC.

P-6

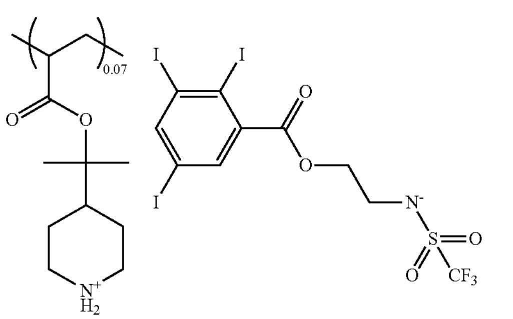

-continued

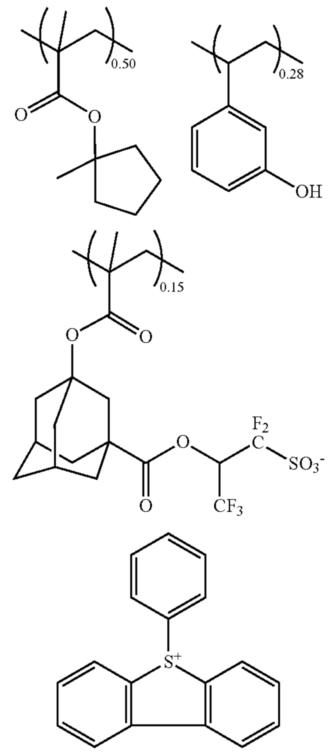

Mw = 10,100
Mw/Mn = 1.93

Synthesis Example 2-7

Synthesis of Polymer P-7

A 2-L flask was charged with 6.0 g of M-7, 8.4 g of 1-methyl-1-cyclopentyl methacrylate, 3.4 g of 3-hydroxystyrene, 11.0 g of PM-2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The precipitated white solid was collected by filtration and vacuum dried at 60° C., yielding Polymer P-7. Polymer P-7 was analyzed for composition by $^{13}C$- and $^{1}H$-NMR and for Mw and Mw/Mn by GPC.

P-7

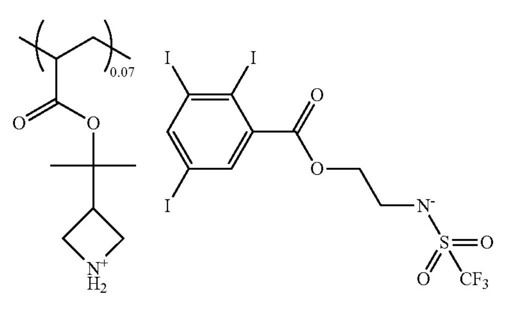

-continued

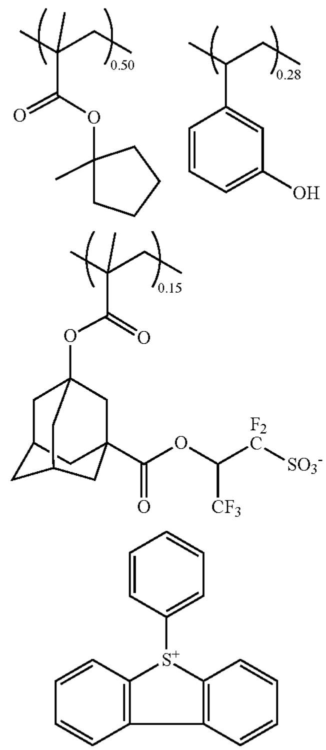

Synthesis Example 2-8

Synthesis of Polymer P-8

A 2-L flask was charged with 5.4 g of M-8, 8.4 g of 1-methyl-1-cyclopentyl methacrylate, 3.4 g of 3-hydroxystyrene, 11.0 g of PM-2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The precipitated white solid was collected by filtration and vacuum dried at 60° C., yielding Polymer P-8. Polymer P-8 was analyzed for composition by $^{13}C$- and $^{1}H$-NMR and for Mw and Mw/Mn by GPC.

P-8

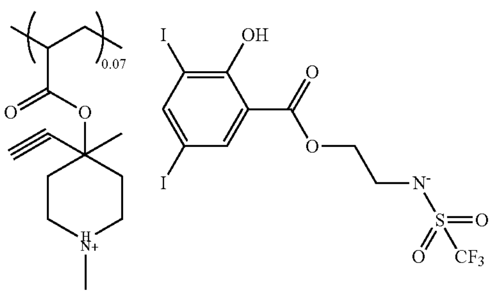

-continued

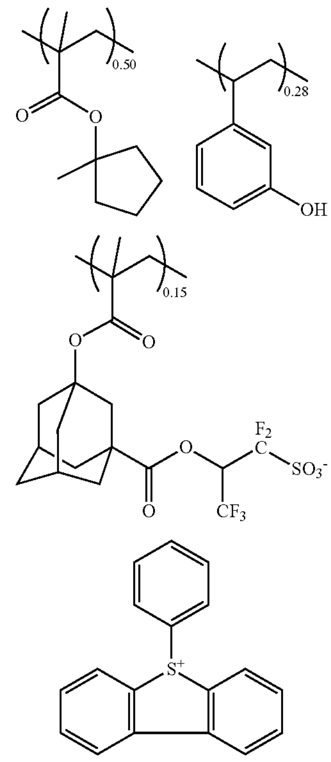

Synthesis Example 2-9

Synthesis of Polymer P-9

A 2-L flask was charged with 5.7 g of M-9, 8.4 g of 1-methyl-1-cyclopentyl methacrylate, 3.4 g of 3-hydroxystyrene, 11.0 g of PM-2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The precipitated white solid was collected by filtration and vacuum dried at 60° C., yielding Polymer P-9. Polymer P-9 was analyzed for composition by $^{13}C$- and $^{1}H$-NMR and for Mw and Mw/Mn by GPC.

P-9

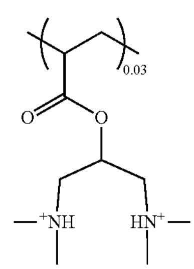

-continued

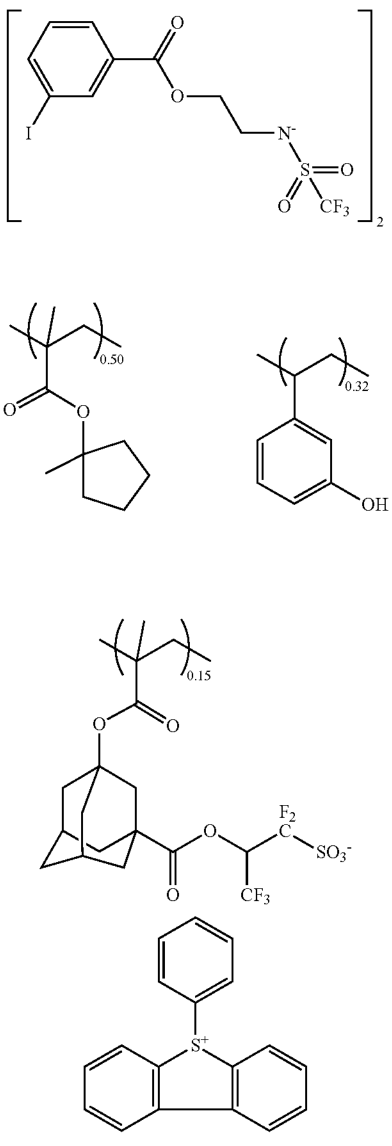

Mw = 10,500
Mw/Mn = 1.94

P-10

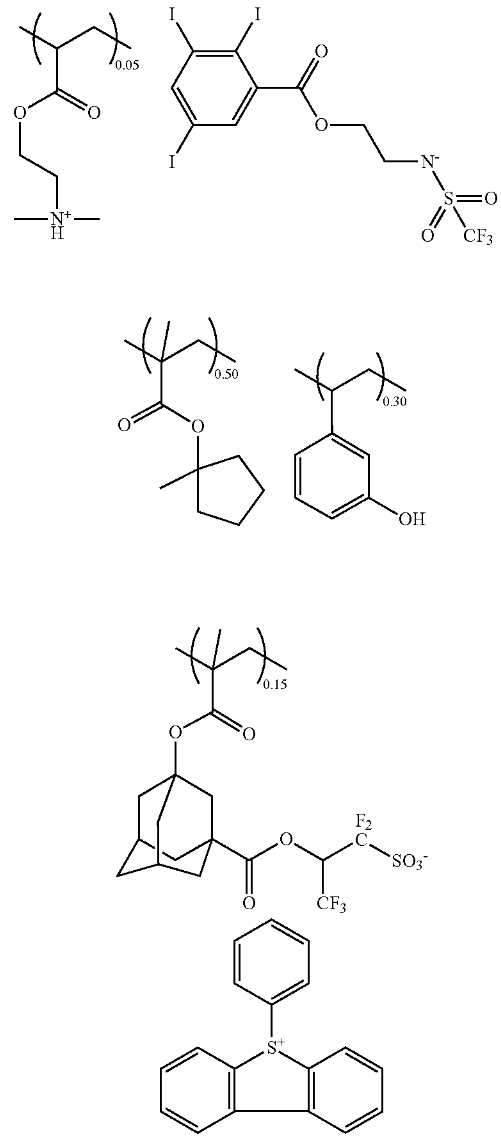

Mw = 9,700
Mw/Mn = 2.01

Synthesis Example 2-10

Synthesis of Polymer P-10

A 2-L flask was charged with 4.5 g of M-10, 8.4 g of 1-methyl-1-cyclopentyl methacrylate, 3.8 g of 3-hydroxystyrene, 11.0 g of PM-2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 horn s. The reaction solution was poured into 1 L of isopropyl alcohol for precipitation. The precipitated white solid was collected by filtration and vacuum dried at 60° C., yielding Polymer P-10. Polymer P-10 was analyzed for composition by $^{13}C$- and $^{1}H$-NMR and for Mw and Mw/Mn by GPC.

Synthesis Example 2-11

Synthesis of Polymer P-11

A 2-L flask was charged with 4.4 g of M-11, 8.4 g of 1-methyl-1-cyclopentyl methacrylate, 3.8 g of 3-hydroxystyrene, 11.0 g of PM-2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 horn s. The reaction solution was poured into 1 L of isopropyl alcohol for precipitation. The precipitated white solid was collected by filtration and vacuum dried at 60° C., yielding Polymer P-11. Polymer P-11 was analyzed for composition by $^{13}C$- and $^{1}H$-NMR and for Mw and Mw/Mn by GPC.

P-11

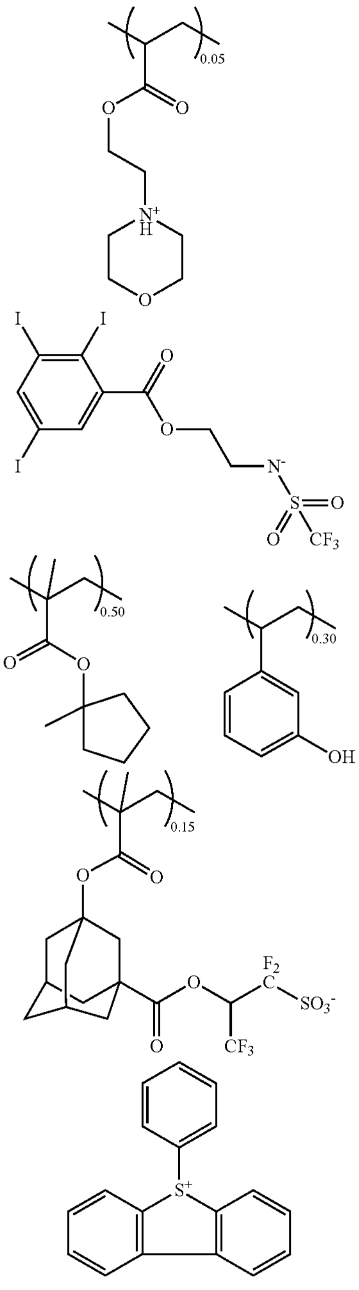

Mw = 9,600
Mw/Mn = 1.73

Synthesis Example 2-12

Synthesis of Polymer P-12

A 2-L flask was charged with 3.2 g of M-12, 8.4 g of 1-methyl-1-cyclopentyl methacrylate, 3.8 g of 3-hydroxystyrene, 11.0 g of PM-2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The precipitated white solid was collected by filtration and vacuum dried at 60° C., yielding Polymer P-12. Polymer P-12 was analyzed for composition by $^{13}C$- and $^{1}H$-NMR and for Mw and Mw/Mn by GPC.

P-12

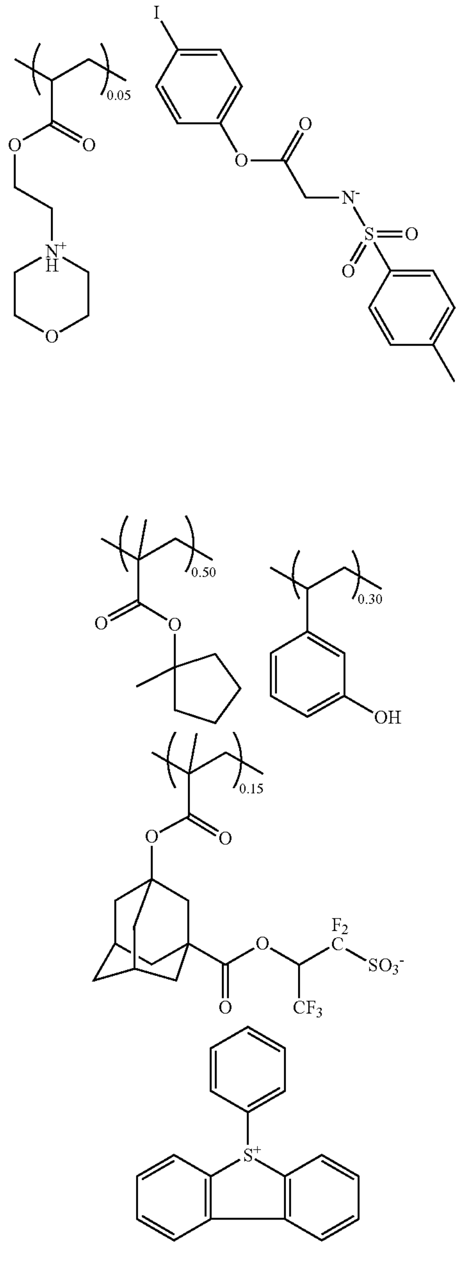

Mw = 9,200
Mw/Mn = 1.75

Comparative Synthesis Example 1

Comparative Polymer cP-1 was obtained by the same procedure as in Synthesis Example 2-1 except that Monomer M-1 was omitted. Comparative Polymer cP-1 was analyzed for composition by $^{13}C$- and $^{1}H$-NMR and for Mw and Mw/Mn by GPC.

cP-1

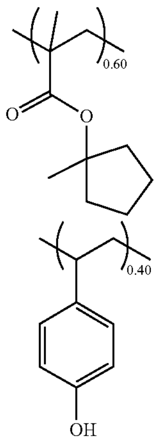

Mw = 9,900
Mw/Mn = 1.99

Comparative Synthesis Example 2

Comparative Polymer cP-2 was obtained by the same procedure as in Synthesis Example 2-1 except that 2-(dimethylamino)ethyl methacrylate was used instead of M-1. Comparative Polymer cP-2 was analyzed for composition by $^{13}$C- and $^{1}$H-NMR and for Mw and Mw/Mn by GPC.

cP-2

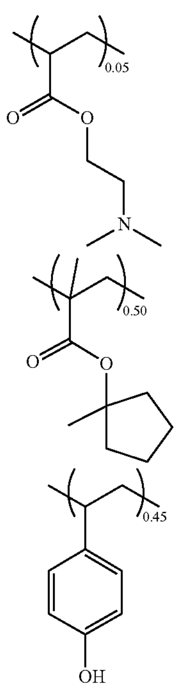

Mw = 7,100
Mw/Mn = 1.93

Comparative Synthesis Example 3

Comparative Polymer cP-3 was obtained by the same procedure as in Synthesis Example 2-2 except that Monomer M-2 was omitted and 1-methyl-1-cyclopentyl methacrylate was used instead of 1-methyl-1-cyclohexyl methacrylate. Comparative Polymer cP-3 was analyzed for composition by $^{13}$C- and $^{1}$H-NMR and for Mw and Mw/Mn by GPC.

cP-3

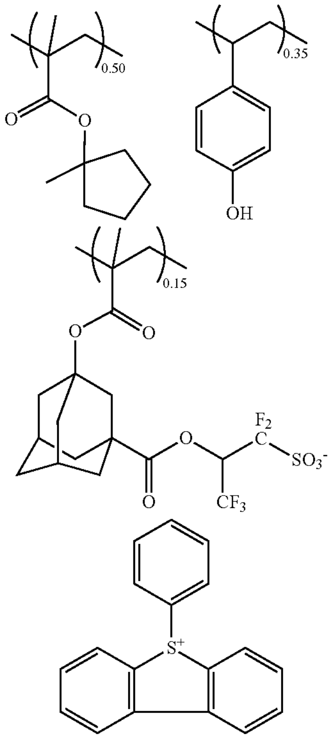

Mw = 9,800
Mw/Mn = 1.72

[3] Preparation and Evaluation of Resist Composition

Examples 1 to 12 and Comparative Examples 1 to 3

(1) Preparation of Resist Composition

Positive resist compositions were prepared by dissolving components in a solvent in accordance with the recipe shown in Table 1, and filtering through a filter having a pore size of 0.2 μm. The solvent contained 100 ppm of surfactant FC-4430 (3M). The components in Table 1 are as identified below.

Organic Solvents:

PGMEA (propylene glycol monomethyl ether acetate)

DAA (diacetone alcohol)

Acid generator: PAG-1 of the following structural formula

Quencher: Q-1 of the following structural formula

PAG-1

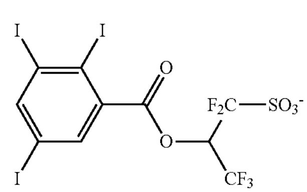

-continued

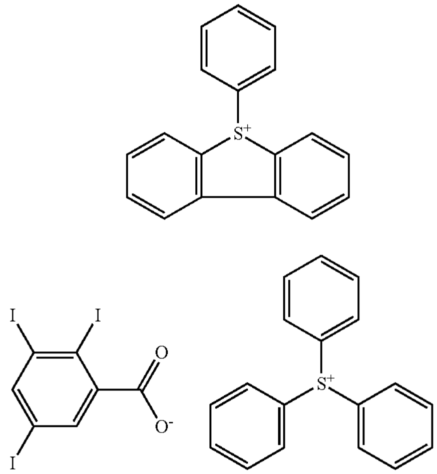

Q-1

(2) Evaluation by EUV Lithography

Each of the resist compositions in Table 1 was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 50 nm thick. Using an EUV scanner NXE3300 (ASML, NA 0.33, σ 0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Table 1 for 60 seconds and developed in a 2.38 wt % TMAH aqueous solution for 30 seconds to form a hole pattern having a size of 23 nm.

The resist pattern was observed under CD-SEM (CG-5000, Hitachi High-Technologies Corp.). The exposure dose that provides a hole pattern having a size of 23 nm is reported as sensitivity. The size of 50 holes was measured, from which a 3-fold value (3σ) of standard deviation (a) was computed and reported as size variation or CDU.

The resist composition is shown in Table 1 together with the sensitivity and CDU of EUV lithography.

TABLE 1

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Example | 1 | P-1 (100) | PAG-1 (25.0) | — | PGMEA (2,000) DAA (500) | 95 | 29 | 3.1 |
| | 2 | P-2 (100) | — | Q-1 (0.20) | PGMEA (2,000) DAA (500) | 95 | 27 | 2.3 |
| | 3 | P-3 (100) | — | — | PGMEA (2,000) DAA (500) | 95 | 26 | 2.8 |
| | 4 | P-4 (100) | — | — | PGMEA (2,000) DAA (500) | 95 | 25 | 2.6 |
| | 5 | P-5 (100) | — | — | PGMEA (2,000) DAA (500) | 95 | 26 | 2.5 |
| | 6 | P-6 (100) | — | — | PGMEA (2,000) DAA (500) | 95 | 26 | 2.6 |
| | 7 | P-7 (100) | — | — | PGMEA (2,000) DAA (500) | 95 | 24 | 2.5 |
| | 8 | P-8 (100) | — | — | PGMEA (2,000) DAA (500) | 95 | 24 | 2.5 |
| | 9 | P-9 (100) | — | — | PGMEA (2,000) DAA (500) | 95 | 26 | 2.6 |
| | 10 | P-10 (100) | — | — | PGMEA (2,000) DAA (500) | 95 | 25 | 2.6 |
| | 11 | P-11 (100) | — | — | PGMEA (2,000) DAA (500) | 95 | 26 | 2.6 |
| | 12 | P-12 (100) | — | — | PGMEA (2,000) DAA (500) | 95 | 28 | 2.6 |
| Comparative Example | 1 | cP-1 (100) | PAG-1 (25.0) | Q-1 (3.00) | PGMEA (2,000) DAA (500) | 95 | 35 | 5.6 |
| | 2 | cP-2 (100) | PAG-1 (25.0) | — | PGMEA (2,000) DAA (500) | 95 | 38 | 4.7 |
| | 3 | cP-3 (100) | — | Q-1 (3.00) | PGMEA (2,000) DAA (500) | 95 | 35 | 3.9 |

It is demonstrated in Table 1 that positive resist compositions comprising a base polymer comprising recurring units having the structure of an ammonium salt of a sulfonamide having an iodized aromatic ring offer a high sensitivity and improved CDU.

Japanese Patent Application No. 2020-086623 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising a base polymer comprising recurring units (a) having the structure of an ammonium salt of a sulfonamide having an iodized aromatic ring and recurring units of at least one type selected from recurring units (b1) having a carboxyl group substituted with an acid labile group and recurring units (b2) having a phenolic hydroxyl group substituted with an acid labile group, wherein the recurring units (a) have the formula (a):

(a)

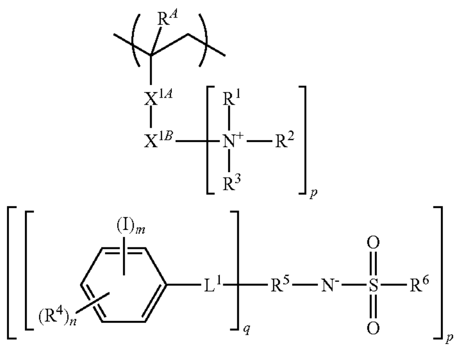

wherein m is an integer of 1 to 5, n is an integer of 0 to 3, $1 \le m+n \le 5$, p is 1 or 2, q is 1 or 2, $R^A$ is hydrogen or methyl, $X^{1A}$ is a single bond, ester bond or amide bond, $X^{1B}$ is a single bond or a $C_1$-$C_{20}$ (p+1)-valent hydrocarbon group which may contain an ether bond, carbonyl moiety, ester bond, amide bond, sultone moiety, lactam moiety, carbonate bond, halogen, hydroxyl moiety or carboxyl moiety, $R^1$, $R^2$ and $R^3$ are each independently hydrogen, a $C_1$-$C_{12}$ alkyl group, $C_2$-$C_{12}$ alkenyl group, $C_6$-$C_{12}$ aryl group, or $C_7$-$C_{12}$ aralkyl group, $R^1$ and $R^2$, or $R^1$ and $X^{1B}$ may bond together to form a ring with the nitrogen atom to which they are attached, the ring may contain oxygen, sulfur, nitrogen or a double bond, $R^4$ is a hydroxyl group, optionally halogenated $C_1$-$C_6$ saturated hydrocarbyl group, optionally halogenated $C_1$-$C_6$ saturated hydrocarbyloxy group, optionally halogenated $C_2$-$C_7$ saturated hydrocarbylcarbonyloxy group, optionally halogenated $C_2$-$C_7$ saturated hydrocarbyloxycarbonyl group, optionally halogenated $C_1$-$C_4$ saturated hydrocarbylsulfonyloxy group, fluorine, chlorine, bromine, amino, nitro, cyano, —N($R^{4A}$)—C(═O)—$R^{4B}$, or —N($R^{4A}$)—C(═O)—O—$R^{4B}$, $R^{4A}$ is hydrogen or a $C_1$-$C_6$ saturated hydrocarbyl group, $R^{4B}$ is a $C_1$-$C_6$ saturated hydrocarbyl group, $C_2$-$C_8$ unsaturated aliphatic hydrocarbyl group, $C_6$-$C_{14}$ aryl group or $C_7$-$C_{15}$ aralkyl group, $R^5$ is a $C_1$-$C_{10}$ (q+1)-valent hydrocarbon group, $R^6$ is a $C_1$-$C_6$ fluorinated saturated hydrocarbyl group or $C_6$-$C_{10}$ fluorinated aryl group, and $L^1$ is a single bond, ether bond, carbonyl group, ester bond, amide bond, carbonate bond, or $C_1$-$C_{20}$ hydrocarbylene group, the hydrocarbylene group may contain an ether bond, carbonyl moiety, ester bond, amide bond, sultone ring, lactam ring, carbonate bond, halogen, hydroxyl moiety or carboxyl moiety.

2. The resist composition of claim 1 wherein the recurring units (b1) have the formula (b1) and the recurring units (b2) have the formula (b2):

(b1)

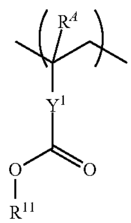

(b2)

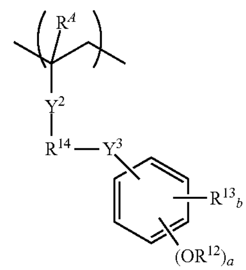

wherein $R^A$ is each independently hydrogen or methyl, $Y^1$ is a single bond, phenylene, naphthylene, or a $C_1$-$C_{12}$ linking group containing an ester bond and/or lactone ring, $Y^2$ is a single bond or ester bond, $Y^3$ is a single bond, ether bond or ester bond, $R^{11}$ and $R^{12}$ each are an acid labile group, $R^{13}$ is a $C_1$-$C_6$ saturated hydrocarbyl group, $C_1$-$C_6$ saturated hydrocarbyloxy group, $C_2$-$C_6$ saturated hydrocarbylcarbonyl group, $C_2$-$C_6$ saturated hydrocarbylcarbonyloxy group, $C_2$-$C_6$ saturated hydrocarbyloxycarbonyl group, halogen, nitro group, or cyano group, $R^{14}$ is a single bond or a $C_1$-$C_6$ saturated hydrocarbylene group in which some carbon may be replaced by an ether bond or ester bond, a is 1 or 2, b is an integer of 0 to 4, and $1 \le a+b \le 5$.

3. The resist composition of claim 1 wherein the base polymer further comprises recurring units of at least one type selected from recurring units having the formulae (d1) to (d3):

(d1)

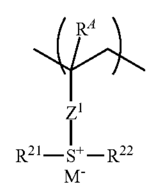

-continued (d2)

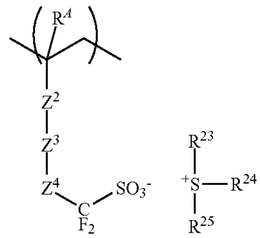

(d3)

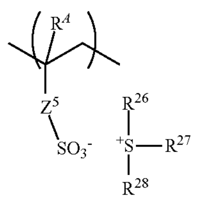

wherein $R^4$ is hydrogen or methyl, $Z^1$ is a single bond, or a $C_1$-$C_6$ aliphatic hydrocarbylene group, phenylene group, naphthylene group, or a $C_7$-$C_{18}$ group obtained by combining the foregoing, or —O—$Z^{11}$—, —C(═O)—O—$Z^{11}$— or —C(═O)—NH—$Z^{11}$—, $Z^{11}$ is a $C_1$-$C_6$ aliphatic hydrocarbylene group, phenylene group, naphthylene group, or a $C_7$-$C_{18}$ group obtained by combining the foregoing, which may contain a carbonyl moiety, ester bond, ether bond or hydroxyl moiety, $Z^2$ is a single bond or ester bond, $Z^3$ is a single bond, —$Z^{31}$—C(═O)—O—, —$Z^{31}$—O—, or —$Z^{31}$—O—C(═O)—, $Z^{31}$ is a $C_1$-$C_{12}$ hydrocarbylene group, phenylene group or a $C_7$-$C_{18}$ group obtained by combining the foregoing, which may contain a carbonyl moiety, ester bond, ether bond, bromine or iodine, $Z^4$ is methylene, 2,2,2-trifluoro-1,1-ethanediyl or carbonyl, $Z^5$ is a single bond, methylene, ethylene, phenylene, fluorinated phenylene, trifluoromethyl-substituted phenylene group, —O—$Z^{51}$—, —C(═O)—O—$Z^{51}$— or —C(═O)—NH—$Z^{51}$—, $Z^{51}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxyl moiety, $R^{21}$ to $R^{28}$ are each independently a $C_1$-$C_{20}$ hydrocarbyl group which may contain a heteroatom, a pair of $R^{23}$ and $R^{24}$ or $R^{26}$ and $R^{27}$ may bond together to form a ring with the sulfur atom to which they are attached, and $M^-$ is a non-nucleophilic counter ion.

4. The resist composition of claim 1, further comprising an acid generator capable of generating a sulfonic acid, sulfone imide or sulfone methide.

5. The resist composition of claim 1, further comprising an organic solvent.

6. The resist composition of claim 1, further comprising a dissolution inhibitor.

7. The resist composition of claim 1, further comprising a surfactant.

8. A pattern forming process comprising the steps of applying the positive resist composition of claim 1 to form a resist film on a substrate, exposing the resist film to high-energy radiation, and developing the exposed resist film in a developer.

9. The process of claim 8 wherein the high-energy radiation is ArF excimer laser of wavelength 193 nm or KrF excimer laser of wavelength 248 nm.

10. The process of claim 8 wherein the high-energy radiation is EB or EUV of wavelength 3 to 15 nm.

11. The resist composition of claim 1 wherein $L^1$ is an ether bond, carbonyl group, ester bond, amide bond or carbonate bond.

12. The resist composition of claim 1 wherein $R^5$ is a $C_2$-$C_{10}$ (q+1)-valent hydrocarbon group.

* * * * *